US011437285B2

(12) United States Patent
St. Amour et al.

(10) Patent No.: US 11,437,285 B2
(45) Date of Patent: Sep. 6, 2022

(54) TRENCH PLUG HARDMASK FOR ADVANCED INTEGRATED CIRCUIT STRUCTURE FABRICATION

(71) Applicant: Intel Corporation, Santa Clara, CA (US)

(72) Inventors: Anthony St. Amour, Portland, OR (US); Michael L. Hattendorf, Portland, OR (US); Christopher P. Auth, Portland, OR (US)

(73) Assignee: Intel Corporation, Santa Clara, CA (US)

(*) Notice: Subject to any disclaimer, the term of this patent is extended or adjusted under 35 U.S.C. 154(b) by 141 days.

(21) Appl. No.: 16/881,514

(22) Filed: May 22, 2020

(65) Prior Publication Data

US 2020/0286792 A1 Sep. 10, 2020

Related U.S. Application Data

(62) Division of application No. 15/859,411, filed on Dec. 30, 2017, now Pat. No. 10,707,133.

(Continued)

(51) Int. Cl.
*H01L 27/092* (2006.01)
*H01L 27/11* (2006.01)

(Continued)

(52) U.S. Cl.
CPC .. *H01L 21/823475* (2013.01); *H01L 21/0337* (2013.01); *H01L 21/28247* (2013.01);

(Continued)

(58) Field of Classification Search
CPC ......... H01L 21/76224; H01L 21/76801; H01L 21/76802; H01L 21/76807
See application file for complete search history.

(56) References Cited

U.S. PATENT DOCUMENTS 9,337,094 B1 * 5/2016 Pranatharthiharan ........................ H01L 29/812
9,716,037 B2 7/2017 Golonzka et al.

(Continued)

FOREIGN PATENT DOCUMENTS

| | | |
|---|---|---|
| DE | 102016 117054 | 6/2017 |
| WO | WO-2017111868 | 6/2017 |
| WO | WO-2017171794 | 10/2017 |

OTHER PUBLICATIONS

Search Report for European Patent Application No. 18203573.3, dated Apr. 4, 2019, 7 pgs.

(Continued)

*Primary Examiner* — John A Bodnar
(74) *Attorney, Agent, or Firm* — Schwabe, Williamson & Wyatt P.C.

(57) ABSTRACT

Embodiments of the disclosure are in the field of advanced integrated circuit structure fabrication and, in particular, 10 nanometer node and smaller integrated circuit structure fabrication and the resulting structures. In an example, an integrated circuit structure includes a fin comprising silicon. A plurality of gate structures is over the fin, individual ones of the plurality of gate structures along a direction orthogonal to the fin and having a pair of dielectric sidewall spacers. A trench contact structure is over the fin and directly between the dielectric sidewalls spacers of a first pair of the plurality of gate structures. A contact plug is over the fin and directly between the dielectric sidewalls spacers of a second pair of the plurality of gate structures, the contact plug comprising a lower dielectric material and an upper hardmask material.

20 Claims, 121 Drawing Sheets

Related U.S. Application Data

(60) Provisional application No. 62/593,149, filed on Nov. 30, 2017.

(51) Int. Cl.

| | |
|---|---|
| ***H01L 21/8234*** | (2006.01) |
| ***H01L 21/822*** | (2006.01) |
| ***H01L 49/02*** | (2006.01) |
| ***H01L 21/762*** | (2006.01) |
| ***H01L 21/8238*** | (2006.01) |
| ***H01L 21/311*** | (2006.01) |
| ***H01L 29/08*** | (2006.01) |
| ***H01L 29/78*** | (2006.01) |
| ***H01L 29/66*** | (2006.01) |
| ***H01L 21/308*** | (2006.01) |
| ***H01L 29/51*** | (2006.01) |
| ***H01L 21/285*** | (2006.01) |
| ***H01L 21/28*** | (2006.01) |
| ***H01L 21/033*** | (2006.01) |
| ***H01L 21/768*** | (2006.01) |
| ***H01L 23/532*** | (2006.01) |
| ***H01L 23/522*** | (2006.01) |
| ***H01L 23/528*** | (2006.01) |
| ***H01L 29/417*** | (2006.01) |
| ***H01L 27/088*** | (2006.01) |

(52) U.S. Cl.

CPC .... *H01L 21/28568* (2013.01); *H01L 21/3086* (2013.01); *H01L 21/31105* (2013.01); *H01L 21/31144* (2013.01); *H01L 21/76224* (2013.01); *H01L 21/76816* (2013.01); *H01L 21/823431* (2013.01); *H01L 21/823481* (2013.01); *H01L 21/823807* (2013.01); *H01L 21/823814* (2013.01); *H01L 21/823821* (2013.01); *H01L 21/823842* (2013.01); *H01L 21/823857* (2013.01); *H01L 21/823871* (2013.01); *H01L 21/823878* (2013.01); *H01L 23/5226* (2013.01); *H01L 23/5283* (2013.01); *H01L 23/53238* (2013.01); *H01L 23/53266* (2013.01); *H01L 27/0886* (2013.01); *H01L 27/0924* (2013.01); *H01L 27/1104* (2013.01); *H01L 28/24* (2013.01); *H01L 29/0847* (2013.01); *H01L 29/41791* (2013.01); *H01L 29/516* (2013.01); *H01L 29/6653* (2013.01); *H01L 29/66795* (2013.01); *H01L 29/785* (2013.01); *H01L 29/7843* (2013.01); *H01L 29/7846* (2013.01); *H01L 29/7854* (2013.01)

(56) References Cited

U.S. PATENT DOCUMENTS

| | | | |
|---|---|---|---|
| 2014/0001572 | A1 | 1/2014 | Bohr et al. |
| 2014/0077305 | A1 | 3/2014 | Pethe et al. |
| 2014/0124873 | A1 | 5/2014 | Jaqannathan |
| 2016/0056156 | A1 | 2/2016 | Ghani et al. |
| 2016/0268244 | A1 | 9/2016 | Young |
| 2016/0276283 | A1 | 9/2016 | Zhang et al. |
| 2017/0110549 | A1 | 4/2017 | Xie et al. |
| 2017/0194211 | A1 | 7/2017 | Lai et al. |

OTHER PUBLICATIONS

Chia-Hong Jan, et al., "Fin-Based Thin Film Resistor", PCT Patent Application No. PCT/US2016/058259, filed Oct. 21, 2016. 34 pgs.

Byron Ho, et al., "Semiconductor Device Having Fin-End Stress-Inducing Features", PCT Patent Application No. PCT/US2016/0646658, filed Dec. 2, 2016. 40 pgs.

Jeffrey S. Leib, et al., "Metal Chemical Vapor Deposition Approaches for Fabricating Wrap-Around Contacts and Resulting Structures", PCT Patent Application No. PCT/US2017/025002, filed Mar. 30, 2017, 32 pgs.

Smita Shridharan, et al., "Internal Node Jumper for Memory Bit Cells", PCT Patent Application No. PCT/US2017/038389, filed Jun. 20, 2017. 26 pgs.

Ranjith Kumar, et al., "Multi Version Library Cell Handling and Integrated Circuit Structures Fabricated Therefrom", PCT Patent Application No. PCT/US2017/052584, filed Sep. 20, 2017. 40 pgs.

Seiyon Kim, et al., "Field Effect Transistors Having Ferroelectric or Antiferroelectric Gate Dielectric Structure", PCT Patent Application No. PCT/US2017/054164, filed Sep. 28, 2017. 33 pgs.

Office Action from European Patent Application No. 18203573.3, dated Oct. 25, 2021, 4 pgs.

* cited by examiner

CROSS-SECTIONAL VIEWS

PLAN VIEWS

TRENCH PLUG HARDMASK FOR ADVANCED INTEGRATED CIRCUIT STRUCTURE FABRICATION

CROSS-REFERENCE TO RELATED APPLICATIONS

This application is a divisional of U.S. patent application Ser. No. 15/859,411 filed Dec. 30, 2017, entitled "TRENCH PLUG HARDMASK FOR ADVANCED INTEGRATED CIRCUIT STRUCTURE FABRICATION", which claims the benefit of U.S. Provisional Application No. 62/593,149, entitled "ADVANCED INTEGRATED CIRCUIT STRUCTURE FABRICATION," filed on Nov. 30, 2017, the entire contents of which are hereby incorporated by reference herein.

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
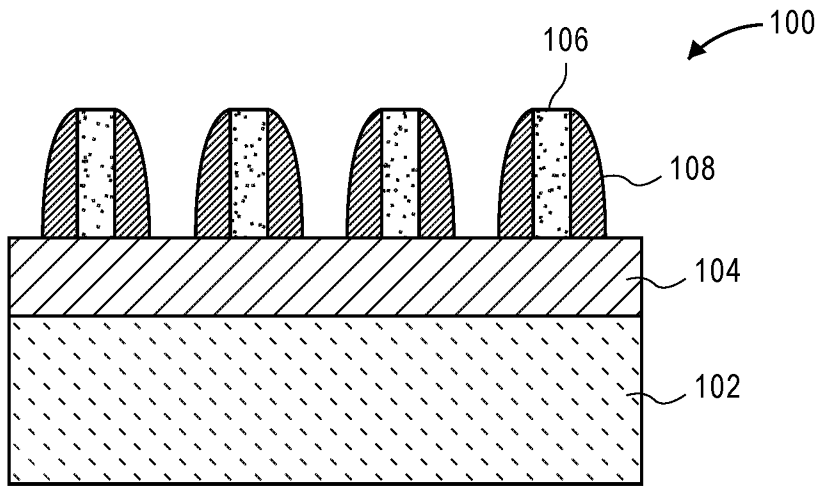
FIG. 1A illustrates a cross-sectional view of a starting structure following deposition, but prior to patterning, of a hardmask material layer formed on an interlayer dielectric (ILD) layer.

Advanced integrated circuit structure fabrication is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 1B:
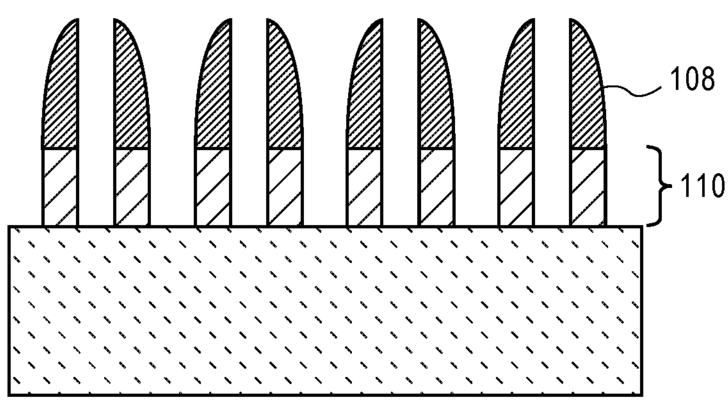
FIG. 1B illustrates a cross-sectional view of the structure of FIG. 1A following patterning of the hardmask layer by pitch halving.

In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through selected lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In accordance with one or more embodiments of the present disclosure, a pitch quartering approach is implemented for patterning a semiconductor layer to form semiconductor fins. In one or more embodiments, a merged fin pitch quartering approach is implemented.

Figure 2A:
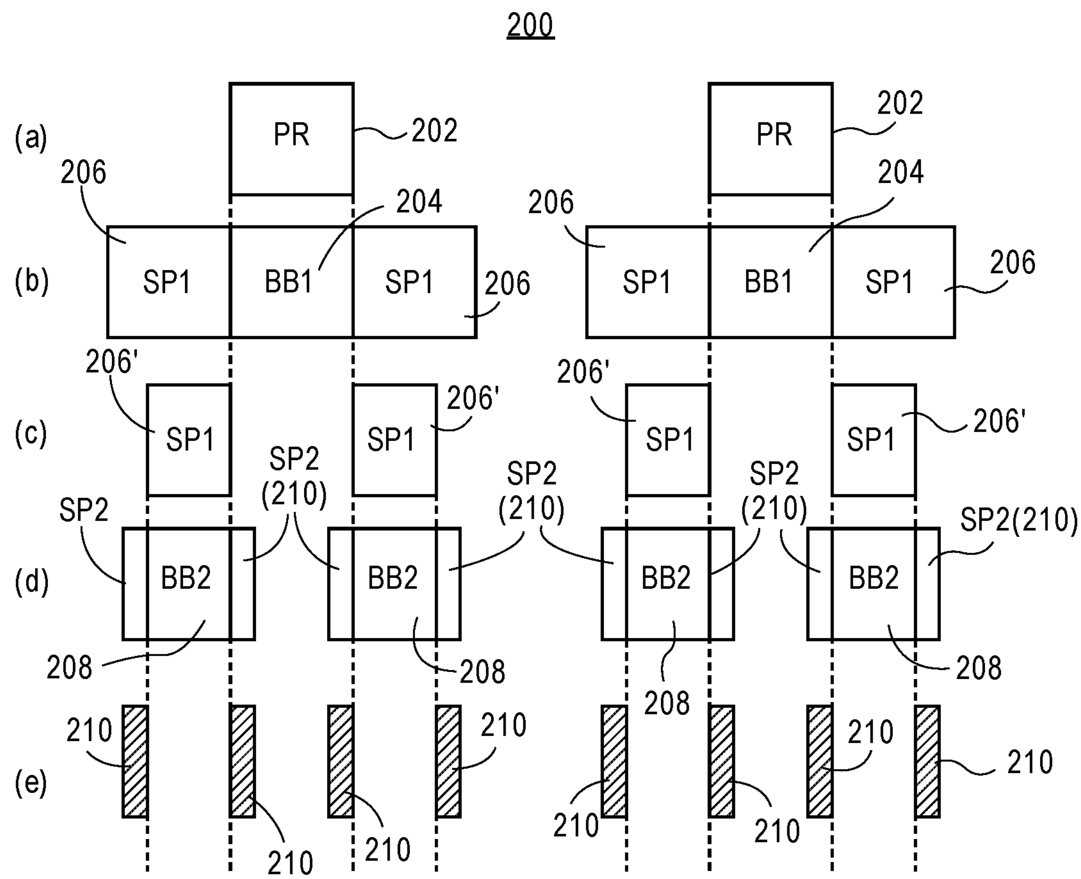
FIG. 2A is a schematic of a pitch quartering approach used to fabricate semiconductor fins, in accordance with an embodiment of the present disclosure.
Figure 2B:
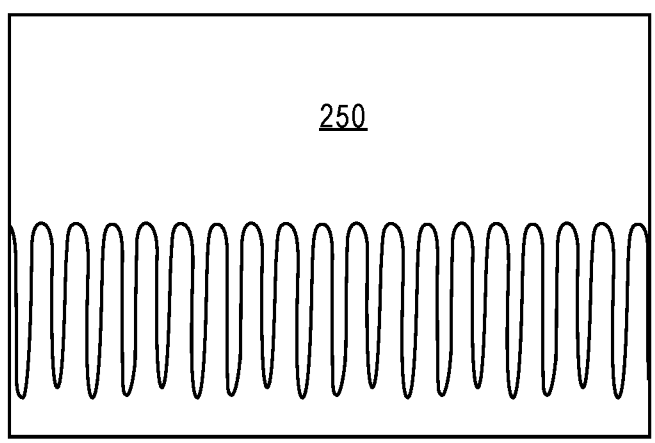
FIG. 2B illustrates a cross-sectional view of semiconductor fins fabricated using a pitch quartering approach, in accordance with an embodiment of the present disclosure.

FIG. 2A is a schematic of a pitch quartering approach 200 used to fabricate semiconductor fins, in accordance with an embodiment of the present disclosure. FIG. 2B illustrates a cross-sectional view of semiconductor fins fabricated using a pitch quartering approach, in accordance with an embodiment of the present disclosure.

Referring to FIG. 2A, at operation (a), a photoresist layer (PR) is patterned to form photoresist features 202. The photoresist features 202 may be patterned using standard lithographic processing techniques, such as 193 immersion lithography. At operation (b), the photoresist features 202 are used to pattern a material layer, such as an insulating or dielectric hardmask layer, to form first backbone (BB1) features 204. First spacer (SP1) features 206 are then formed adjacent the sidewalls of the first backbone features 204. At operation (c), the first backbone features 204 are removed to leave only the first spacer features 206 remaining. Prior to or during the removal of the first backbone features 204, the first spacer features 206 may be thinned to form thinned first spacer features 206', as is depicted in FIG. 2A. This thinning can be performed prior to (as depicted) of after BB1 (feature 204) removal, depending on the required spacing and sizing needed for the BB2 features (208, described below). At operation (d), the first spacer features 206 or the thinned first spacer features 206' are used to pattern a material layer, such as an insulating or dielectric hardmask layer, to form second backbone (BB2) features 208. Second spacer (SP2) features 210 are then formed adjacent the sidewalls of the second backbone features 208. At operation (e), the second backbone features 208 are removed to leave only the second spacer features 210 remaining. The remaining second spacer features 210 may then be used to pattern a semiconductor layer to provide a plurality of semiconductor fins having a pitch quartered dimension relative to the initial patterned photoresist features 202. As an example, referring to FIG. 2B, a plurality of semiconductor fins 250, such as silicon fins formed from a bulk silicon layer, is formed using the second spacer features 210 as a mask for the patterning, e.g., a dry or plasma etch patterning. In the example of FIG. 2B, the plurality of semiconductor fins 250 has essentially a same pitch and spacing throughout.

Figure 3A:
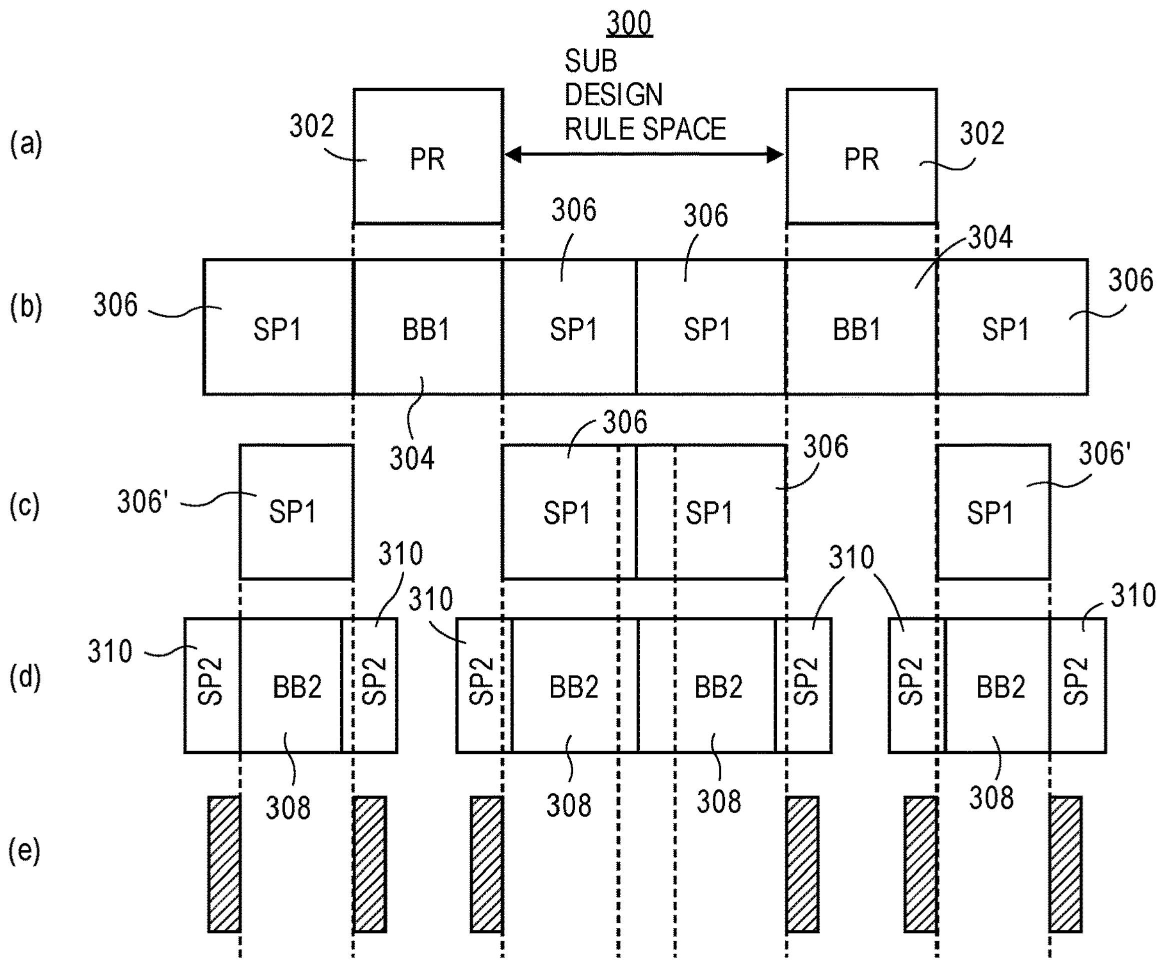
FIG. 3A is a schematic of a merged fin pitch quartering approach used to fabricate semiconductor fins, in accordance with an embodiment of the present disclosure.
Figure 3B:
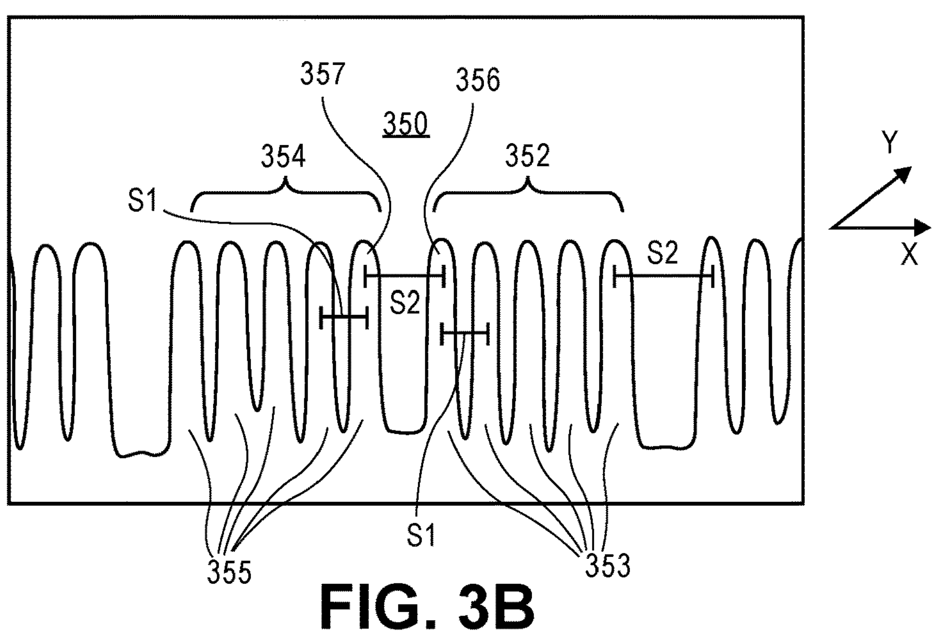
FIG. 3B illustrates a cross-sectional view of semiconductor fins fabricated using a merged fin pitch quartering approach, in accordance with an embodiment of the present disclosure.

It is to be appreciated that the spacing between initially patterned photoresist features can be modified to vary the structural result of the pitch quartering process. In an example, FIG. 3A is a schematic of a merged fin pitch quartering approach 300 used to fabricate semiconductor fins, in accordance with an embodiment of the present disclosure. FIG. 3B illustrates a cross-sectional view of semiconductor fins fabricated using a merged fin pitch quartering approach, in accordance with an embodiment of the present disclosure.

Referring to FIG. 3A, at operation (a), a photoresist layer (PR) is patterned to form photoresist features 302. The photoresist features 302 may be patterned using standard lithographic processing techniques, such as 193 immersion lithography, but at a spacing that may ultimately interfere with design rules required to produce a uniform pitch multiplied pattern (e.g., a spacing referred to as a sub design rule space). At operation (b), the photoresist features 302 are used to pattern a material layer, such as an insulating or dielectric hardmask layer, to form first backbone (BB1) features 304. First spacer (SP1) features 306 are then formed adjacent the sidewalls of the first backbone features 304. However, in contrast to the scheme illustrated in FIG. 2A, some of the adjacent first spacer features 306 are merged spacer features as a result of the tighter photoresist features 302. At operation (c), the first backbone features 304 are removed to leave only the first spacer features 306 remaining. Prior to or after the removal of the first backbone features 304, some of the first spacer features 306 may be thinned to form thinned first spacer features 306', as is depicted in FIG. 3A. At operation (d), the first spacer features 306 and the thinned first spacer features 306' are used to pattern a material layer, such as an insulating or dielectric hardmask layer, to form second backbone (BB2) features 308. Second spacer (SP2) features 310 are then formed adjacent the sidewalls of the second backbone features 308. However, in locations where BB2 features 308 are merged features, such as at the central BB2 features 308 of FIG. 3A, second spacers are not formed. At operation (e), the second backbone features 308 are removed to leave only the second spacer features 310 remaining. The remaining second spacer features 310 may then be used to pattern a semiconductor layer to provide a plurality of semiconductor fins having a pitch quartered dimension relative to the initial patterned photoresist features 302.

As an example, referring to FIG. 3B, a plurality of semiconductor fins 350, such as silicon fins formed from a bulk silicon layer, is formed using the second spacer features 310 as a mask for the patterning, e.g., a dry or plasma etch patterning. In the example of FIG. 3B, however, the plurality of semiconductor fins 350 has a varied pitch and spacing. Such a merged fin spacer patterning approach may be implemented to essentially eliminate the presence of a fin in certain locations of a pattern of a plurality of fins. Accordingly, merging the first spacer features 306 in certain locations allows for the fabrication of six or four fins with based on two first backbone features 304, which typically generate eight fins, as described in association with FIGS. 2A and 2B. In one example, in board fins have a tighter pitch than would normally be allowed by creating the fins at uniform pitch and then cutting the unneeded fins, although the latter approach may still be implemented in accordance with embodiments described herein.

In an exemplary embodiment, referring to FIG. 3B, an integrated circuit structure, a first plurality of semiconductor fins 352 has a longest dimension along a first direction (y, into the page). Adjacent individual semiconductor fins 353 of the first plurality of semiconductor fins 352 are spaced apart from one another by a first amount (S11) in a second direction (x) orthogonal to the first direction y. A second plurality of semiconductor fins 354 has a longest dimension along the first direction y. Adjacent individual semiconductor fins 355 of the second plurality of semiconductor fins 354 are spaced apart from one another by the first amount (S1) in the second direction. Closest semiconductor fins 356 and 357 of the first plurality of semiconductor fins 352 and the second plurality of semiconductor fins 354, respectively, are spaced apart from one another by a second amount (S2) in the second direction x. In an embodiment, the second amount S2 is greater than the first amount S1 but less than twice the first amount S1. In another embodiment, the second amount S2 is more than two times the first amount S1.

In one embodiment, the first plurality of semiconductor fins 352 and the second plurality of semiconductor fins 354 include silicon. In one embodiment, the first plurality of semiconductor fins 352 and the second plurality of semiconductor fins 354 are continuous with an underlying monocrystalline silicon substrate. In one embodiment, individual ones of the first plurality of semiconductor fins 352 and the second plurality of semiconductor fins 354 have outwardly tapering sidewalls along the second direction x from a top to a bottom of individual ones of the first plurality of semiconductor fins 352 and the second plurality of semiconductor fins 354. In one embodiment, the first plurality of semiconductor fins 352 has exactly five semiconductor fins, and the second plurality of semiconductor fins 354 has exactly five semiconductor fins.

In another exemplary embodiment, referring to FIGS. 3A and 3B, a method of fabricating an integrated circuit structure includes forming a first primary backbone structure 304 (left BB1) and a second primary backbone structure 304 (right BB1). Primary spacer structures 306 are formed adjacent sidewalls of the first primary backbone structure 304 (left BB1) and the second primary backbone structure 304 (right BB1) Primary spacer structures 306 between the first primary backbone structure 304 (left BB1) and the second primary backbone structure 304 (right BB1) are merged. The first primary backbone structure (left BB1) and the second primary backbone structure (right BB1) are removed, and first, second, third and fourth secondary backbone structures 308 are provided. The second and third secondary backbone structures (e.g., the central pair of the secondary backbone structures 308) are merged. Secondary spacer structures 310 are formed adjacent sidewalls of the first, second, third and fourth secondary backbone structures 308. The first, second, third and fourth secondary backbone structures 308 are then removed. A semiconductor material is then patterned with the secondary spacer structures 310 to form semiconductor fins 350 in the semiconductor material.

In one embodiment, the first primary backbone structure 304 (left BB1) and the second primary backbone structure 304 (right BB1) are patterned with a sub-design rule spacing between the first primary backbone structure and the second primary backbone structure. In one embodiment, the semiconductor material includes silicon. In one embodiment, individual ones of the semiconductor fins 350 have outwardly tapering sidewalls along the second direction x from a top to a bottom of individual ones of the semiconductor fins 350. In one embodiment, the semiconductor fins 350 are continuous with an underlying monocrystalline silicon substrate. In one embodiment, patterning the semiconductor material with the secondary spacer structures 310 includes forming a first plurality of semiconductor fins 352 having a longest dimension along a first direction y, where adjacent individual semiconductor fins of the first plurality of semiconductor fins 352 are spaced apart from one another by a first amount S1 in a second direction x orthogonal to the first direction y. A second plurality of semiconductor fins 354 is formed having a longest dimension along the first direction y, where adjacent individual semiconductor fins of the second plurality of semiconductor fins 354 are spaced apart from one another by the first amount S1 in the second direction x. Closest semiconductor fins 356 and 357 of the first plurality of semiconductor fins 352 and the second plurality of semiconductor fins 354, respectively, are spaced apart from one another by a second amount S2 in the second direction x. In an embodiment, the second amount S2 is greater than the first amount S1. In one such embodiment, the second amount S2 is less than twice the first amount S1. In another such embodiment, the second amount S2 is more than two times but less than three times greater than the first amount S1. In an embodiment, the first plurality of semiconductor fins 352 has exactly five semiconductor fins, and the second plurality of semiconductor fins 254 has exactly five semiconductor fins, as is depicted in FIG. 3B.

In another aspect, it is to be appreciated that a fin trim process, where fin removal is performed as an alternative to a merged fin approach, fins may be trimmed (removed) during hardmask patterning or by physically removing the fin. As an example, of the latter approach, FIGS. 4A-4C cross-sectional views representing various operations in a method of fabricating a plurality of semiconductor fins, in accordance with an embodiment of the present disclosure.

Figure 4A:
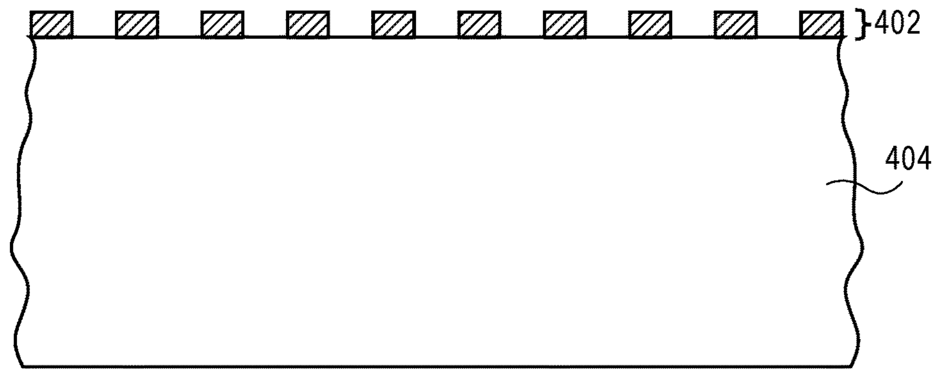
FIGS. 4A-4C cross-sectional views representing various operations in a method of fabricating a plurality of semiconductor fins, in accordance with an embodiment of the present disclosure.
Figure 4B:
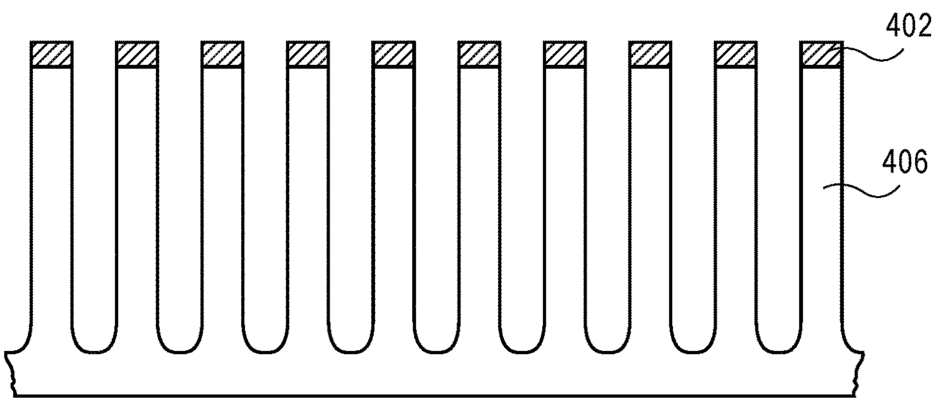
Figure 4C:
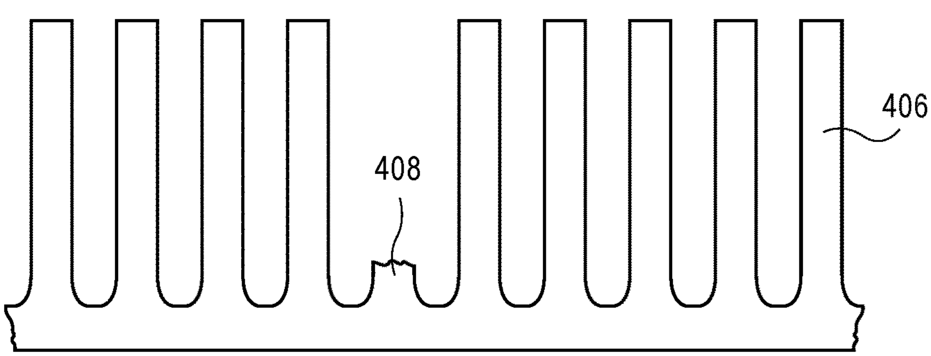

Referring to FIG. 4A, a patterned hardmask layer 402 is formed above a semiconductor layer 404, such as a bulk single crystalline silicon layer. Referring to FIG. 4B, fins 406 are then formed in the semiconductor layer 404, e.g., by a dry or plasma etch process. Referring to FIG. 4C, select fins 406 are removed, e.g., using a masking and etch process. In the example shown, one of the fins 406 is removed and may leave a remnant fin stub 408, as is depicted in FIG. 4C. In such a "fin trim last" approach, the hardmask 402 is patterned as whole to provide a grating structure without removal or modification of individual features. The fin population is not modified until after fins are fabricated.

In another aspect, a multi-layer trench isolation region, which may be referred to as a shallow trench isolation (STI) structure, may be implemented between semiconductor fins. In an embodiment, a multi-layer STI structure is formed between silicon fins formed in a bulk silicon substrate to define sub-fin regions of the silicon fins.

It may be desirable to use bulk silicon for fins or trigate based transistors. However, there is a concern that regions (sub-fin) below the active silicon fin portion of the device (e.g., the gate-controlled region, or HSi) is under diminished or no gate control. As such, if source or drain regions are at or below the HSi point, then leakage pathways may exist through the sub-fin region. It may be the case that leakage pathways in the sub-fin region should be controlled for proper device operation.

One approach to addressing the above issues have involved the use of well implant operations, where the sub-fin region is heavily doped (e.g., much greater than $2E18/cm^3$), which shuts off sub-fin leakage but leads to substantial doping in the fin as well. The addition of halo implants further increases fin doping such that end of line fins are doped at a high level (e.g., greater than approximately $1E18/cm^3$).

Another approach involves doping provided through sub-fin doping without necessarily delivering the same level of doping to the HSi portions of the fins. Processes may involve selectively doping sub-fin regions of tri-gate or FinFET transistors fabricated on bulk silicon wafers, e.g., by way of tri-gate doped glass sub-fin out-diffusion. For example, selectively doping a sub-fin region of tri-gate or FinFET transistors may mitigate sub-fin leakage while simultaneously keeping fin doping low. Incorporation of a solid state doping sources (e.g., p-type and n-type doped oxides, nitrides, or carbides) into the transistor process flow, which after being recessed from the fin sidewalls, delivers well doping into the sub-fin region while keeping the fin body relatively undoped.

Thus, process schemes may include the use of a solid source doping layer (e.g. boron doped oxide) deposited on fins subsequent to fin etch. Later, after trench fill and polish, the doping layer is recessed along with the trench fill material to define the fin height (HSi) for the device. The operation removes the doping layer from the fin sidewalls above HSi. Therefore, the doping layer is present only along the fin sidewalls in the sub-fin region which ensures precise control of doping placement. After a drive-in anneal, high doping is limited to the sub-fin region, quickly transitioning to low doping in the adjacent region of the fin above HSi (which forms the channel region of the transistor). In general, borosilicate glass (BSG) is implemented for NMOS fin doping, while a phosphosilicate (PSG) or arsenic-silicate glass (AsSG) layer is implemented for PMOS fin doping. In one example, such a P-type solid state dopant source layer is a BSG layer having a boron concentration approximately in the range of 0.1-10 weight %. In a another example, such an N-type solid state dopant source layer is a PSG layer or an AsSG layer having a phosphorous or arsenic, respectively, concentration approximately in the range of 0.1-10 weight %. A silicon nitride capping layer may be included on the doping layer, and a silicon dioxide or silicon oxide fill material may then be included on the silicon nitride capping layer.

In accordance with another embodiment of the present disclosure, sub fin leakage is sufficiently low for relatively thinner fins (e.g., fins having a width of less than approximately 20 nanometers) where an undoped or lightly doped silicon oxide or silicon dioxide film is formed directly adjacent a fin, a silicon nitride layer is formed on the undoped or lightly doped silicon oxide or silicon dioxide film, and a silicon dioxide or silicon oxide fill material is included on the silicon nitride capping layer. It is to be appreciated that doping, such as halo doping, of the sub-fin regions may also be implemented with such a structure.

Figure 5A:
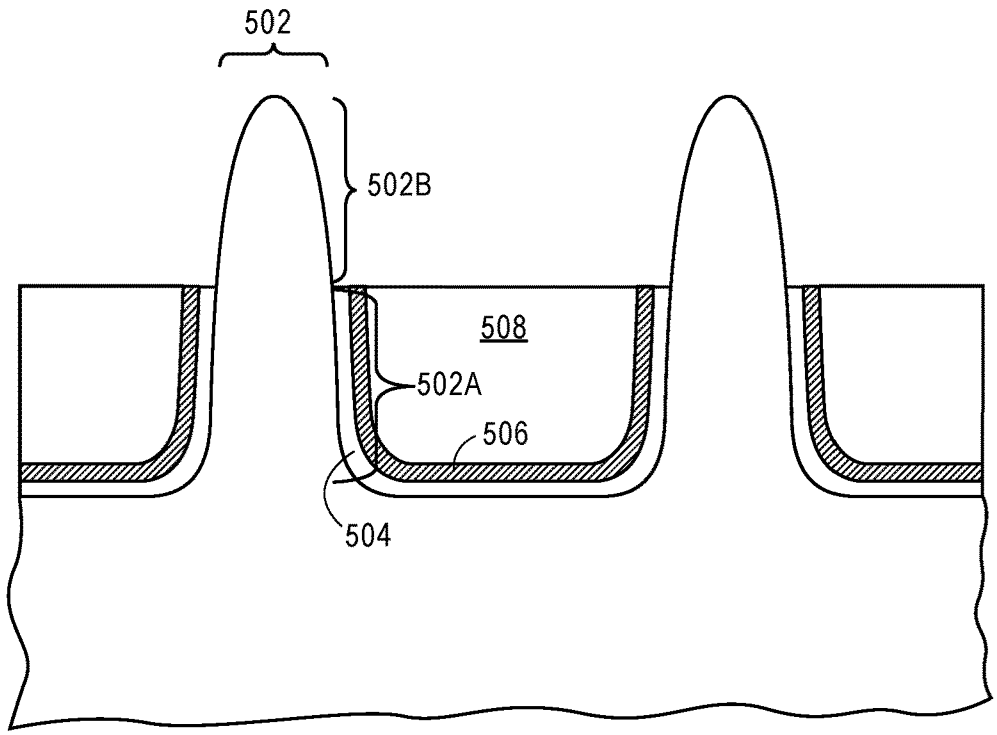
FIG. 5A illustrates a cross-sectional view of a pair of semiconductor fins separated by a three-layer trench isolation structure, in accordance with an embodiment of the present disclosure.

FIG. 5A illustrates a cross-sectional view of a pair of semiconductor fins separated by a three-layer trench isolation structure, in accordance with an embodiment of the present disclosure.

Referring to FIG. 5A, an integrated circuit structure includes a fin 502, such as a silicon fin. The fin 502 has a lower fin portion (sub-fin) 502A and an upper fin portion 502B ($H_{Si}$). A first insulating layer 504 is directly on sidewalls of the lower fin portion 502A of the fin 502. A second insulating layer 506 is directly on the first insulating layer 504 directly on the sidewalls of the lower fin portion 502A of the fin 502. A dielectric fill material 508 is directly laterally adjacent to the second insulating layer 506 directly on the first insulating layer 504 directly on the sidewalls of the lower fin portion 502A of the fin 502.

In an embodiment, the first insulating layer 504 is a non-doped insulating layer including silicon and oxygen, such as a silicon oxide or silicon dioxide insulating layer. In an embodiment, the first insulating layer 504 includes silicon and oxygen and has no other atomic species having an atomic concentration greater than 1E15 atoms per cubic centimeter. In an embodiment, the first insulating layer 504 has a thickness in the range of 0.5-2 nanometers.

In an embodiment, the second insulating layer 506 includes silicon and nitrogen, such as a stoichiometric $Si_3N_4$ silicon nitride insulating layer, a silicon-rich silicon nitride insulating layer, or a silicon-poor silicon nitride insulating layer. In an embodiment, the second insulating layer 506 has a thickness in the range of 2-5 nanometers.

In an embodiment, the dielectric fill material 508 includes silicon and oxygen, such as a silicon oxide or silicon dioxide insulating layer. In an embodiment, a gate electrode is ultimately formed over a top of and laterally adjacent to sidewalls of the upper fin portion 502B of the fin 502.

It is to be appreciated that during processing, upper fin portions of semiconductor fins may be eroded or consumed. Also, trench isolation structures between fins may also become eroded to have non-planar topography or may be formed with non-planar topography up fabrication. As an example, FIG. 5B illustrates a cross-sectional view of another pair of semiconductor fins separated by another three-layer trench isolation structure, in accordance with another embodiment of the present disclosure.

Figure 5B:
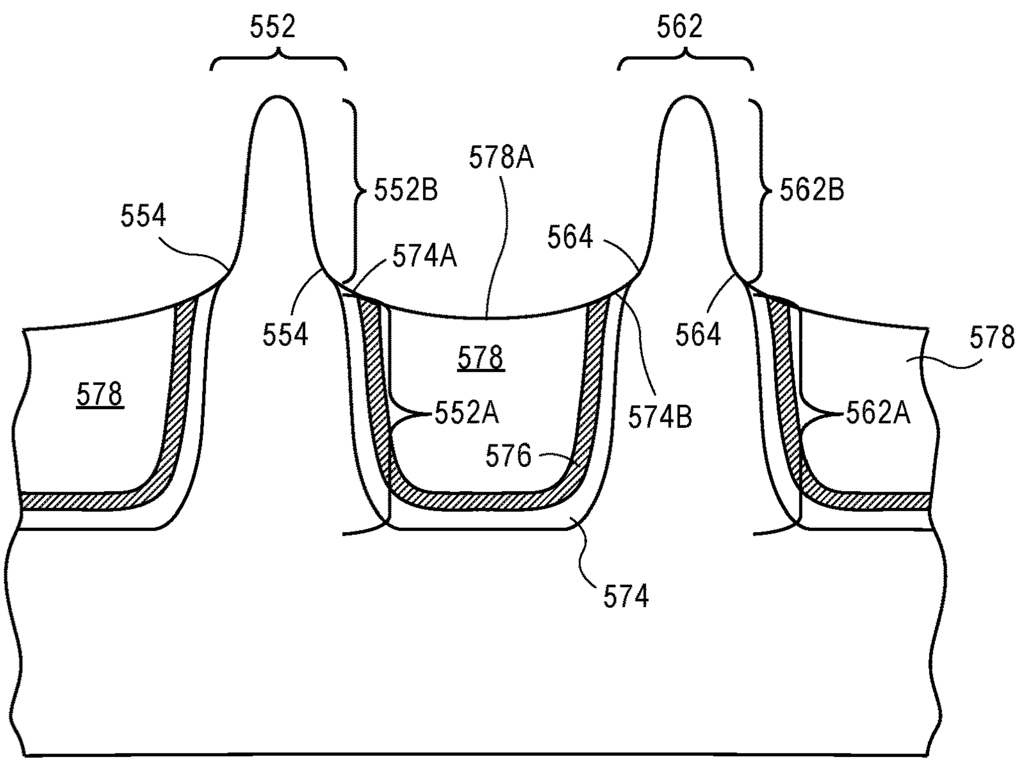
FIG. 5B illustrates a cross-sectional view of another pair of semiconductor fins separated by another three-layer trench isolation structure, in accordance with another embodiment of the present disclosure.

Referring to FIG. 5B, an integrated circuit structure includes a first fin 552, such as a silicon fin. The first fin 552 has a lower fin portion 552A and an upper fin portion 552B and a shoulder feature 554 at a region between the lower fin portion 552A and the upper fin portion 552B. A second fin 562, such as a second silicon fin, has a lower fin portion 562A and an upper fin portion 562B and a shoulder feature 564 at a region between the lower fin portion 562A and the upper fin portion 562B. A first insulating layer 574 is directly on sidewalls of the lower fin portion 552A of the first fin 552 and directly on sidewalls of the lower fin portion 562A of the second fin 562. The first insulating layer 574 has a first end portion 574A substantially co-planar with the shoulder feature 554 of the first fin 552, and the first insulating layer 574 further has a second end portion 574B substantially co-planar with the shoulder feature 564 of the second fin 562. A second insulating layer 576 is directly on the first insulating layer 574 directly on the sidewalls of the lower fin portion 552A of the first fin 552 and directly on the sidewalls of the lower fin portion 562A of the second fin 562.

A dielectric fill material 578 is directly laterally adjacent to the second insulating layer 576 directly on the first insulating layer 574 directly on the sidewalls of the lower fin portion 552A of the first fin 552 and directly on the sidewalls of the lower fin portion 562A of the second fin 562. In an embodiment, the dielectric fill material 578 has an upper surface 578A, where a portion of the upper surface 578A of the dielectric fill material 578 is below at least one of the shoulder features 554 of the first fin 552 and below at least one of the shoulder features 564 of the second fin 562, as is depicted in FIG. 5B.

In an embodiment, the first insulating layer 574 is a non-doped insulating layer including silicon and oxygen, such as a silicon oxide or silicon dioxide insulating layer. In an embodiment, the first insulating layer 574 includes silicon and oxygen and has no other atomic species having an atomic concentration greater than 1E15 atoms per cubic centimeter. In an embodiment, the first insulating layer 574 has a thickness in the range of 0.5-2 nanometers.

In an embodiment, the second insulating layer 576 includes silicon and nitrogen, such as a stoichiometric $Si_3N_4$ silicon nitride insulating layer, a silicon-rich silicon nitride insulating layer, or a silicon-poor silicon nitride insulating layer. In an embodiment, the second insulating layer 576 has a thickness in the range of 2-5 nanometers.

In an embodiment, the dielectric fill material 578 includes silicon and oxygen, such as a silicon oxide or silicon dioxide insulating layer. In an embodiment, a gate electrode is ultimately formed over a top of and laterally adjacent to sidewalls of the upper fin portion 552B of the first fin 552, and over a top of and laterally adjacent to sidewalls of the upper fin portion 562B of the second fin 562. The gate electrode is further over the dielectric fill material 578 between the first fin 552 and the second fin 562.

FIGS. 6A-6D illustrate a cross-sectional view of various operations in the fabrication of a three-layer trench isolation structure, in accordance with an embodiment of the present disclosure.

Figure 6A:
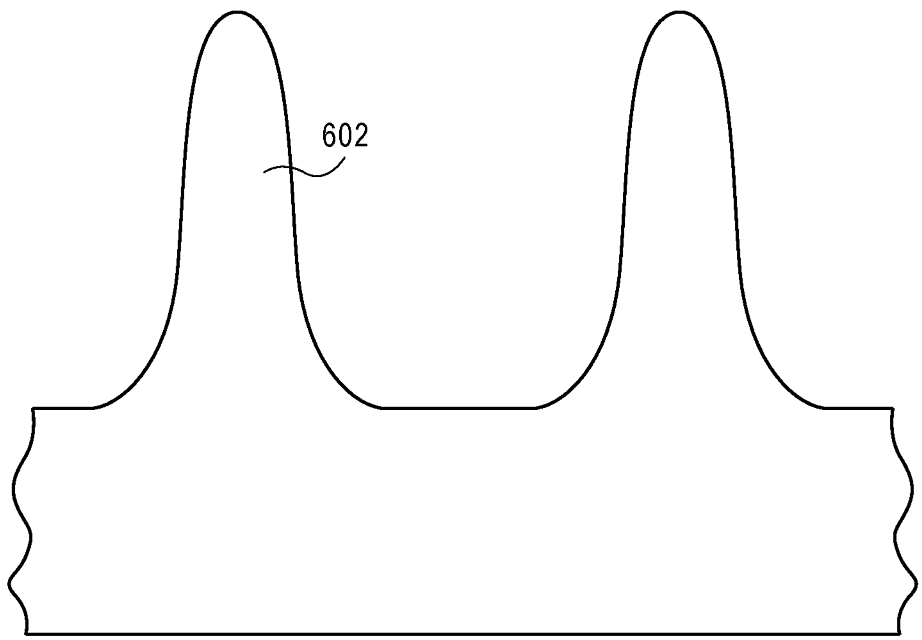
FIGS. 6A-6D illustrate a cross-sectional view of various operations in the fabrication of a three-layer trench isolation structure, in accordance with an embodiment of the present disclosure.
Figure 6B:
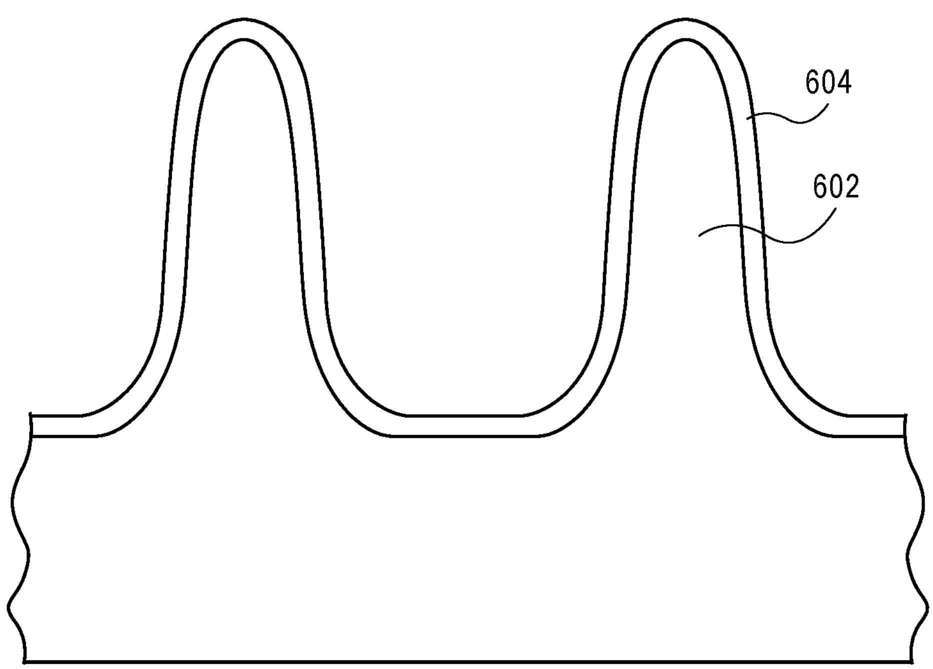

Referring to FIG. 6A, a method of fabricating an integrated circuit structure includes forming a fin 602, such as a silicon fin. A first insulating layer 604 is formed directly on and conformal with the fin 602, as is depicted in FIG. 6B. In an embodiment, the first insulating layer 604 includes silicon and oxygen and has no other atomic species having an atomic concentration greater than 1E15 atoms per cubic centimeter.

Figure 6C:
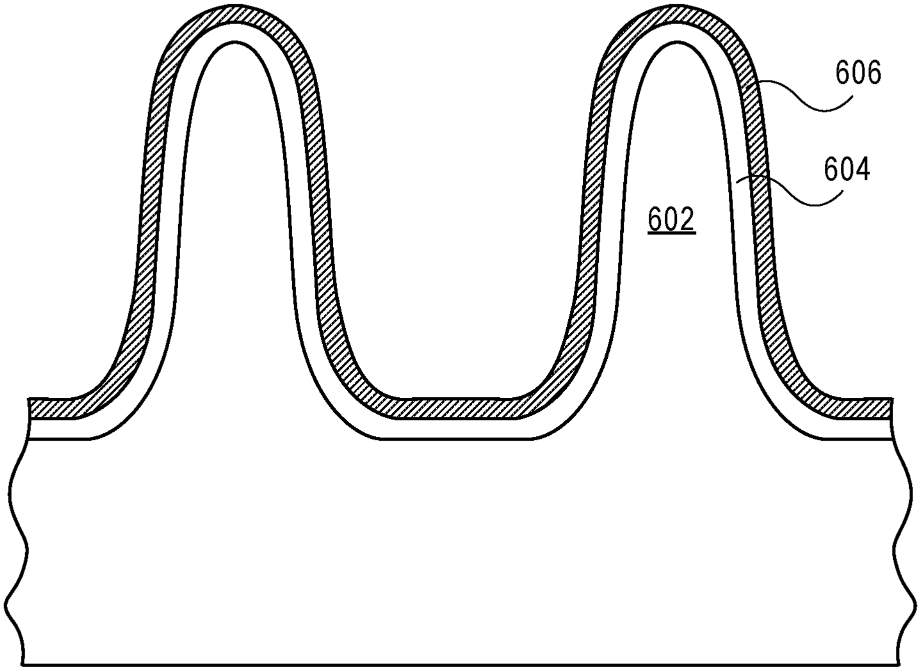
Figure 6D:
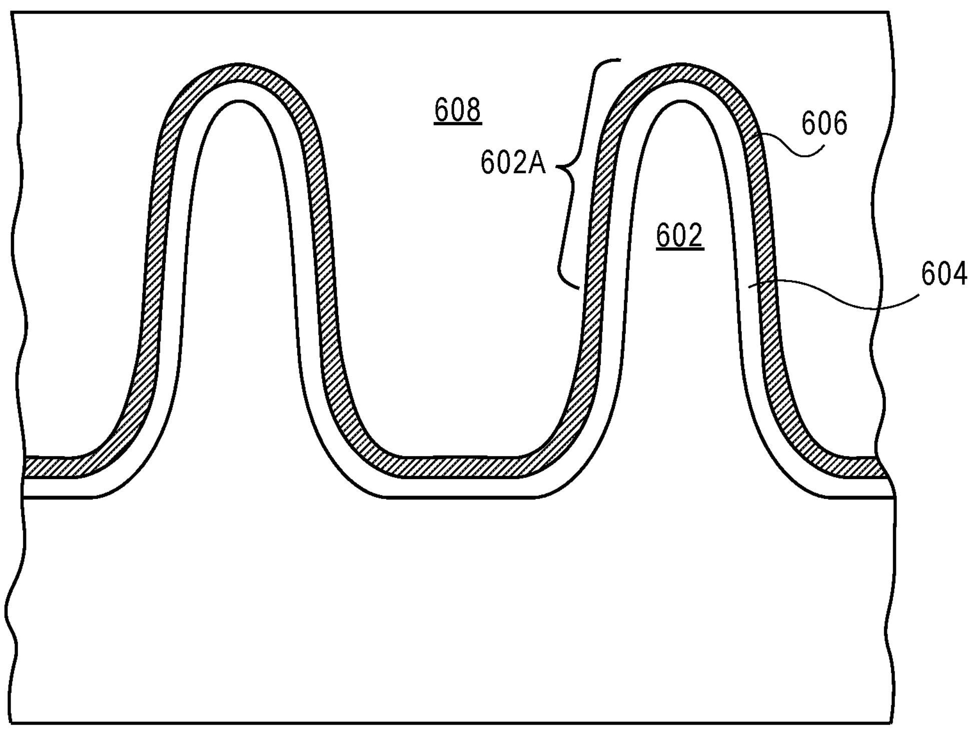

Referring to FIG. 6C, a second insulating layer 606 is formed directly on and conformal with the first insulating layer 604. In an embodiment, the second insulating layer 606 includes silicon and nitrogen. A dielectric fill material 608 is formed directly on the second insulating layer 606, as is depicted in FIG. 6D.

In an embodiment, the method further involves recessing the dielectric fill material 608, the first insulating layer 604 and the second insulating layer 606 to provide the fin 602 having an exposed upper fin portion 602A (e.g., such as upper fin portions 502B, 552B or 562B of FIGS. 5A and 5B). The resulting structure may be as described in association with FIG. 5A or 5B. In one embodiment, recessing the dielectric fill 608 material, the first insulating layer 604 and the second insulating layer 606 involves using a wet etch process. In another embodiment, recessing the dielectric fill 608 material, the first insulating layer 604 and the second insulating layer 606 involves using a plasma etch or dry etch process.

In an embodiment, the first insulating layer 604 is formed using a chemical vapor deposition process. In an embodiment, the second insulating layer 606 is formed using a chemical vapor deposition process. In an embodiment, the dielectric fill material 608 is formed using a spin-on process. In one such embodiment, the dielectric fill material 608 is a spin-on material and is exposed to a steam treatment, e.g., either before or after a recess etch process, to provide a cured material including silicon and oxygen. In an embodiment, a gate electrode is ultimately formed over a top of and laterally adjacent to sidewalls of an upper fin portion of the fin 602.

In another aspect, gate sidewall spacer material may be retained over certain trench isolation regions as a protection against erosion of the trench isolation regions during subsequent processing operations. For example, FIGS. 7A-7E illustrate angled three-dimensional cross-sectional views of various operations in a method of fabricating an integrated circuit structure, in accordance with an embodiment of the present disclosure.

Figure 7A:
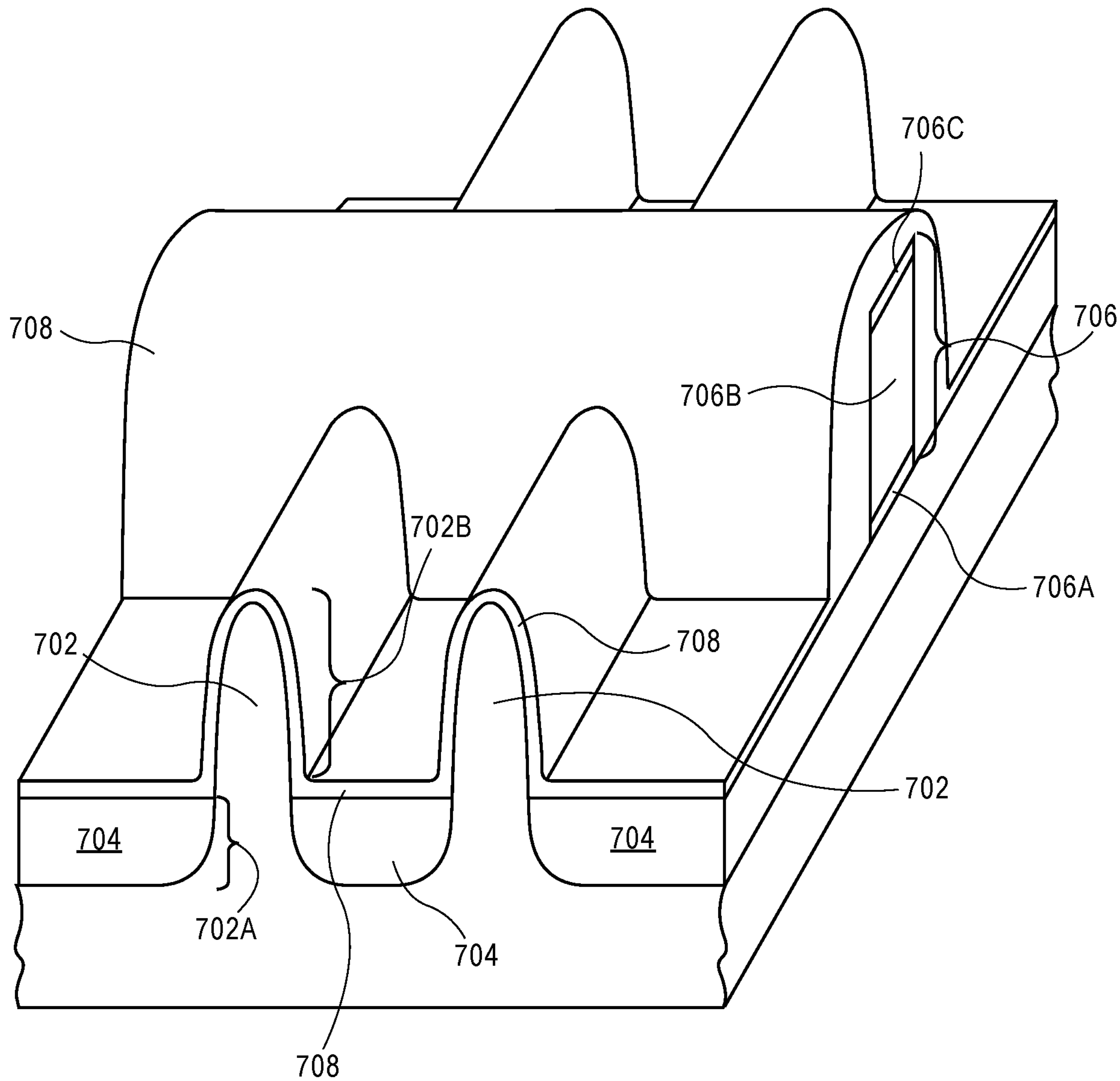
FIGS. 7A-7E illustrate angled three-dimensional cross-sectional views of various operations in a method of fabricating an integrated circuit structure, in accordance with an embodiment of the present disclosure.

Referring to FIG. 7A, a method of fabricating an integrated circuit structure includes forming a fin 702, such as a silicon fin. The fin 702 has a lower fin portion 702A and an upper fin portion 702B. An insulating structure 704 is formed directly adjacent sidewalls of the lower fin portion 702A of the fin 702. A gate structure 706 is formed over the upper fin portion 702B and over the insulating structure 704. In an embodiment, the gate structure is a placeholder or dummy gate structure including a sacrificial gate dielectric layer 706A, a sacrificial gate 706B, and a hardmask 706C. A dielectric material 708 is formed conformal with the upper fin portion 702B of the fin 702, conformal with the gate structure 706, and conformal with the insulating structure 704.

Figure 7B:
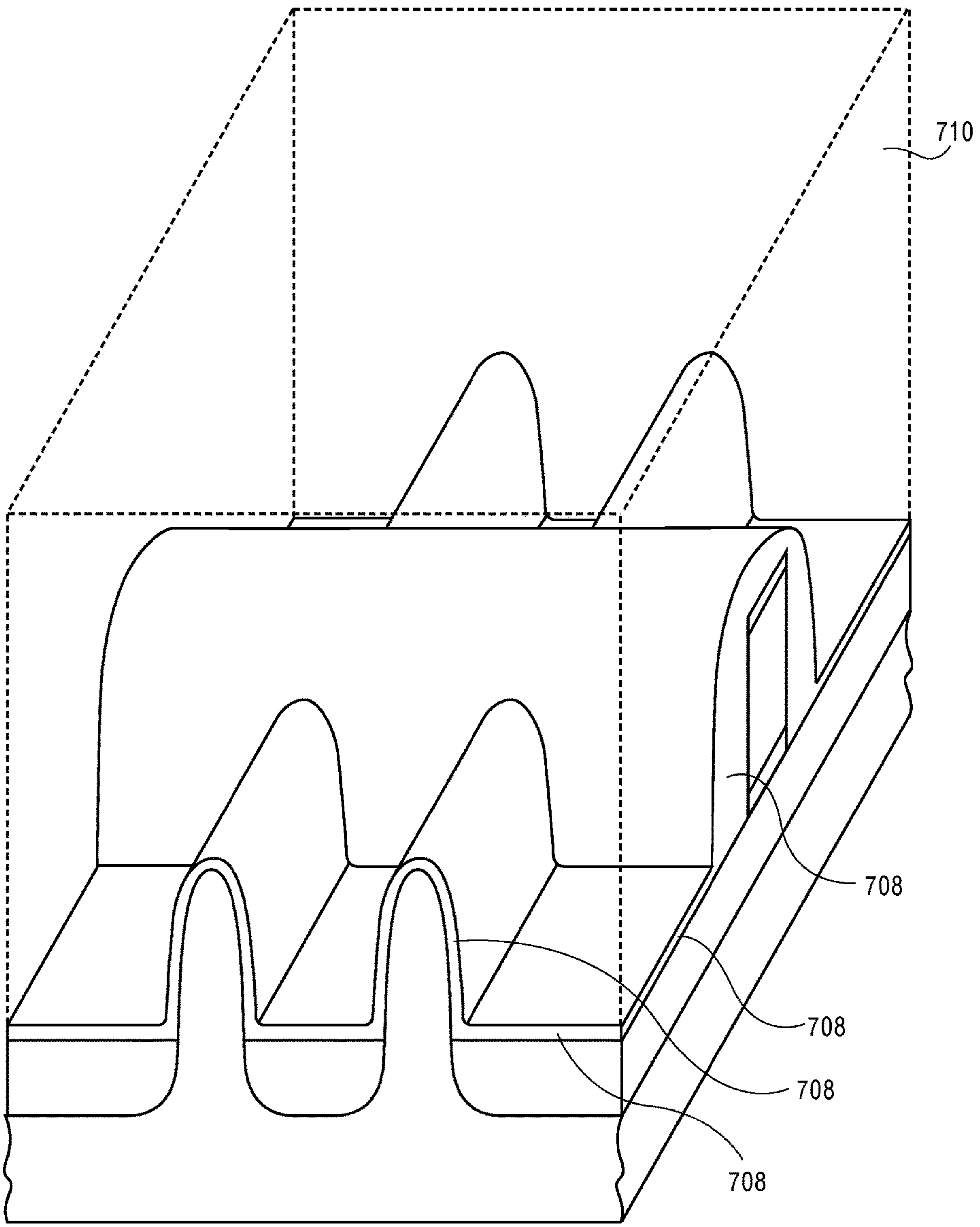

Referring to FIG. 7B, a hardmask material 710 is formed over the dielectric material 708. In an embodiment, the hardmask material 710 is a carbon-based hardmask material formed using a spin-on process.

Figure 7C:
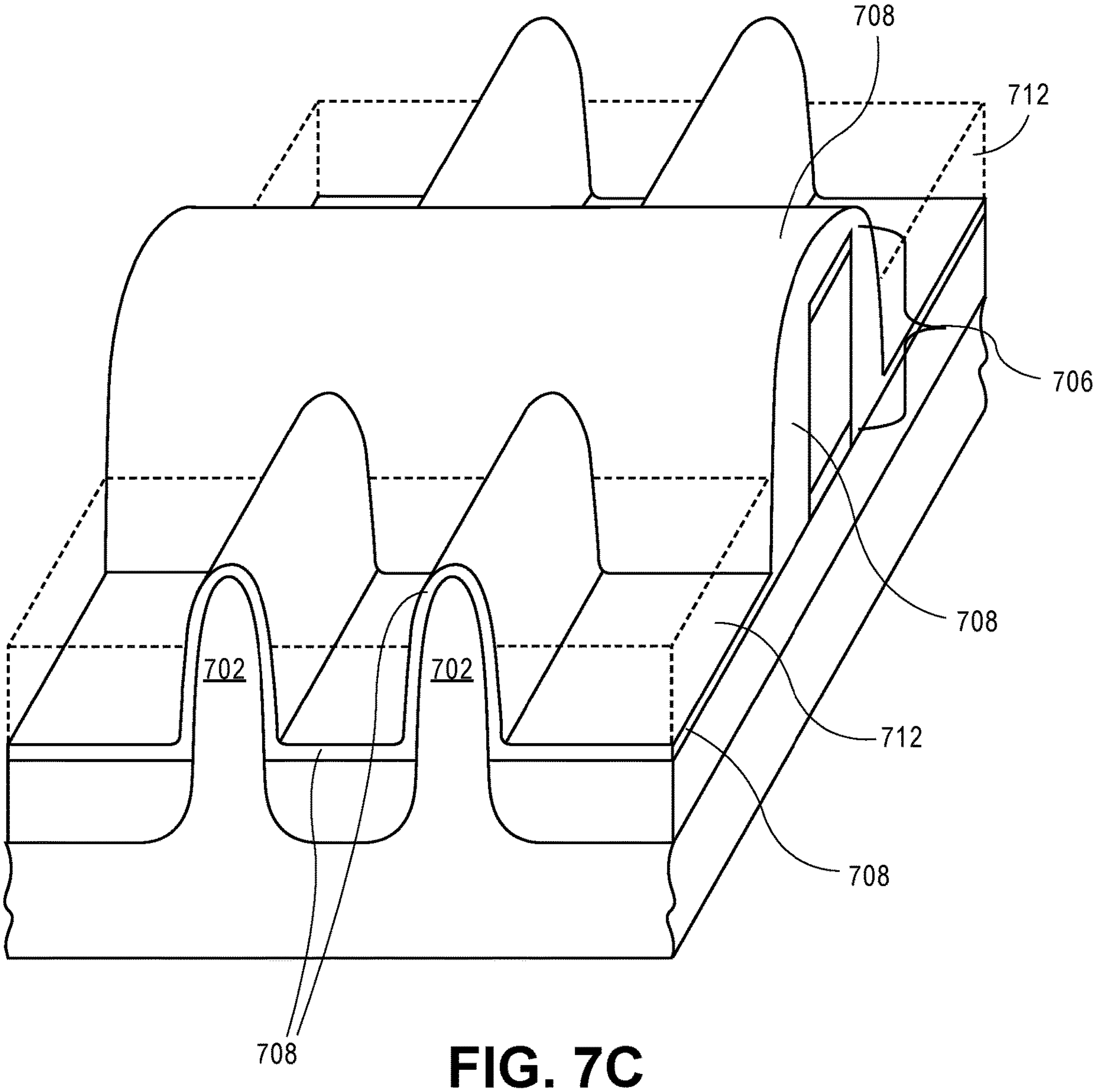

Referring to FIG. 7C, the hardmask material 710 is recessed to form a recessed hardmask material 712 and to expose a portion of the dielectric material 708 conformal with the upper fin portion 702B of the fin 702 and conformal with the gate structure 706. The recessed hardmask material 712 covers a portion of the dielectric material 708 conformal with the insulating structure 704. In an embodiment, the hardmask material 710 is recessed using a wet etching process. In another embodiment, the hardmask material 710 is recessed using an ash, a dry etch or a plasma etch process.

Figure 7D:
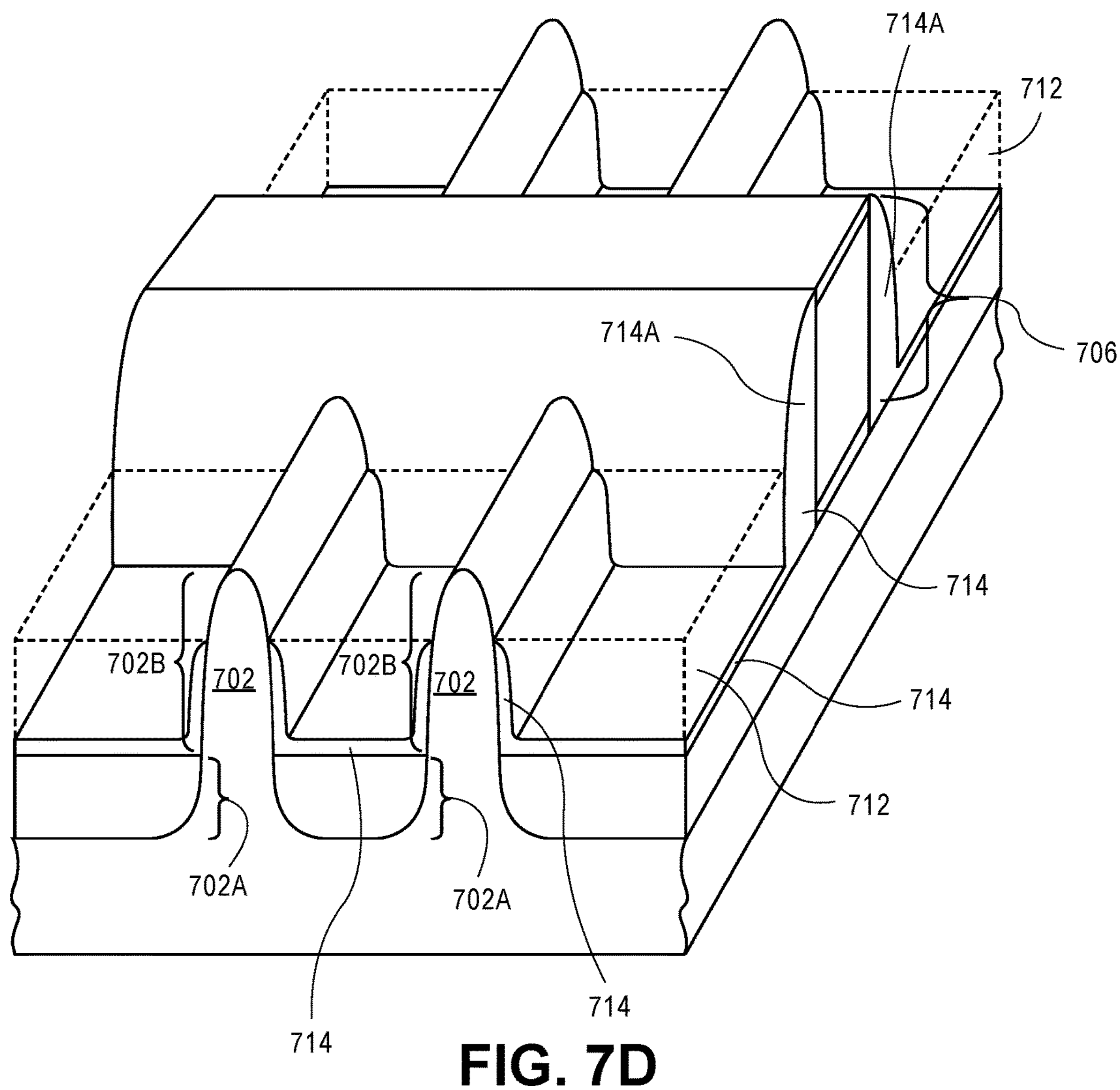

Referring to FIG. 7D, the dielectric material 708 is anisotropically etched to form a patterned dielectric material 714 along sidewalls of the gate structure 706 (as dielectric spacers 714A), along portions of the sidewalls of the upper fin portion 702B of the fin 702, and over the insulating structure 704.

Figure 7E:
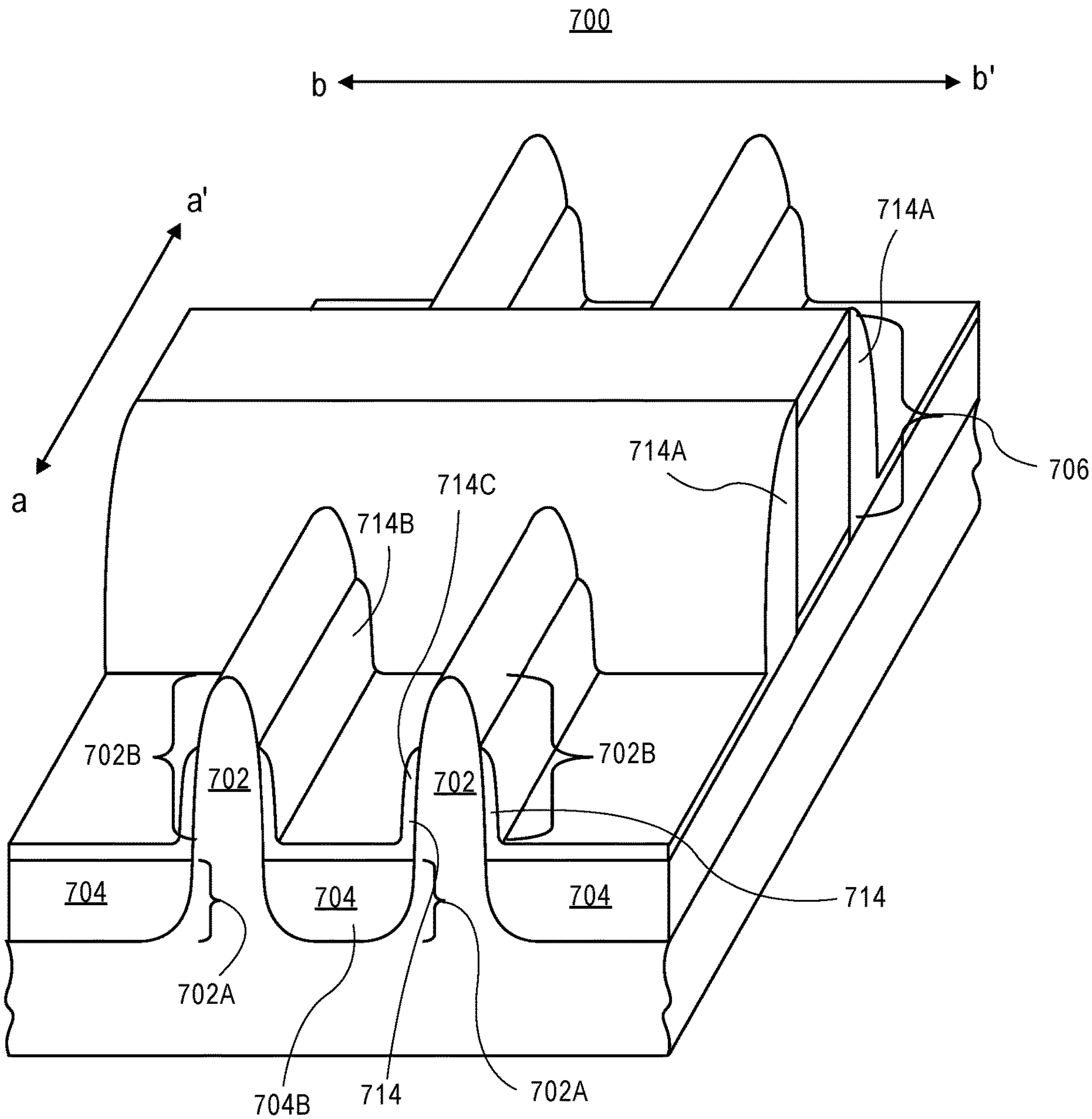

Referring to FIG. 7E, the recessed hardmask material 712 is removed from the structure of FIG. 7D. In an embodiment, the gate structure 706 is a dummy gate structure, and subsequent processing includes replacing the gate structure 706 with a permanent gate dielectric and gate electrode stack. In an embodiment, further processing includes forming embedded source or drain structures on opposing sides of the gate structure 706, as is described in greater detail below.

Referring again to FIG. 7E, in an embodiment, an integrated circuit structure 700 includes a first fin (left 702), such as a first silicon fin, the first fin having a lower fin portion 702A and an upper fin portion 702B. The integrated circuit structure further includes a second fin (right 702), such as a second silicon fin, the second fin having a lower fin portion 702A and an upper fin portion 702B. An insulating structure 704 is directly adjacent sidewalls of the lower fin portion 702A of the first fin and directly adjacent sidewalls of the lower fin portion 702A of the second fin. A gate electrode 706 is over the upper fin portion 702B of the first fin (left 702), over the upper fin portion 702B of the second fin (right 702), and over a first portion 704A of the insulating structure 704. A first dielectric spacer 714A along a sidewall of the upper fin portion 702B of the first fin (left 702), and a second dielectric spacer 702C is along a sidewall of the upper fin portion 702B of the second fin (right 702). The second dielectric spacer 714C is continuous with the first dielectric spacer 714B over a second portion 704B of the insulating structure 704 between the first fin (left 702 and the second fin (right 702).

In an embodiment, the first and second dielectric spacers 714B and 714C include silicon and nitrogen, such as a stoichiometric $Si_3N_4$ silicon nitride material, a silicon-rich silicon nitride material, or a silicon-poor silicon nitride material.

In an embodiment, the integrated circuit structure 700 further includes embedded source or drain structures on opposing sides of the gate electrode 706, the embedded source or drain structures having a bottom surface below a top surface of the first and second dielectric spacers 714B and 714C along the sidewalls of the upper fin portions 702B of the first and second fins 702, and the source or drain structures having a top surface above a top surface of the first and second dielectric spacers 714B and 714C along the sidewalls of the upper fin portions 702B of the first and second fins 702, as is described below in association with FIG. 9B. In an embodiment, the insulating structure 704 includes a first insulating layer, a second insulating layer directly on the first insulating layer, and a dielectric fill material directly laterally on the second insulating layer, as is also described below in association with FIG. 9B.

FIGS. 8A-8F illustrate slightly projected cross-sectional views taken along the a-a' axis of FIG. 7E for various operations in a method of fabricating an integrated circuit structure, in accordance with an embodiment of the present disclosure.

Figure 8A:
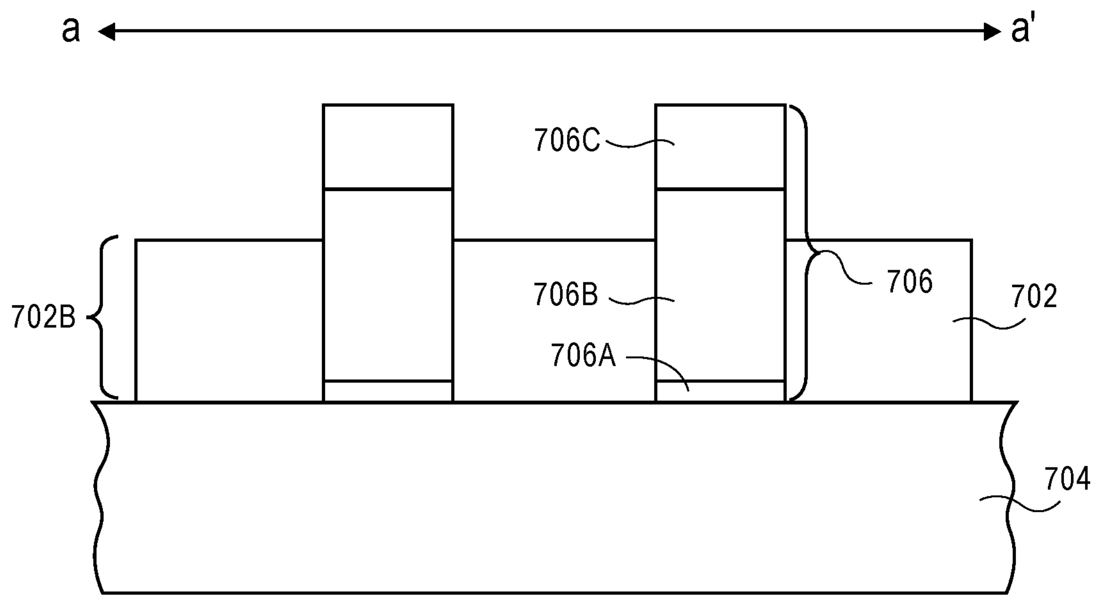
FIGS. 8A-8F illustrate slightly projected cross-sectional views taken along the a-a' axis of FIG. 7E for various operations in a method of fabricating an integrated circuit structure, in accordance with an embodiment of the present disclosure.

Referring to FIG. 8A, a method of fabricating an integrated circuit structure includes forming a fin 702, such as a silicon fin. The fin 702 has a lower fin portion (not seen in FIG. 8A) and an upper fin portion 702B. An insulating structure 704 is formed directly adjacent sidewalls of the lower fin portion 702A of the fin 702. A pair of gate structures 706 is formed over the upper fin portion 702B and over the insulating structure 704. It is to be appreciated that the perspective shown in FIGS. 8A-8F is slightly projected to show portions of the gate structures 706 and insulating structure in front of (out of the page) the upper fin portion 702B, with the upper fin portion slightly into the page. In an embodiment, the gate structures 706 are a placeholder or dummy gate structures including a sacrificial gate dielectric layer 706A, a sacrificial gate 706B, and a hardmask 706C.

Figure 8B:
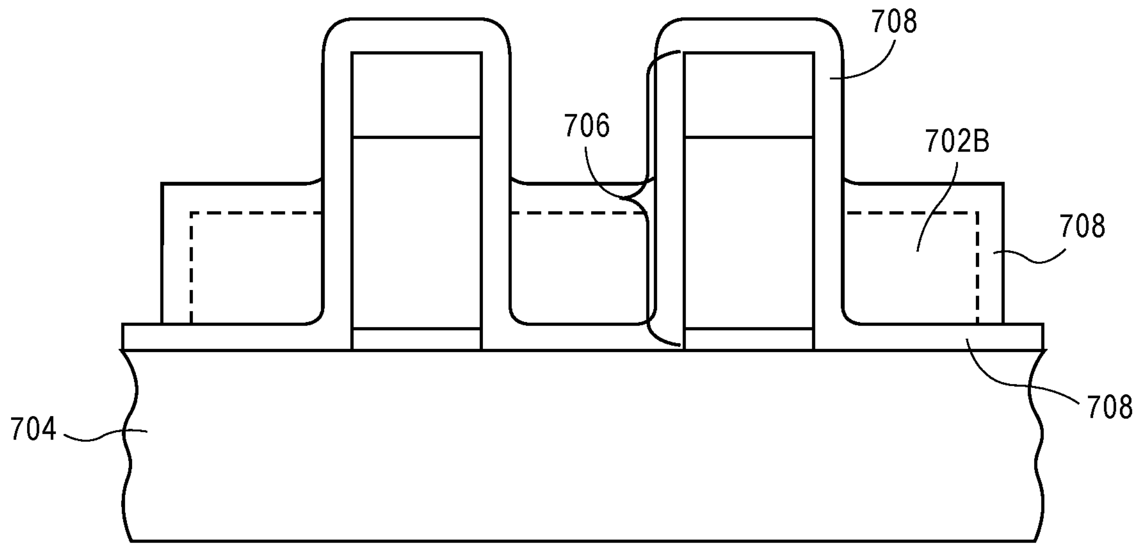

Referring to FIG. 8B, which corresponds to the process operation described in association with FIG. 7A, a dielectric material 708 is formed conformal with the upper fin portion 702B of the fin 702, conformal with the gate structures 706, and conformal with exposed portions of the insulating structure 704.

Figure 8C:
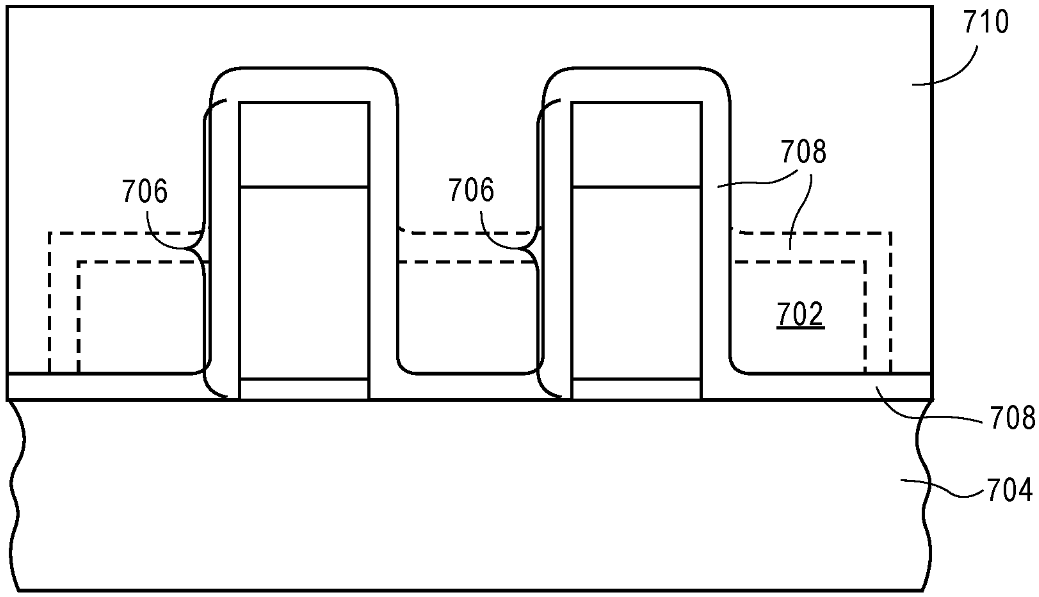

Referring to FIG. 8C, which corresponds to the process operation described in association with FIG. 7B, a hardmask material 710 is formed over the dielectric material 708. In an embodiment, the hardmask material 710 is a carbon-based hardmask material formed using a spin-on process.

Figure 8D:
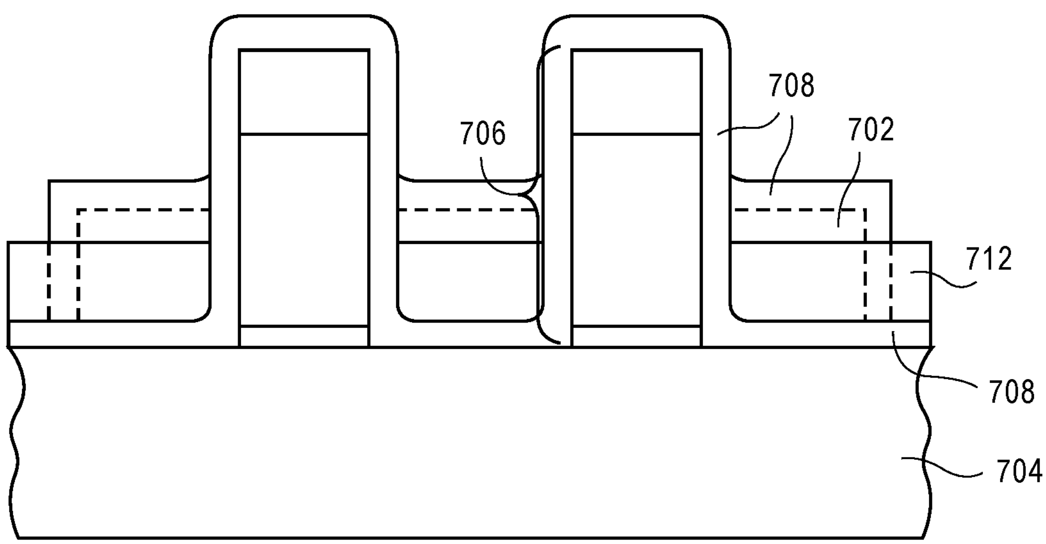

Referring to FIG. 8D, which corresponds to the process operation described in association with FIG. 7C, the hardmask material 710 is recessed to form a recessed hardmask material 712 and to expose a portion of the dielectric material 708 conformal with the upper fin portion 702B of the fin 702 and conformal with the gate structures 706. The recessed hardmask material 712 covers a portion of the dielectric material 708 conformal with the insulating structure 704. In an embodiment, the hardmask material 710 is recessed using a wet etching process. In another embodiment, the hardmask material 710 is recessed using an ash, a dry etch or a plasma etch process.

Figure 8E:
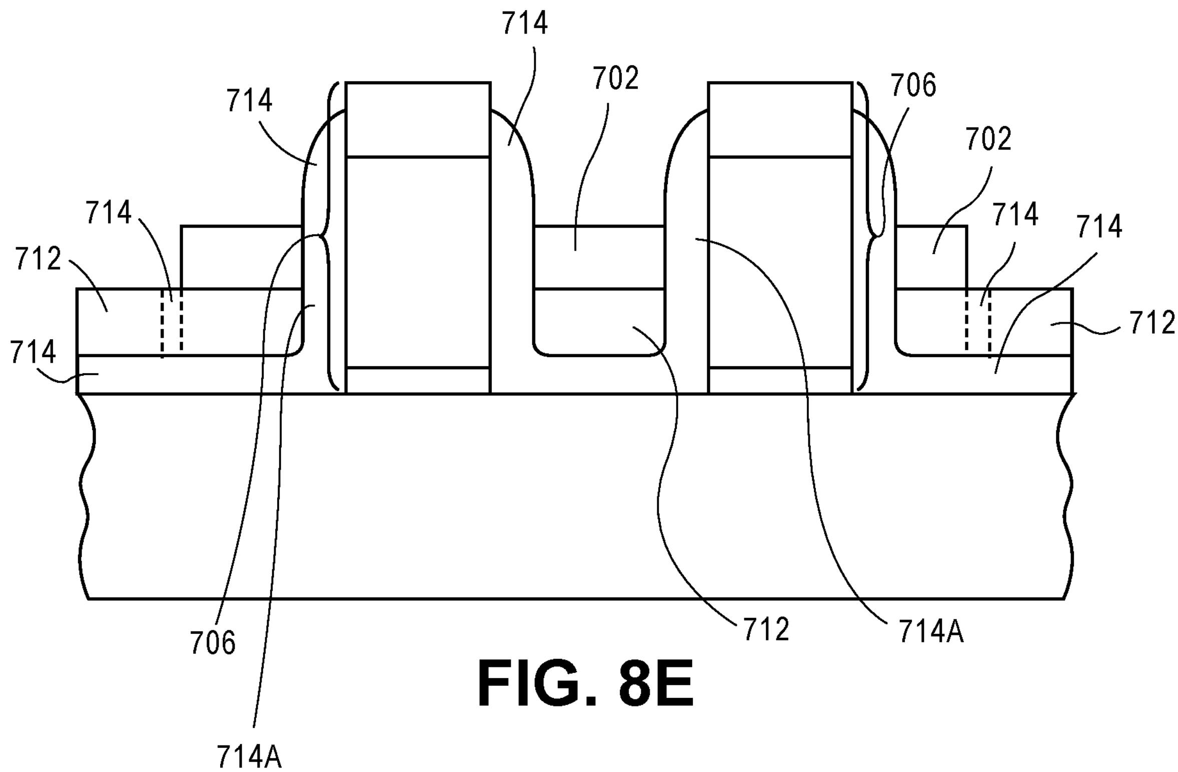

Referring to FIG. 8E, which corresponds to the process operation described in association with FIG. 7D, the dielectric material 708 is anisotropically etched to form a patterned dielectric material 714 along sidewalls of the gate structure 706 (as portions 714A), along portions of the sidewalls of the upper fin portion 702B of the fin 702, and over the insulating structure 704.

Figure 8F:
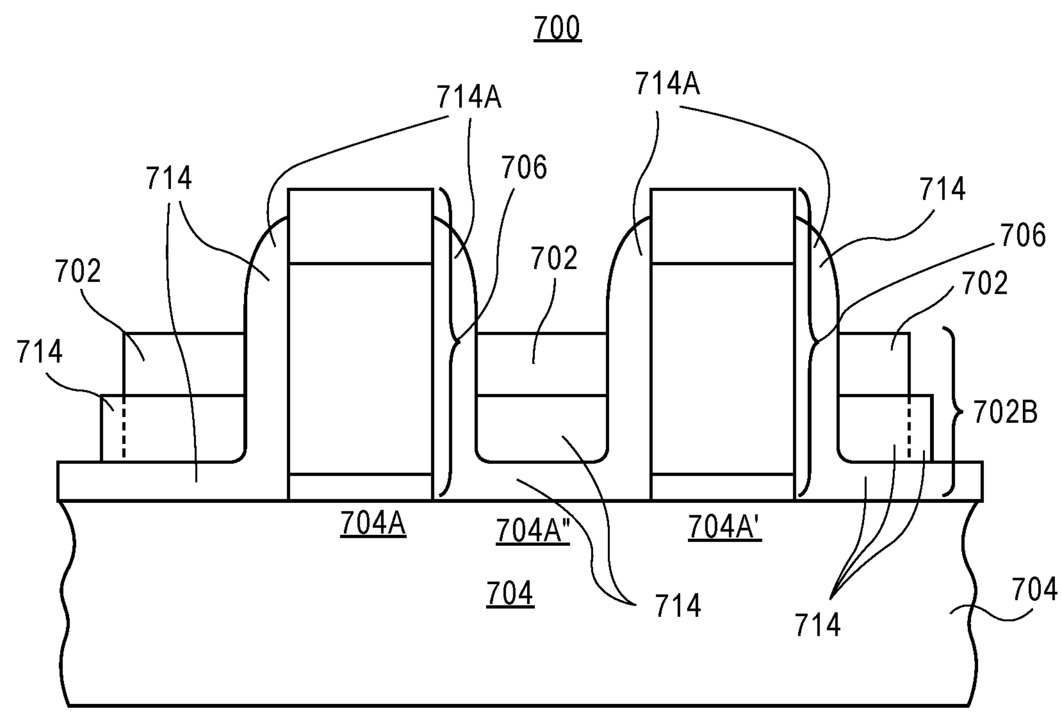

Referring to FIG. 8F, which corresponds to the process operation described in association with FIG. 7E, the recessed hardmask material 712 is removed from the structure of FIG. 8E. In an embodiment, the gate structures 706 are dummy gate structures, and subsequent processing includes replacing the gate structures 706 with permanent gate dielectric and gate electrode stacks. In an embodiment, further processing includes forming embedded source or drain structures on opposing sides of the gate structure 706, as is described in greater detail below.

Referring again to FIG. 8F, in an embodiment, an integrated circuit structure 700 includes a fin 702, such as a silicon fin, the fin 702 having a lower fin portion (not viewed in FIG. 8F) and an upper fin portion 702B. An insulating structure 704 is directly adjacent sidewalls of the lower fin portion of the fin 702. A first gate electrode (left 706) is over the upper fin portion 702B and over a first portion 704A of the insulating structure 704. A second gate electrode (right 706) is over the upper fin portion 702B and over a second portion 704A' of the insulating structure 704. A first dielectric spacer (right 714A of left 706) is along a sidewall of the first gate electrode (left 706), and a second dielectric spacer (left 714A of right 706) is along a sidewall of the second gate electrode (right 706), the second dielectric spacer continuous with the first dielectric spacer over a third portion 704A" of the insulating structure 704 between the first gate electrode (left 706) and the second gate electrode (right 706).

Figure 9A:
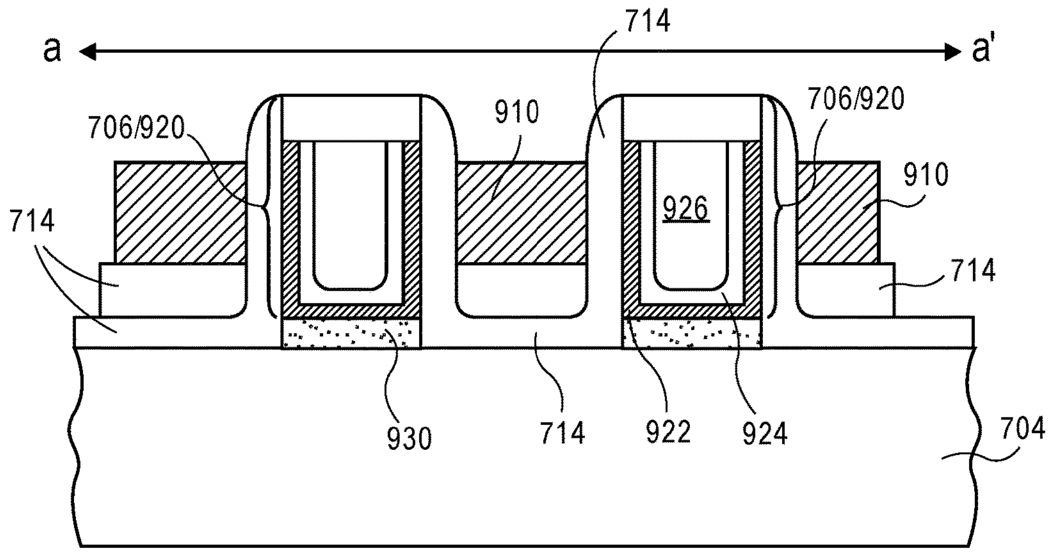
FIG. 9A illustrates a slightly projected cross-sectional view taken along the a-a' axis of FIG. 7E for an integrated circuit structure including permanent gate stacks and epitaxial source or drain regions, in accordance with an embodiment of the present disclosure.

FIG. 9A illustrates a slightly projected cross-sectional view taken along the a-a' axis of FIG. 7E for an integrated circuit structure including permanent gate stacks and epitaxial source or drain regions, in accordance with an embodiment of the present disclosure. FIG. 9B illustrates a cross-sectional view taken along the b-b' axis of FIG. 7E for an integrated circuit structure including epitaxial source or drain regions and a multi-layer trench isolation structure, in accordance with an embodiment of the present disclosure.

Figure 9B:
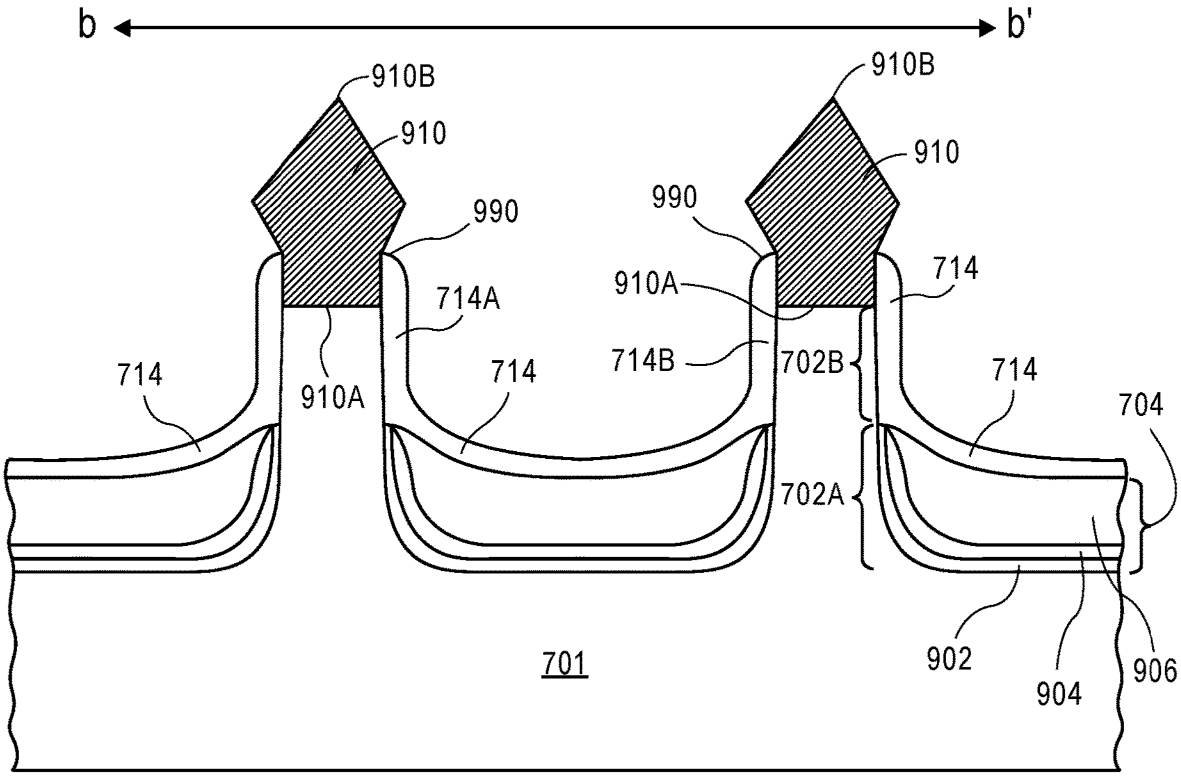
FIG. 9B illustrates a cross-sectional view taken along the b-b' axis of FIG. 7E for an integrated circuit structure including epitaxial source or drain regions and a multi-layer trench isolation structure, in accordance with an embodiment of the present disclosure.

Referring to FIGS. 9A and 9B, in an embodiment, the integrated circuit structure includes embedded source or drain structures 910 on opposing sides of the gate electrodes 706. The embedded source or drain structures 910 have a bottom surface 910A below a top surface 990 of the first and second dielectric spacers 714B and 714C along the sidewalls of the upper fin portions 702B of the first and second fins 702. The embedded source or drain structures 910 have a top surface 910B above a top surface of the first and second dielectric spacers 714B and 714C along the sidewalls of the upper fin portions 702B of the first and second fins 702.

In an embodiment, gate stacks 706 are permanent gate stacks 920. In one such embodiment, the permanent gate stacks 920 include a gate dielectric layer 922, a first gate layer 924, such as a workfunction gate layer, and a gate fill material 926, as is depicted in FIG. 9A. In one embodiment, where the permanent gate structures 920 are over the insulating structure 704, the permanent gate structures 920 are formed on residual polycrystalline silicon portions 930, which may be remnants of a replacement gate process involving sacrificial polycrystalline silicon gate electrodes.

In an embodiment, the insulating structure 704 includes a first insulating layer 902, a second insulating layer 904 directly on the first insulating layer 902, and a dielectric fill material 906 directly laterally on the second insulating layer 904. In one embodiment, the first insulating layer 902 is a non-doped insulating layer including silicon and oxygen. In one embodiment, the second insulating layer 904 includes silicon and nitrogen. In one embodiment, the dielectric fill material 906 includes silicon and oxygen.

In another aspect, epitaxial embedded source or drain regions are implemented as source or drain structures for semiconductor fins. As an example, FIG. 10 illustrates a cross-sectional view of an integrated circuit structure taken at a source or drain location, in accordance with an embodiment of the present disclosure.

Figure 10:
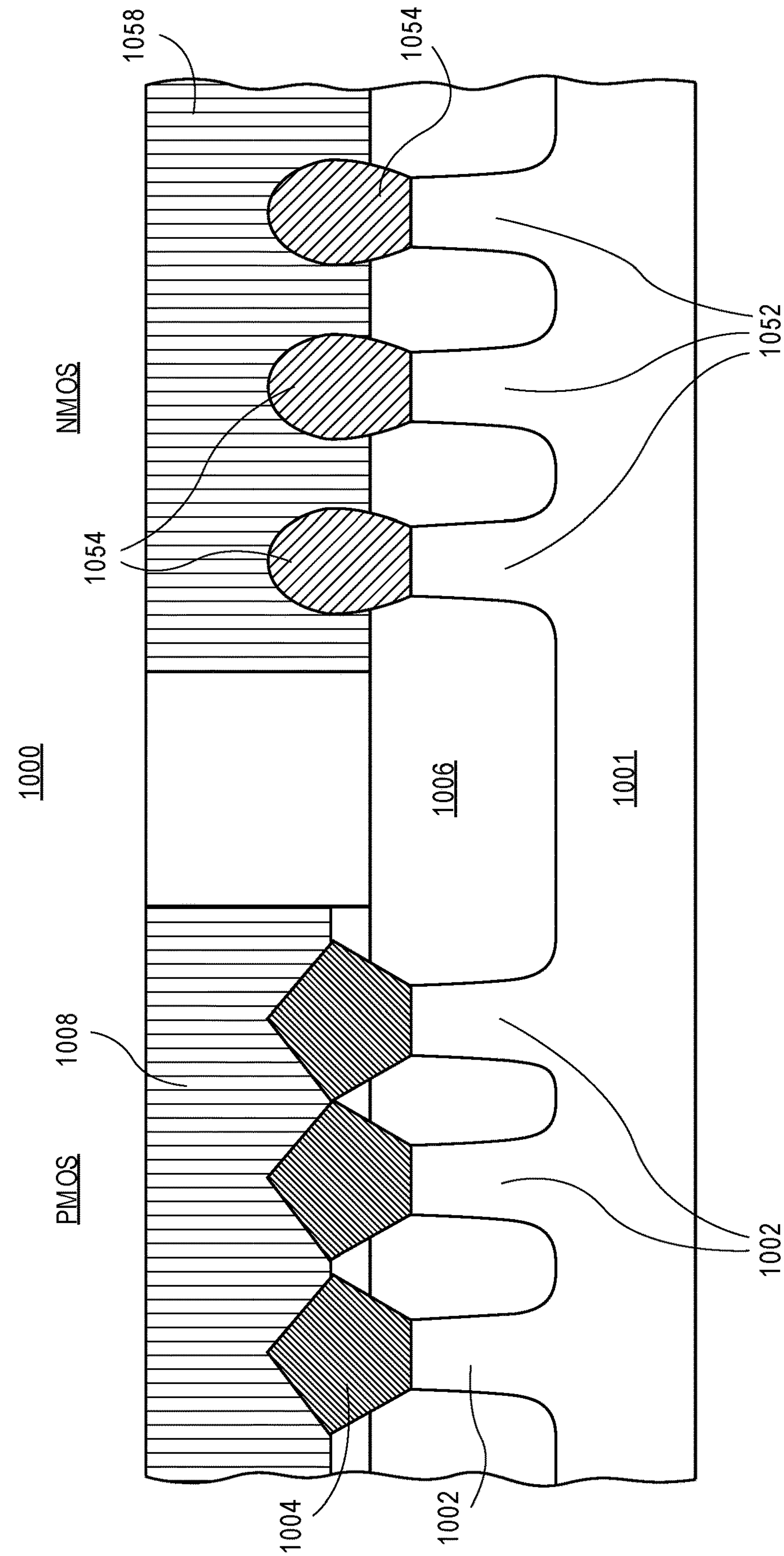
FIG. 10 illustrates a cross-sectional view of an integrated circuit structure taken at a source or drain location, in accordance with an embodiment of the present disclosure.

Referring to FIG. 10, an integrated circuit structure 1000 includes a P-type device, such as a P-type Metal Oxide Semiconductor (PMOS) device. The integrated circuit structure 1000 also includes an N-type device, such as an N-type Metal Oxide Semiconductor (PMOS) device.

The PMOS device of FIG. 10 includes a first plurality of semiconductor fins 1002, such as silicon fins formed from a bulk silicon substrate 1001. At the source or drain location, upper portions of the fins 1002 have been removed, and a same or different semiconductor material is grown to form source or drain structures 1004. It is to be appreciated that the source or drain structures 1004 will look the same at a cross-sectional view taken on either side of a gate electrode, e.g., they will look essentially the same at a source side as at a drain side. In an embodiment, as depicted, the source or drain structures 1004 have a portion below and a portion above an upper surface of an insulating structure 1006. In an embodiment, as depicted, the source or drain structures 1004 are strongly faceted. In an embodiment, a conductive contact 1008 is formed over the source or drain structures 1004. In one such embodiment, however, the strong faceting, and the relatively wide growth of the source or drain structures 1004 inhibits good coverage by the conductive contact 1008 at least to some extent.

The NMOS device of FIG. 10 includes a second plurality of semiconductor fins 1052, such as silicon fins formed from the bulk silicon substrate 1001. At the source or drain location, upper portions of the fins 1052 have been removed, and a same or different semiconductor material is grown to form source or drain structures 1054. It is to be appreciated that the source or drain structures 1054 will look the same at a cross-sectional view taken on either side of a gate electrode, e.g., they will look essentially the same at a source side as at a drain side. In an embodiment, as depicted, the source or drain structures 1054 have a portion below and a portion above an upper surface of the insulating structure 1006. In an embodiment, as depicted, the source or drain structures 1054 are weakly faceted relative to the source or drain structures 1004. In an embodiment, a conductive contact 1058 is formed over the source or drain structures 1054. In one such embodiment, relatively weak faceting, and the resulting relatively narrower growth of the source or drain structures 1054 (as compared with the source or drain structures 1004) enhances good coverage by the conductive contact 1058.

The shape of the source or drain structures of a PMOS device may be varied to improve contact area with an overlying contact. For example, FIG. 11 illustrates a cross-sectional view of another integrated circuit structure taken at a source or drain location, in accordance with an embodiment of the present disclosure.

Figure 11:
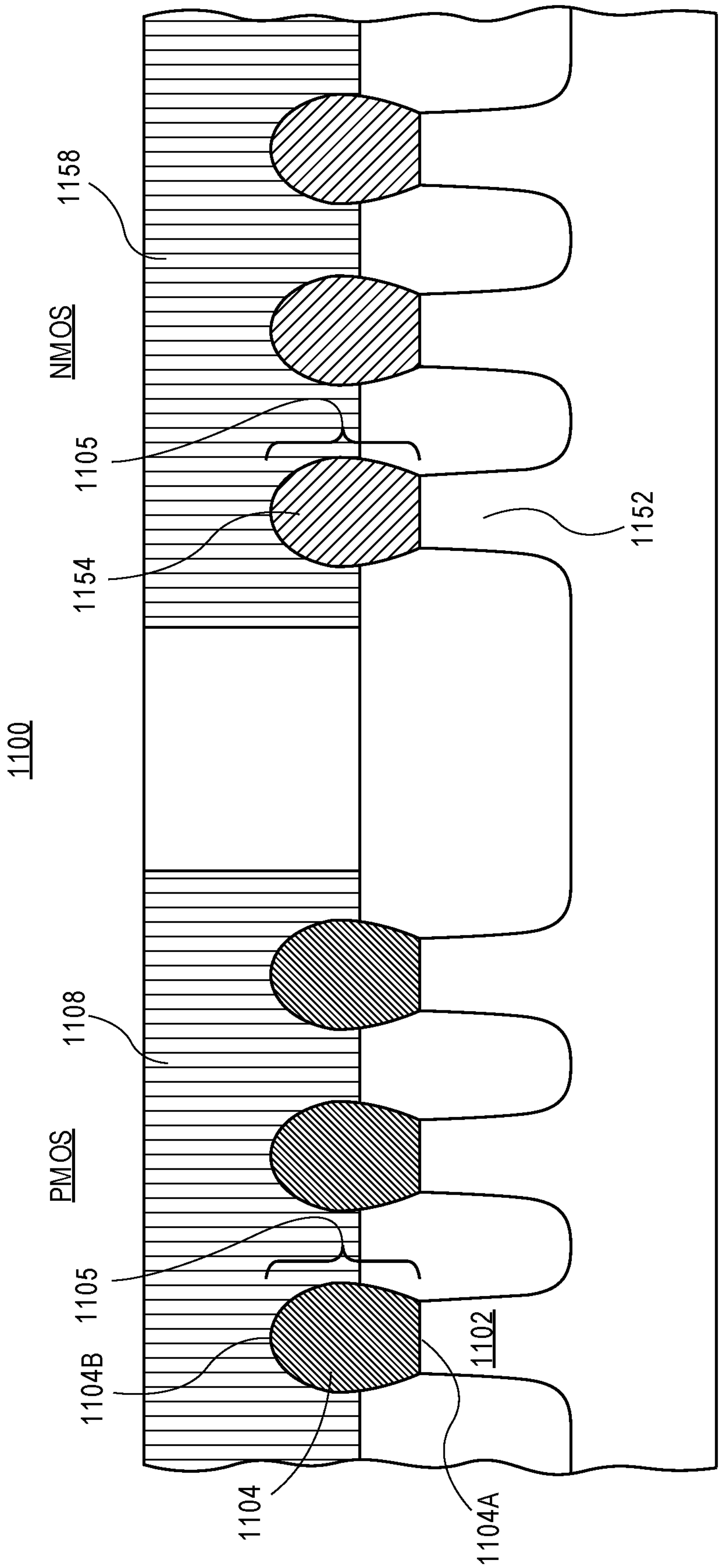
FIG. 11 illustrates a cross-sectional view of another integrated circuit structure taken at a source or drain location, in accordance with an embodiment of the present disclosure.

Referring to FIG. 11, an integrated circuit structure 1100 includes a P-type semiconductor (e.g., PMOS) device. The PMOS device includes a first fin 1102, such as a silicon fin. A first epitaxial source or drain structure 1104 is embedded in the first fin 1102. In one embodiment, although not depicted, the first epitaxial source or drain structure 1104 is at a first side of a first gate electrode (which may be formed over an upper fin portion such as a channel portion of the fin 1102), and a second epitaxial source or drain structure is embedded in the first fin 1102 at a second side of such a first gate electrode opposite the first side. In an embodiment, the first 1104 and second epitaxial source or drain structures include silicon and germanium and have a profile 1105. In one embodiment, the profile is a match-stick profile, as depicted in FIG. 11. A first conductive electrode 1108 is over the first epitaxial source or drain structure 1104.

Referring again to FIG. 11, in an embodiment, the integrated circuit structure 1100 also includes an N-type semiconductor (e.g., NMOS) device. The NMOS device includes a second fin 1152, such as a silicon fin. A third epitaxial source or drain structure 1154 is embedded in the second fin 1152. In one embodiment, although not depicted, the third epitaxial source or drain structure 1154 is at a first side of a second gate electrode (which may be formed over an upper fin portion such as a channel portion of the fin 1152), and a fourth epitaxial source or drain structure is embedded in the second fin 1152 at a second side of such a second gate electrode opposite the first side. In an embodiment, the third 1154 and fourth epitaxial source or drain structures include silicon and have substantially the same profile as the profile 1105 of the first and second epitaxial source or drain structures 1004. A second conductive electrode 1158 is over the third epitaxial source or drain structure 1154.

In an embodiment, the first epitaxial source or drain structure 1104 is weakly faceted. In an embodiment, the first epitaxial source or drain structure 1104 has a height of approximately 50 nanometers and has a width in the range of 30-35 nanometers. In one such embodiment, the third epitaxial source or drain structure 1154 has a height of approximately 50 nanometers and has a width in the range of 30-35 nanometers.

In an embodiment, the first epitaxial source or drain structure 1104 is graded with an approximately 20% germanium concentration at a bottom 1104A of the first epitaxial source or drain structure 1104 to an approximately 45% germanium concentration at a top 1104B of the first epitaxial source or drain structure 1104. In an embodiment, the first epitaxial source or drain structure 1104 is doped with boron atoms. In one such embodiment, the third epitaxial source or drain structure 1154 is doped with phosphorous atoms or arsenic atoms.

FIGS. 12A-12D illustrate cross-sectional views taken at a source or drain location and representing various operations in the fabrication of an integrated circuit structure, in accordance with an embodiment of the present disclosure.

Figure 12A:
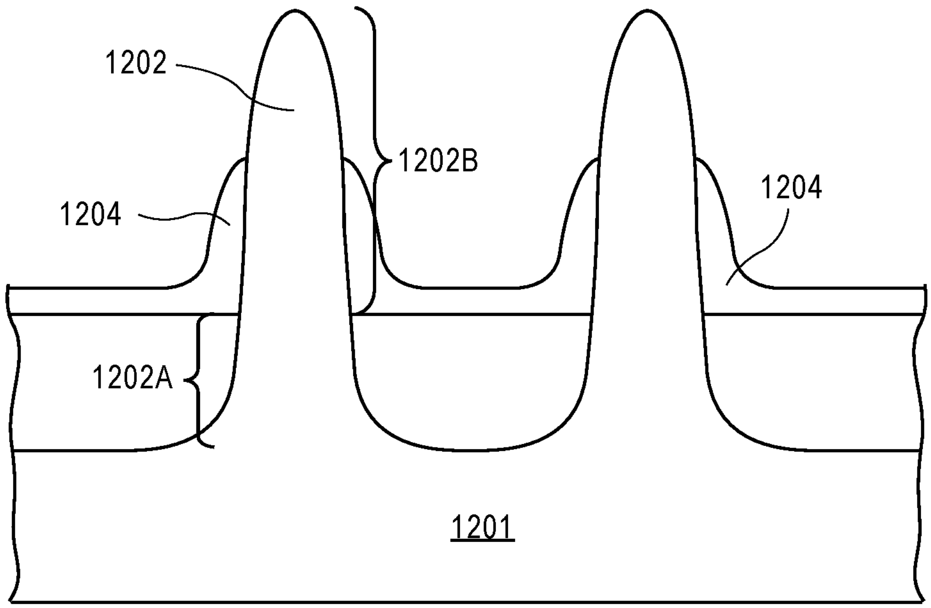
FIGS. 12A-12D illustrate cross-sectional views taken at a source or drain location and representing various operations in the fabrication of an integrated circuit structure, in accordance with an embodiment of the present disclosure.

Referring to FIG. 12A, a method of fabricating an integrated circuit structure includes forming a fin, such as a silicon fin formed from a silicon substrate 1201. The fin 1202 has a lower fin portion 1202A and an upper fin portion 1202B. In an embodiment, although not depicted, a gate electrode is formed over a portion of the upper fin portion 1202B of the fin 1202 at a location into the page. Such a gate electrode has a first side opposite a second side and defines source or drain locations on the first and second sides. For example, for the purposes of illustration, the cross-sectional locations for the views of FIGS. 12A-12D are taken at one of the source or drain locations at one of the sides of a gate electrode.

Figure 12B:
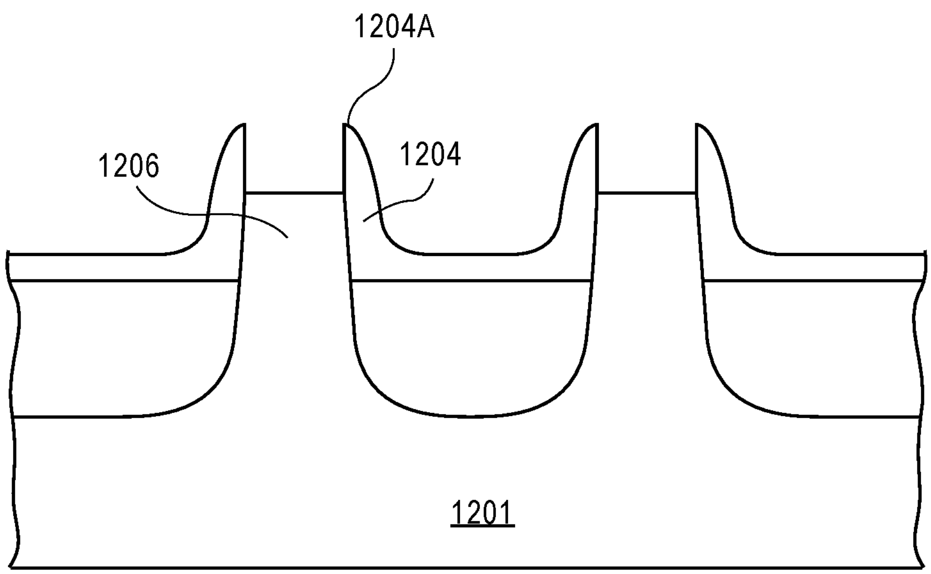

Referring to FIG. 12B, a source of drain location of the fin 1202 is recessed to form recessed fin portion 1206. The recessed source or drain location of the fin 1202 may be at a side of a gate electrode and at the second side of the gate electrode. Referring to both FIGS. 12A and 12B, in an embodiment, dielectric spacers 1204 are formed along sidewalls of a portion of the fin 1202, e.g., at a side of a gate structure. In one such embodiment, recessing the fin 1202 involves recessing the fin 1202 below a top surface 1204A of the dielectric spacers 1204.

Figure 12C:
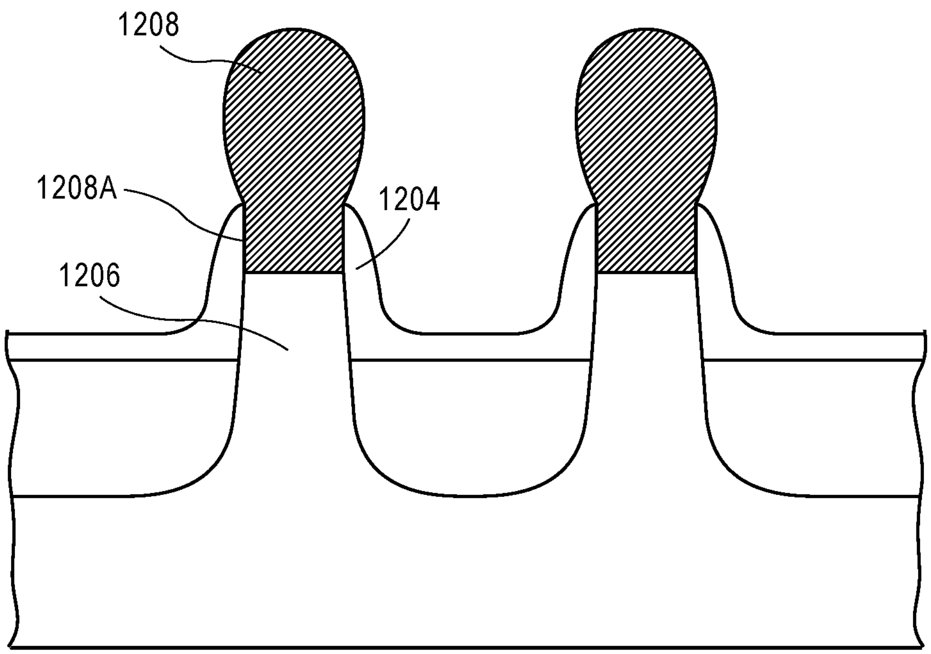

Referring to FIG. 12C, an epitaxial source or drain structure 1208 is formed on the recessed fin 1206, e.g., and thus may be formed at a side of a gate electrode. In one such embodiment, a second epitaxial source or drain structure is formed on a second portion of the recessed fin 1206 at a second side of such a gate electrode. In an embodiment, the epitaxial source or drain structure 1208 includes silicon and germanium, and has a match-stick profile, as is depicted in FIG. 12C. In an embodiment, dielectric spacers 1204 are included and are along a lower portion 1208A of sidewalls of the epitaxial source or drain structure 1208, as depicted.

Figure 12D:
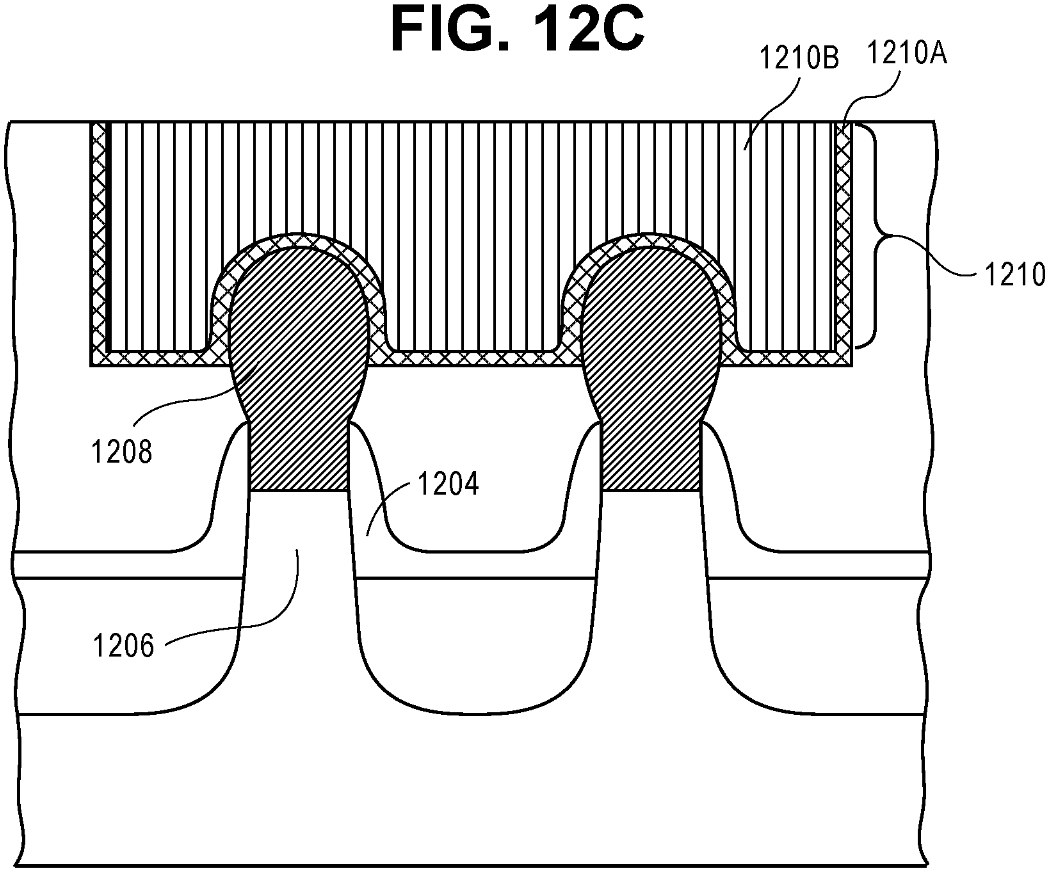

Referring to FIG. 12D, a conductive electrode 1210 is formed on the epitaxial source or drain structure 1208. In an embodiment, the conductive electrode 1210 includes a conductive barrier layer 1210A and a conductive fill material 1201B. In one embodiment, the conductive electrode 1210 follows the profile of the epitaxial source or drain structure 1208, as is depicted. In other embodiments, upper portions of the epitaxial source or drain structure 1208 are eroded during fabrication of the conductive electrode 1210.

In another aspect, fin-trim isolation (FTI) and single gate spacing for isolated fins is described. Non-planar transistors which utilize a fin of semiconductor material protruding from a substrate surface employ a gate electrode that wraps around two, three, or even all sides of the fin (i.e., dual-gate, tri-gate, nanowire transistors). Source and drain regions are typically then formed in the fin, or as re-grown portions of the fin, on either side of the gate electrode. To isolate a source or drain region of a first non-planar transistor from a source or drain region of an adjacent second non-planar transistor, a gap or space may be formed between two adjacent fins. Such an isolation gap generally requires a masked etch of some sort. Once isolated, a gate stack is then patterned over the individual fins, again typically with a masked etch of some sort (e.g., a line etch or an opening etch depending on the specific implementation).

One potential issue with the fin isolation techniques described above is that the gates are not self-aligned with the ends of the fins, and alignment of the gate stack pattern with the semiconductor fin pattern relies on overlay of these two patterns. As such, lithographic overlay tolerances are added into the dimensioning of the semiconductor fin and the isolation gap with fins needing to be of greater length and isolation gaps larger than they would be otherwise for a given level of transistor functionality. Device architectures and fabrication techniques that reduce such over-dimensioning therefore offer highly advantageous improvements in transistor density.

Another potential issue with the fin isolation techniques described in the above is that stress in the semiconductor fin desirable for improving carrier mobility may be lost from the channel region of the transistor where too many fin surfaces are left free during fabrication, allowing fin strain to relax. Device architectures and fabrication techniques that maintain higher levels of desirable fin stress therefore offer advantageous improvements in non-planar transistor performance.

In accordance with an embodiment of the present disclosure, through-gate fin isolation architectures and techniques are described herein. In the exemplary embodiments illustrated, non-planar transistors in a microelectronic device, such as an integrated circuit (IC) are isolated from one another in a manner that is self-aligned to gate electrodes of the transistors. Although embodiments of the present disclosure are applicable to virtually any IC employing non-planar transistors, exemplary ICs include, but are not limited to, microprocessor cores including logic and memory (SRAM) portions, RFICs (e.g., wireless ICs including digital baseband and analog front end modules), and power ICs.

In embodiments, two ends of adjacent semiconductor fins are electrically isolated from each other with an isolation region that is positioned relative to gate electrodes with the use of only one patterning mask level. In an embodiment, a single mask is employed to form a plurality of sacrificial placeholder stripes of a fixed pitch, a first subset of the placeholder stripes define a location or dimension of isolation regions while a second subset of the placeholder stripes defines a location or dimension of a gate electrode. In certain embodiments, the first subset of placeholder stripes is removed and isolation cuts made into the semiconductor fins in the openings resulting from the first subset removal while the second subset of the placeholder stripes is ultimately replaced with non-sacrificial gate electrode stacks. Since a subset of placeholders utilized for gate electrode replacement are employed to form the isolation regions, the method and resulting architecture is referred to herein as "through-gate" isolation. One or more through-gate isolation embodiments described herein may, for example, enable higher transistor densities and higher levels of advantageous transistor channel stress.

With isolation defined after placement or definition of the gate electrode, a greater transistor density can be achieved because fin isolation dimensioning and placement can be made perfectly on-pitch with the gate electrodes so that both gate electrodes and isolation regions are integer multiples of a minimum feature pitch of a single masking level. In further embodiments where the semiconductor fin has a lattice mismatch with a substrate on which the fin is disposed, greater degrees of strain are maintained by defining the isolation after placement or definition of the gate electrode. For such embodiments, other features of the transistor (such as the gate electrode and added source or drain materials) that are formed before ends of the fin are defined help to mechanically maintain fin strain after an isolation cut is made into the fin.

To provide further context, transistor scaling can benefit from a denser packing of cells within the chip. Currently, most cells are separated from their neighbors by two or more dummy gates, which have buried fins. The cells are isolated by etching the fins beneath these two or more dummy gates, which connect one cell to the other. Scaling can benefit significantly if the number of dummy gates that separate neighboring cells can be reduced from two or more down to one. As explained above, one solution requires two or more dummy gates. The fins under the two or more dummy gates are etched during fin patterning. A potential issue with such an approach is that dummy gates consume space on the chip which can be used for cells. In an embodiment, approaches described herein enable the use of only a single dummy gate to separate neighboring cells.

In an embodiment, a fin trim isolation approach is implemented as a self-aligned patterning scheme. Here, the fins beneath a single gate are etched out. Thus, neighboring cells can be separated by a single dummy gate. Advantages to such an approach may include saving space on the chip and allowing for more computational power for a given area. The approach may also allow for fin trim to be performed at a sub-fin pitch distance.

Figure 13A:
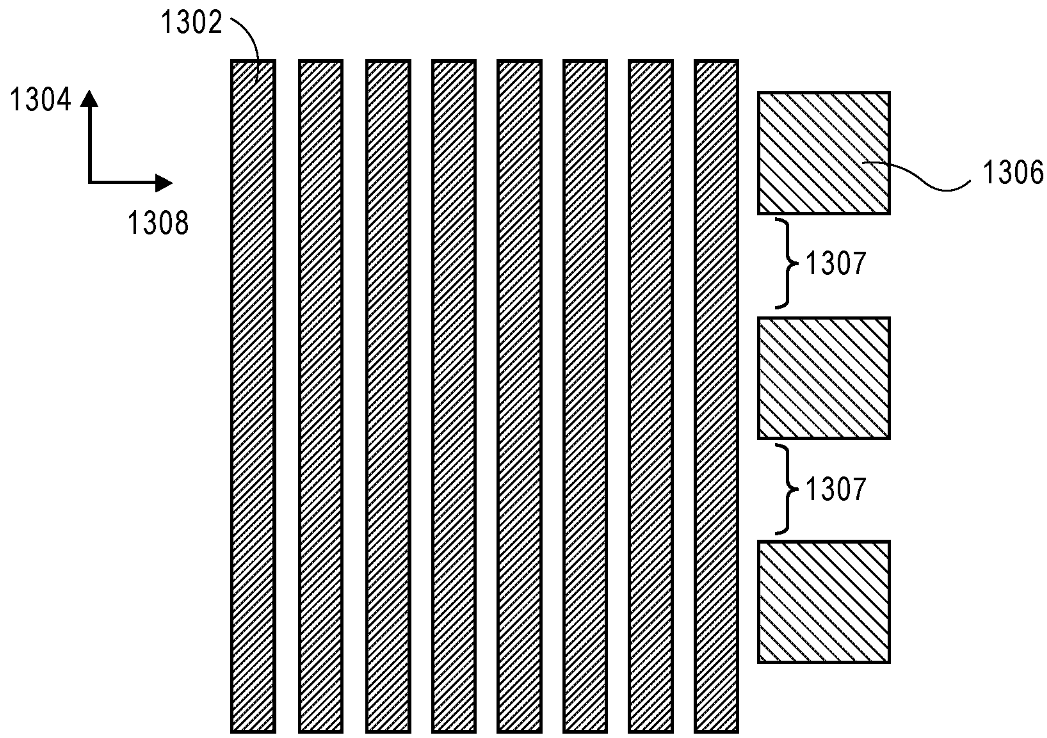
FIGS. 13A and 13B illustrate plan views representing various operations in a method of patterning of fins with multi-gate spacing for forming a local isolation structure, in accordance with an embodiment of the present disclosure.
Figure 13B:
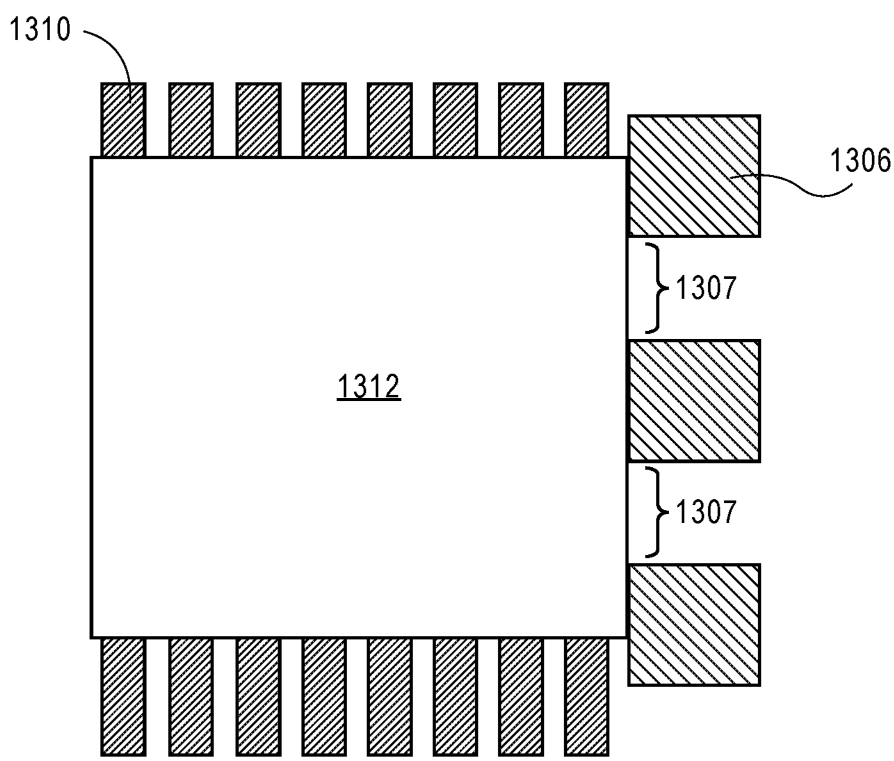

FIGS. 13A and 13B illustrate plan views representing various operations in a method of patterning of fins with multi-gate spacing for forming a local isolation structure, in accordance with an embodiment of the present disclosure.

Referring to FIG. 13A, a plurality of fins 1302 is shown having a length along a first direction 1304. A grid 1306, having spacings 1307 there between, defining locations for ultimately forming a plurality of gate lines is shown along a second direction 1308 orthogonal to the first direction 1304.

Referring to FIG. 13B, a portion of the plurality of fins 1302 is cut (e.g., removed by an etch process) to leave fins 1310 having a cut 1312 therein. An isolation structure ultimately formed in the cut 1312 therefore has a dimension of more than a single gate line, e.g., a dimension of three gate lines 1306. Accordingly, gate structures ultimately formed along the locations of the gate lines 1306 will be formed at least partially over an isolation structure formed in cut 1312. Thus, cut 1312 is a relatively wide fin cut.

FIGS. 14A-14D illustrate plan views representing various operations in a method of patterning of fins with single gate spacing for forming a local isolation structure, in accordance with another embodiment of the present disclosure.

Figure 14A:
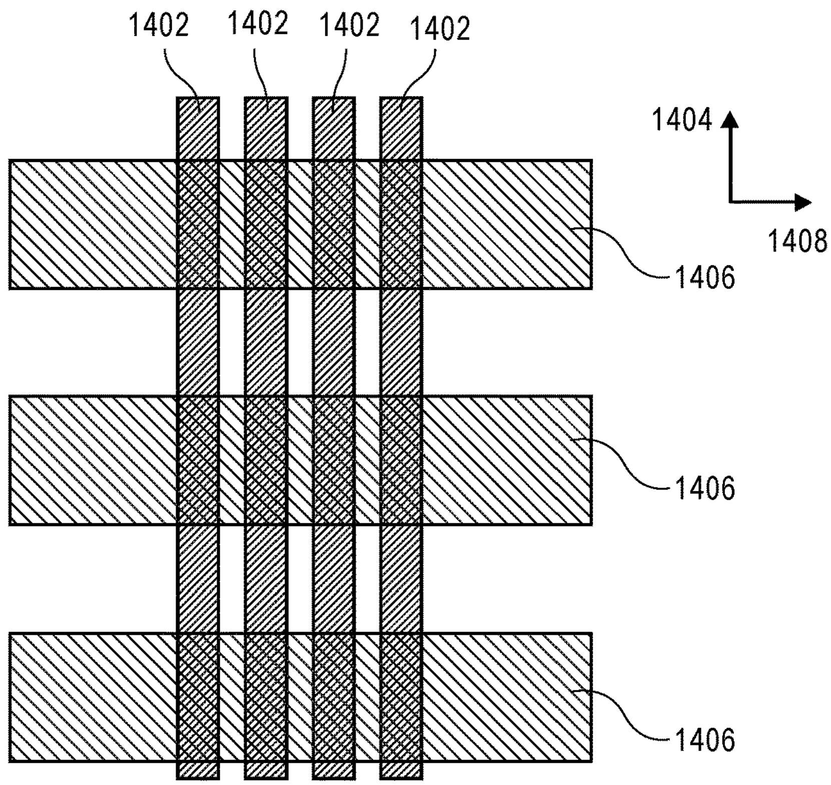
FIGS. 14A-14D illustrate plan views representing various operations in a method of patterning of fins with single gate spacing for forming a local isolation structure, in accordance with another embodiment of the present disclosure.

Referring to FIG. 14A, a method of fabricating an integrated circuit structure includes forming a plurality of fins 1402, individual ones of the plurality of fins 1402 having a longest dimension along a first direction 1404. A plurality of gate structures 1406 is over the plurality of fins 1402, individual ones of the gate structures 1406 having a longest dimension along a second direction 1408 orthogonal to the first direction 1404. In an embodiment, the gate structures 1406 are sacrificial or dummy gate lines, e.g., fabricated from polycrystalline silicon. In one embodiment, the plurality of fins 1402 are silicon fins and are continuous with a portion of an underlying silicon substrate.

Figure 14B:
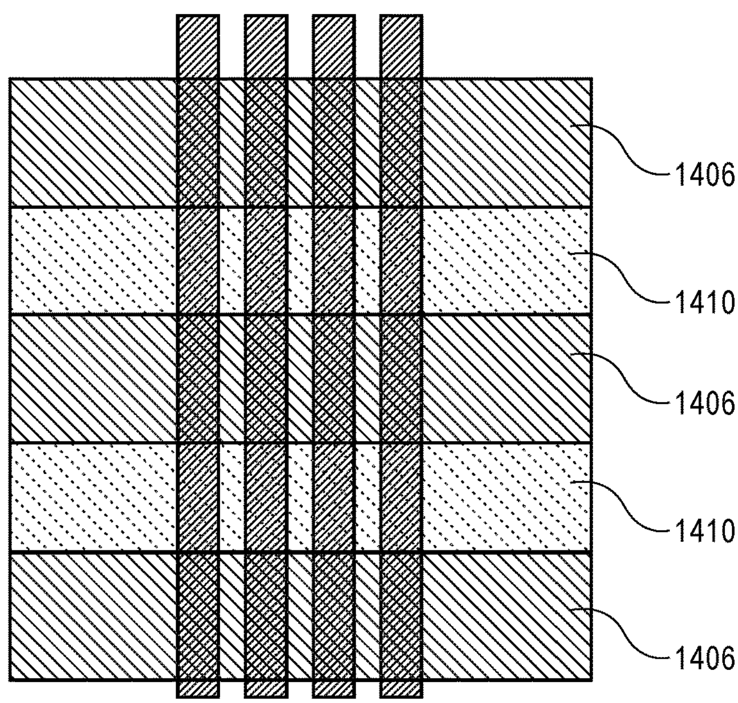

Referring to FIG. 14B, a dielectric material structure 1410 is formed between adjacent ones of the plurality of gate structures 1406.

Figure 14C:
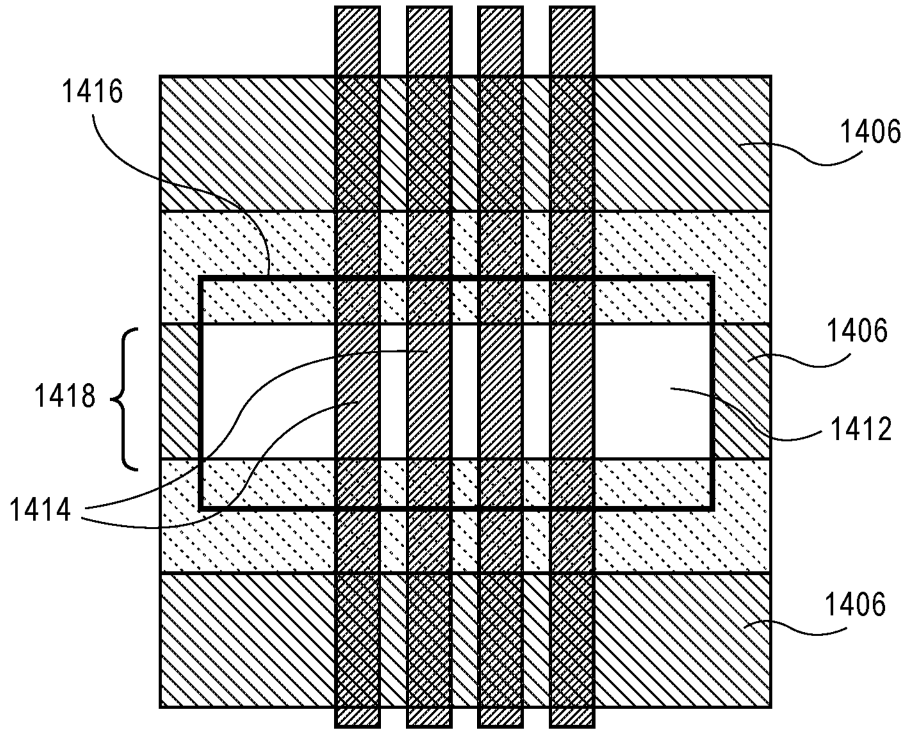

Referring to FIG. 14C, a portion 1412 of one of the plurality of gate structures 1406 is removed to expose a portion 1414 of each of the plurality of fins 1402. In an embodiment, removing the portion 1412 of the one of the plurality of gate structures 1406 involves using a lithographic window 1416 wider than a width 1418 of the portion 1412 of the one of the plurality of gate structures 1406.

Figure 14D:
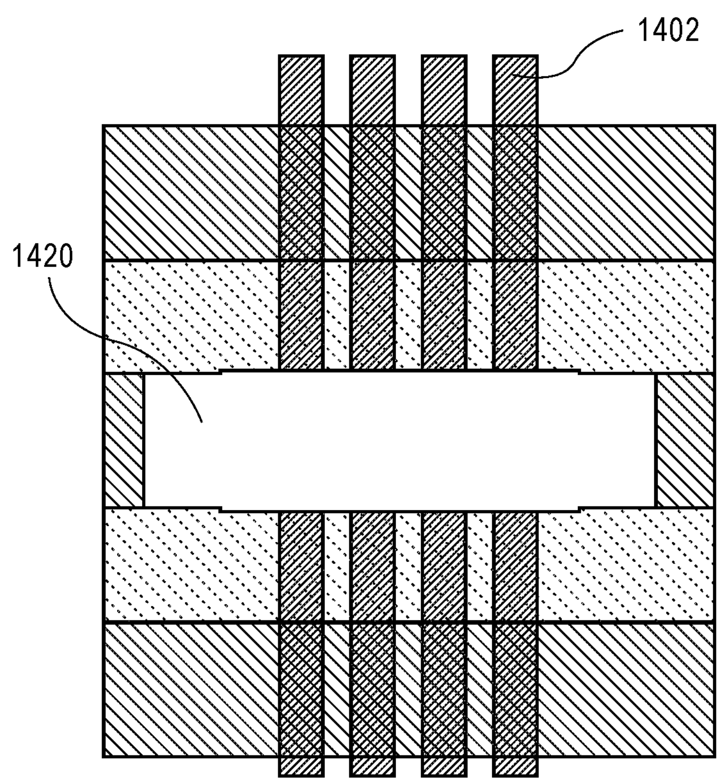

Referring to FIG. 14D, the exposed portion 1414 of each of the plurality of fins 1402 is removed to form a cut region 1420. In an embodiment, the exposed portion 1414 of each of the plurality of fins 1402 is removed using a dry or plasma etch process. In an embodiment, removing the exposed portion 1414 of each of the plurality of fins 1402 involves etching to a depth less than a height of the plurality of fins 1402. In one such embodiment, the depth is greater than a depth of source or drain regions in the plurality of fins 1402. In an embodiment, the depth is deeper than a depth of an active portion of the plurality of fins 1402 to provide isolation margin. In an embodiment, the exposed portion 1414 of each of the plurality of fins 1402 is removed without etching or without substantially etching source or drain regions (such as epitaxial source or drain regions) of the plurality of fins 1402. In one such embodiment, the exposed portion 1414 of each of the plurality of fins 1402 is removed without laterally etching or without substantially laterally etching source or drain regions (such as epitaxial source or drain regions) of the plurality of fins 1402.

In an embodiment, the cut region 1420 is ultimately filled with an insulating layer, e.g., in locations of the removed portion 1414 of each of the plurality of fins 1402. Exemplary insulating layers or "poly cut" or "plug" structure are described below. In other embodiments, however, the cut region 1420 is only partially filled with an insulating layer in which a conductive structure is then formed. The conductive structure may be used as a local interconnect. In an embodiment, prior to filling the cut region 1420 with an insulating layer or with an insulating layer housing a local interconnect structure, dopants may be implanted or delivered by a solid source dopant layer into the locally cut portion of the fin or fins through the cut region 1420.

Figure 15:
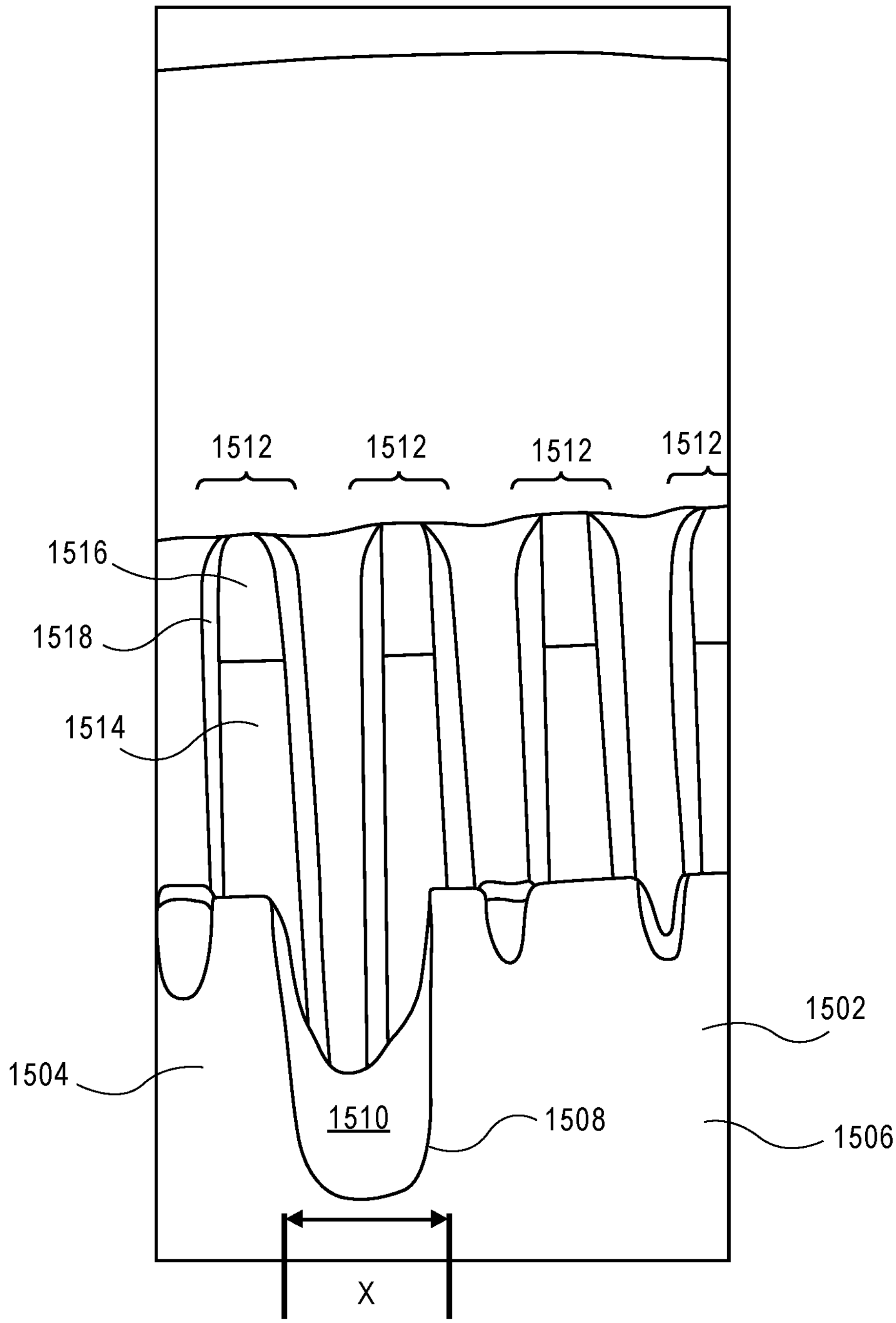
FIG. 15 illustrates a cross-sectional view of an integrated circuit structure having a fin with multi-gate spacing for local isolation, in accordance with an embodiment of the present disclosure.

FIG. 15 illustrates a cross-sectional view of an integrated circuit structure having a fin with multi-gate spacing for local isolation, in accordance with an embodiment of the present disclosure.

Referring to FIG. 15, a silicon fin 1502 has a first fin portion 1504 laterally adjacent a second fin portion 1506. The first fin portion 1504 is separated from the second fin portion 1506 by a relatively wide cut 1508, such as described in association with FIGS. 13A and 13B, the relatively wide cut 1508 having a width X. A dielectric fill material 1510 is formed in the relatively wide cut 1508 and electrically isolates the first fin portion 1504 from the second fin portion 1506. A plurality of gate lines 1512 is over the silicon fin 1502, where each of the gate lines may include a gate dielectric and gate electrode stack 1514, a dielectric cap layer 1516, and sidewall spacers 1518. Two gate lines (left two gate lines 1512) occupy the relatively wide cut 1508 and, as such, the first fin portion 1504 is separated from the second fin portion 1506 by effectively two dummy or inactive gates.

By contrast, fin portions may be separated by a single gate distance. As an example, FIG. 16A illustrates a cross-sectional view of an integrated circuit structure having a fin with single gate spacing for local isolation, in accordance with another embodiment of the present disclosure.

Figure 16A:
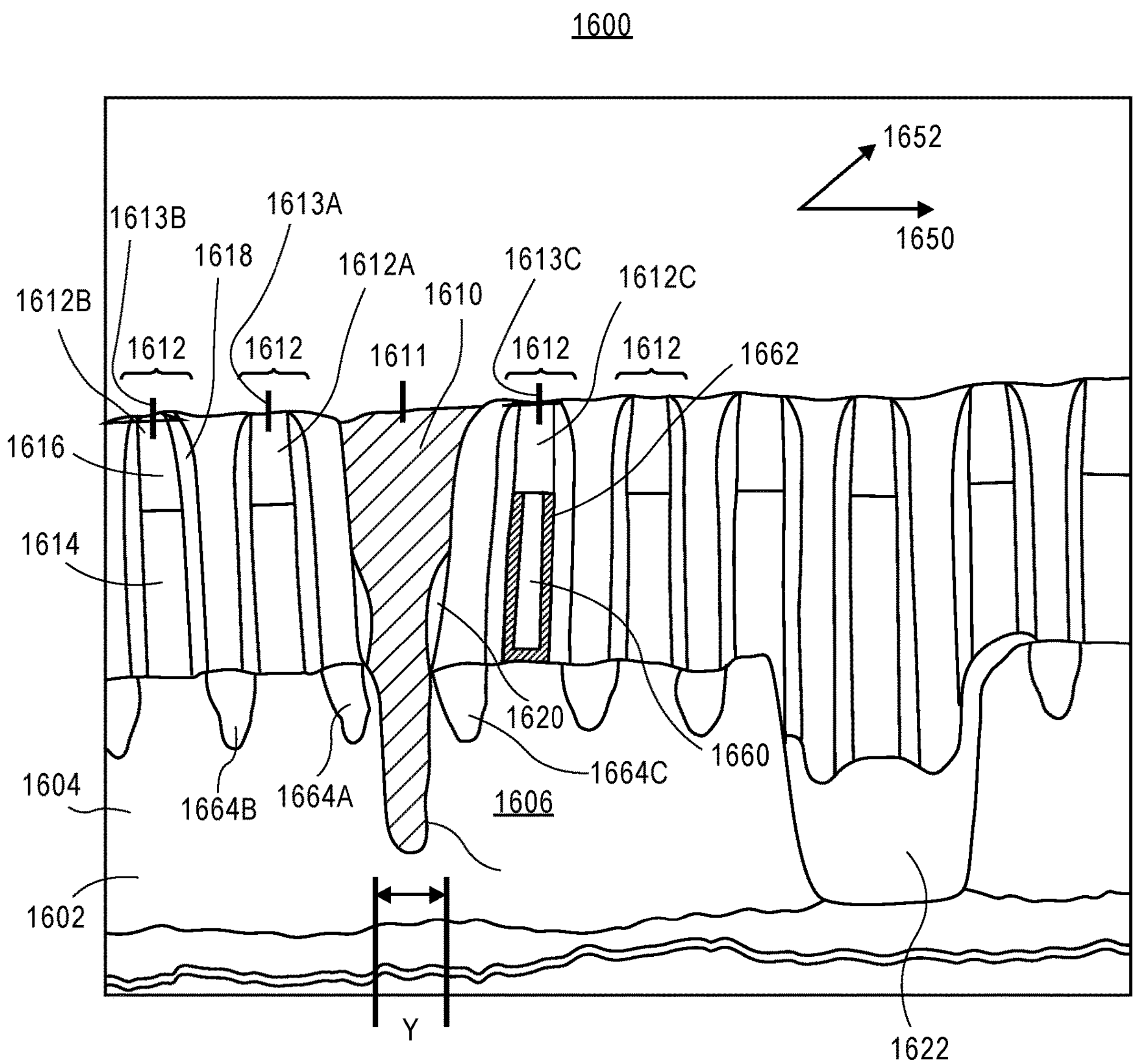
FIG. 16A illustrates a cross-sectional view of an integrated circuit structure having a fin with single gate spacing for local isolation, in accordance with another embodiment of the present disclosure.

Referring to FIG. 16A, a silicon fin 1602 has a first fin portion 1604 laterally adjacent a second fin portion 1606. The first fin portion 1604 is separated from the second fin portion 1606 by a relatively narrow cut 1608, such as described in association with FIGS. 14A-14D, the relatively narrow cut 1608 having a width Y, where Y is less than X of FIG. 15. A dielectric fill material 1610 is formed in the relatively narrow cut 1608 and electrically isolates the first fin portion 1604 from the second fin portion 1606. A plurality of gate lines 1612 is over the silicon fin 1602, where each of the gate lines may include a gate dielectric and gate electrode stack 1614, a dielectric cap layer 1616, and sidewall spacers 1618. The dielectric fill material 1610 occupies the location where a single gate line was previously and, as such, the first fin portion 1604 is separated from the second fin portion 1606 by single "plugged" gate line. In one embodiment, residual spacer material 1620 remains on the sidewalls of the location of the removed gate line portion, as depicted. It is to be appreciated that other regions of the fin 1602 may be isolated from one another by two or even more inactive gate lines (region 1622 having three inactive gate lines) fabricated by an earlier, broader fin cut process, as described below.

Referring again to FIG. 16A, an integrated circuit structure 1600 a fin 1602, such as a silicon fin. The fin 1602 has a longest dimension along a first direction 1650. An isolation structure 1610 separates a first upper portion 1604 of the fin 1602 from a second upper portion 1606 of the fin 1602 along the first direction 1650. The isolation structure 1610 has a center 1611 along the first direction 1650.

A first gate structure 1612A is over the first upper portion 1604 of the fin 1602, the first gate structure 1612A has a longest dimension along a second direction 1652 (e.g., into the page) orthogonal to the first direction 1650. A center 1613A of the first gate structure 1612A is spaced apart from the center 1611 of the isolation structure 1610 by a pitch along the first direction 1650. A second gate structure 1612B is over the first upper portion 1604 of the fin, the second gate structure 1612B having a longest dimension along the second direction 1652. A center 1613B of the second gate structure 1612B is spaced apart from the center 1613A of the first gate structure 1612A by the pitch along the first direction 1650. A third gate structure 1612C is over the second upper portion 1606 of the fin 1602, the third gate structure 1612C having a longest dimension along the second direction 1652. A center 1613C of the third gate structure 1612C is spaced apart from the center 1611 of the isolation structure 1610 by the pitch along the first direction 1650. In an embodiment, the isolation structure 1610 has a top substantially co-planar with a top of the first gate structure 1612A, with a top of the second gate structure 1612B, and with a top of the third gate structure 1612C, as is depicted.

In an embodiment, each of the first gate structure 1612A, the second gate structure 1612B and the third gate structure 1612C includes a gate electrode 1660 on and between sidewalls of a high-k gate dielectric layer 1662, as is illustrated for exemplary third gate structure 1612C. In one such embodiment, each of the first gate structure 1612A, the second gate structure 1612B and the third gate structure 1612C further includes an insulating cap 1616 on the gate electrode 1660 and on and the sidewalls of the high-k gate dielectric layer 1662.

In an embodiment, the integrated circuit structure 1600 further includes a first epitaxial semiconductor region 1664A on the first upper portion 1604 of the fin 1602 between the first gate structure 1612A and the isolation structure 1610. A second epitaxial semiconductor region 1664B is on the first upper portion 1604 of the fin 1602 between the first gate structure 1612A and the second gate structure 1612B. A third epitaxial semiconductor region 1664C is on the second upper portion 1606 of the fin 1602 between the third gate structure 1612C and the isolation structure 1610. In one embodiment, the first 1664A, second 1664B and third 1664C epitaxial semiconductor regions include silicon and germanium. In another embodiment, the first 1664A, second 1664B and third 1664C epitaxial semiconductor regions include silicon.

In an embodiment, the isolation structure 1610 induces a stress on the first upper portion 1604 of the fin 1602 and on the second upper portion 1606 of the fin 1602. In one embodiment, the stress is a compressive stress. In another embodiment, the stress is a tensile stress. In other embodiments, the isolation structure 1610 is a partially filling insulating layer in which a conductive structure is then formed. The conductive structure may be used as a local interconnect. In an embodiment, prior to forming the isolation structure 1610 with an insulating layer or with an insulating layer housing a local interconnect structure, dopants are implanted or delivered by a solid source dopant layer into a locally cut portion of the fin or fins.

In another aspect, it is to be appreciated that isolation structures such as isolation structure 1610 described above may be formed in place of active gate electrode at local locations of a fin cut or at broader locations of a fin cut. Additionally, the depth of such local or broader locations of fin cut may be formed to varying depths within the fin relative to one another. In a first example, FIG. 16B illustrates a cross-sectional view showing locations where a fin isolation structure may be formed in place of a gate electrode, in accordance with an embodiment of the present disclosure.

Figure 16B:
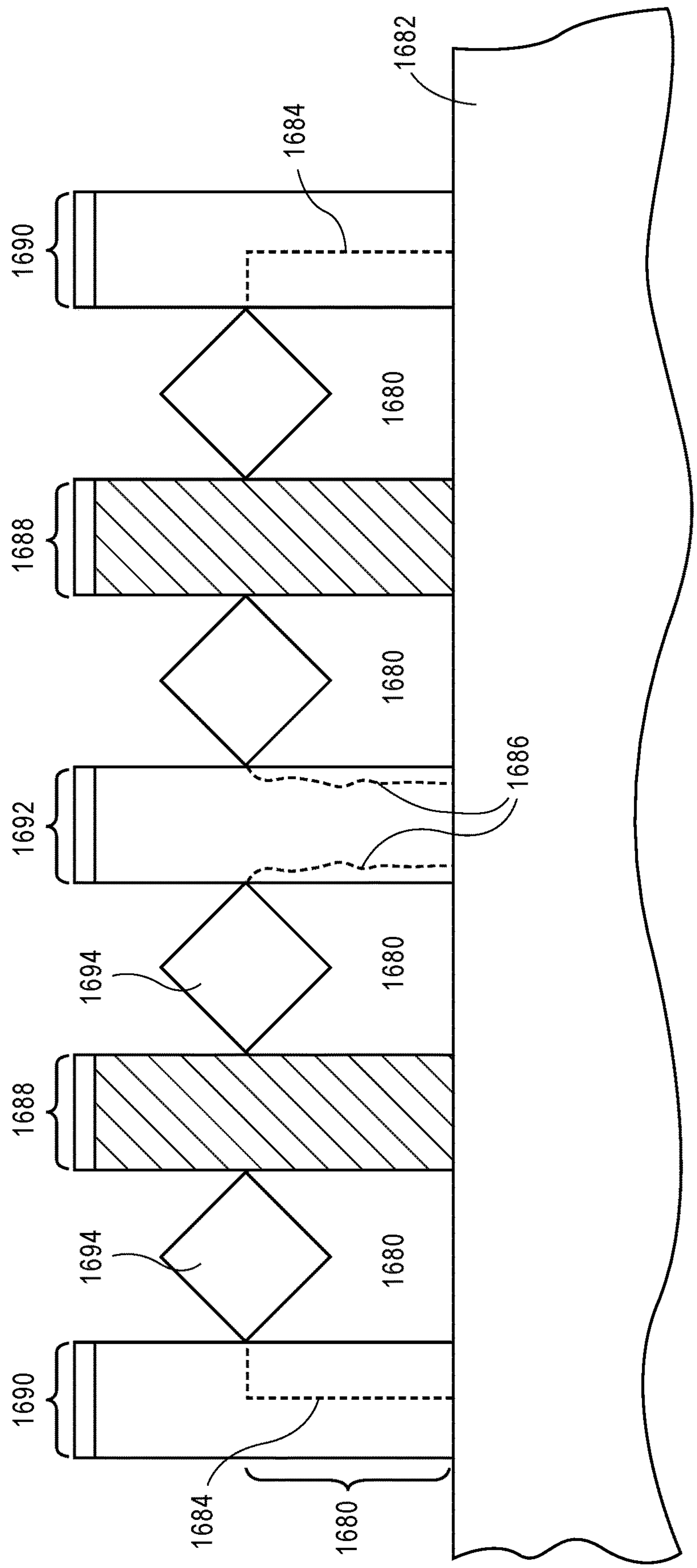
FIG. 16B illustrates a cross-sectional view showing locations where a fin isolation structure may be formed in place of a gate electrode, in accordance with an embodiment of the present disclosure.

Referring to FIG. 16B, a fin 1680, such as a silicon fin, is formed above and may be continuous with a substrate 1682. The fin 1680 has fin ends or broad fin cuts 1684, e.g., which may be formed at the time of fin patterning such as in a fin trim last approach described above. The fin 1680 also has a local cut 1686, where a portion of the fin 1680 is removed, e.g., using a fin trim isolation approach where dummy gates are replaced with dielectric plugs, as described above. Active gate electrodes 1688 are formed over the fin and, for the sake of illustration purposes, are shown slightly in front of the fin 1680, with the fin 1680 in the background, where the dashed lines represent areas covered from the front view. Dielectric plugs 1690 may be formed at the fin ends or broad fin cuts 1684 in place of using active gates at such locations. In addition, or in the alternative, a dielectric plug 1692 may be formed at the local cut 1686 in place of using an active gate at such a location. It is to be appreciated that epitaxial source or drain regions 1694 are also shown at locations of the fins 1680 between the active gate electrodes 1688 and the plugs 1690 or 1692. Additionally, in an embodiment, the surface roughness of the ends of the fin at the local cut 1686 are rougher than the ends of the fin at a location of a broader cut, as is depicted in FIG. 16B.

Figure 17A:
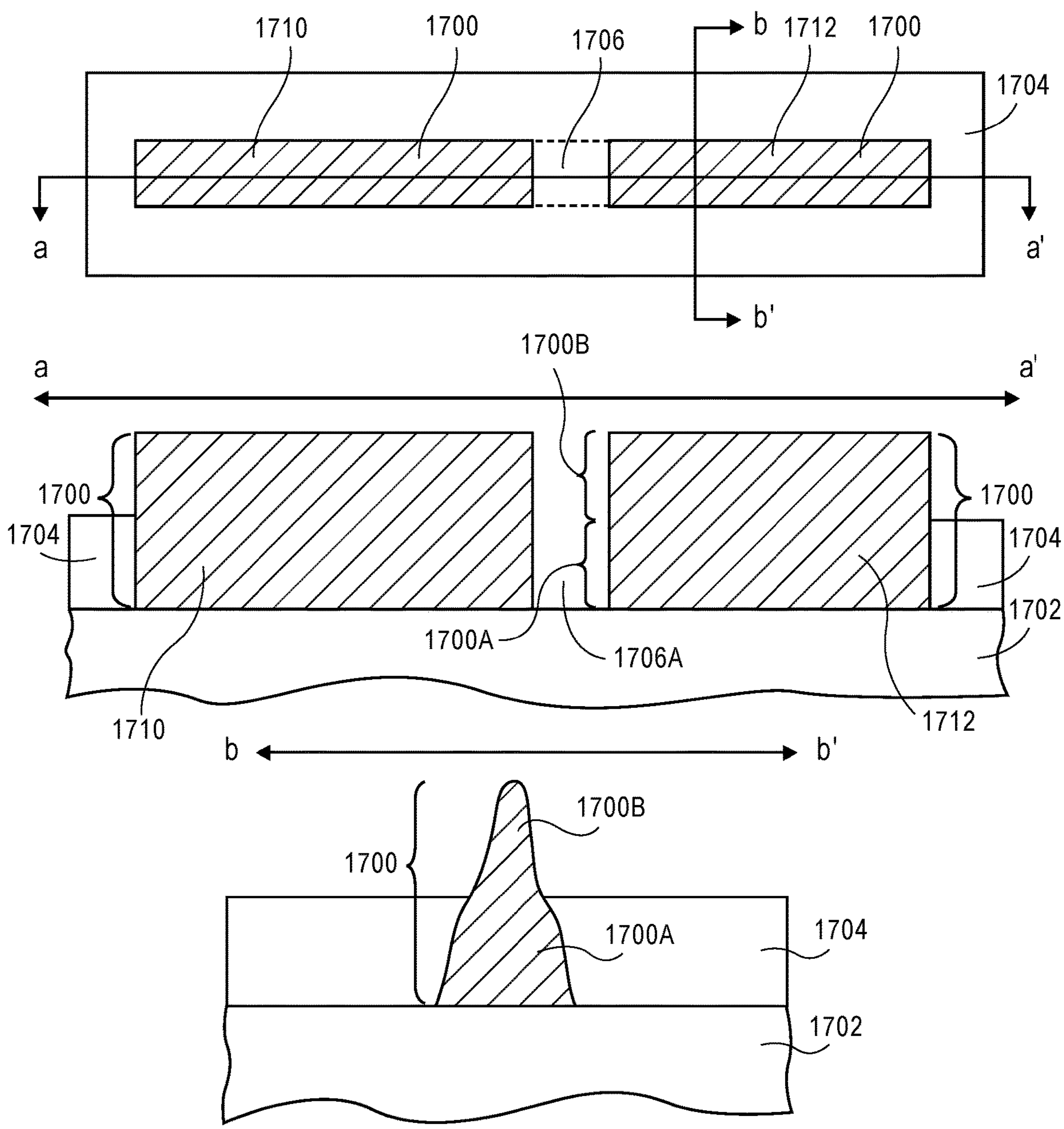
FIGS. 17A-17C illustrate various depth possibilities for a fin cut fabricated using fin trim isolation approach, in accordance with an embodiment of the preset disclosure.
Figure 17B:
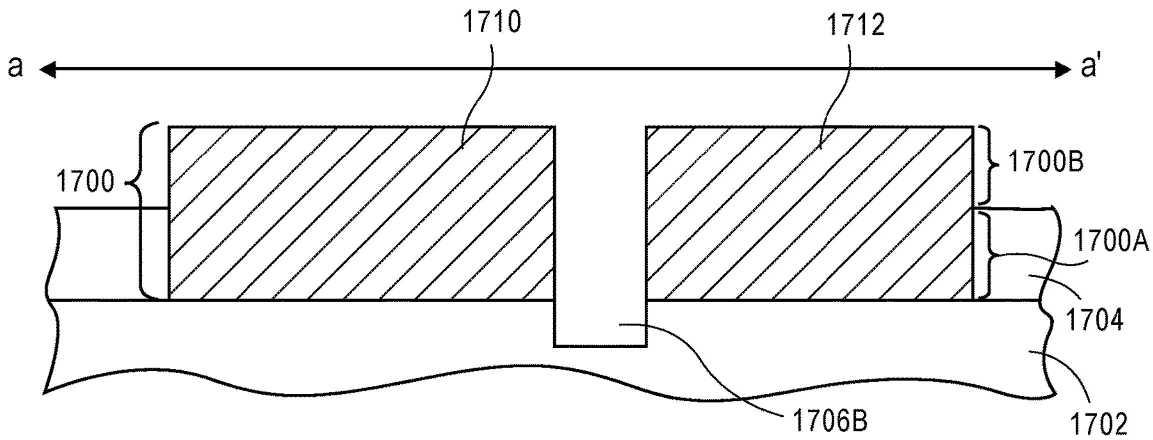
Figure 17C:
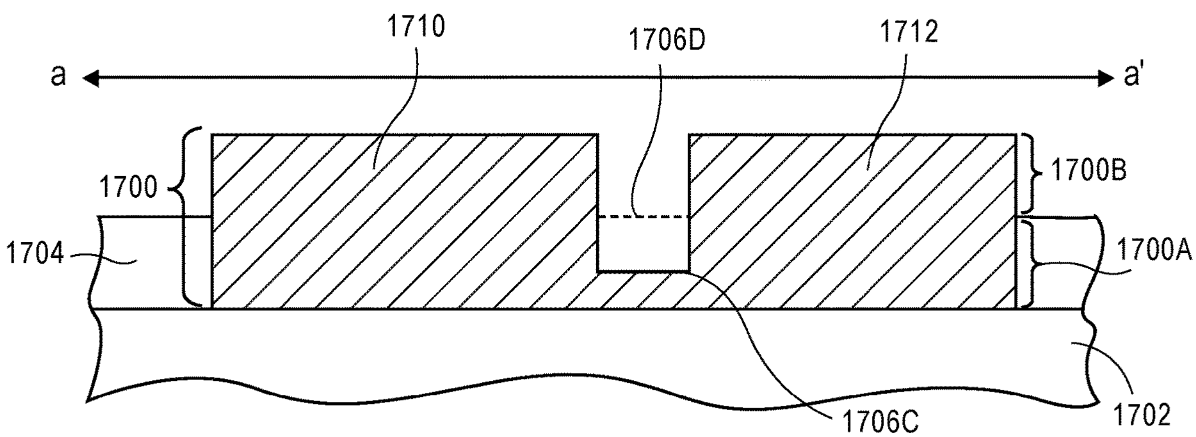

FIGS. 17A-17C illustrate various depth possibilities for a fin cut fabricated using fin trim isolation approach, in accordance with an embodiment of the preset disclosure.

Referring to FIG. 17A, a semiconductor fin 1700, such as a silicon fin, is formed above and may be continuous with an underlying substrate 1702. The fin 1700 has a lower fin portion 1700A and an upper fin portion 1700B, as defined by the height of an insulating structure 1704 relative to the fin 1700. A local fin isolation cut 1706A separates the fin 1700 into a first fin portion 1710 from a second fin portion 1712. In the example of FIG. 17A, as shown along the a-a' axis, the depth of the local fin isolation cut 1706A is the entire depth of the fin 1700 to the substrate 1702.

Referring to FIG. 17B, in a second example, as shown along the a-a' axis, the depth of a local fin isolation cut 1706B is deeper than the entire depth of the fin 1700 to the substrate 1702. That is, the cut 1706B extends into the underlying substrate 1702.

Referring to FIG. 17C, in a third example, as shown along the a-a' axis, the depth of a local fin isolation cut 1706C is less than the entire depth of the fin 1700, but is deeper than an upper surface of the isolation structure 1704. Referring again to FIG. 17C, in a fourth example, as shown along the a-a' axis, the depth of a local fin isolation cut 1706D is less than the entire depth of the fin 1700, and is at a level approximately co-planar with an upper surface of the isolation structure 1704.

Figure 18:
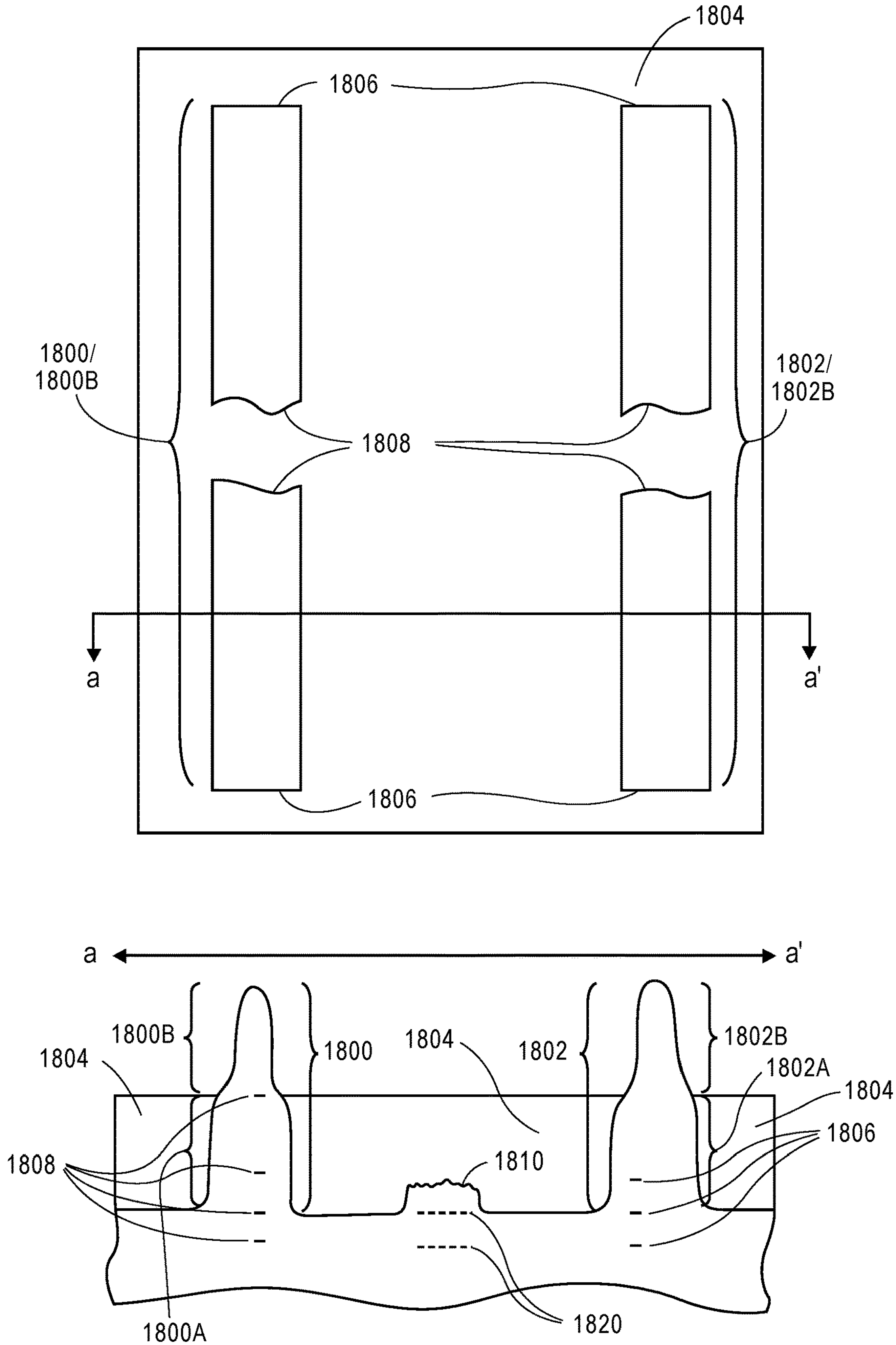
FIG. 18 illustrates a plan view and corresponding cross-sectional view taken along the a-a' axis showing possible options for the depth of local versus broader locations of fin cuts within a fin, in accordance with an embodiment of the present disclosure.

FIG. 18 illustrates a plan view and corresponding cross-sectional view taken along the a-a' axis showing possible options for the depth of local versus broader locations of fin cuts within a fin, in accordance with an embodiment of the present disclosure.

Referring to FIG. 18, first and second semiconductor fins 1800 and 1802, such as silicon fins, have upper fin portions 1800B and 1802B extending above an insulating structure 1804. Both of the fins 1800 and 1802 have fin ends or broad fin cuts 1806, e.g., which may be formed at the time of fin patterning such as in a fin trim last approach described above. Both of the fins 1800 and 1802 also have a local cut 1808, where a portion of the fin 1800 or 1802 is removed, e.g., using a fin trim isolation approach where dummy gates are replaced with dielectric plugs, as described above. In an embodiment, the surface roughness of the ends of the fins

1800 and 1802 at the local cut 1808 are rougher than the ends of the fins at a location of 1806, as is depicted in FIG. 18.

Referring to the cross-sectional view of FIG. 18, lower fin portions 1800A and 1802A can be viewed below the height of the insulating structure 1804. Also, seen in the cross-sectional view is a remnant portion 1810 of a fin that was removed at a fin trim last process prior to formation of the insulating structure 1804, as described above. Although shown as protruding above a substrate, remnant portion 1810 could also be at the level of the substrate or into the substrate, as is depicted by the additional exemplary broad cut depths 1820. It is to be appreciated that the broad cuts 1806 for fins 1800 and 1802 may also be at the levels described for cut depth 1820, examples of which are depicted. The local cut 1808 can have exemplary depths corresponding to the depths described for FIGS. 17A-17C, as is depicted.

Referring collectively to FIGS. 16A, 16B, 17A-17C and 18, in accordance with an embodiment of the present disclosure, an integrated circuit structure includes a fin including silicon, the fin having a top and sidewalls, where the top has a longest dimension along a first direction. A first isolation structure separates a first end of a first portion of the fin from a first end of a second portion of the fin along the first direction. The first isolation structure has a width along the first direction. The first end of the first portion of the fin has a surface roughness. A gate structure includes a gate electrode over the top of and laterally adjacent to the sidewalls of a region of the first portion of the fin. The gate structure has the width along the first direction, and a center of the gate structure is spaced apart from a center of the first isolation structure by a pitch along the first direction. A second isolation structure is over a second end of a first portion of the fin, the second end opposite the first end. The second isolation structure has the width along the first direction, and the second end of the first portion of the fin has a surface roughness less than the surface roughness of the first end of the first portion of the fin. A center of the second isolation structure is spaced apart from the center of the gate structure by the pitch along the first direction.

In one embodiment, the first end of the first portion of the fin has a scalloped topography, as is depicted in FIG. 16B. In one embodiment, a first epitaxial semiconductor region is on the first portion of the fin between the gate structure and the first isolation structure. A second epitaxial semiconductor region is on the first portion of the fin between the gate structure and the second isolation structure. In one embodiment, the first and second epitaxial semiconductor regions have a width along a second direction orthogonal to the first direction, the width along the second direction wider than a width of the first portion of the fin along the second direction beneath the gate structure, e.g., as epitaxial features described in association with FIGS. 11 and 12D which have a width wider than the fin portions on which they are grown in the perspective shown in FIGS. 11 and 12D. In one embodiment, the gate structure further includes a high-k dielectric layer between the gate electrode and the first portion of the fin and along sidewalls of the gate electrode.

Referring collectively to FIGS. 16A, 16B, 17A-17C and 18, in accordance with another embodiment of the present disclosure, an integrated circuit structure includes a fin including silicon, the fin having a top and sidewalls, wherein the top has a longest dimension along a direction. A first isolation structure separates a first end of a first portion of the fin from a first end of a second portion of the fin along the direction. The first end of the first portion of the fin has a depth. A gate structure includes a gate electrode over the top of and laterally adjacent to the sidewalls of a region of the first portion of the fin. A second isolation structure is over a second end of a first portion of the fin, the second end opposite the first end. The second end of the first portion of the fin has a depth different than the depth of the first end of the first portion of the fin.

In one embodiment, the depth of the second end of the first portion of the fin is less than the depth of the first end of the first portion of the fin. In one embodiment, the depth of the second end of the first portion of the fin is greater than the depth of the first end of the first portion of the fin. In one embodiment, the first isolation structure has a width along the direction, and the gate structure has the width along the direction. The second isolation structure has the width along the direction. In one embodiment, a center of the gate structure is spaced apart from a center of the first isolation structure by a pitch along the direction, and a center of the second isolation structure is spaced apart from the center of the gate structure by the pitch along the direction.

Referring collectively to FIGS. 16A, 16B, 17A-17C and 18, in accordance with another embodiment of the present disclosure, an integrated circuit structure includes a first fin including silicon, the first fin having a top and sidewalls, where the top has a longest dimension along a direction, and a discontinuity separates a first end of a first portion of the first fin from a first end of a second portion of the fin along the direction. The first portion of the first fin has a second end opposite the first end, and the first end of the first portion of the fin has a depth. The integrated circuit structures also includes a second fin including silicon, the second fin having a top and sidewalls, where the top has a longest dimension along the direction. The integrated circuit structure also includes a remnant or residual fin portion between the first fin and the second fin. The residual fin portion has a top and sidewalls, where the top has a longest dimension along the direction, and the top is non-co-planar with the depth of the first end of the first portion of the fin.

In one embodiment, the depth of the first end of the first portion of the fin is below the top of the remnant or residual fin portion. In one embodiment, the second end of the first portion of the fin has a depth co-planar with the depth of the first end of the first portion of the fin. In one embodiment, the second end of the first portion of the fin has a depth below the depth of the first end of the first portion of the fin. In one embodiment, the second end of the first portion of the fin has a depth above the depth of the first end of the first portion of the fin. In one embodiment, the depth of the first end of the first portion of the fin is above the top of the remnant or residual fin portion. In one embodiment, the second end of the first portion of the fin has a depth co-planar with the depth of the first end of the first portion of the fin. In one embodiment, the second end of the first portion of the fin has a depth below the depth of the first end of the first portion of the fin. In one embodiment, the second end of the first portion of the fin has a depth above the depth of the first end of the first portion of the fin. In one embodiment, the second end of the first portion of the fin has a depth co-planar with the top of the residual fin portion. In one embodiment, the second end of the first portion of the fin has a depth below the top of the residual fin portion. In one embodiment, the second end of the first portion of the fin has a depth above the top of the residual fin portion.

In another aspect, dielectric plugs formed in locations of local or broad fin cuts can be tailored to provide a particular stress to the fin or fin portion. The dielectric plugs may be referred to as fin end stressors in such implementations.

One or more embodiments are directed to the fabrication of fin-based semiconductor devices. Performance improvement for such devices may be made via channel stress induced from a poly plug fill process. Embodiments may include the exploitation of material properties in a poly plug fill process to induce mechanical stress in a metal oxide semiconductor field effect transistor (MOSFET) channel. As a result, an induced stress can boost the mobility and drive current of the transistor. In addition, a method of plug fill described herein may allow for the elimination of any seam or void formation during deposition.

To provide context, manipulating unique material properties of a plug fill that abuts fins can induce stress within the channel. In accordance with one or more embodiments, by tuning the composition, deposition, and post-treatment conditions of the plug fill material, stress in the channel is modulated to benefit both NMOS and PMOS transistors. In addition, such plugs can reside deeper in the fin substrate compared to other common stressor techniques, such as epitaxial source or drains. The nature of the plug fill to achieve such effect also eliminates seams or voids during deposition and mitigates certain defect modes during the process.

To provide further context, presently there is no intentional stress engineering for gate (poly) plugs. The stress enhancement from traditional stressors such as epitaxial source or drains, dummy poly gate removal, stress liners, etc. unfortunately tends to diminish as device pitches shrink. Addressing one or more of the above issues, in accordance with one or more embodiments of the present disclosure, an additional source of stress is incorporated into the transistor structure. Another possible benefit with such a process may be the elimination of seams or voids within the plug that may be common with other chemical vapor deposition methods.

Figure 19A:
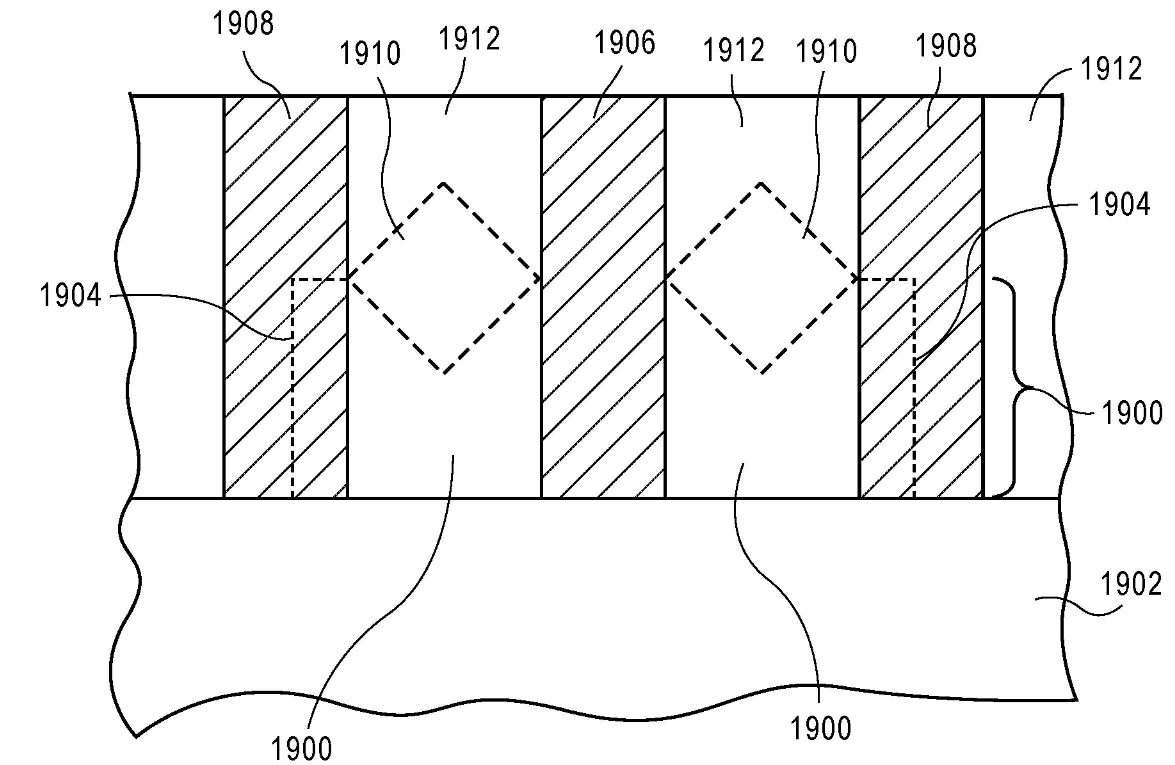
FIGS. 19A and 19B illustrate cross-sectional views of various operations in a method of selecting fin end stressor locations at ends of a fin that has a broad cut, in accordance with an embodiment of the present disclosure.
Figure 19B:
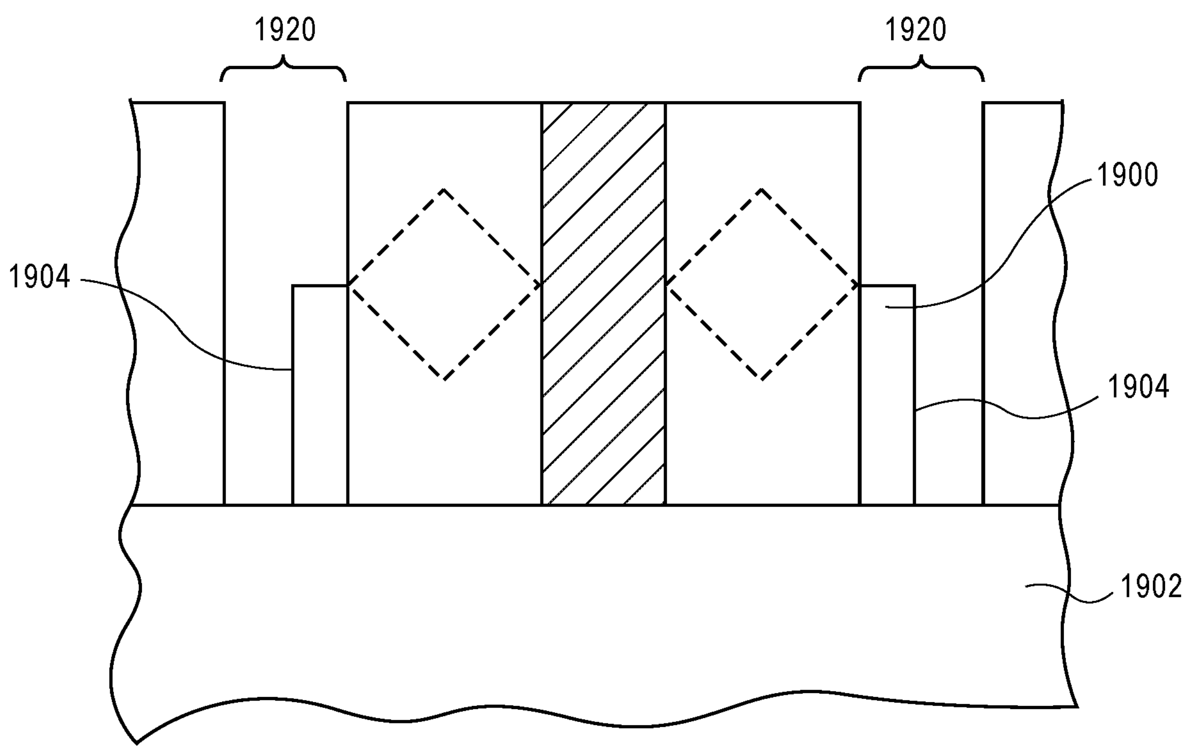

FIGS. 19A and 19B illustrate cross-sectional views of various operations in a method of selecting fin end stressor locations at ends of a fin that has a broad cut, e.g., as part of a fin trim last process as described above, in accordance with an embodiment of the present disclosure.

Referring to FIG. 19A, a fin 1900, such as a silicon fin, is formed above and may be continuous with a substrate 1902. The fin 1900 has fin ends or broad fin cuts 1904, e.g., which may be formed at the time of fin patterning such as in a fin trim last approach described above. An active gate electrode location 1906 and dummy gate electrode locations 1908 are formed over the fin 1900 and, for the sake of illustration purposes, are shown slightly in front of the fin 1900, with the fin 1900 in the background, where the dashed lines represent areas covered from the front view. It is to be appreciated that epitaxial source or drain regions 1910 are also shown at locations of the fin 1900 between the gate locations 1906 and 1908. Additionally, an inter-layer dielectric material 1912 is included at locations of the fin 1900 between the gate locations 1906 and 1908.

Referring to FIG. 19B, the gate placeholder structures or dummy gates locations 1908 are removed, exposing the fin ends or broad fin cuts 1904. The removal creates openings 1920 where dielectric plugs, e.g., fin end stressor dielectric plugs, may ultimately be formed.

Figure 20A:
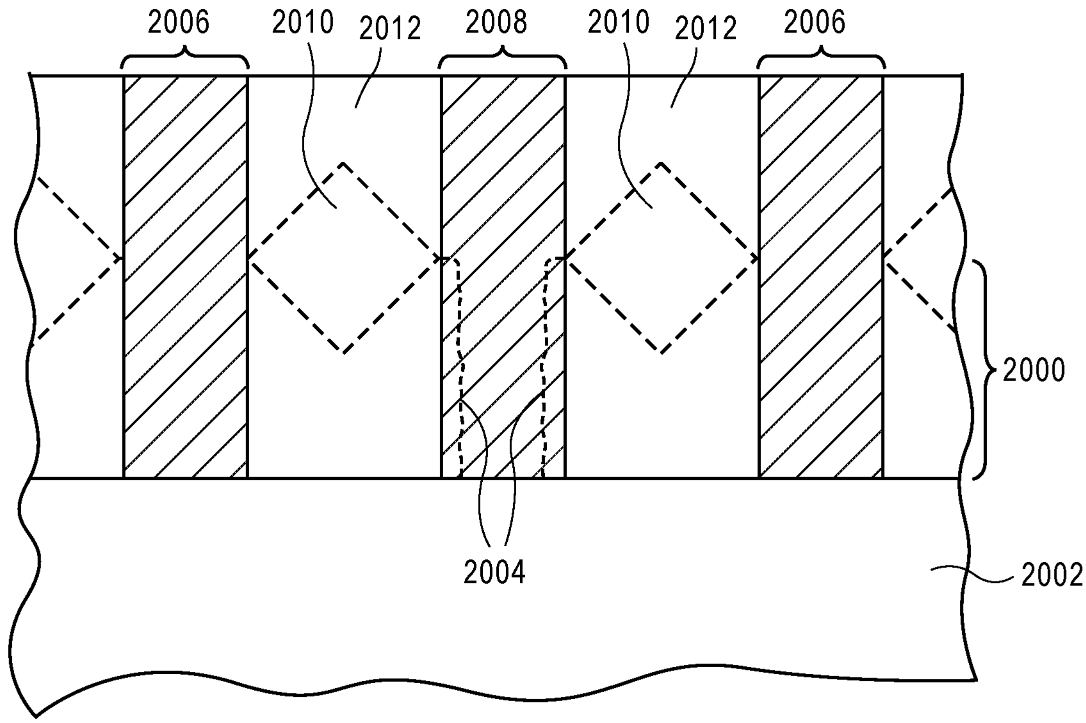
FIGS. 20A and 20B illustrate cross-sectional views of various operations in a method of selecting fin end stressor locations at ends of a fin that has a local cut, in accordance with an embodiment of the present disclosure.
Figure 20B:
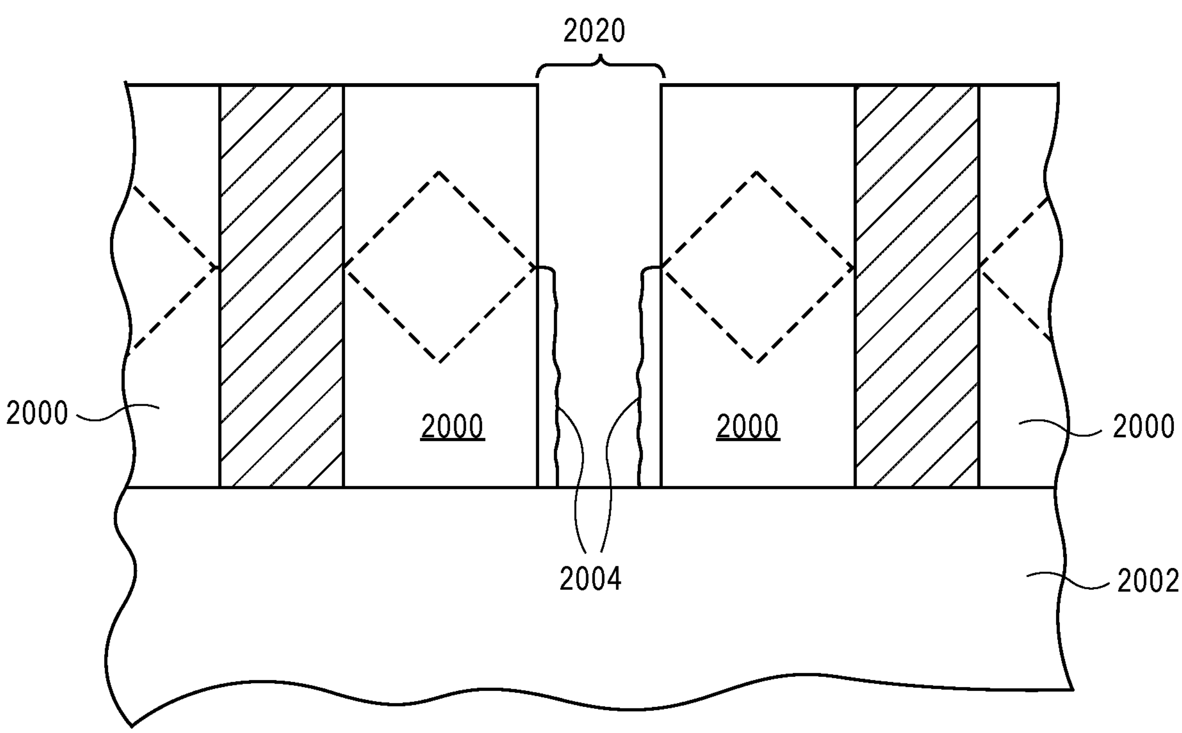

FIGS. 20A and 20B illustrate cross-sectional views of various operations in a method of selecting fin end stressor locations at ends of a fin that has a local cut, e.g., as part of a fin trim isolation process as described above, in accordance with an embodiment of the present disclosure.

Referring to FIG. 20A, a fin 2000, such as a silicon fin, is formed above and may be continuous with a substrate 2002. The fin 2000 has a local cut 2004, where a portion of the fin 2000 is removed, e.g., using a fin trim isolation approach where a dummy gate is removed and the fin is etched in a local location, as described above. Active gate electrode locations 2006 and a dummy gate electrode location 2008 are formed over the fin 2000 and, for the sake of illustration purposes, are shown slightly in front of the fin 2000, with the fin 2000 in the background, where the dashed lines represent areas covered from the front view. It is to be appreciated that epitaxial source or drain regions 2010 are also shown at locations of the fin 2000 between the gate locations 2006 and 2008. Additionally, an inter-layer dielectric material 2012 is included at locations of the fin 2000 between the gate locations 2006 and 2008.

Referring to FIG. 20B, the gate placeholder structure or dummy gate electrode location 2008 is removed, exposing the fin ends with local cut 2004. The removal creates opening 2020 where a dielectric plug, e.g., a fin end stressor dielectric plug, may ultimately be formed.

FIGS. 21A-21M illustrate cross-sectional views of various operation in a method of fabricating an integrated circuit structure having differentiated fin end dielectric plugs, in accordance with an embodiment of the present disclosure.

Figure 21A:
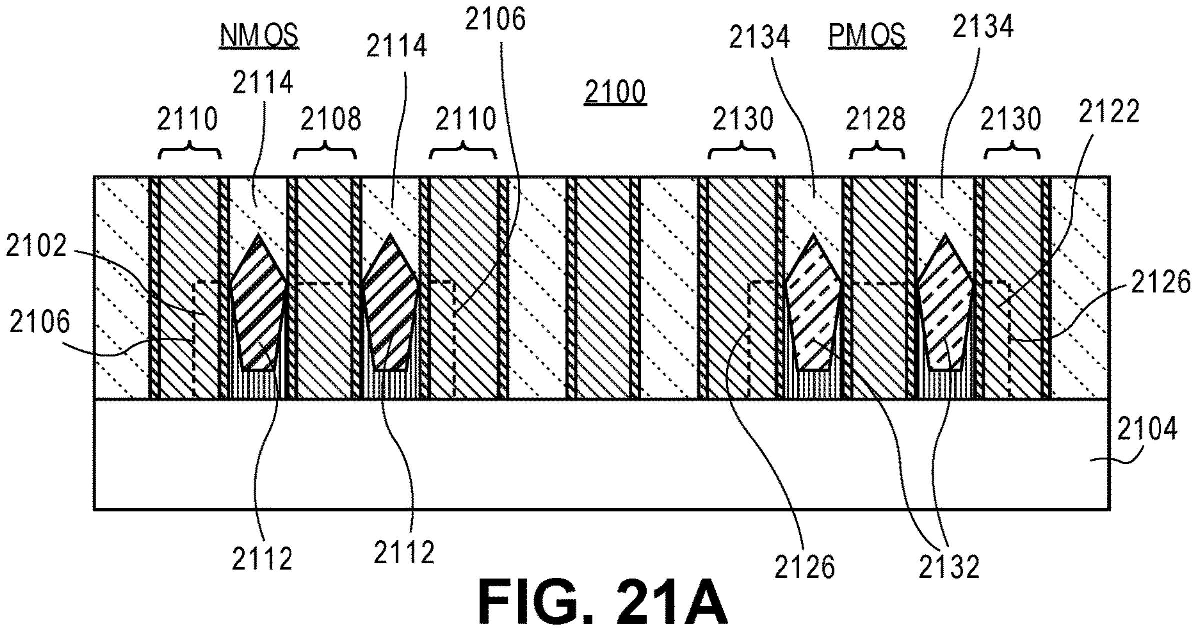
FIGS. 21A-21M illustrate cross-sectional views of various operation in a method of fabricating an integrated circuit structure having differentiated fin end dielectric plugs, in accordance with an embodiment of the present disclosure.

Referring to FIG. 21A, a starting structure 2100 includes an NMOS region and a PMOS region. The NMOS region of the starting structure 2100 includes a first fin 2102, such as a first silicon fin, which is formed above and may be continuous with a substrate 2104. The first fin 2102 has fin ends 2106 which may be formed from local or broad fin cuts. A first active gate electrode location 2108 and first dummy gate electrode locations 2110 are formed over the first fin 2102 and, for the sake of illustration purposes, are shown slightly in front of the first fin 2102, with the first fin 2102 in the background, where the dashed lines represent areas covered from the front view. Epitaxial N-type source or drain regions 2112, such as epitaxial silicon source of drain structures, are also shown at locations of the first fin 2102 between the gate locations 2108 and 2110. Additionally, an inter-layer dielectric material 2114 is included at locations of the first fin 2102 between the gate locations 2108 and 2110.

The PMOS region of the starting structure 2100 includes a second fin 2122, such as a second silicon fin, which is formed above and may be continuous with the substrate 2104. The second fin 2122 has fin ends 2126 which may be formed from local or broad fin cuts. A second active gate electrode location 2128 and second dummy gate electrode locations 2130 are formed over the second fin 2122 and, for the sake of illustration purposes, are shown slightly in front of the second fin 2122, with the second fin 2122 in the background, where the dashed lines represent areas covered from the front view. Epitaxial P-type source or drain regions 2132, such as epitaxial silicon germanium source of drain structures, are also shown at locations of the second fin 2122 between the gate locations 2128 and 2130. Additionally, an inter-layer dielectric material 2134 is included at locations of the second fin 2122 between the gate locations 2128 and 2130.

Figure 21B:
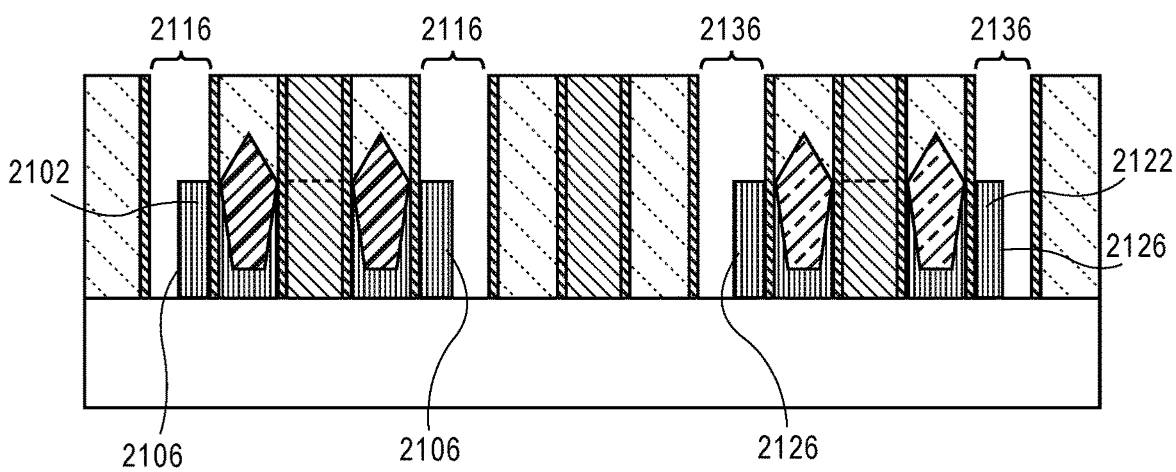

Referring to FIG. 21B, the first and second dummy gate electrodes at locations 2110 and 2130, respectively, are removed. Upon removal, the fin ends 2106 of first fin 2102 and the fin ends 2126 of second fin 2122 are exposed. The removal also creates openings 2116 and 2136, respectively, where dielectric plugs, e.g., fin end stressor dielectric plugs, may ultimately be formed.

Figure 21C:
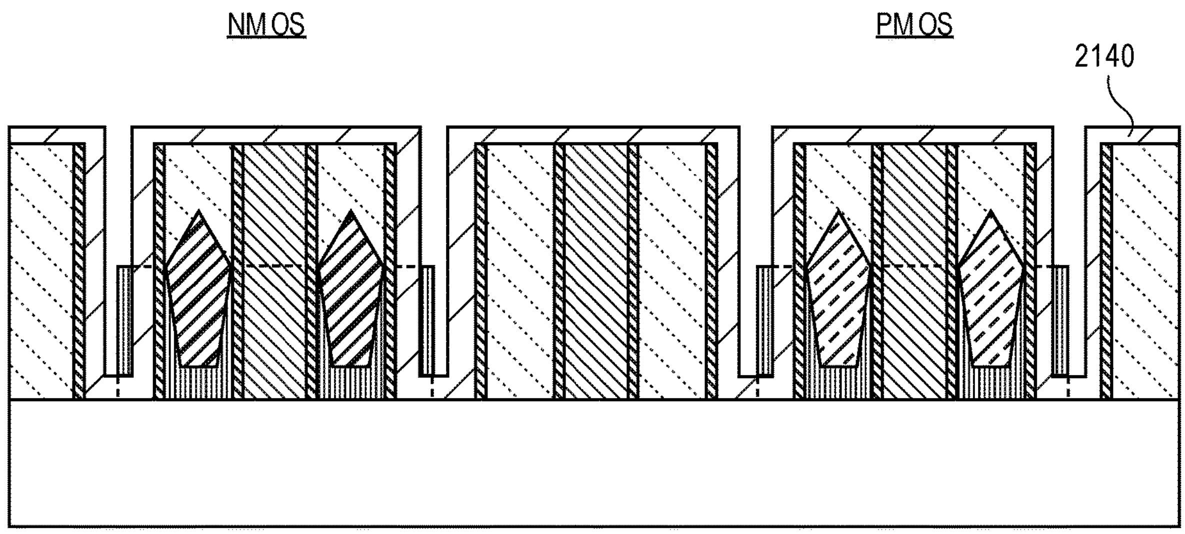

Referring to FIG. 21C, a material liner 2140 is formed conformal with the structure of FIG. 21B. In an embodiment, the material liner includes silicon and nitrogen, such as a silicon nitride material liner.

Figure 21D:
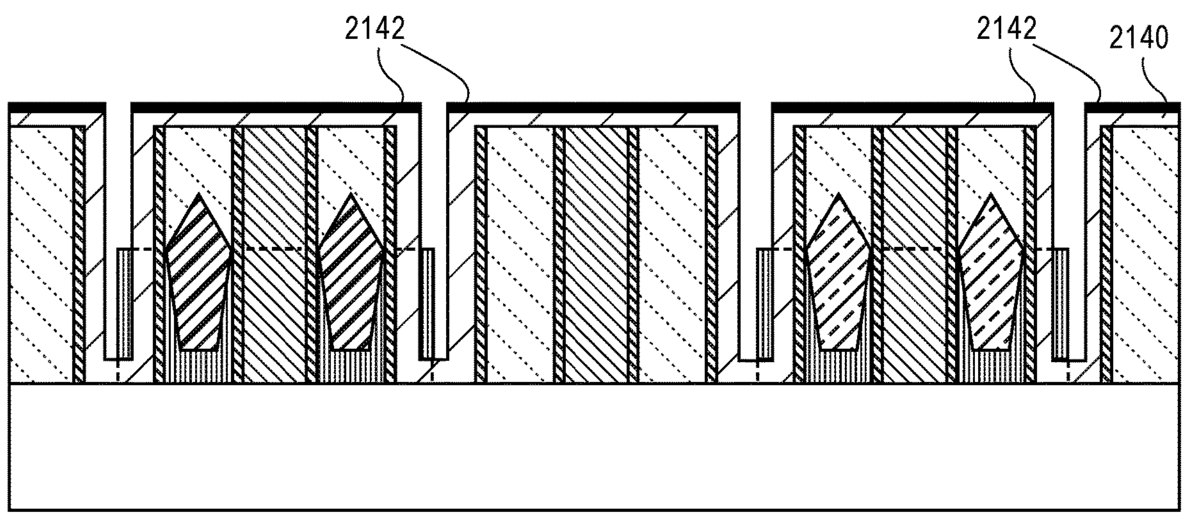

Referring to FIG. 21D, a protective crown layer 2142, such as a metal nitride layer, is formed on the structure of FIG. 21C.

Figure 21E:
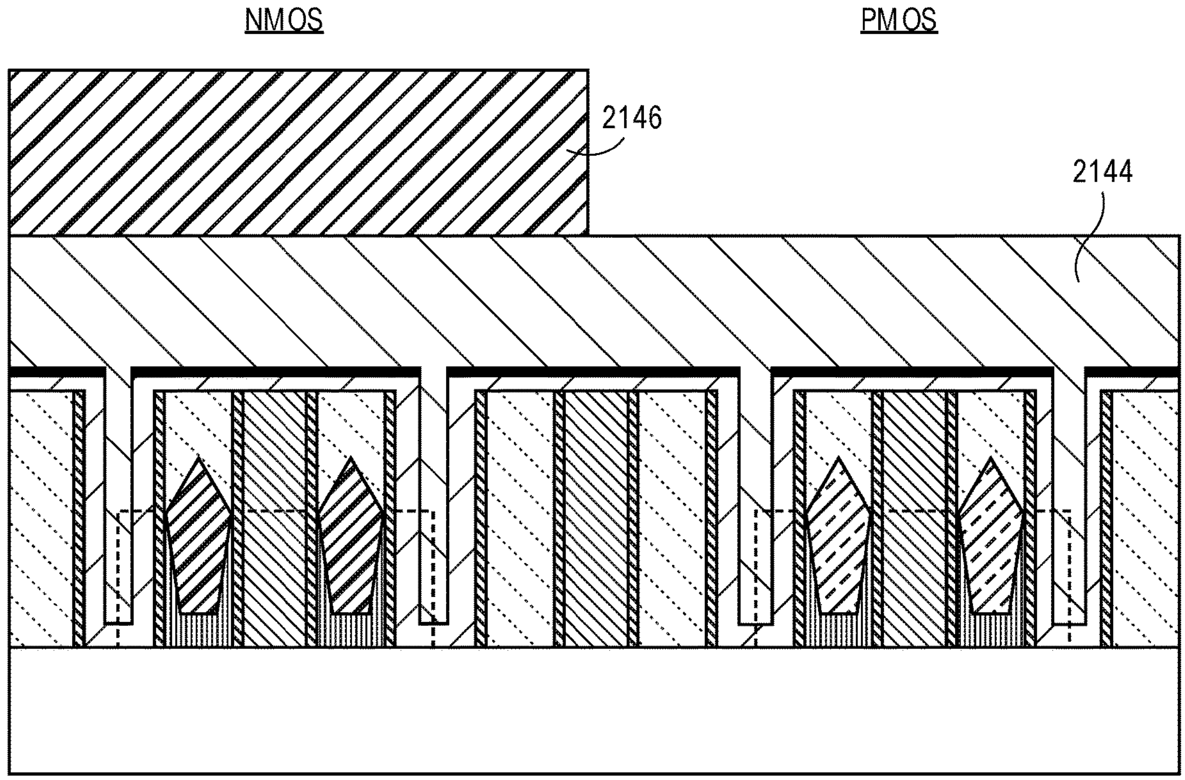

Referring to FIG. 21E, a hardmask material 2144, such as a carbon-based hardmask material is formed over the structure of FIG. 21D. A lithographic mask or mask stack 2146 is formed over the hardmask material 2144.

Figure 21F:
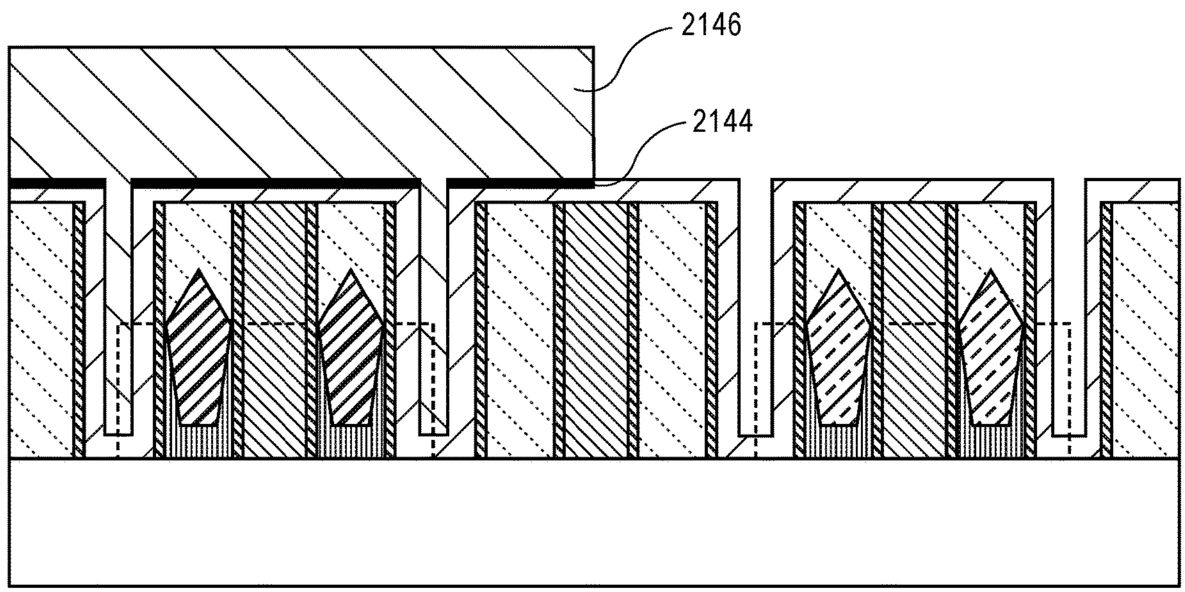

Referring to FIG. 21F, portions of the hardmask material 2144 and portions of the protective crown layer 2142 in the PMOS region are removed from the structure of FIG. 21E. The lithographic mask or mask stack 2146 is also removed.

Figure 21G:
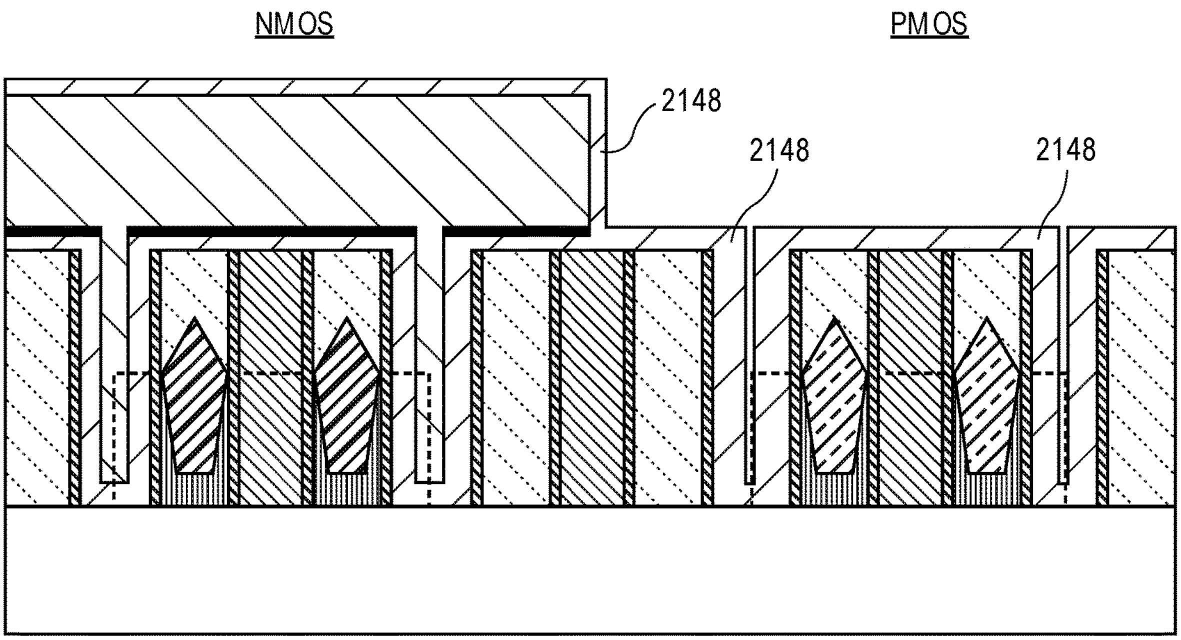

Referring to FIG. 21G, a second material liner 2148 is formed conformal with the structure of FIG. 21F. In an embodiment, the second material liner includes silicon and nitrogen, such as a second silicon nitride material liner. In an embodiment, the second material liner 2148 has a different stress state to adjust stress in exposed plugs.

Figure 21H:
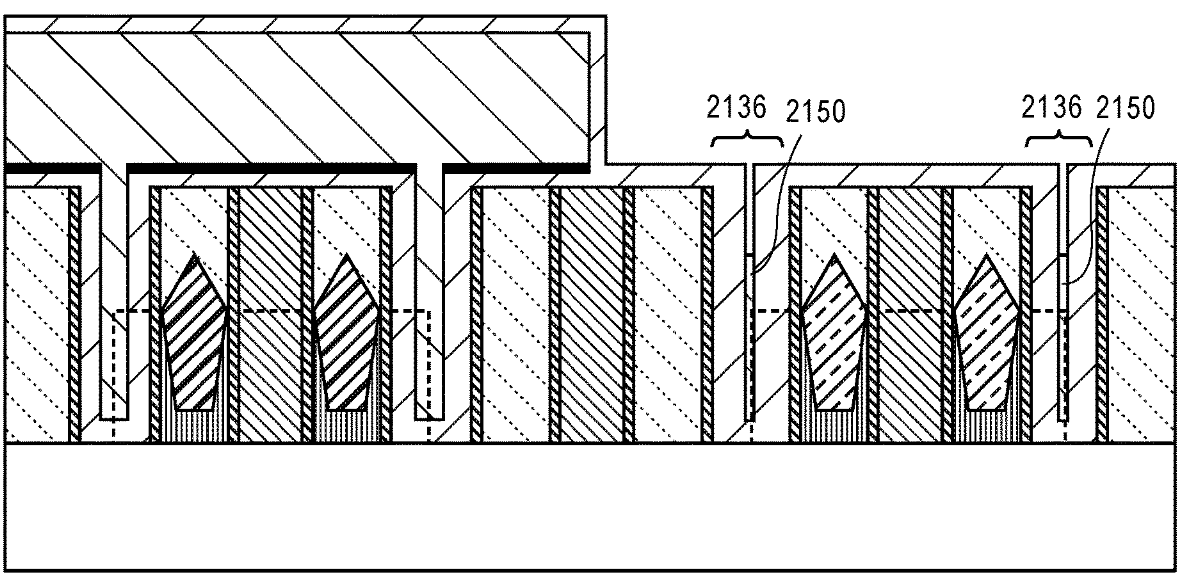

Referring to FIG. 21H, a second hardmask material 2150, such as a second carbon-based hardmask material is formed over the structure of FIG. 21G and is then recessed within openings 2136 of the PMOS region of the structure.

Figure 21I:
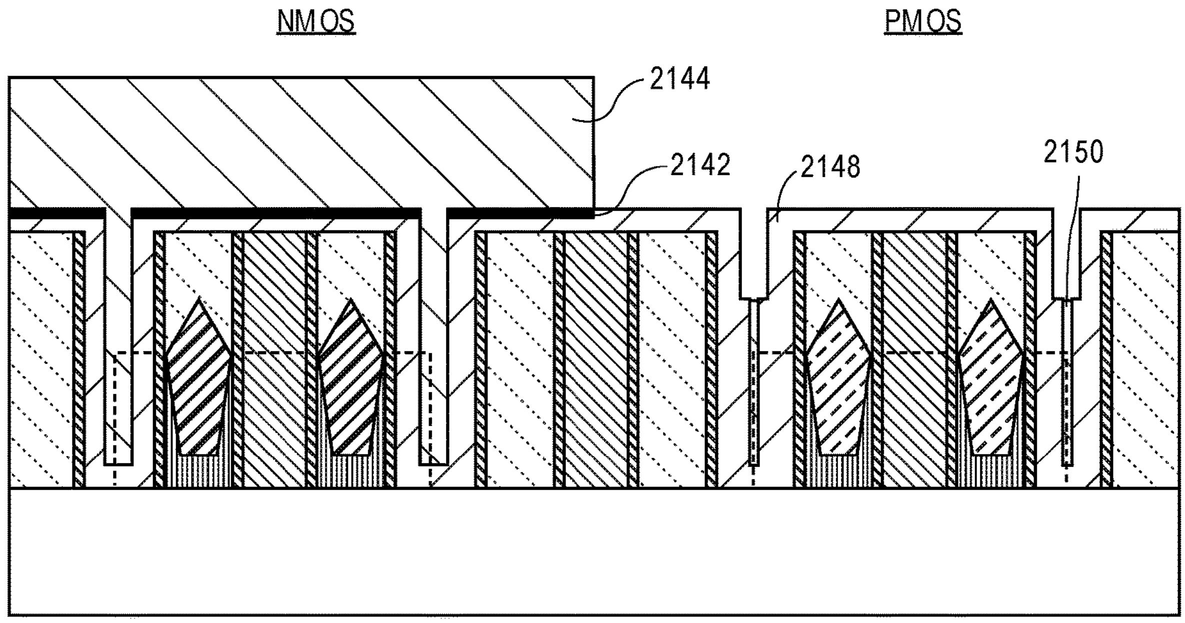
Figure 21J:
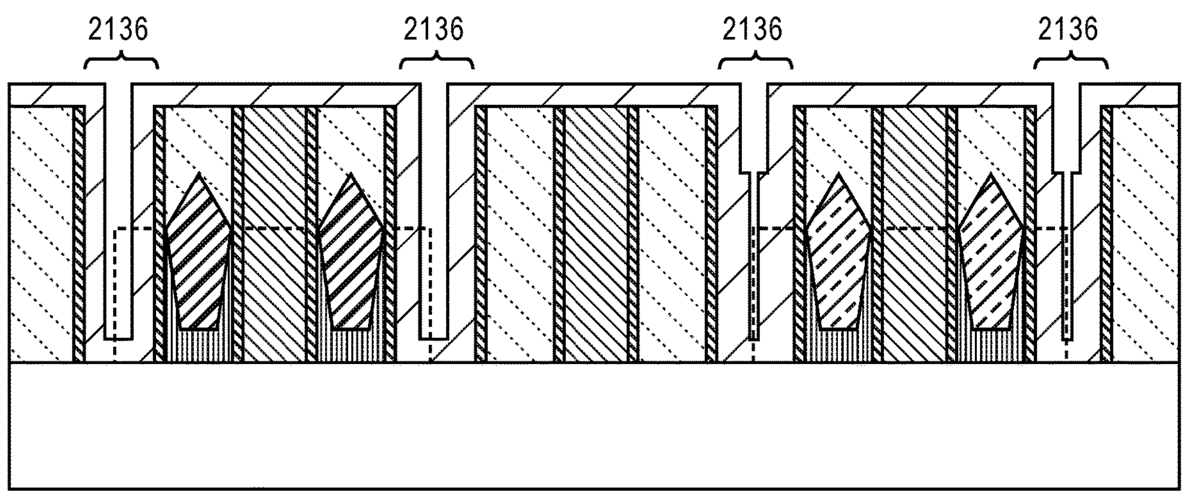
Figure 21K:
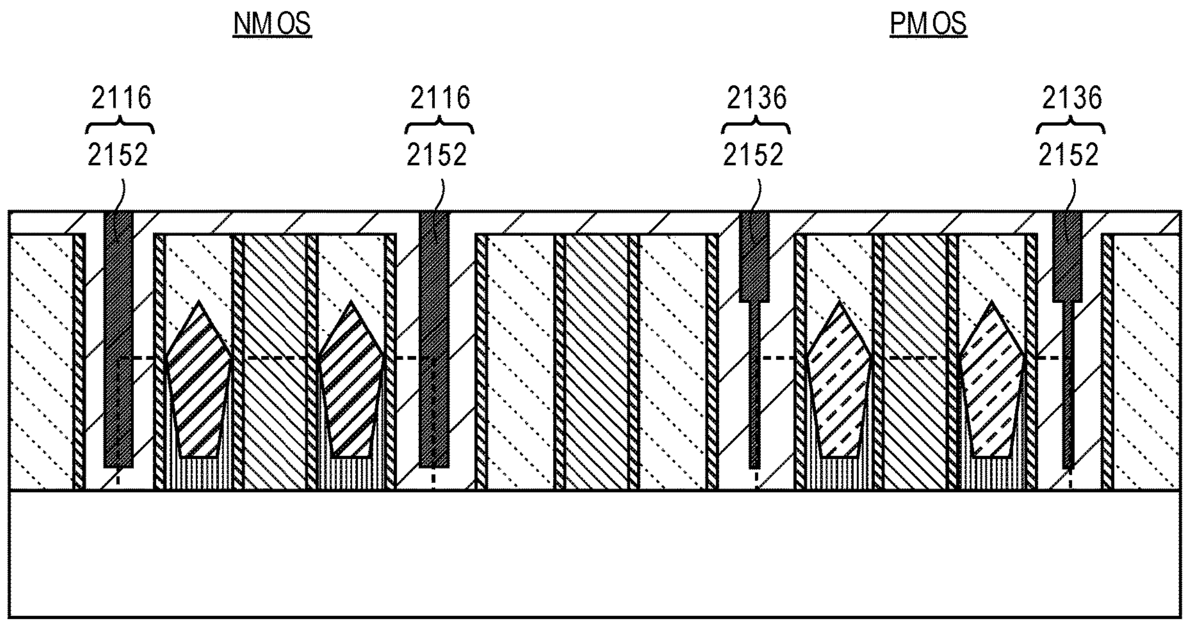

Referring to FIG. 21I, the second material liner 2148 is etched from the structure of FIG. 2H to remove the second material liner 2148 from the NMOS region and to recess the second material liner 2148 in the PMOS region of the structure.

Referring to FIG. 2J, the hardmask material 2144, the protective crown layer 2142, and the second hardmask material 2150 are removed from the structure of FIG. 2I. The removal leaves two different fill structures for openings 2116 as compared to openings 2136, respectively.

Referring to FIG. 2K, an insulating fill material 2152 is formed in the openings 2116 and 2136 of the structure of FIG. 2J and is planarized. In an embodiment, the insulating fill material 2152 is a flowable oxide material, such as a flowable silicon oxide or silicon dioxide material.

Referring to FIG. 2L, the insulating fill material 2152 is recessed within the openings 2116 and 2136 of the structure of FIG. 2K to form a recessed insulating fill material 2154. In an embodiment, a steam oxidation process is performed as part of the recess process or subsequent to the recess process to cure the recessed insulating fill material 2154. In one such embodiment, the recessed insulating fill material 2154 shrinks, inducing a tensile stress on the fins 2102 and 2122. However, there is relatively less tensile stress inducing material in the PMOS region than in the NMOS region.

Figure 21L:
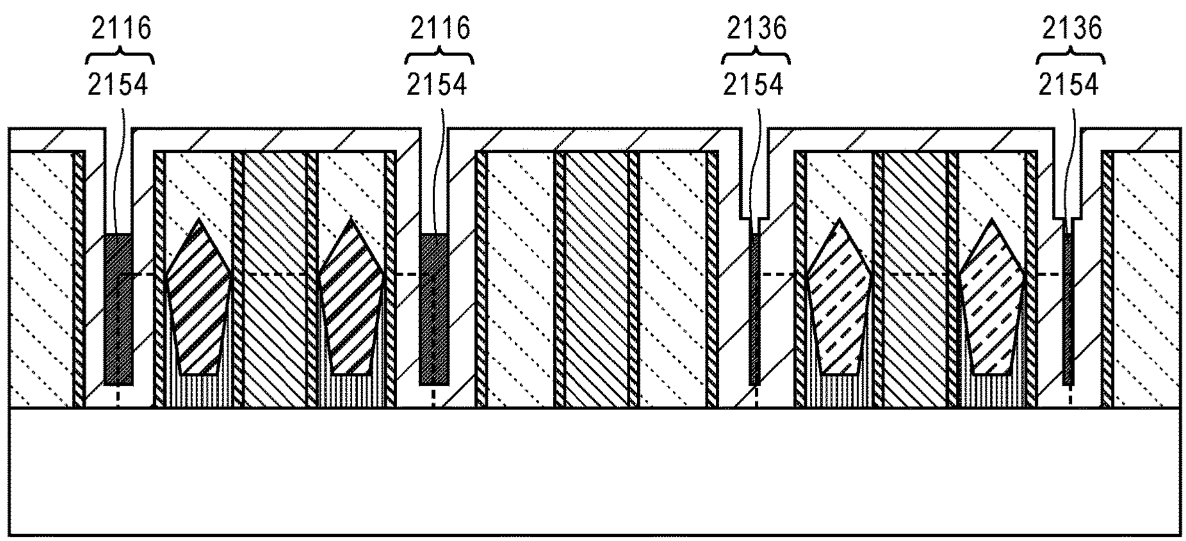
Figure 21M:
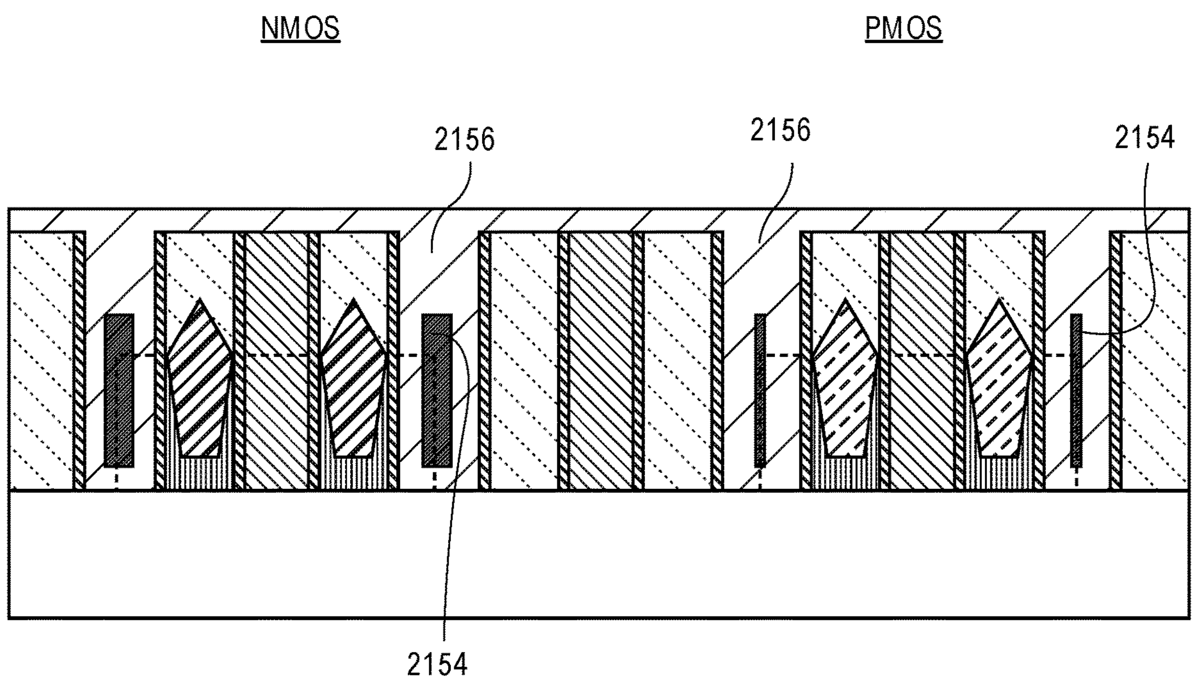

Referring to FIG. 21M, a third material liner 2156 is over the structure of FIG. 21L. In an embodiment, the third material liner 2156 includes silicon and nitrogen, such as a third silicon nitride material liner. In an embodiment, the third material liner 2156 prevents recessed insulating fill material 2154 from being etched out during a subsequent source or drain contact etch.

FIGS. 22A-22D illustrate cross-sectional views of exemplary structures of a PMOS fin end stressor dielectric plug, in accordance with an embodiment of the present disclosure.

Figures 22A, 22B, 22C, 22D:
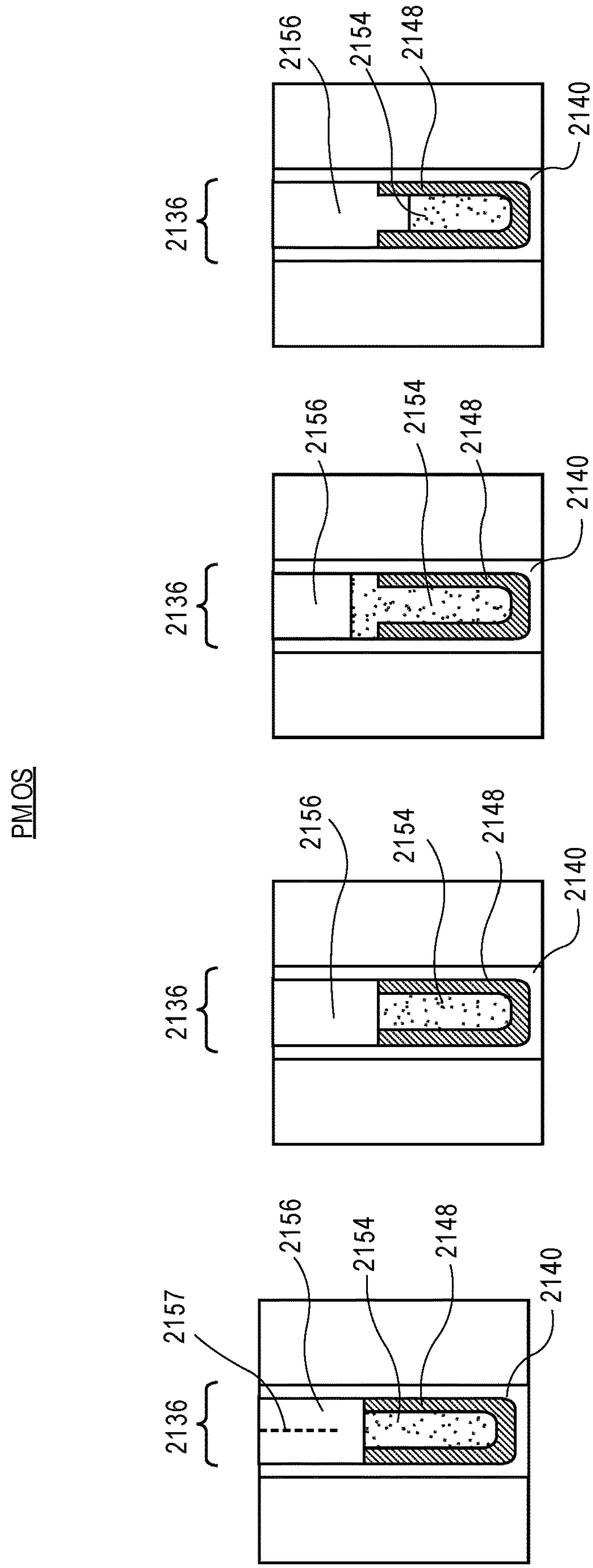
FIGS. 22A-22D illustrate cross-sectional views of exemplary structures of a PMOS fin end stressor dielectric plug, in accordance with an embodiment of the present disclosure.

Referring to FIG. 22A, an opening 2136 on the PMOS region of structure 2100 includes a material liner 2140 along the sidewalls of the opening 2136. A second material liner 2148 is conformal with a lower portion of the material liner 2140 but is recessed relative to an upper portion of the material liner 2140. A recessed insulating fill material 2154 is within the second material liner 2148 and has an upper surface co-planar with an upper surface of the second material liner 2148. A third material liner 2156 is within the upper portion of the material liner 2140 and is on the upper surface of the insulating fill material 2154 and on the upper surface of the second material liner 2148. The third material liner 2156 has a seam 2157, e.g., as an artifact of a deposition process used to form the third material liner 2156.

Referring to FIG. 22B, an opening 2136 on the PMOS region of structure 2100 includes a material liner 2140 along the sidewalls of the opening 2136. A second material liner 2148 is conformal with a lower portion of the material liner 2140 but is recessed relative to an upper portion of the material liner 2140. A recessed insulating fill material 2154 is within the second material liner 2148 and has an upper surface co-planar with an upper surface of the second material liner 2148. A third material liner 2156 is within the upper portion of the material liner 2140 and is on the upper surface of the insulating fill material 2154 and on the upper surface of the second material liner 2148. The third material liner 2156 does not have a seam.

Referring to FIG. 22C, an opening 2136 on the PMOS region of structure 2100 includes a material liner 2140 along the sidewalls of the opening 2136. A second material liner 2148 is conformal with a lower portion of the material liner 2140 but is recessed relative to an upper portion of the material liner 2140. A recessed insulating fill material 2154 is within and over the second material liner 2148 and has an upper surface above an upper surface of the second material liner 2148. A third material liner 2156 is within the upper portion of the material liner 2140 and is on the upper surface of the insulating fill material 2154. The third material liner 2156 is shown without a seam, but in other embodiments, the third material liner 2156 has a seam.

Referring to FIG. 22D, an opening 2136 on the PMOS region of structure 2100 includes a material liner 2140 along the sidewalls of the opening 2136. A second material liner 2148 is conformal with a lower portion of the material liner 2140 but is recessed relative to an upper portion of the material liner 2140. A recessed insulating fill material 2154 is within the second material liner 2148 and has an upper surface recessed below an upper surface of the second material liner 2148. A third material liner 2156 is within the upper portion of the material liner 2140 and is on the upper surface of the insulating fill material 2154 and on the upper surface of the second material liner 2148. The third material liner 2156 is shown without a seam, but in other embodiments, the third material liner 2156 has a seam.

Referring collectively to FIGS. 19A, 19B, 20A, 20B, 21A-21M, and 22A-22D, in accordance with an embodiment of the present disclosure, an integrated circuit structure includes a fin, such as a silicon, the fin having a top and sidewalls. The top has a longest dimension along a direction. A first isolation structure is over a first end of the fin. A gate structure includes a gate electrode over the top of and laterally adjacent to the sidewalls of a region of the fin. The gate structure is spaced apart from the first isolation structure along the direction. A second isolation structure is over a second end of the fin, the second end opposite the first end. The second isolation structure is spaced apart from the gate structure along the direction. The first isolation structure and the second isolation structure both include a first dielectric material (e.g., material liner 2140) laterally surrounding a recessed second dielectric material (e.g., second material liner 2148) distinct from the first dielectric material. The recessed second dielectric material is laterally surrounding at least a portion of a third dielectric material (e.g., recessed insulating fill material 2154) different from the first and second dielectric materials.

In one embodiment, the first isolation structure and the second isolation structure both further include a fourth dielectric material (e.g., third material liner 2156) laterally surrounded by an upper portion of the first dielectric material, the fourth dielectric material on an upper surface of the third dielectric material. In one such embodiment, the fourth dielectric material is further on an upper surface of the second dielectric material. In another such embodiment, the fourth dielectric material has an approximately vertical central seam. In another such embodiment, the fourth dielectric material does not have a seam.

In one embodiment, the third dielectric material has an upper surface co-planar with an upper surface of the second dielectric material. In one embodiment, the third dielectric material has an upper surface below an upper surface of the second dielectric material. In one embodiment, the third dielectric material has an upper surface above an upper surface of the second dielectric material, and the third dielectric material is further over the upper surface of the second dielectric material. In one embodiment, the first and second isolation structures induce a compressive stress on the fin. In one such embodiment, the gate electrode is a P-type gate electrode.

In one embodiment, the first isolation structure has a width along the direction, the gate structure has the width along the direction, and the second isolation structure has the width along the direction. In one such embodiment, a center of the gate structure is spaced apart from a center of the first isolation structure by a pitch along the direction, and a center of the second isolation structure is spaced apart from the center of the gate structure by the pitch along the direction. In one embodiment, the first and second isolation structures are both in a corresponding trench in an inter-layer dielectric layer.

In one such embodiment, a first source or drain region is between the gate structure and the first isolation structure. A second source or drain region is between the gate structure and the second isolation structure. In one such embodiment, the first and second source or drain regions are embedded source or drain regions including silicon and germanium. In one such embodiment, the gate structure further includes a high-k dielectric layer between the gate electrode and the fin and along sidewalls of the gate electrode.

Figure 23A:
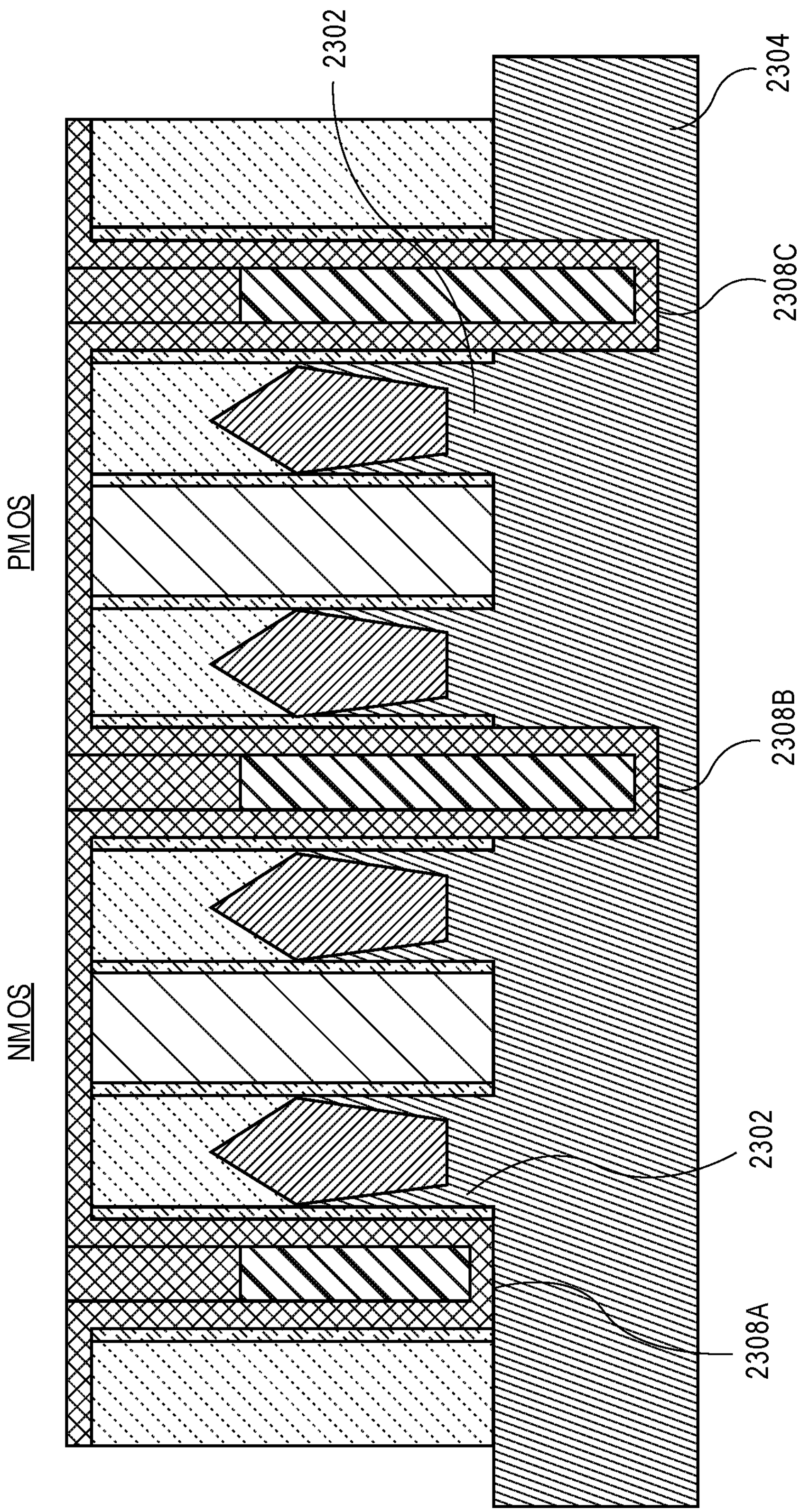
FIG. 23A illustrates a cross-sectional view of another semiconductor structure having fin-end stress-inducing features, in accordance with another embodiment of the present disclosure.

In another aspect, the depth of individual dielectric plugs may be varied within a semiconductor structure or within an architecture formed on a common substrate. As an example, FIG. 23A illustrates a cross-sectional view of another semiconductor structure having fin-end stress-inducing features, in accordance with another embodiment of the present disclosure. Referring to FIG. 23A, a shallow dielectric plug 2308A is included along with a pair of deep dielectric plugs 2308B and 2308C. In one such embodiment, as depicted, the shallow dielectric plug 2308C is at a depth approximately equal to the depth of a semiconductor fin 2302 within a substrate 2304, while the pair of deep dielectric plugs 2308B and 2308C is at a depth below the depth of the semiconductor fin 2302 within substrate 2304.

Referring again to FIG. 23A, such an arrangement may enable stress amplification on fin trim isolation (FTI) devices in a trench that etches deeper into the substrate 2304 in order to provide isolation between adjacent fins 2302. Such an approach may be implemented to increases the density of transistors on a chip. In an embodiment, the stress effect induced on transistors from the plug fill is magnified in FTI transistors since the stress transfer occurs in both the fin and in a substrate or well underneath the transistor.

Figure 23B:
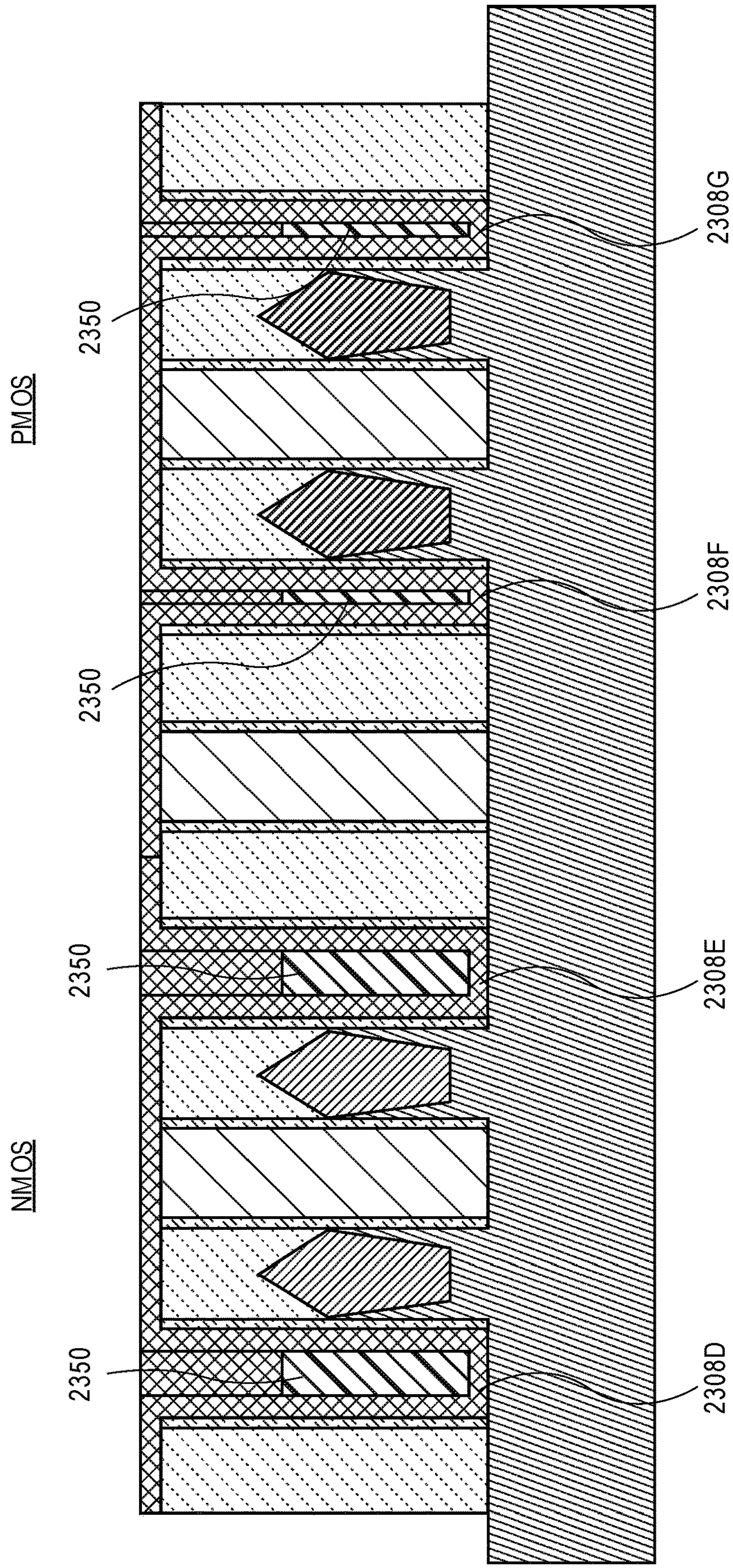
FIG. 23B illustrates a cross-sectional view of another semiconductor structure having fin-end stress-inducing features, in accordance with another embodiment of the present disclosure.

In another aspect, the width or amount of a tensile stress-inducing oxide layer included in a dielectric plug may be varied within a semiconductor structure or within an architecture formed on a common substrate, e.g., depending if the device is a PMOS device or an NMOS device. As an example, FIG. 23B illustrates a cross-sectional view of another semiconductor structure having fin-end stress-inducing features, in accordance with another embodiment of the present disclosure. Referring to FIG. 23B, in a particular embodiment, NMOS devices include relatively more of a tensile stress-inducing oxide layer 2350 than corresponding PMOS devices.

With reference again to FIG. 23B, in an embodiment, differentiating plug fill is implemented to induce appropriate stress in NMOS and PMOS. For example, NMOS plugs 2308D and 2308E have a greater volume and greater width of the tensile stress-inducing oxide layer 2350 than do PMOS plugs 2308F and 2308G. The plug fill may be patterned to induce different stress in NMOS and PMOS devices. For example, lithographic patterning may be used to open up PMOS devices (e.g., widen the dielectric plug trenches for PMOS devices), at which point different fill options can be performed to differentiate the plug fill in NMOS versus PMOS devices. In an exemplary embodiment, reducing the volume of a flowable oxide in the plug on PMOS devices can reduce the induced tensile stress. In one such embodiment, compressive stress may be dominate, e.g., from compressively stressing source and drain regions. In other embodiments, the use of different plug liners or different fill materials provides tunable stress control.

As described above, it is to be appreciated that poly plug stress effects can benefit both NMOS transistors (e.g., tensile channel stress) and PMOS transistors (e.g., compressive channel stress). In accordance with an embodiment of the present disclosure, a semiconductor fin is a uniaxially stressed semiconductor fin. The uniaxially stressed semiconductor fin may be uniaxially stressed with tensile stress or with compressive stress. For example, FIG. 24A illustrates an angled view of a fin having tensile uniaxial stress, while FIG. 24B illustrates an angled view of a fin having compressive uniaxial stress, in accordance with one or more embodiments of the present disclosure.

Figure 24A:
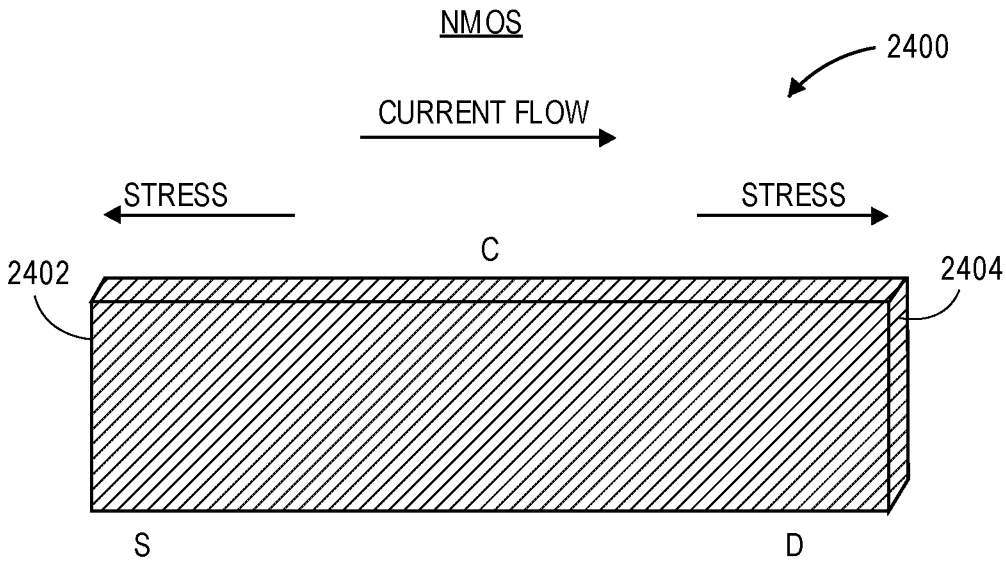
FIG. 24A illustrates an angled view of a fin having tensile uniaxial stress, in accordance with an embodiment of the present disclosure.

Referring to FIG. 24A, a semiconductor fin 2400 has a discrete channel region (C) disposed therein. A source region (S) and a drain region (D) are disposed in the semiconductor fin 2400, on either side of the channel region (C). The discrete channel region of the semiconductor fin 2400 has a current flow direction along the direction of a uniaxial tensile stress (arrows pointed away from one another and towards ends 2402 and 2404), from the source region (S) to the drain region (D).

Figure 24B:
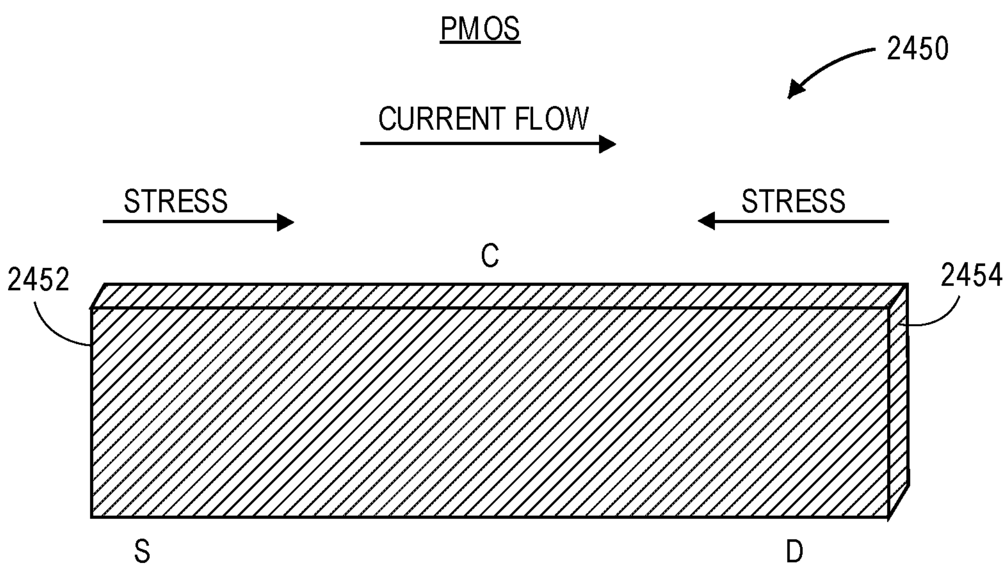
FIG. 24B illustrates an angled view of a fin having compressive uniaxial stress, in accordance with an embodiment of the present disclosure.

Referring to FIG. 24B, a semiconductor fin 2450 has a discrete channel region (C) disposed therein. A source region (S) and a drain region (D) are disposed in the semiconductor fin 2450, on either side of the channel region (C). The discrete channel region of the semiconductor fin 2450 has a current flow direction along the direction of a uniaxial compressive stress (arrows pointed toward one another and from ends 2452 and 2454), from the source region (S) to the drain region (D). Accordingly, embodiments described herein may be implemented to improve transistor mobility and drive current, allowing for faster performing circuits and chips.

In another aspect, there may be a relationship between locations where gate line cuts (poly cuts) are made and fin-trim isolation (FTI) local fin cuts are made. In an embodiment, FTI local fin cuts are made only in locations where poly cuts are made. In one such embodiment, however, an FTI cut is not necessarily made at every location where a poly cut is made.

Figure 25A:
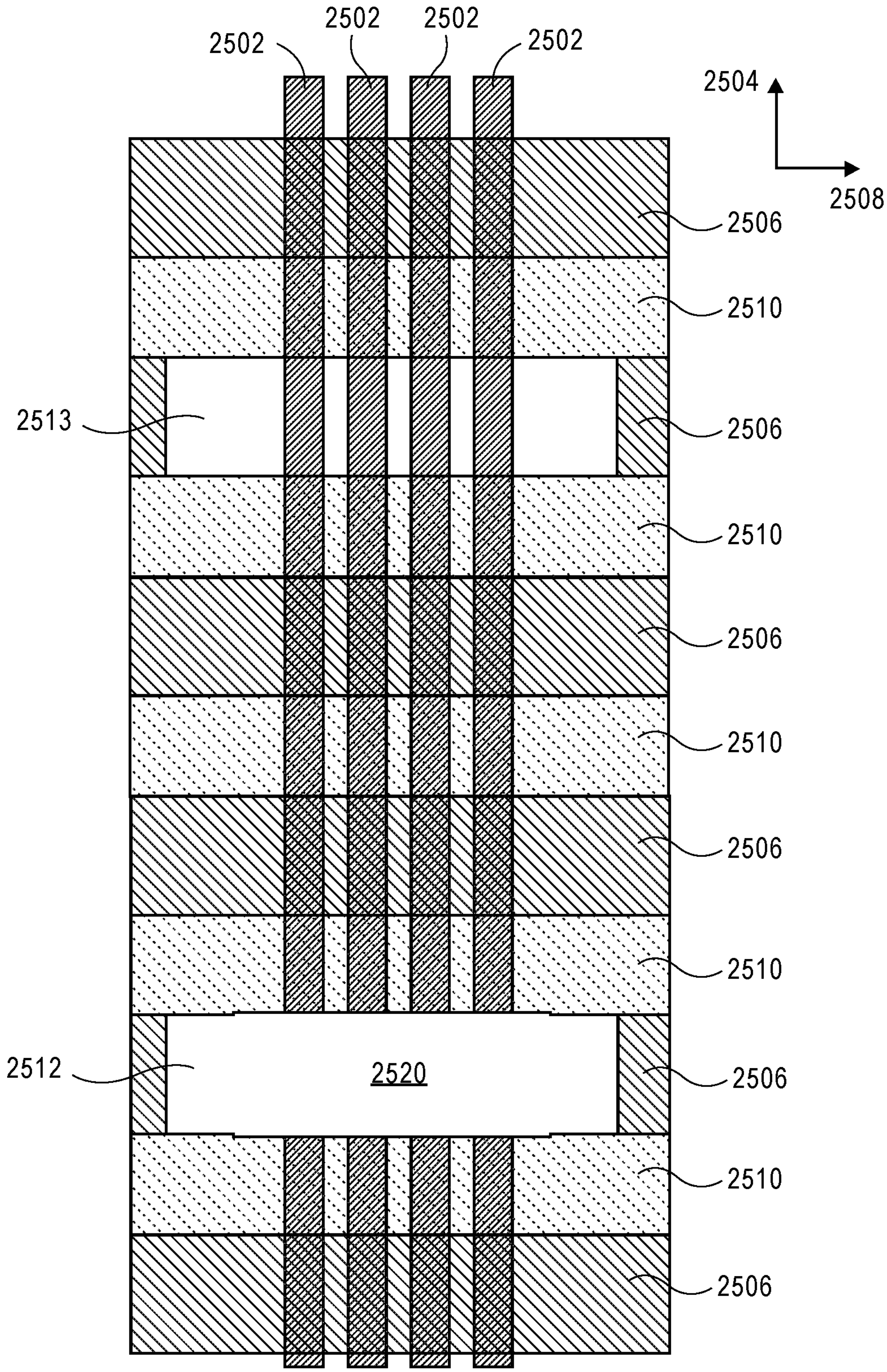
FIGS. 25A and 25B illustrate plan views representing various operations in a method of patterning of fins with single gate spacing for forming a local isolation structure in select gate line cut locations, in accordance with an embodiment of the present disclosure.
Figure 25B:
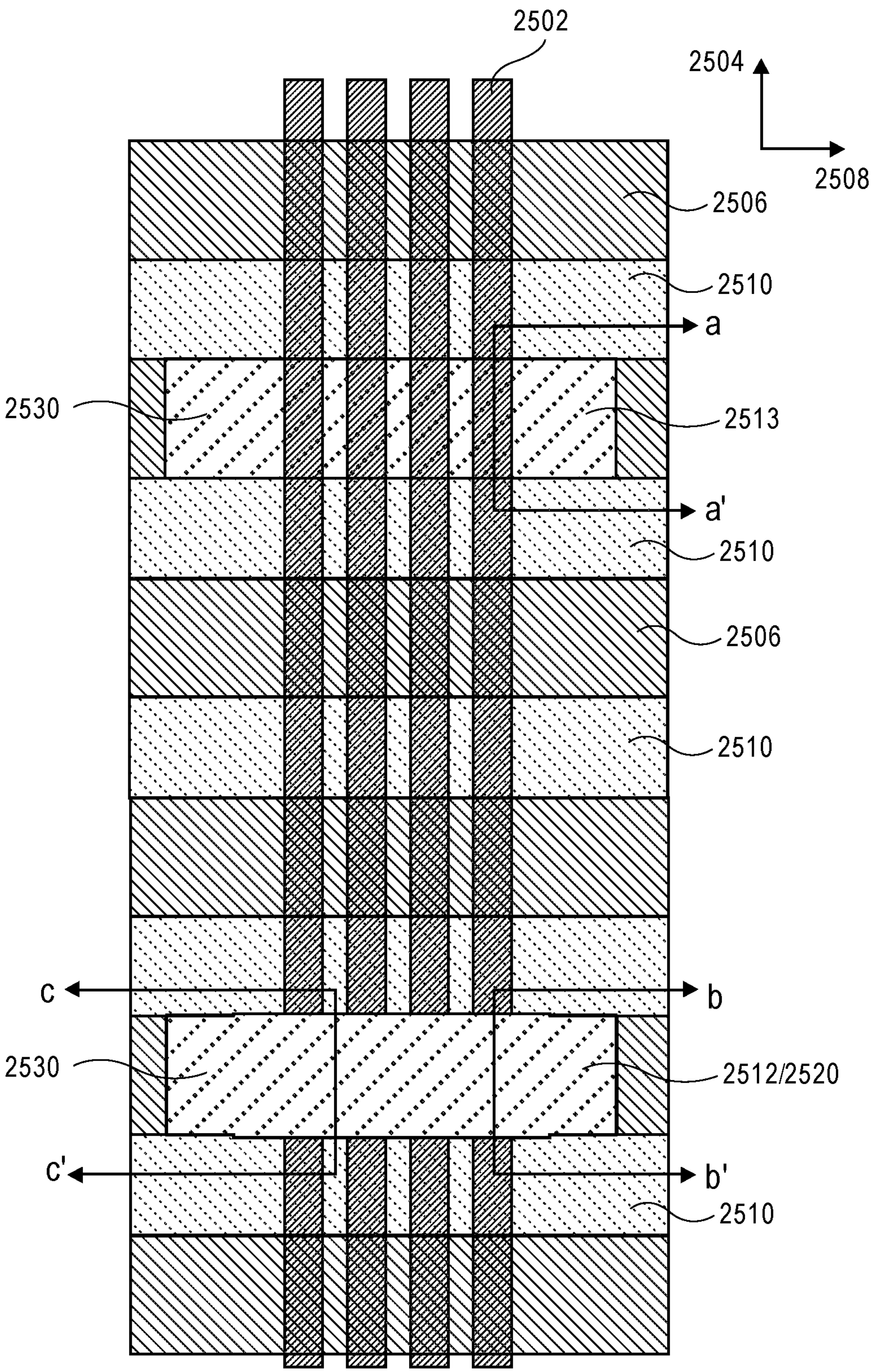

FIGS. 25A and 25B illustrate plan views representing various operations in a method of patterning of fins with single gate spacing for forming a local isolation structure in select gate line cut locations, in accordance with an embodiment of the present disclosure.

Referring to FIG. 25A, a method of fabricating an integrated circuit structure includes forming a plurality of fins 2502, individual ones of the plurality of fins 2502 having a longest dimension along a first direction 2504. A plurality of gate structures 2506 is over the plurality of fins 2502, individual ones of the gate structures 2506 having a longest dimension along a second direction 2508 orthogonal to the first direction 2504. In an embodiment, the gate structures 2506 are sacrificial or dummy gate lines, e.g., fabricated from polycrystalline silicon. In one embodiment, the plurality of fins 2502 are silicon fins and are continuous with a portion of an underlying silicon substrate.

Referring again to FIG. 25A, a dielectric material structure 2510 is formed between adjacent ones of the plurality of gate structures 2506. Portions 2512 and 2513 of two of the plurality of gate structures 2506 are removed to expose portions of each of the plurality of fins 2502. In an embodiment, removing the portions 2512 and 2513 of the two of the gate structures 2506 involves using a lithographic window wider than a width of each of the portions 2512 and 2513 of the gate structures 2506. The exposed portion of each of the plurality of fins 2502 at location 2512 is removed to form a cut region 2520. In an embodiment, the exposed portion of each of the plurality of fins 2502 is removed using a dry or plasma etch process. However, the exposed portion of each of the plurality of fins 2502 at location 2513 is masked from removal. In an embodiment, the region 2512/2520 represents both a poly cut and an FTI local fin cut. However, the location 2513 represents a poly cut only.

Referring to FIG. 25B, the location 2512/2520 of the poly cut and FTI local fin cut and the location 2513 of the poly cut are filled with insulating structures 2530 such as a dielectric plugs. Exemplary insulating structures or "poly cut" or "plug" structure are described below.

Figure 26C:
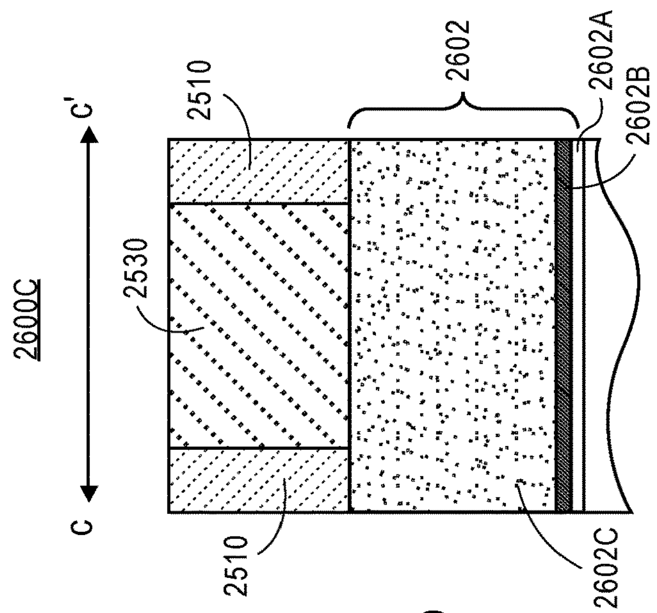
FIGS. 26A-26C illustrate cross-sectional views of various possibilities for dielectric plugs for poly cut and fin trim isolation (FTI) local fin cut locations and poly cut only locations for various regions of the structure of FIG. 25B, in accordance with an embodiment of the present disclosure.
Figure 26B:
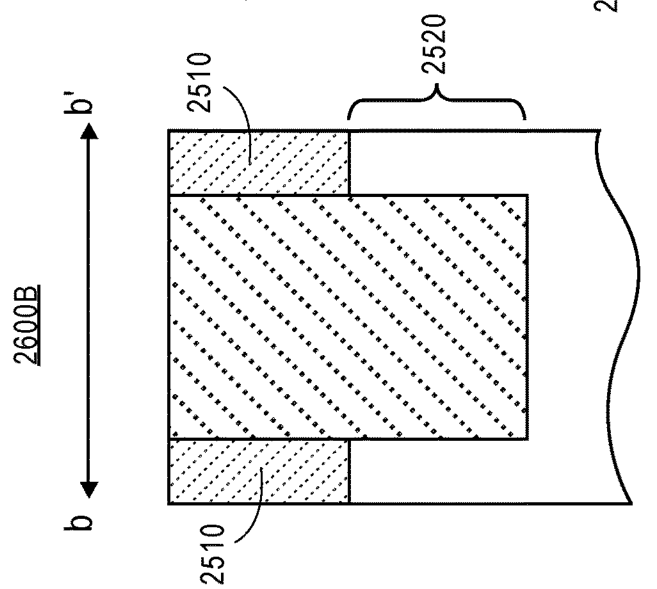
Figure 26A:
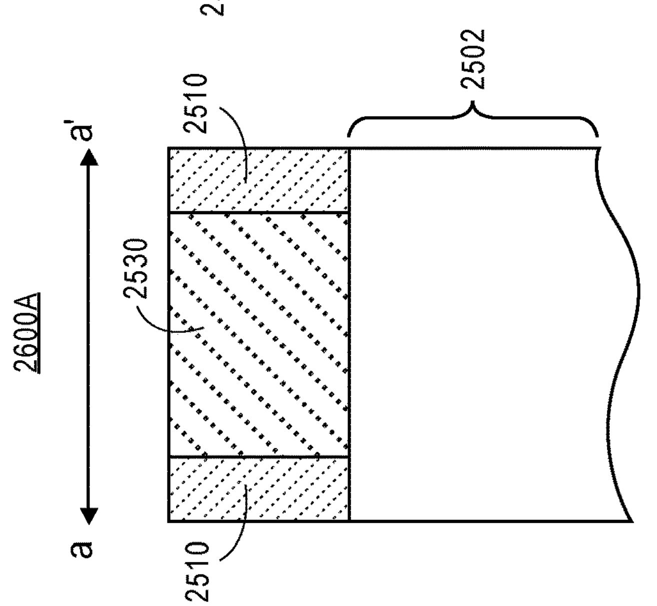

FIGS. 26A-26C illustrate cross-sectional views of various possibilities for dielectric plugs for poly cut and FTI local fin cut locations and poly cut only locations for various regions of the structure of FIG. 25B, in accordance with an embodiment of the present disclosure.

Referring to FIG. 26A, a cross-sectional view of a portion 2600A of the dielectric plug 2530 at location 2513 is shown along the a-a' axis of the structure of FIG. 25B. The portion 2600A of the dielectric plug 2530 is shown on an uncut fin 2502 and between dielectric material structures 2510.

Referring to FIG. 26B, a cross-sectional view of a portion 2600B of the dielectric plug 2530 at location 2512 is shown along the b-b' axis of the structure of FIG. 25B. The portion 2600B of the dielectric plug 2530 is shown on an cut fin location 2520 and between dielectric material structures 2510.

Referring to FIG. 26C, a cross-sectional view of a portion 2600C of the dielectric plug 2530 at location 2512 is shown along the c-c' axis of the structure of FIG. 25B. The portion 2600C of the dielectric plug 2530 is shown on a trench isolation structure 2602 between fins 2502 and between dielectric material structures 2510. In an embodiment, examples of which are described above, the trench isolation structure 2602 includes a first insulating layer 2602A, a second insulating layer 2602B, and an insulating fill material 2602C on the second insulating layer 2602B.

Referring collectively to FIGS. 25A, 25B and 26A-26C, in accordance with an embodiment of the present disclosure, a method of fabricating an integrated circuit structure includes forming a plurality of fins, individual ones of the plurality of fins along a first direction. A plurality of gate structures is formed over the plurality of fins, individual ones of the gate structures along a second direction orthogonal to the first direction. A dielectric material structure is formed between adjacent ones of the plurality of gate structures. A portion of a first of the plurality of gate structures is removed to expose a first portion of each of the plurality of fins. A portion of a second of the plurality of gate structures is removed to expose a second portion of each of the plurality of fins. The exposed first portion of each of the plurality of fins is removed, but the exposed second portion of each of the plurality of fins is not removed. A first insulating structure is formed in a location of the removed first portion of the plurality of fins. A second insulating structure is formed in a location of the removed portion of the second of the plurality of gate structures.

In one embodiment, removing the portions of the first and second of the plurality of gate structures involves using a lithographic window wider than a width of each of the portions of the first and second of the plurality of gate structures. In one embodiment, removing the exposed first portion of each of the plurality of fins involves etching to a depth less than a height of the plurality of fins. In one such embodiment, the depth is greater than a depth of source or drain regions in the plurality of fins. In one embodiment, the plurality of fins include silicon and are continuous with a portion of a silicon substrate.

Referring collectively to FIGS. 16A, 25A, 25B and 26A-26C, in accordance with another embodiment of the present disclosure, an integrated circuit structure includes a fin including silicon, the fin having a longest dimension along a first direction. An isolation structure is over an upper portion of the fin, the isolation structure having a center along the first direction. A first gate structure is over the upper portion of the fin, the first gate structure having a longest dimension along a second direction orthogonal to the first direction. A center of the first gate structure is spaced apart from the center of the isolation structure by a pitch along the first direction. A second gate structure is over the upper portion of the fin, the second gate structure having a longest dimension along the second direction. A center of the second gate structure is spaced apart from the center of the first gate structure by the pitch along the first direction. A third gate structure is over the upper portion of the fin opposite a side of the isolation structure from the first and second gate structures, the third gate structure having a longest dimension along the second direction. A center of the third gate structure is spaced apart from the center of the isolation structure by the pitch along the first direction.

In one embodiment, each of the first gate structure, the second gate structure and the third gate structure includes a gate electrode on and between sidewalls of a high-k gate dielectric layer. In one such embodiment, each of the first gate structure, the second gate structure and the third gate structure further includes an insulating cap on the gate electrode and on and the sidewalls of the high-k gate dielectric layer.

In one embodiment, a first epitaxial semiconductor region is on the upper portion of the fin between the first gate structure and the isolation structure. A second epitaxial semiconductor region is on the upper portion of the fin between the first gate structure and the second gate structure. A third epitaxial semiconductor region on the upper portion of the fin between the third gate structure and the isolation structure. In one such embodiment, the first, second and third epitaxial semiconductor regions include silicon and germanium. In another such embodiment, the first, second and third epitaxial semiconductor regions includes silicon.

Referring collectively to FIGS. 16A, 25A, 25B and 26A-26C, in accordance with another embodiment of the present disclosure, an integrated circuit structure includes a shallow trench isolation (STI) structure between a pair of semiconductor fins, the STI structure having a longest dimension along a first direction. An isolation structure is on the STI structure, the isolation structure having a center along the first direction. A first gate structure on the STI structure, the first gate structure having a longest dimension along a second direction orthogonal to the first direction. A center of the first gate structure is spaced apart from the center of the isolation structure by a pitch along the first direction. A second gate structure is on the STI structure, the second gate structure having a longest dimension along the second direction. A center of the second gate structure is spaced apart from the center of the first gate structure by the pitch along the first direction. A third gate structure is on the STI structure opposite a side of the isolation structure from the first and second gate structures, the third gate structure having a longest dimension along the second direction. A center of the third gate structure is spaced apart from the center of the isolation structure by the pitch along the first direction.

In one embodiment, each of the first gate structure, the second gate structure and the third gate structure includes a gate electrode on and between sidewalls of a high-k gate dielectric layer. In one such embodiment, each of the first gate structure, the second gate structure and the third gate structure further includes an insulating cap on the gate electrode and on and the sidewalls of the high-k gate dielectric layer. In one embodiment, the pair of semiconductor fins is a pair of silicon fins.

In another aspect, whether a poly cut and FTI local fin cut together or a poly cut only, the insulating structures or dielectric plugs used to fill the cut locations may laterally extend into dielectric spacers of the corresponding cut gate line, or even beyond the dielectric spacers of the corresponding cut gate line.

Figure 27A:
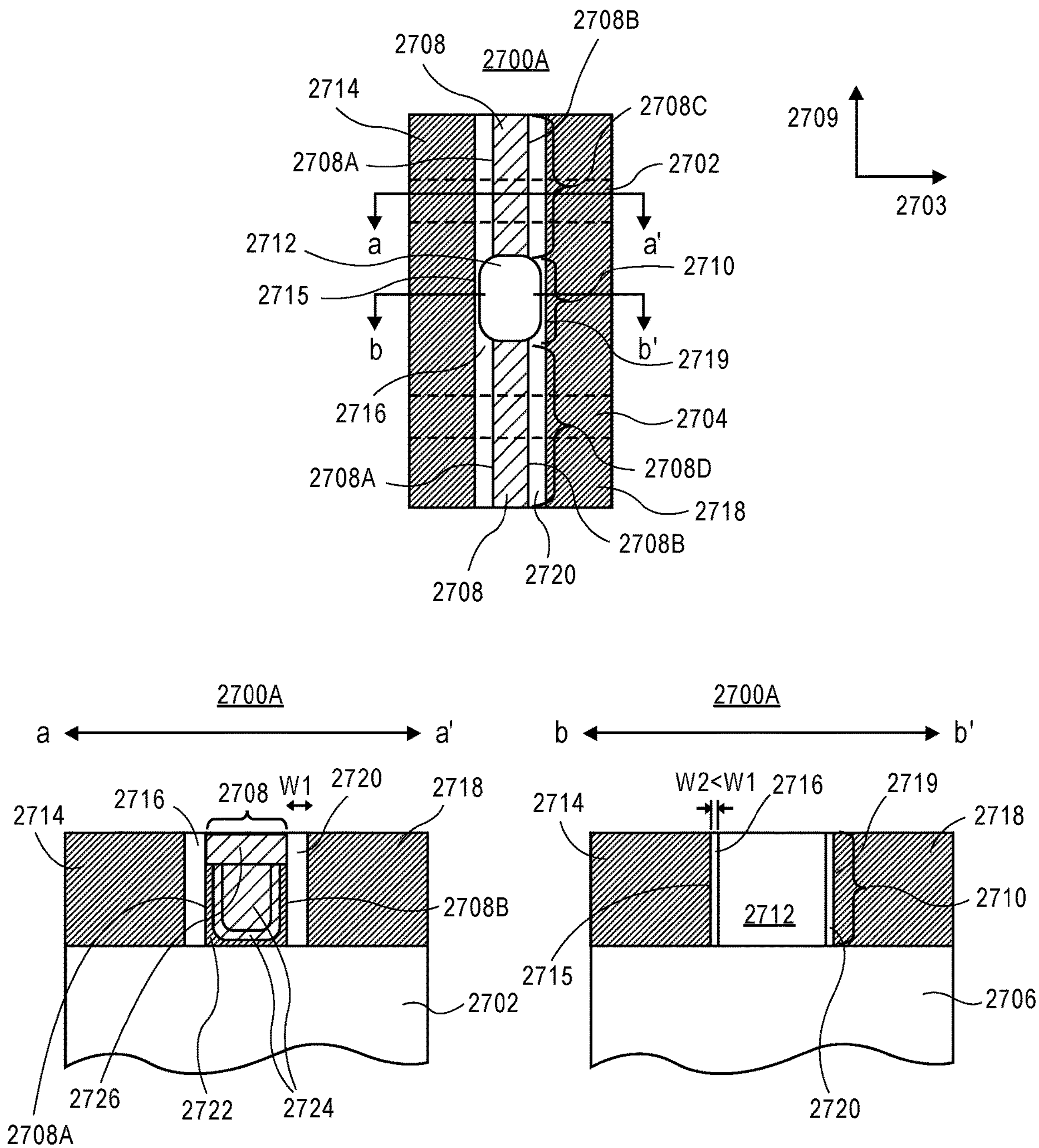
FIG. 27A illustrates a plan view and corresponding cross-sectional view of an integrated circuit structure having a gate line cut with a dielectric plug that extends into dielectric spacers of the gate line, in accordance with an embodiment of the present disclosure.

In a first example where trench contact shape is not affected by a poly cut dielectric plug, FIG. 27A illustrates a plan view and corresponding cross-sectional view of an integrated circuit structure having a gate line cut with a dielectric plug that extends into dielectric spacers of the gate line, in accordance with an embodiment of the present disclosure.

Referring to FIG. 27A, an integrated circuit structure 2700A includes a first silicon fin 2702 having a longest dimension along a first direction 2703. A second silicon fin 2704 has a longest dimension along the first direction 2703. An insulator material 2706 is between the first silicon fin 2702 and the second silicon fin 2704. A gate line 2708 is over the first silicon fin 2702 and over the second silicon fin 2704 along a second direction 2709, the second direction 2709 orthogonal to the first direction 2703. The gate line 2708 has a first side 2708A and a second side 2708B, and has a first end 2708C and a second end 2708D. The gate line 2708 has a discontinuity 2710 over the insulator material 2706, between the first end 2708C and the second end 2708D of the gate line 2708. The discontinuity 2710 is filled by a dielectric plug 2712.

A trench contact 2714 is over the first silicon fin 2702 and over the second silicon fin 2704 along the second direction 2709 at the first side 2708A of the gate line 2708. The trench contact 2714 is continuous over the insulator material 2706 at a location 2715 laterally adjacent to the dielectric plug 2712. A dielectric spacer 2716 is laterally between the trench contact 2714 and the first side 2708A of the gate line 2708. The dielectric spacer 2716 is continuous along the first side 2708A of the gate line 2708 and the dielectric plug 2712. The dielectric spacer 2716 has a width (W2) laterally adjacent to the dielectric plug 2712 thinner than a width (W1) laterally adjacent to the first side 2708A of the gate line 2708.

In one embodiment, a second trench contact 2718 is over the first silicon fin 2702 and over the second silicon fin 2704 along the second direction 2709 at the second side 2708B of the gate line 2708. The second trench contact 2718 is continuous over the insulator material 2706 at a location 2719 laterally adjacent to the dielectric plug 2712. In one such embodiment, a second dielectric spacer 2720 is laterally between the second trench contact 2718 and the second side 2708B of the gate line 2708. The second dielectric spacer 2720 is continuous along the second side 2708B of the gate line 2708 and the dielectric plug 2712. The second dielectric spacer has a width laterally adjacent to the dielectric 2712 plug thinner than a width laterally adjacent to the second side 2708B of the gate line 2708.

In one embodiment, the gate line 2708 includes a high-k gate dielectric layer 2722, a gate electrode 2724, and a dielectric cap layer 2726. In one embodiment, the dielectric plug 2712 includes a same material as the dielectric spacer 2714 but is discrete from the dielectric spacer 2714. In one embodiment, the dielectric plug 2712 includes a different material than the dielectric spacer 2714.

Figure 27B:
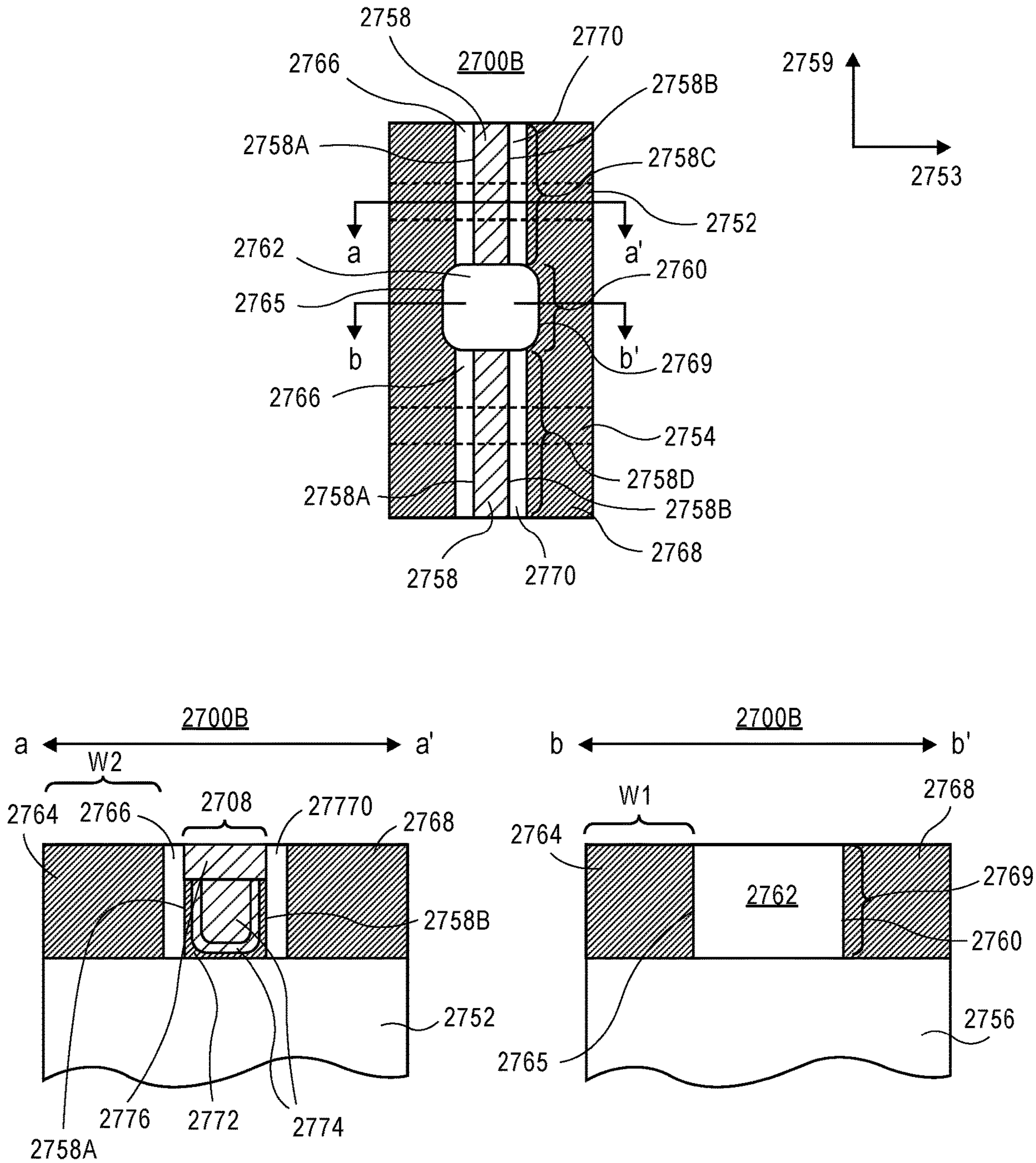
FIG. 27B illustrates a plan view and corresponding cross-sectional view of an integrated circuit structure having a gate line cut with a dielectric plug that extends beyond dielectric spacers of the gate line, in accordance with another embodiment of the present disclosure.

In a second example where trench contact shape is affected by a poly cut dielectric plug, FIG. 27B illustrates a plan view and corresponding cross-sectional view of an integrated circuit structure having a gate line cut with a dielectric plug that extends beyond dielectric spacers of the gate line, in accordance with another embodiment of the present disclosure.

Referring to FIG. 27B, an integrated circuit structure 2700B includes a first silicon fin 2752 having a longest dimension along a first direction 2753. A second silicon fin 2754 has a longest dimension along the first direction 2753. An insulator material 2756 is between the first silicon fin 2752 and the second silicon fin 2754. A gate line 2758 is over the first silicon fin 2752 and over the second silicon fin 2754 along a second direction 2759, the second direction 2759 orthogonal to the first direction 2753. The gate line 2758 has a first side 2758A and a second side 2758B, and has a first end 2758C and a second end 2758D. The gate line 2758 has a discontinuity 2760 over the insulator material 2756, between the first end 2758C and the second end 2758D of the gate line 2758. The discontinuity 2760 is filled by a dielectric plug 2762.

A trench contact 2764 is over the first silicon fin 2752 and over the second silicon fin 2754 along the second direction 2759 at the first side 2758A of the gate line 2758. The trench contact 2764 is continuous over the insulator material 2756 at a location 2765 laterally adjacent to the dielectric plug 2762. A dielectric spacer 2766 is laterally between the trench contact 2764 and the first side 2758A of the gate line 2758. The dielectric spacer 2766 is along the first side 2758A of the gate line 2758 but is not along the dielectric plug 2762, resulting in a discontinuous dielectric spacer 2766. The trench contact 2764 has a width (W1) laterally adjacent to the dielectric plug 2762 that is thinner than a width (W2) laterally adjacent to the dielectric spacer 2766.

In one embodiment, a second trench contact 2768 is over the first silicon fin 2752 and over the second silicon fin 2754 along the second direction 2759 at the second side 2758B of the gate line 2758. The second trench contact 2768 is continuous over the insulator material 2756 at a location 2769 laterally adjacent to the dielectric plug 2762. In one such embodiment, a second dielectric spacer 2770 is laterally between the second trench contact 2768 and the second side 2758B of the gate line 2758. The second dielectric spacer 2770 is along the second side 2508B of the gate line 2758 but is not along the dielectric plug 2762, resulting in a discontinuous dielectric spacer 2770. The second trench contact 2768 has a width laterally adjacent to the dielectric plug 2762 thinner than a width laterally adjacent to the second dielectric spacer 2770.

In one embodiment, the gate line 2758 includes a high-k gate dielectric layer 2772, a gate electrode 2774, and a dielectric cap layer 2776. In one embodiment, the dielectric plug 2762 includes a same material as the dielectric spacer 2764 but is discrete from the dielectric spacer 2764. In one embodiment, the dielectric plug 2762 includes a different material than the dielectric spacer 2764.

In a third example where a dielectric plug for a poly cut location tapers from the top of the plug to the bottom of the plug, FIGS. 28A-28F illustrate cross-sectional views of various operations in a method of fabricating an integrated circuit structure having a gate line cut with a dielectric plug with an upper portion that extends beyond dielectric spacers of the gate line and a lower portion that extends into the dielectric spacers of the gate line, in accordance with another embodiment of the present disclosure.

Figure 28A:
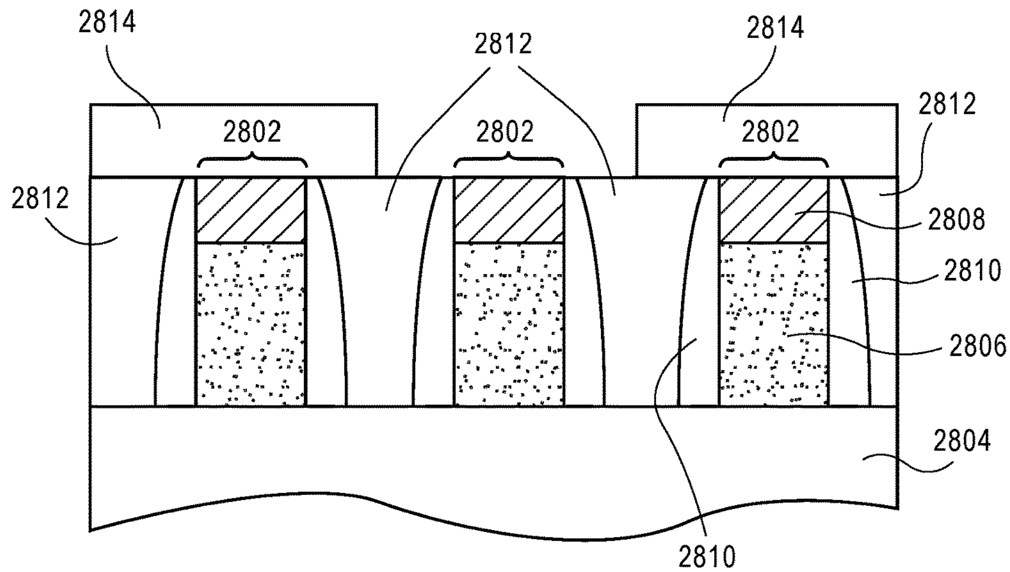
FIGS. 28A-28F illustrate cross-sectional views of various operations in a method of fabricating an integrated circuit structure having a gate line cut with a dielectric plug with an upper portion that extends beyond dielectric spacers of the gate line and a lower portion that extends into the dielectric spacers of the gate line, in accordance with another embodiment of the present disclosure.

Referring to FIG. 28A, a plurality of gate lines 2802 is formed over a structure 2804, such as over a trench isolation structure between semiconductor fins. In one embodiment, each of the gate lines 2802 is a sacrificial or dummy gate line, e.g., with a dummy gate electrode 2806 and a dielectric cap 2808. Portions of such sacrificial or dummy gate lines may later replaced in a replacement gate process, e.g., subsequent to the below described dielectric plug formation. Dielectric spacers 2810 are along sidewalls of the gate lines 2802. A dielectric material 2812, such as an inter-dielectric layer, is between the gate lines 2802. A mask 2814 is formed and lithographically patterned to expose a portion of one of the gate lines 2802.

Figure 28B:
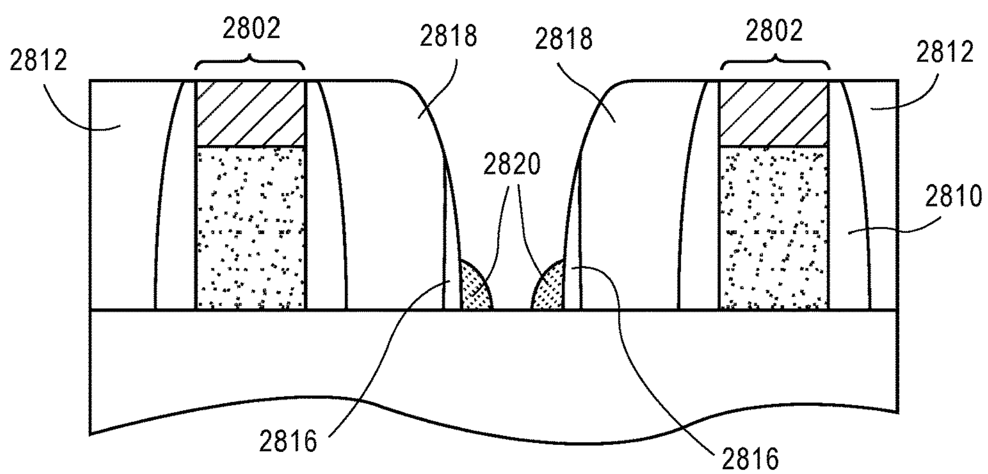

Referring to FIG. 28B, with the mask 2814 in place, the center gate line 2802 is removed with an etch process. The mask 2814 is then removed. In an embodiment, the etch process erodes portions of the dielectric spacers 2810 of the removed gate line 2802, forming reduced dielectric spacers 2816. Additionally, upper portions of the dielectric material 2812 exposed by the mask 2814 are eroded in the etch process, forming eroded dielectric material portions 2818. In a particular embodiment, residual dummy gate material 2820, such as residual polycrystalline silicon, remains in the structure, as an artifact of an incomplete etch process.

Figure 28C:
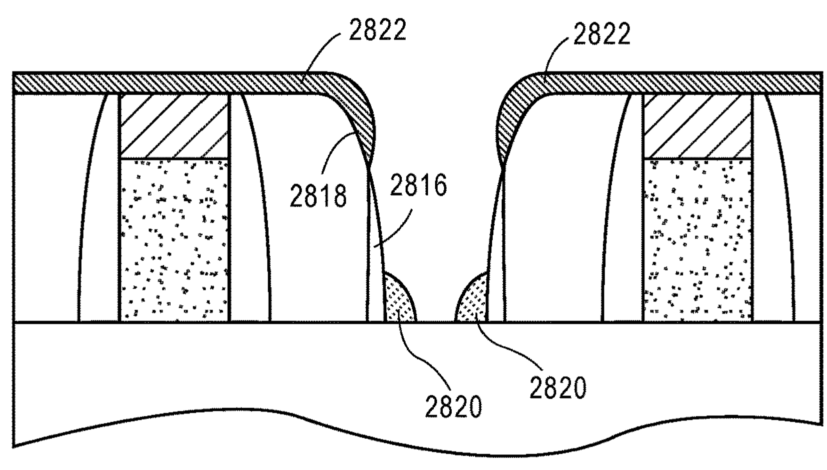

Referring to FIG. 28C, a hardmask 2822 is formed over the structure of FIG. 28B. The hardmask 2822 may be conformal with the upper portion of the structure of FIG. 2B and, in particular, with the eroded dielectric material portions 2818.

Figure 28D:
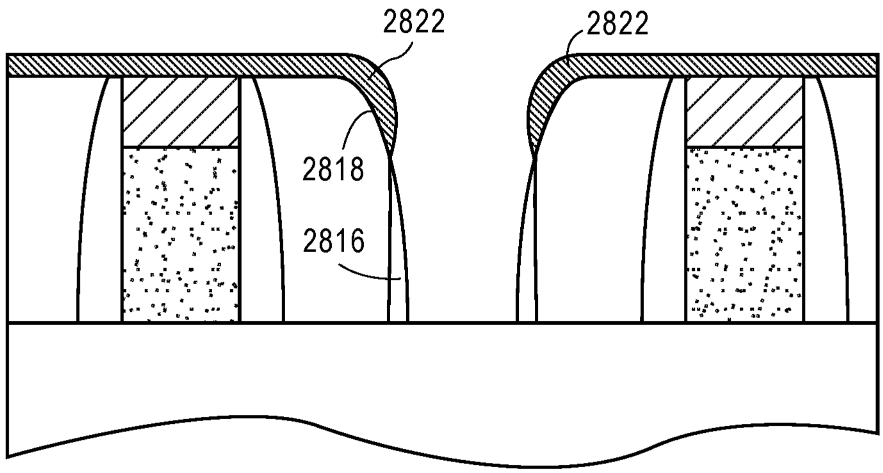

Referring to FIG. 28D, the residual dummy gate material 2820 is removed, e.g., with an etch process, which may be similar in chemistry to the etch process used to remove the central one of the gate lines 2802. In an embodiment, the hardmask 2822 protects the eroded dielectric material portions 2818 from further erosion during the removal of the residual dummy gate material 2820.

Figure 28E:
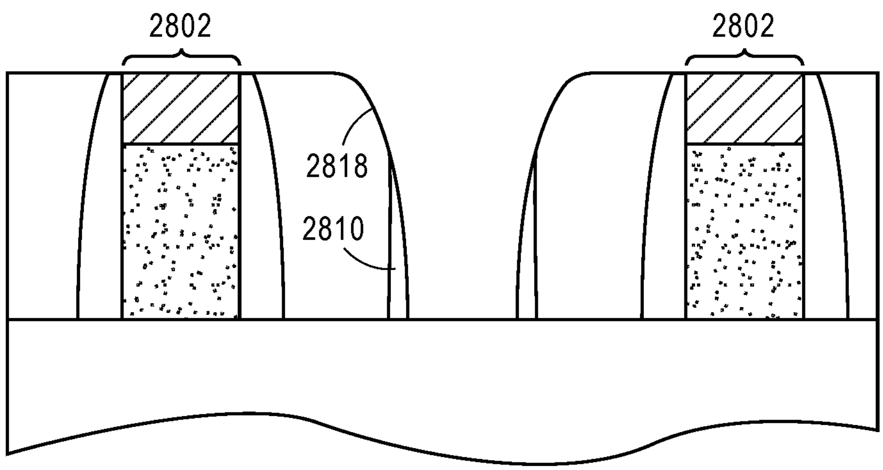

Referring to FIG. 28E, hardmask 2822 is removed. In one embodiment, hardmask 2822 is removed without or essentially without further erosion of the eroded dielectric material portions 2818.

Figure 28F:
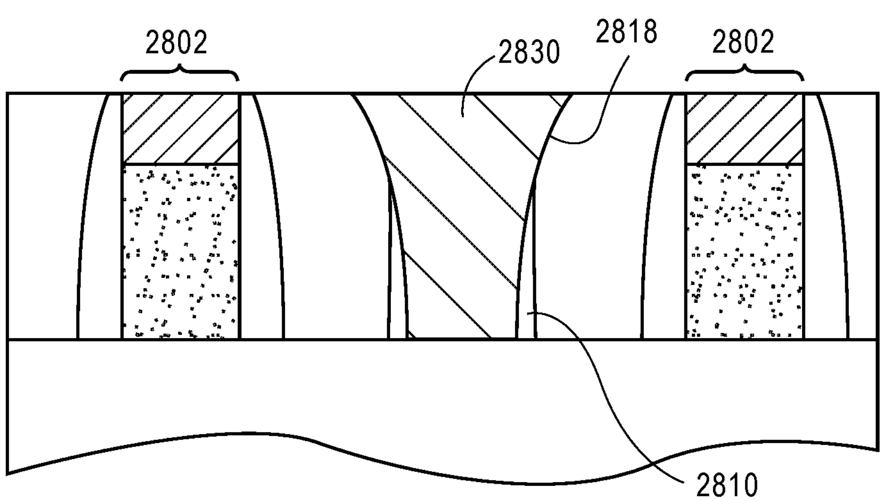

Referring to FIG. 28F, a dielectric plug 2830 is formed in the opening of the structure of FIG. 28E. The upper portion of dielectric plug 2830 is over the eroded dielectric material portions 2818, e.g., effectively beyond original spacers 2810. The lower portion of dielectric plug 2830 is adjacent to the reduced dielectric spacers 2816, e.g., effectively into but not beyond the original spacers 2810. As a result, dielectric plug 2830 has a tapered profile as depicted in FIG. 28F. It is to be appreciated that dielectric plug 2830 may be fabricated from materials and process described above for other poly cut or FTI plugs or fin end stressors.

In another aspect, portions of a placeholder gate structure or dummy gate structure may be retained over trench isolation regions beneath a permanent gate structure as a protection against erosion of the trench isolation regions during a replacement gate process. For example, FIGS. 29A-29C illustrate a plan view and corresponding cross-sectional views of an integrated circuit structure having residual dummy gate material at portions of the bottom of a permanent gate stack, in accordance with an embodiment of the present disclosure.

Figure 29A:
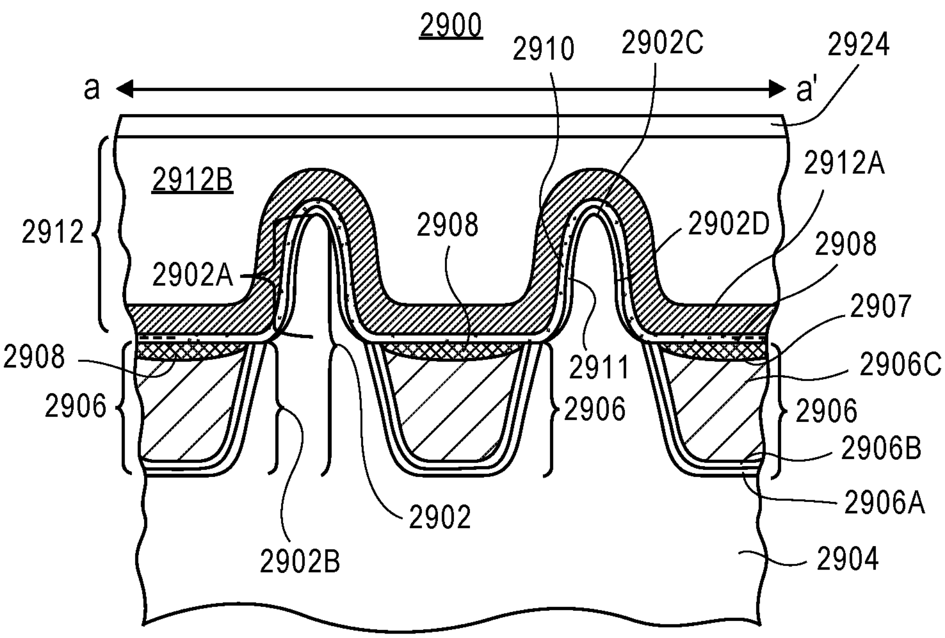
FIGS. 29A-29C illustrate a plan view and corresponding cross-sectional views of an integrated circuit structure having residual dummy gate material at portions of the bottom of a permanent gate stack, in accordance with an embodiment of the present disclosure.
Figure 29B:
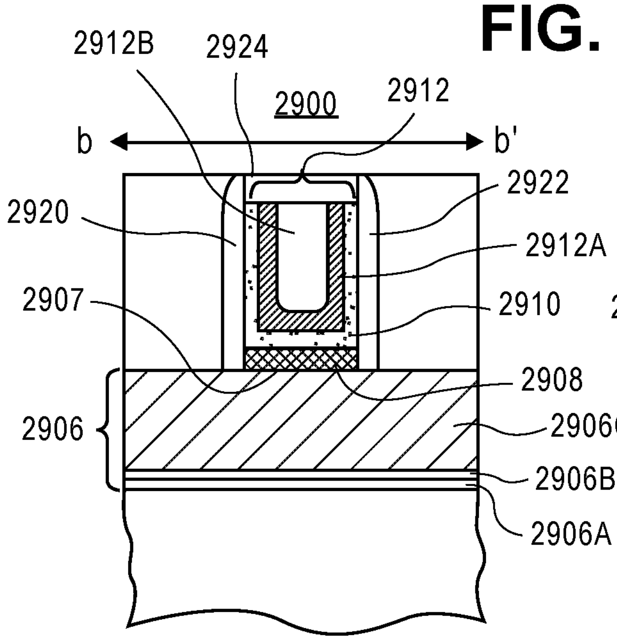
Figure 29C:
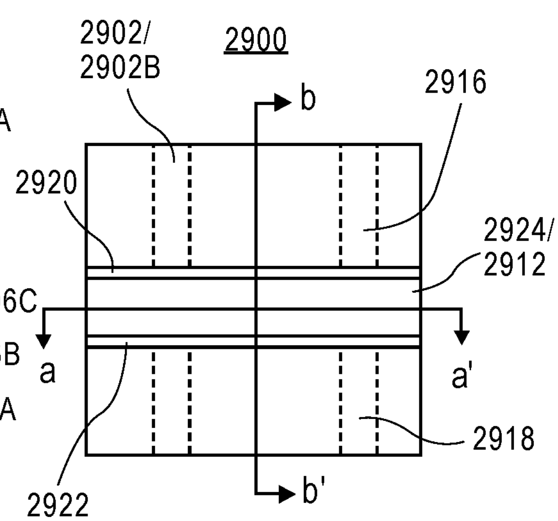

Referring to FIGS. 29A-29C, an integrated circuit structure includes a fin 2902, such as a silicon fin, protruding from a semiconductor substrate 2904. The fin 2902 has a lower fin portion 2902B and an upper fin portion 2902A. The upper fin portion 2902A has a top 2902C and sidewalls 2902D. An isolation structure 2906 surrounds the lower fin portion 2902B. The isolation structure 2906 includes an insulating material 2906C having a top surface 2907. A semiconductor material 2908 is on a portion of the top surface 2907 of the insulating material 2906C. The semiconductor material 2908 is separated from the fin 2902.

A gate dielectric layer 2910 is over the top 2902C of the upper fin portion 2902A and laterally adjacent the sidewalls 2902D of the upper fin portion 2902A. The gate dielectric layer 2910 is further on the semiconductor material 2908 on the portion of the top surface 2907 of the insulating material 2906C. An intervening additional gate dielectric layer 2911, such as an oxidized portion of the fin 2902 may be between the gate dielectric layer 2910 over the top 2902C of the upper fin portion 2902A and laterally adjacent the sidewalls 2902D of the upper fin portion 2902A. A gate electrode 2912 is over the gate dielectric layer 2910 over the top 2902C of the upper fin portion 2902A and laterally adjacent the sidewalls 2902D of the upper fin portion 2902A. The gate electrode 2912 is further over the gate dielectric layer 2910 on the semiconductor material 2908 on the portion of the top surface 2907 of the insulating material 2906C. A first source or drain region 2916 is adjacent a first side of the gate electrode 2912, and a second source or drain region 2918 is adjacent a second side of the gate electrode 2912, the second side opposite the first side. In an embodiment, examples of which are described above, the isolation structure 2906 includes a first insulating layer 2906A, a second insulating layer 2906B, and the insulating material 2906C.

In one embodiment, the semiconductor material 2908 on the portion of the top surface 2907 of the insulating material 2906C is or includes polycrystalline silicon. In one embodiment, the top surface 2907 of the insulating material 2906C has a concave depression, and is depicted, and the semiconductor material 2908 is in the concave depression. In one embodiment, the isolation structure 2906 includes a second insulating material (2906A or 2906B or both 2906A/2906B)

along a bottom and sidewalls of the insulating material 2906C. In one such embodiment, the portion of the second insulating material (2906A or 2906B or both 2906A/2906B) along the sidewalls of the insulating material 2906C has a top surface above an uppermost surface of the insulating material 2906C, as is depicted. In one embodiment, the top surface of the second insulating material (2906A or 2906B or both 2906A/2906B) is above or co-planar with an uppermost surface of the semiconductor material 2908.

In one embodiment, the semiconductor material 2908 on the portion of the top surface 2907 of the insulating material 2906C does not extend beyond the gate dielectric layer 2910. That is, from a plan view perspective, the location of the semiconductor material 2908 is limited to the region covered by the gate stack 2912/2910. In one embodiment, a first dielectric spacer 2920 is along the first side of the gate electrode 2912. A second dielectric spacer 2922 is along the second side of the gate electrode 2912. In one such embodiment, the gate dielectric layer 2910 further extends along sidewalls of the first dielectric spacer 2920 and the second dielectric spacer 2922, as is depicted in FIG. 29B.

In one embodiment, the gate electrode 2912 includes a conformal conductive layer 2912A (e.g., a workfunction layer). In one such embodiment, the workfunction layer 2912A includes titanium and nitrogen. In another embodiment, the workfunction layer 2912A includes titanium, aluminum, carbon and nitrogen. In one embodiment, the gate electrode 2912 further includes a conductive fill metal layer 2912B over the workfunction layer 2912A. In one such embodiment, the conductive fill metal layer 2912B includes tungsten. In a particular embodiment, the conductive fill metal layer 2912B includes 95 or greater atomic percent tungsten and 0.1 to 2 atomic percent fluorine. In one embodiment, an insulating cap 2924 is on the gate electrode 2912 and may extend over the gate dielectric layer 2910, as is depicted in FIG. 29B.

FIGS. 30A-30D illustrate cross-sectional views of various operations in a method of fabricating an integrated circuit structure having residual dummy gate material at portions of the bottom of a permanent gate stack, in accordance with another embodiment of the present disclosure. The perspective show is along a portion of the a-a' axis of the structure of FIG. 29C.

Figure 30A:
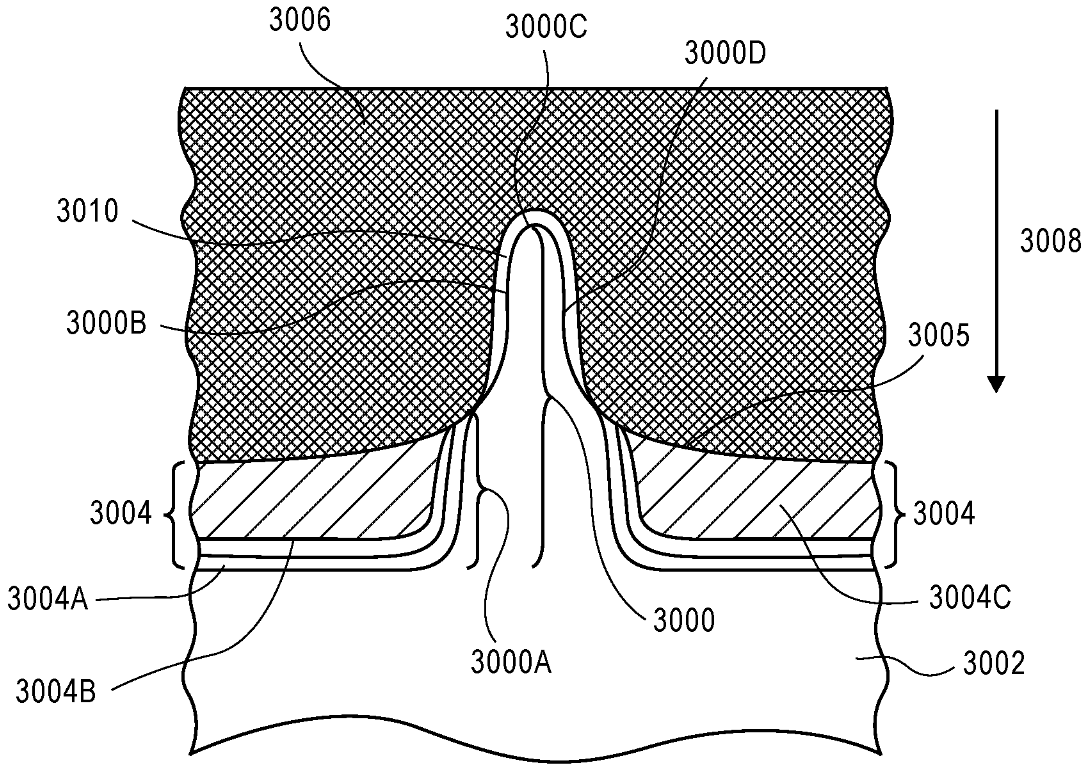
FIGS. 30A-30D illustrate cross-sectional views of various operations in a method of fabricating an integrated circuit structure having residual dummy gate material at portions of the bottom of a permanent gate stack, in accordance with another embodiment of the present disclosure.

Referring to FIG. 30A, a method of fabricating an integrated circuit structure includes forming a fin 3000 from a semiconductor substrate 3002. The fin 3000 has a lower fin portion 3000A and an upper fin portion 3000B. The upper fin portion 3000B has a top 3000C and sidewalls 3000D. An isolation structure 3004 surrounds the lower fin portion 3000A. The isolation structure 3004 includes an insulating material 3004C having a top surface 3005. A placeholder gate electrode 3006 is over the top 3000C of the upper fin portion 3000B and laterally adjacent the sidewalls 3000D of the upper fin portion 3000B. The placeholder gate electrode 3006 includes a semiconductor material.

Although not depicted from the perspective of FIG. 30A (but locations for which are shown in FIG. 29C), a first source or drain region may be formed adjacent a first side of the placeholder gate electrode 3006, and a second source or drain region may be formed adjacent a second side of the placeholder gate electrode 3006, the second side opposite the first side. Additionally, gate dielectric spacers may be formed along the sidewalls of the placeholder gate electrode 3006, and an inter-layer dielectric (ILD) layer may be formed laterally adjacent the placeholder gate electrode 3006.

In one embodiment, the placeholder gate electrode 3006 is or includes polycrystalline silicon. In one embodiment, the top surface 3005 of the insulating material 3004C of the isolation structure 3004 has a concave depression, as is depicted. A portion of the placeholder gate electrode 3006 is in the concave depression. In one embodiment, the isolation structure 3004 includes a second insulating material (3004A or 3004B or both 3004A and 3004B) is along a bottom and sidewalls of the insulating material 3004C, as is depicted. In one such embodiment, the portion of the second insulating material (3004A or 3004B or both 3004A and 3004B) along the sidewalls of the insulating material 3004C has a top surface above at least a portion of the top surface 3005 of the insulating material 3004C. In one embodiment, the top surface of the second insulating material (3004A or 3004B or both 3004A and 3004B) is above a lowermost surface of a portion of the placeholder gate electrode 3006.

Figure 30B:
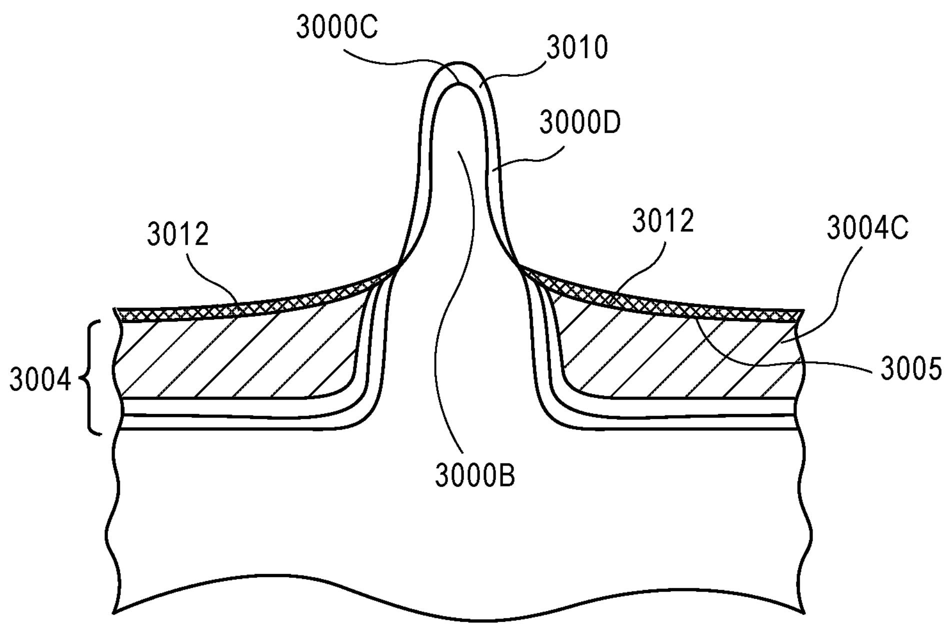

Referring to FIG. 30B, the placeholder gate electrode 3006 is etched from over the top 3000C and sidewalls 3000D of the upper fin portion 3000B, e.g., along direction 3008 of FIG. 30A. The etch process may be referred to as a replacement gate process. In an embodiment, the etching or replacement gate process is incomplete and leaves a portion 3012 of the placeholder gate electrode 3006 on at least a portion of the top surface 3005 of the insulating material 3004C of the isolation structure 3004.

Referring to both FIGS. 30A and 30B, in an embodiment, an oxidized portion 3010 of the upper fin portion 3000B formed prior to forming the placeholder gate electrode 3006 is retained during the etch process, as is depicted. In another embodiment, however, a placeholder gate dielectric layer is formed prior to forming the placeholder gate electrode 3006, and the placeholder gate dielectric layer is removed subsequent to etching the placeholder gate electrode.

Figure 30C:
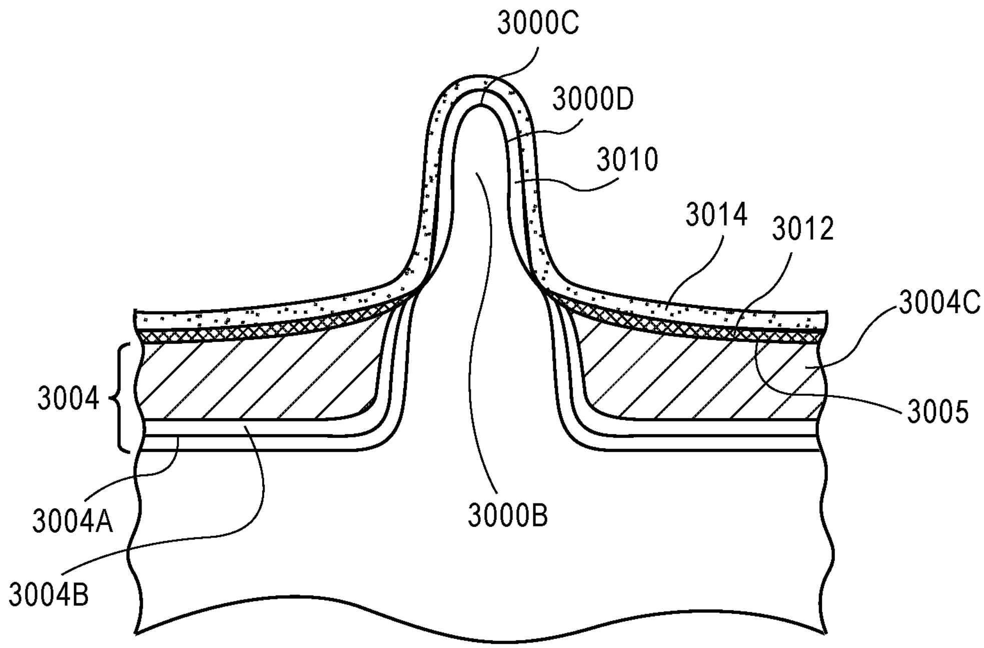

Referring to FIG. 30C, a gate dielectric layer 3014 is formed over the top 3000C of the upper fin portion 3000B and laterally adjacent the sidewalls 3000D of the upper fin portion 3000B. In one embodiment, the gate dielectric layer 3014 is formed on the oxidized portion 3010 of the upper fin portion 3000B over the top 3000C of the upper fin portion 3000B and laterally adjacent the sidewalls 3000D of the upper fin portion 3000B, as is depicted. In another embodiment, the gate dielectric layer 3014 is formed directly on the upper fin portion 3000B over the top of 3000C of the upper fin portion 3000B and laterally adjacent the sidewalls 3000D of the upper fin portion 3000B in the case where the oxidized portion 3010 of the upper fin portion 3000B is removed subsequent to etching the placeholder gate electrode. In either case, in an embodiment, the gate dielectric layer 3014 is further formed on the portion 3012 of the placeholder gate electrode 3006 on the portion of the top surface 3005 of the insulating material 3004C of the isolation structure 3004.

Figure 30D:
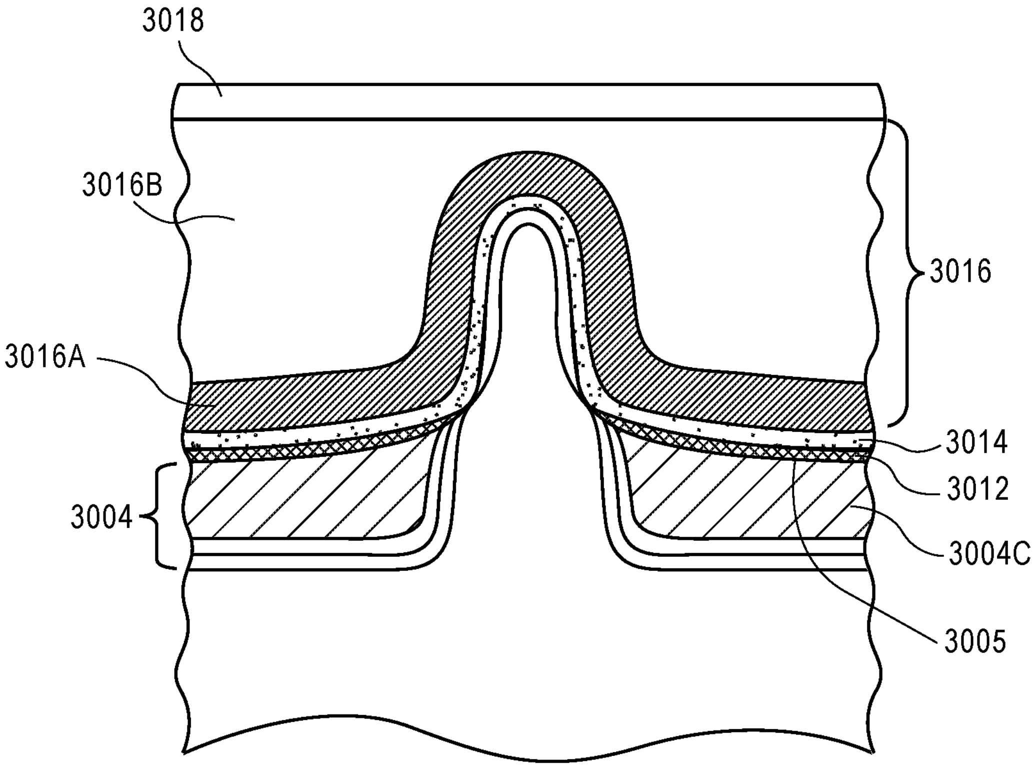

Referring to FIG. 30D, a permanent gate electrode 3016 is formed over the gate dielectric layer 3014 over the top 3000C of the upper fin portion 3000B and laterally adjacent the sidewalls 3000D of the upper fin portion 3000B. The permanent gate electrode 3016 is further over the gate dielectric layer 3014 on the portion 3012 of the placeholder gate electrode 3006 on the portion of the top surface 3005 of the insulating material 3004C.

In one embodiment, forming the permanent gate electrode 3016 includes forming a workfunction layer 3016A. In one such embodiment, the workfunction layer 3016A includes titanium and nitrogen. In another such embodiment, the workfunction layer 3016A includes titanium, aluminum, carbon and nitrogen. In one embodiment, forming the permanent gate electrode 3016 further includes forming a conductive fill metal layer 3016B formed over the workfunction layer 3016A. In one such embodiment, forming the conductive fill metal layer 3016B includes forming a tungsten-containing film using atomic layer deposition (ALD) with a tungsten hexafluoride ($WF_6$) precursor. In an embodiment, an insulating gate cap layer 3018 is formed on the permanent gate electrode 3016.

In another aspect, some embodiments of the present disclosure include an amorphous high-k layer in a gate dielectric structure for a gate electrode. In other embodiments, a partially or fully crystalline high-k layer is included in a gate dielectric structure for a gate electrode. In one embodiment where a partially or fully crystalline high-k layer is included, the gate dielectric structure is a ferroelectric (FE) gate dielectric structure. In another embodiment where a partially or fully crystalline high-k layer is included, the gate dielectric structure is an antiferroelectric (AFE) gate dielectric structure.

In an embodiment, approaches are described herein to increase charge in a device channel and improve subthreshold behavior by adopting ferroelectric or antiferroelectric gate oxides. Ferroelectric and antiferroelectric gate oxide can increase channel charge for higher current and also can make steeper turn-on behavior.

To provide context, hafnium or zirconium (Hf or Zr) based ferroelectric and antiferroelectric (FE or AFE) materials are typically much thinner than ferroelectric material such lead zirconium titanate (PZT) and, as such, may be compatible with highly scaled logic technology. There are two features of FE or AFE materials can improve the performance of logic transistors: (1) the higher charge in the channel achieved by FE or AFE polarization and (2) a steeper turn-on behavior due to a sharp FE or AFE transition. Such properties can improve the transistor performance by increasing current and reducing subthreshold swing (SS).

Figure 31A:
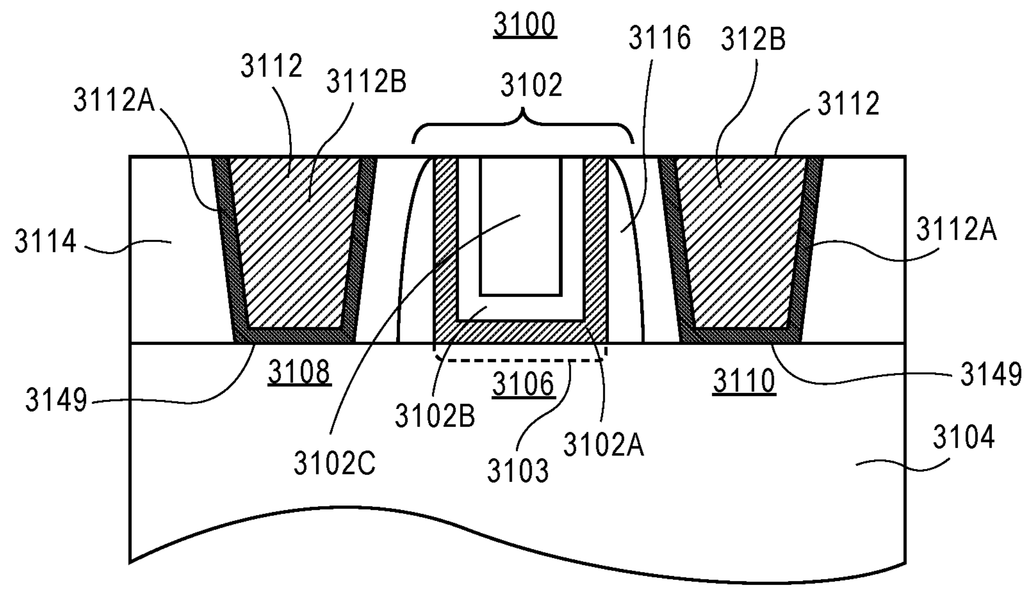
FIG. 31A illustrates a cross-sectional view of a semiconductor device having a ferroelectric or antiferroelectric gate dielectric structure, in accordance with an embodiment of the present disclosure.

FIG. 31A illustrates a cross-sectional view of a semiconductor device having a ferroelectric or antiferroelectric gate dielectric structure, in accordance with an embodiment of the present disclosure.

Referring to FIG. 31A, an integrated circuit structure 3100 includes a gate structure 3102 above a substrate 3104. In one embodiment, the gate structure 3102 is above or over a semiconductor channel structure 3106 including a monocrystalline material, such as monocrystalline silicon. The gate structure 3102 includes a gate dielectric over the semiconductor channel structure 3106 and a gate electrode over the gate dielectric structure. The gate dielectric includes a ferroelectric or antiferroelectric polycrystalline material layer 3102A. The gate electrode has a conductive layer 3102B on the ferroelectric or antiferroelectric polycrystalline material layer 3102A. The conductive layer 3102B includes a metal and may be a barrier layer, a workfunction layer, or templating layer enhancing crystallization of FE or AFE layers. A gate fill layer or layer(s) 3102C is on or above the conductive layer 3102B. A source region 3108 and a drain region 3110 are on opposite sides of the gate structure 3102. Source or drain contacts 3112 are electrically connected to the source region 3108 and the drain region 3110 at locations 3149, and are spaced apart of the gate structure 3102 by one or both of an inter-layer dielectric layer 3114 or gate dielectric spacers 3116. In the example of FIG. 31A, the source region 3108 and the drain region 3110 are regions of the substrate 3104. In an embodiment, the source or drain contacts 3112 include a barrier layer 3112A, and a conductive trench fill material 3112B. In one embodiment, the ferroelectric or antiferroelectric polycrystalline material layer 3102A extends along the dielectric spacers 3116, as is depicted in FIG. 31A.

In an embodiment, and as applicable throughout the disclosure, the ferroelectric or antiferroelectric polycrystalline material layer 3102A is a ferroelectric polycrystalline material layer. In one embodiment, the ferroelectric polycrystalline material layer is an oxide including Zr and Hf with a Zr:Hf ratio of 50:50 or greater in Zr. The ferroelectric effect may increase as the orthorhombic crystallinity increases. In one embodiment ferroelectric polycrystalline material layer has at least 80% orthorhombic crystallinity.

In an embodiment, and as applicable throughout the disclosure, the ferroelectric or antiferroelectric polycrystalline material layer 3102A is an antiferroelectric polycrystalline material layer. In one embodiment, the antiferroelectric polycrystalline material layer is an oxide including Zr and Hf with a Zr:Hf ratio of 80:20 or greater in Zr, and even up to 100% Zr, $ZrO_2$. In one embodiment, the antiferroelectric polycrystalline material layer has at least 80% tetragonal crystallinity.

In an embodiment, and as applicable throughout the disclosure, the gate dielectric of gate stack 3102 further includes an amorphous dielectric layer 3103, such as a native silicon oxide layer, high K dielectric (HfOx, $Al_2O_3$, etc.), or combination of oxide and high K between the ferroelectric or antiferroelectric polycrystalline material layer 3102A and the semiconductor channel structure 3106. In an embodiment, and as applicable throughout the disclosure, the ferroelectric or antiferroelectric polycrystalline material layer 3102A has a thickness in the range of 1 nanometer to 8 nanometers. In an embodiment, and as applicable throughout the disclosure, the ferroelectric or antiferroelectric polycrystalline material layer 3102A has a crystal grain size approximately in the range of 20 or more nanometers.

In an embodiment, following deposition of the ferroelectric or antiferroelectric polycrystalline material layer 3102A, e.g., by atomic layer deposition (ALD), a layer including a metal (e.g., layer 3102B, such as a 5-10 nanometer titanium nitride or tantalum nitride or tungsten) is formed on the ferroelectric or antiferroelectric polycrystalline material layer 3102A. An anneal is then performed. In one embodiment, the anneal is performed for a duration in the range of 1 millisecond-30 minutes. In one embodiment, the anneal is performed at a temperature in the range of 500-1100 degrees Celsius.

Figure 31B:
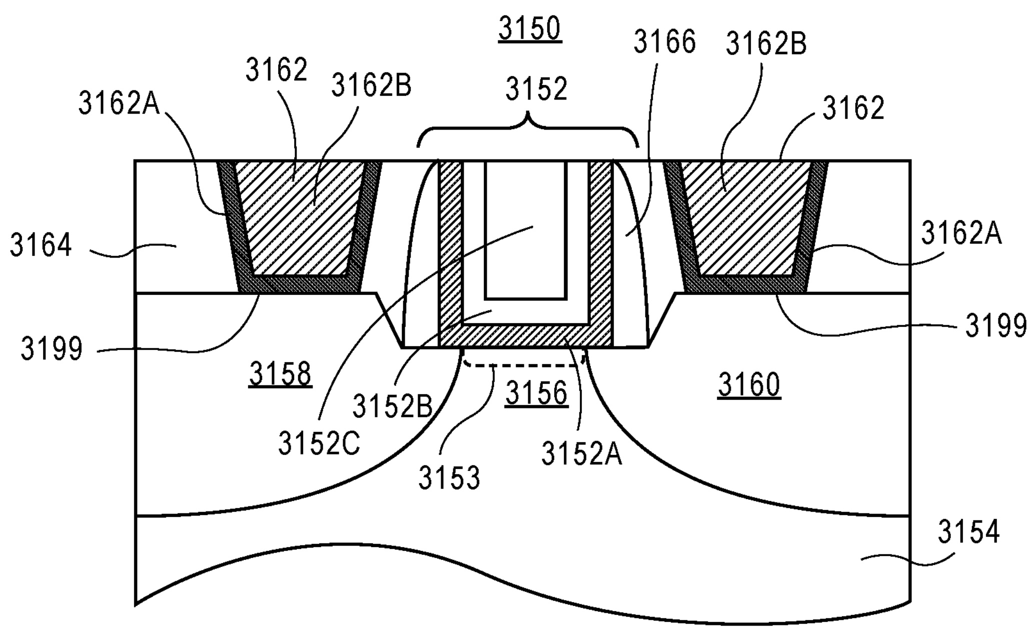
FIG. 31B illustrates a cross-sectional view of another semiconductor device having a ferroelectric or antiferroelectric gate dielectric structure, in accordance with another embodiment of the present disclosure.

FIG. 31B illustrates a cross-sectional view of another semiconductor device having a ferroelectric or antiferroelectric gate dielectric structure, in accordance with another embodiment of the present disclosure.

Referring to FIG. 31B, an integrated circuit structure 3150 includes a gate structure 3152 above a substrate 3154. In one embodiment, the gate structure 3152 is above or over a semiconductor channel structure 3156 including a monocrystalline material, such as monocrystalline silicon. The gate structure 3152 includes a gate dielectric over the semiconductor channel structure 3156 and a gate electrode over the gate dielectric structure. The gate dielectric includes a ferroelectric or antiferroelectric polycrystalline material layer 3152A, and may further include an amorphous oxide layer 3153. The gate electrode has a conductive layer 3152B on the ferroelectric or antiferroelectric polycrystalline material layer 3152A. The conductive layer 3152B includes a metal and may be a barrier layer or a workfunction layer. A gate fill layer or layer(s) 3152C is on or above the conductive layer 3152B. A raised source region 3158 and a raised drain region 3160, such as regions of semiconductor material different than the semiconductor channel structure 3156, are on opposite sides of the gate structure 3152. Source or drain contacts 3162 are electrically connected to the source region 3158 and the drain region 3160 at locations 3199, and are spaced apart of the gate structure 3152 by one or both of an inter-layer dielectric layer 3164 or gate dielectric spacers 3166. In an embodiment, the source or drain contacts 3162 include a barrier layer 3162A, and a conductive trench fill material 3162B. In one embodiment, the ferroelectric or antiferroelectric polycrystalline material layer 3152A extends along the dielectric spacers 3166, as is depicted in FIG. 31B.

Figure 32A:
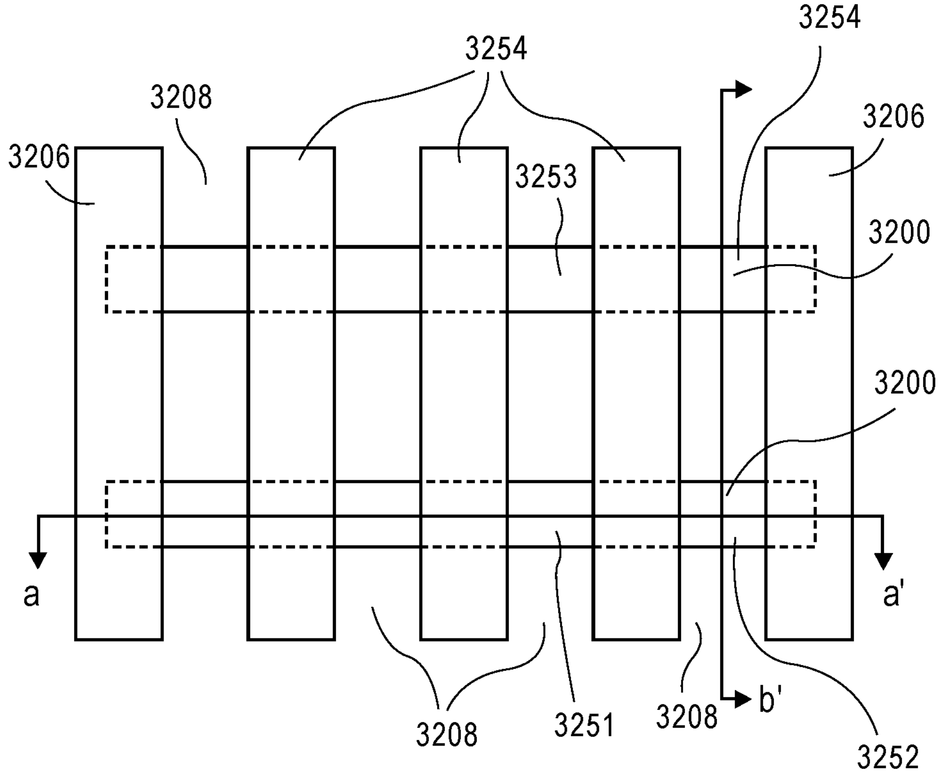
FIG. 32A illustrates a plan view of a plurality of gate lines over a pair of semiconductor fins, in accordance with an embodiment of the present disclosure.

FIG. 32A illustrates a plan view of a plurality of gate lines over a pair of semiconductor fins, in accordance with another embodiment of the present disclosure.

Referring to FIG. 32A, a plurality of active gate lines 3204 is formed over a plurality of semiconductor fins 3200. Dummy gate lines 3206 are at the ends of the plurality of semiconductor fins 3200. Spacings 3208 between the gate lines 3204/3206 are locations where trench contacts may be located to provide conductive contacts to source or drain regions, such as source or drain regions 3251, 3252, 3253, and 3254. In an embodiment, the pattern of the plurality of gate lines 3204/3206 or the pattern of the plurality of semiconductor fins 3200 is described as a grating structure. In one embodiment, the grating-like pattern includes the plurality of gate lines 3204/3206 or the pattern of the plurality of semiconductor fins 3200 spaced at a constant pitch and having a constant width, or both.

Figure 32B:
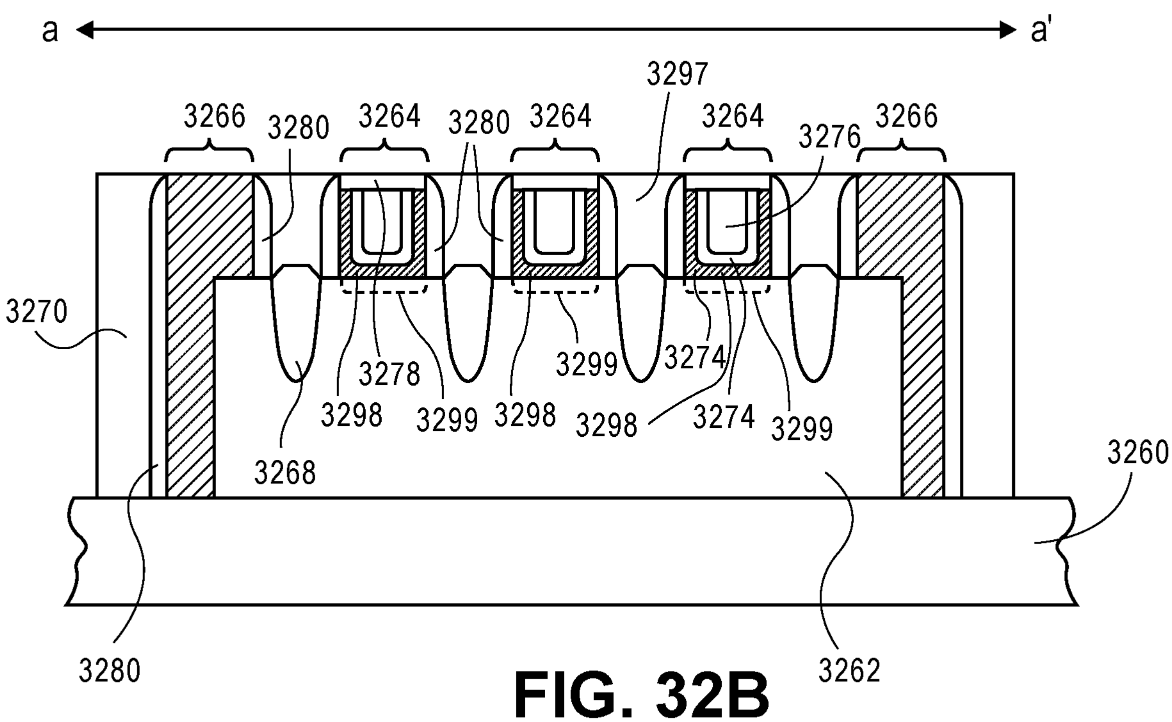
FIG. 32B illustrates a cross-sectional view, taken along the a-a' axis of FIG. 32A, in accordance with an embodiment of the present disclosure.

FIG. 32B illustrates a cross-sectional view, taken along the a-a' axis of FIG. 32A, in accordance with an embodiment of the present disclosure.

Referring to FIG. 32B, a plurality of active gate lines 3264 is formed over a semiconductor fin 3262 formed above a substrate 3260. Dummy gate lines 3266 are at the ends of the semiconductor fin 3262. A dielectric layer 3270 is outside of the dummy gate lines 3266. A trench contact material 3297 is between the active gate lines 3264, and between the dummy gate lines 3266 and the active gate lines 3264. Embedded source or drain structures 3268 are in the semiconductor fin 3262 between the active gate lines 3264 and between the dummy gate lines 3266 and the active gate lines 3264.

The active gate lines 3264 include a gate dielectric structure 3272, a workfunction gate electrode portion 3274 and a fill gate electrode portion 3276, and a dielectric capping layer 3278. Dielectric spacers 3280 line the sidewalls of the active gate lines 3264 and the dummy gate lines 3266. In an embodiment, the gate dielectric structure 3272 includes a ferroelectric or antiferroelectric polycrystalline material layer 3298. In one embodiment, the gate dielectric structure 3272 further includes an amorphous oxide layer 3299.

In another aspect, devices of a same conductivity type, e.g., N-type or P-type, may have differentiated gate electrode stacks for a same conductivity type. However, for comparison purposes, devices having a same conductivity type may have differentiated voltage threshold (VT) based on modulated doping.

Figure 33A:
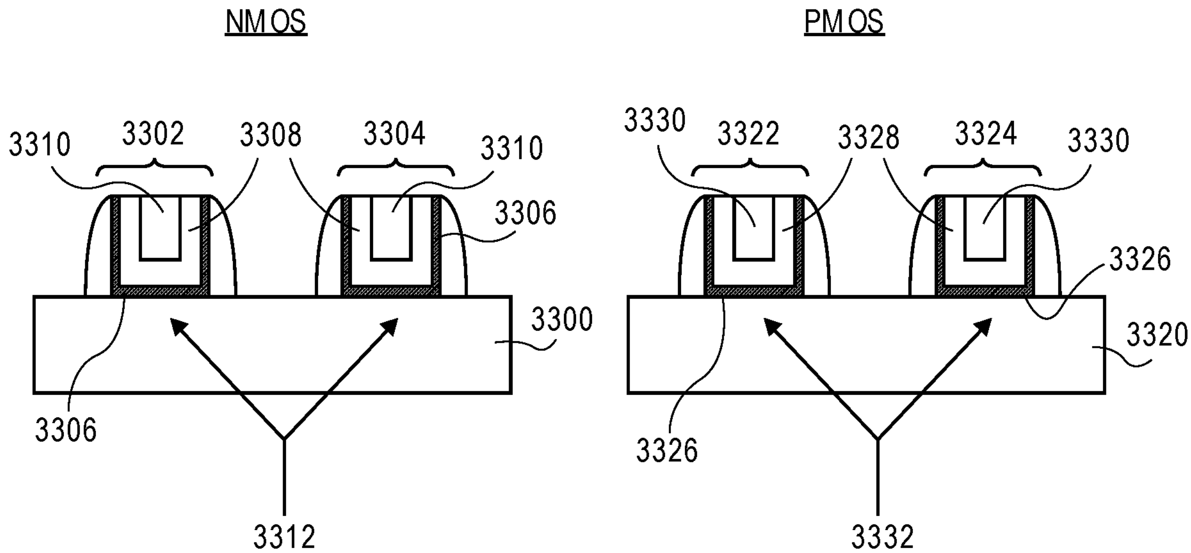
FIG. 33A illustrates cross-sectional views of a pair of NMOS devices having a differentiated voltage threshold based on modulated doping, and a pair of PMOS devices having a differentiated voltage threshold based on modulated doping, in accordance with an embodiment of the present disclosure.

FIG. 33A illustrates cross-sectional views of a pair of NMOS devices having a differentiated voltage threshold based on modulated doping, and a pair of PMOS devices having a differentiated voltage threshold based on modulated doping, in accordance with an embodiment of the present disclosure.

Referring to FIG. 33A, a first NMOS device 3302 is adjacent a second NMOS device 3304 over a semiconductor active region 3300, such as over a silicon fin or substrate. Both first NMOS device 3302 and second NMOS device 3304 include a gate dielectric layer 3306, a first gate electrode conductive layer 3308, such as a workfunction layer, and a gate electrode conductive fill 3310. In an embodiment, the first gate electrode conductive layer 3308 of the first NMOS device 3302 and of the second NMOS device 3304 are of a same material and a same thickness and, as such, have a same workfunction. However, the first NMOS device 3302 has a lower VT than the second NMOS device 3304. In one such embodiment, the first NMOS device 3302 is referred to as a "standard VT" device, and the second NMOS device 3304 is referred to as a "high VT" device. In an embodiment, the differentiated VT is achieved by using modulated or differentiated implant doping at regions 3312 of the first NMOS device 3302 and the second NMOS device 3304.

Referring again to FIG. 33A, a first PMOS device 3322 is adjacent a second PMOS device 3324 over a semiconductor active region 3320, such as over a silicon fin or substrate. Both first PMOS device 3322 and second PMOS device 3324 include a gate dielectric layer 3326, a first gate electrode conductive layer 3328, such as a workfunction layer, and a gate electrode conductive fill 3330. In an embodiment, the first gate electrode conductive layer 3328 of the first PMOS device 3322 and of the second PMOS device 3324 are of a same material and a same thickness and, as such, have a same workfunction. However, the first PMOS device 3322 has a higher VT than the second PMOS device 3324. In one such embodiment, the first PMOS device 3322 is referred to as a "standard VT" device, and the second PMOS device 3324 is referred to as a "low VT" device. In an embodiment, the differentiated VT is achieved by using modulated or differentiated implant doping at regions 3332 of the first PMOS device 3322 and the second PMOS device 3324.

Figure 33B:
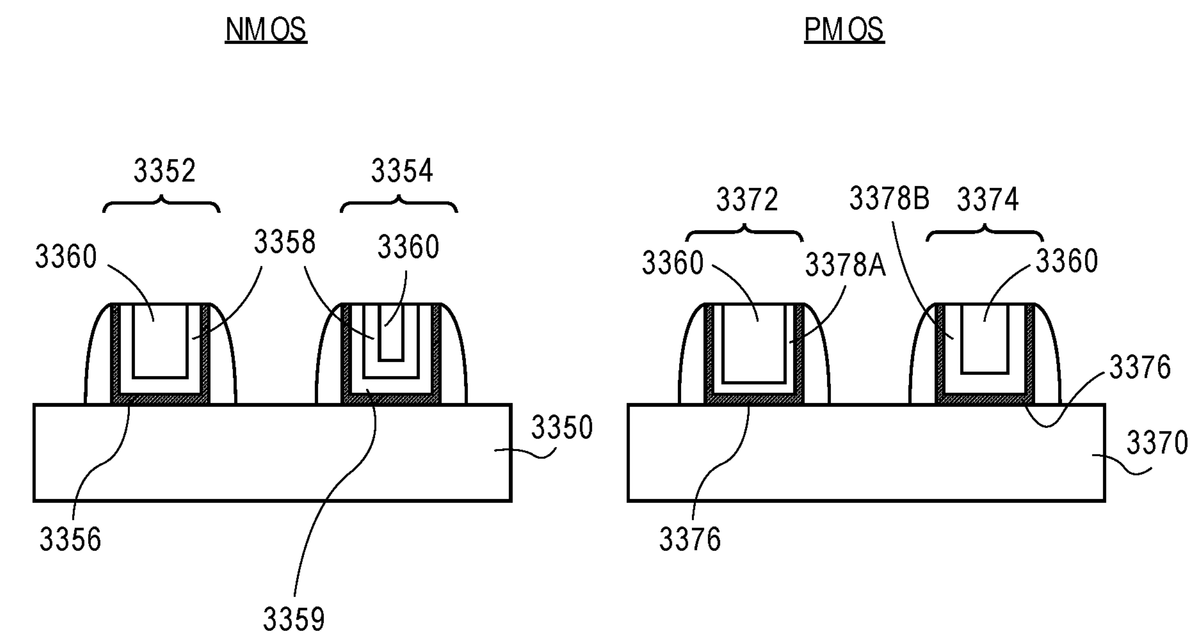
FIG. 33B illustrates cross-sectional views of a pair of NMOS devices having a differentiated voltage threshold based on differentiated gate electrode structure, and a pair of PMOS devices having a differentiated voltage threshold based on differentiated gate electrode structure, in accordance with another embodiment of the present disclosure.

In contrast to FIG. 33A, FIG. 33B illustrates cross-sectional views of a pair of NMOS devices having a differentiated voltage threshold based on differentiated gate electrode structure, and a pair of PMOS devices having a differentiated voltage threshold based on differentiated gate electrode structure, in accordance with another embodiment of the present disclosure.

Referring to FIG. 33B, a first NMOS device 3352 is adjacent a second NMOS device 3354 over a semiconductor active region 3350, such as over a silicon fin or substrate. Both first NMOS device 3352 and second NMOS device 3354 include a gate dielectric layer 3356. However, the first NMOS device 3352 and second NMOS device 3354 have structurally different gate electrode stacks. In particular, the first NMOS device 3352 includes a first gate electrode conductive layer 3358, such as a first workfunction layer, and a gate electrode conductive fill 3360. The second NMOS device 3354 includes a second gate electrode conductive layer 3359, such as a second workfunction layer, the first gate electrode conductive layer 3358 and the gate electrode conductive fill 3360. The first NMOS device 3352 has a lower VT than the second NMOS device 3354. In one such embodiment, the first NMOS device 3352 is referred to as a "standard VT" device, and the second NMOS device 3354 is referred to as a "high VT" device. In an embodiment, the differentiated VT is achieved by using differentiated gate stacks for same conductivity type devices.

Referring again to FIG. 33B, a first PMOS device 3372 is adjacent a second PMOS device 3374 over a semiconductor active region 3370, such as over a silicon fin or substrate. Both first PMOS device 3372 and second PMOS device 3374 include a gate dielectric layer 3376. However, the first PMOS device 3372 and second PMOS device 3374 have structurally different gate electrode stacks. In particular, the first PMOS device 3372 includes a gate electrode conductive layer 3378A having a first thickness, such as a workfunction layer, and a gate electrode conductive fill 3380. The second PMOS device 3374 includes a gate electrode conductive layer 3378B having a second thickness, and the gate electrode conductive fill 3380. In one embodiment, the gate electrode conductive layer 3378A and the gate electrode conductive layer 3378B have a same composition, but the thickness of the gate electrode conductive layer 3378B (second thickness) is greater than the thickness of the gate electrode conductive layer 3378A (first thickness). The first PMOS device 3372 has a higher VT than the second PMOS device 3374. In one such embodiment, the first PMOS device 3372 is referred to as a "standard VT" device, and the second PMOS device 3374 is referred to as a "low VT" device. In an embodiment, the differentiated VT is achieved by using differentiated gate stacks for same conductivity type devices.

Referring again to FIG. 33B, in accordance with an embodiment of the present disclosure, an integrated circuit structure includes a fin (e.g., a silicon fin such as 3350). It is to be appreciated that the fin has a top (as shown) and sidewalls (into and out of the page). A gate dielectric layer 3356 is over the top of the fin and laterally adjacent the sidewalls of the fin. An N-type gate electrode of device 3354 is over the gate dielectric layer 3356 over the top of the fin and laterally adjacent the sidewalls of the fin. The N-type gate electrode includes a P-type metal layer 3359 on the gate dielectric layer 3356, and an N-type metal layer 3358 on the P-type metal layer 3359. As will be appreciated, a first N-type source or drain region may be adjacent a first side of the gate electrode (e.g., into the page), and a second N-type source or drain region may be adjacent a second side of the gate electrode (e.g., out of the page), the second side opposite the first side.

In one embodiment, the P-type metal layer 3359 includes titanium and nitrogen, and the N-type metal layer 3358 includes titanium, aluminum, carbon and nitrogen. In one embodiment, the P-type metal layer 3359 has a thickness in the range of 2-12 Angstroms, and in a specific embodiment, the P-type metal layer 3359 has a thickness in the range of 2-4 Angstroms. In one embodiment, the N-type gate electrode further includes a conductive fill metal layer 3360 on the N-type metal layer 3358. In one such embodiment, the conductive fill metal layer 3360 includes tungsten. In a particular embodiment, the conductive fill metal layer 3360 includes 95 or greater atomic percent tungsten and 0.1 to 2 atomic percent fluorine.

Referring again to FIG. 33B, in accordance with another embodiment of the present disclosure, an integrated circuit structure includes a first N-type device 3352 having a voltage threshold (VT), the first N-type device 3352 having a first gate dielectric layer 3356, and a first N-type metal layer 3358 on the first gate dielectric layer 3356. Also, included is a second N-type device 3354 having a voltage threshold (VT), the second N-type device 3354 having a second gate dielectric layer 3356, a P-type metal layer 3359 on the second gate dielectric layer 3356, and a second N-type metal layer 3358 on the P-type metal layer 3359.

In one embodiment, wherein the VT of the second N-type device 3354 is higher than the VT of the first N-type device 3352. In one embodiment, the first N-type metal layer 3358 and the second N-type metal layer 3358 have a same composition. In one embodiment, the first N-type metal layer 3358 and the second N-type metal layer 3358 have a same thickness. In one embodiment, wherein the N-type metal layer 3358 includes titanium, aluminum, carbon and nitrogen, and the P-type metal layer 3359 includes titanium and nitrogen.

Referring again to FIG. 33B, in accordance with another embodiment of the present disclosure, an integrated circuit structure includes a first P-type device 3372 having a voltage threshold (VT), the first P-type device 3372 having a first gate dielectric layer 3376, and a first P-type metal layer 3378A on the first gate dielectric layer 3376. The first P-type metal layer 3378A has a thickness. A second P-type device 3374 is also included and has a voltage threshold (VT). The second P-type device 3374 has a second gate dielectric layer 3376, and a second P-type metal layer 3378B on the second gate dielectric layer 3376. The second P-type metal layer 3378B has a thickness greater than the thickness of the first P-type metal layer 3378A.

In one embodiment, the VT of the second P-type device 3374 is lower than the VT of the first P-type device 3372. In one embodiment, the first P-type metal layer 3378A and the second P-type metal layer 3378B have a same composition. In one embodiment, the first P-type metal layer 3378A and the second P-type metal layer 3378B both include titanium and nitrogen. In one embodiment, the thickness of the first P-type metal layer 3378A is less than a work-function saturation thickness of a material of the first P-type metal layer 3378A. In one embodiment, although not depicted the second P-type metal layer 3378B includes a first metal film (e.g., from a second deposition) on a second metal film (e.g., from a first deposition), and a seam is between the first metal film and the second metal film.

Referring again to FIG. 33B, in accordance with another embodiment of the present disclosure, an integrated circuit structure includes a first N-type device 3352 has a first gate dielectric layer 3356, and a first N-type metal layer 3358 on the first gate dielectric layer 3356. A second N-type device 3354 has a second gate dielectric layer 3356, a first P-type metal layer 3359 on the second gate dielectric layer 3356, and a second N-type metal layer 3358 on the first P-type metal layer 3359. A first P-type device 3372 has a third gate dielectric layer 3376, and a second P-type metal layer 3378A on the third gate dielectric layer 3376. The second P-type metal layer 3378A has a thickness. A second P-type device 3374 has a fourth gate dielectric layer 3376, and a third P-type metal layer 3378B on the fourth gate dielectric layer 3376. The third P-type metal layer 3378B has a thickness greater than the thickness of the second P-type metal layer 3378A.

In one embodiment, the first N-type device 3352 has a voltage threshold (VT), the second N-type device 3354 has a voltage threshold (VT), and the VT of the second N-type device 3354 is lower than the VT of the first N-type device 3352. In one embodiment, the first P-type device 3372 has a voltage threshold (VT), the second P-type device 3374 has a voltage threshold (VT), and the VT of the second P-type device 3374 is lower than the VT of the first P-type device 3372. In one embodiment, the third P-type metal layer 3378B includes a first metal film on a second metal film, and a seam between the first metal film and the second metal film.

It is to be appreciated that greater than two types of VT devices for a same conductivity type may be included in a same structure, such as on a same die. In a first example, FIG. 34A illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with an embodiment of the present disclosure.

Figure 34A:
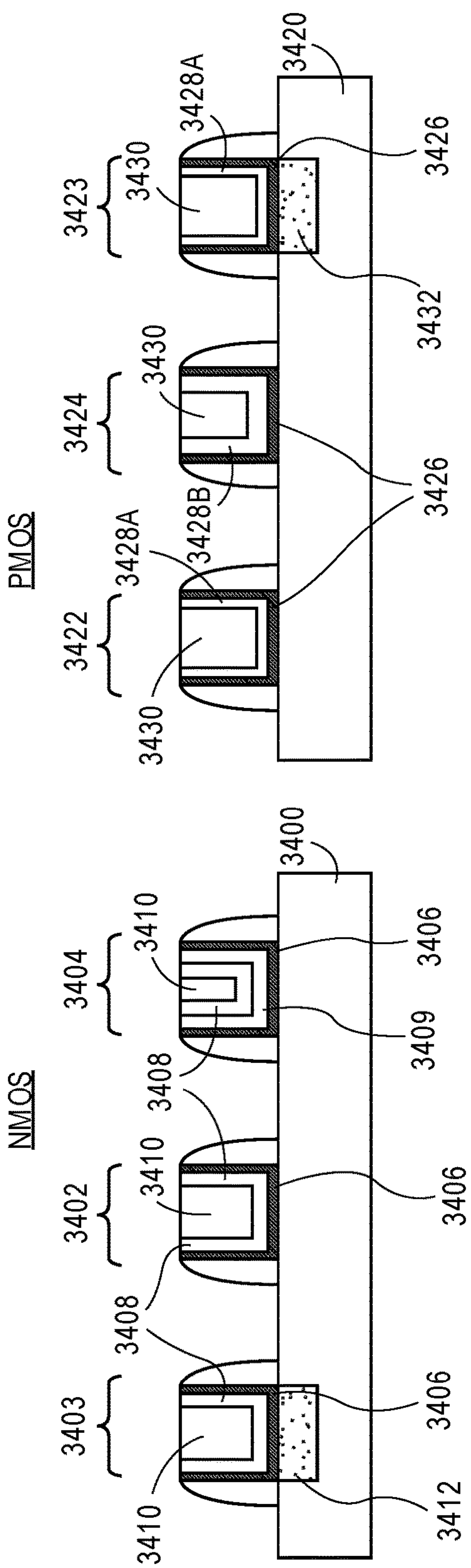
FIG. 34A illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with an embodiment of the present disclosure.

Referring to FIG. 34A, a first NMOS device 3402 is adjacent a second NMOS device 3404 and a third NMOS device 3403 over a semiconductor active region 3400, such as over a silicon fin or substrate. The first NMOS device 3402, second NMOS device 3404, and third NMOS device 3403 include a gate dielectric layer 3406. The first NMOS device 3402 and third NMOS device 3403 have structurally same or similar gate electrode stacks. However, the second NMOS device 3404 has a structurally different gate electrode stack than the first NMOS device 3402 and the third NMOS device 3403. In particular, the first NMOS device 3402 and the third NMOS device 3403 include a first gate electrode conductive layer 3408, such as a first workfunction layer, and a gate electrode conductive fill 3410. The second NMOS device 3404 includes a second gate electrode conductive layer 3409, such as a second workfunction layer, the first gate electrode conductive layer 3408 and the gate electrode conductive fill 3410. The first NMOS device 3402 has a lower VT than the second NMOS device 3404. In one such embodiment, the first NMOS device 3402 is referred to as a "standard VT" device, and the second NMOS device 3404 is referred to as a "high VT" device. In an embodiment, the differentiated VT is achieved by using differentiated gate stacks for same conductivity type devices. In an embodiment, the third NMOS device 3403 has a VT different than the VT of the first NMOS device 3402 and the second NMOS device 3404, even though the gate electrode structure of the third NMOS device 3403 is the same as the gate electrode structure of the first NMOS device 3402. In one embodiment, the VT of the third NMOS device 3403 is between the VT of the first NMOS device 3402 and the second NMOS device 3404. In an embodiment, the differentiated VT between the third NMOS device 3403 and the first NMOS device 3402 is achieved by using modulated or differentiated implant doping at a region 3412 of the third NMOS device 3403. In one such embodiment, the third N-type device 3403 has a channel region having a dopant concentration different than a dopant concentration of a channel region of the first N-type device 3402.

Referring again to FIG. 34A, a first PMOS device 3422 is adjacent a second PMOS device 3424 and a third PMOS device 3423 over a semiconductor active region 3420, such as over a silicon fin or substrate. The first PMOS device 3422, second PMOS device 3424, and third PMOS device 3423 include a gate dielectric layer 3426. The first PMOS device 3422 and third PMOS device 3423 have structurally same or similar gate electrode stacks. However, the second PMOS device 3424 has a structurally different gate electrode stack than the first PMOS device 3422 and the third PMOS device 3423. In particular, the first PMOS device 3422 and the third PMOS device 3423 include a gate electrode conductive layer 3428A having a first thickness, such as a workfunction layer, and a gate electrode conductive fill 3430. The second PMOS device 3424 includes a gate electrode conductive layer 3428B having a second thickness, and the gate electrode conductive fill 3430. In one embodiment, the gate electrode conductive layer 3428A and the gate electrode conductive layer 3428B have a same composition, but the thickness of the gate electrode conductive layer 3428B (second thickness) is greater than the thickness of the gate electrode conductive layer 3428A (first thickness). In an embodiment, the first PMOS device 3422 has a higher VT than the second PMOS device 3424. In one such embodiment, the first PMOS device 3422 is referred to as a "standard VT" device, and the second PMOS device 3424 is referred to as a "low VT" device. In an embodiment, the differentiated VT is achieved by using differentiated gate stacks for same conductivity type devices. In an embodiment, the third PMOS device 3423 has a VT different than the VT of the first PMOS device 3422 and the second PMOS device 3424, even though the gate electrode structure of the third PMOS device 3423 is the same as the gate electrode structure of the first PMOS device 3422. In one embodiment, the VT of the third PMOS device 3423 is between the VT of the first PMOS device 3422 and the second PMOS device 3424. In an embodiment, the differentiated VT between the third PMOS device 3423 and the first PMOS device 3422 is achieved by using modulated or differentiated implant doping at a region 3432 of the third PMOS device 3423. In one such embodiment, the third P-type device 3423 has a channel region having a dopant concentration different than a dopant concentration of a channel region of the first P-type device 3422.

Figure 34B:
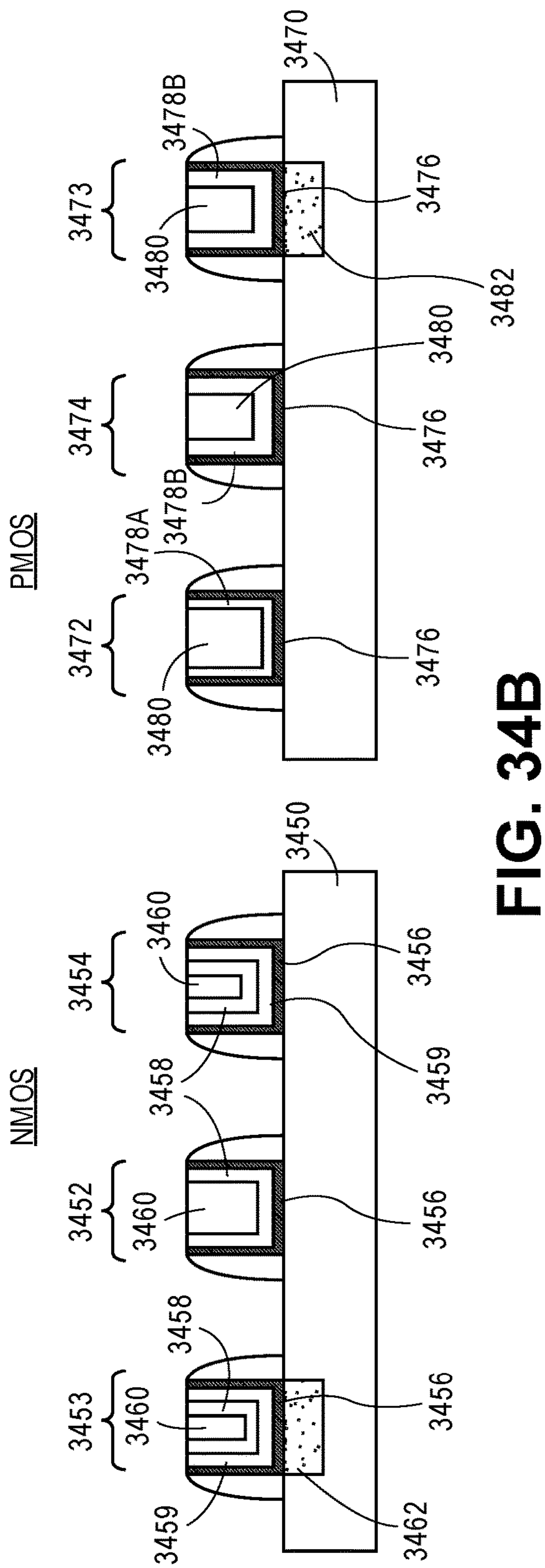
FIG. 34B illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with another embodiment of the present disclosure.

In a second example, FIG. 34B illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with another embodiment of the present disclosure.

Referring to FIG. 34B, a first NMOS device 3452 is adjacent a second NMOS device 3454 and a third NMOS device 3453 over a semiconductor active region 3450, such as over a silicon fin or substrate. The first NMOS device 3452, second NMOS device 3454, and third NMOS device 3453 include a gate dielectric layer 3456. The second NMOS device 3454 and third NMOS device 3453 have structurally same or similar gate electrode stacks. However, the first NMOS device 3452 has a structurally different gate electrode stack than the second NMOS device 3454 and the third NMOS device 3453. In particular, the first NMOS device 3452 includes a first gate electrode conductive layer 3458, such as a first workfunction layer, and a gate electrode conductive fill 3460. The second NMOS device 3454 and the third NMOS device 3453 include a second gate electrode conductive layer 3459, such as a second workfunction layer, the first gate electrode conductive layer 3458 and the gate electrode conductive fill 3460. The first NMOS device 3452 has a lower VT than the second NMOS device 3454. In one such embodiment, the first NMOS device 3452 is referred to as a "standard VT" device, and the second NMOS device 3454 is referred to as a "high VT" device. In an embodiment, the differentiated VT is achieved by using differentiated gate stacks for same conductivity type devices. In an embodiment, the third NMOS device 3453 has a VT different than the VT of the first NMOS device 3452 and the second NMOS device 3454, even though the gate electrode structure of the third NMOS device 3453 is the same as the gate electrode structure of the second NMOS device 3454. In one embodiment, the VT of the third NMOS device 3453 is between the VT of the first NMOS device 3452 and the second NMOS device 3454. In an embodiment, the differentiated VT between the third NMOS device 3453 and the second NMOS device 3454 is achieved by using modulated or differentiated implant doping at a region 3462 of the third NMOS device 3453. In one such embodiment, the third N-type device 3453 has a channel region having a dopant concentration different than a dopant concentration of a channel region of the second N-type device 3454.

Referring again to FIG. 34B, a first PMOS device 3472 is adjacent a second PMOS device 3474 and a third PMOS device 3473 over a semiconductor active region 3470, such as over a silicon fin or substrate. The first PMOS device 3472, second PMOS device 3474, and third PMOS device 3473 include a gate dielectric layer 3476. The second PMOS device 3474 and third PMOS device 3473 have structurally same or similar gate electrode stacks. However, the first PMOS device 3472 has a structurally different gate electrode stack than the second PMOS device 3474 and the third PMOS device 3473. In particular, the first PMOS device 3472 includes a gate electrode conductive layer 3478A having a first thickness, such as a workfunction layer, and a gate electrode conductive fill 3480. The second PMOS device 3474 and the third PMOS device 3473 include a gate electrode conductive layer 3478B having a second thickness, and the gate electrode conductive fill 3480. In one embodiment, the gate electrode conductive layer 3478A and the gate electrode conductive layer 3478B have a same composition, but the thickness of the gate electrode conductive layer 3478B (second thickness) is greater than the thickness of the gate electrode conductive layer 3478A (first thickness). In an embodiment, the first PMOS device 3472 has a higher VT than the second PMOS device 3474. In one such embodiment, the first PMOS device 3472 is referred to as a "standard VT" device, and the second PMOS device 3474 is referred to as a "low VT" device. In an embodiment, the differentiated VT is achieved by using differentiated gate stacks for same conductivity type devices. In an embodiment, the third PMOS device 3473 has a VT different than the VT of the first PMOS device 3472 and the second PMOS device 3474, even though the gate electrode structure of the third PMOS device 3473 is the same as the gate electrode structure of the second PMOS device 3474. In one embodiment, the VT of the third PMOS device 3473 is between the VT of the first PMOS device 3472 and the second PMOS device 3474. In an embodiment, the differentiated VT between the third PMOS device 3473 and the first PMOS device 3472 is achieved by using modulated or differentiated implant doping at a region 3482 of the third PMOS device 3473. In one such embodiment, the third P-type device 3473 has a channel region having a dopant concentration different than a dopant concentration of a channel region of the second P-type device 3474.

FIGS. 35A-35D illustrate cross-sectional views of various operations in a method of fabricating NMOS devices having a differentiated voltage threshold based on differentiated gate electrode structure, in accordance with another embodiment of the present disclosure.

Figure 35A:
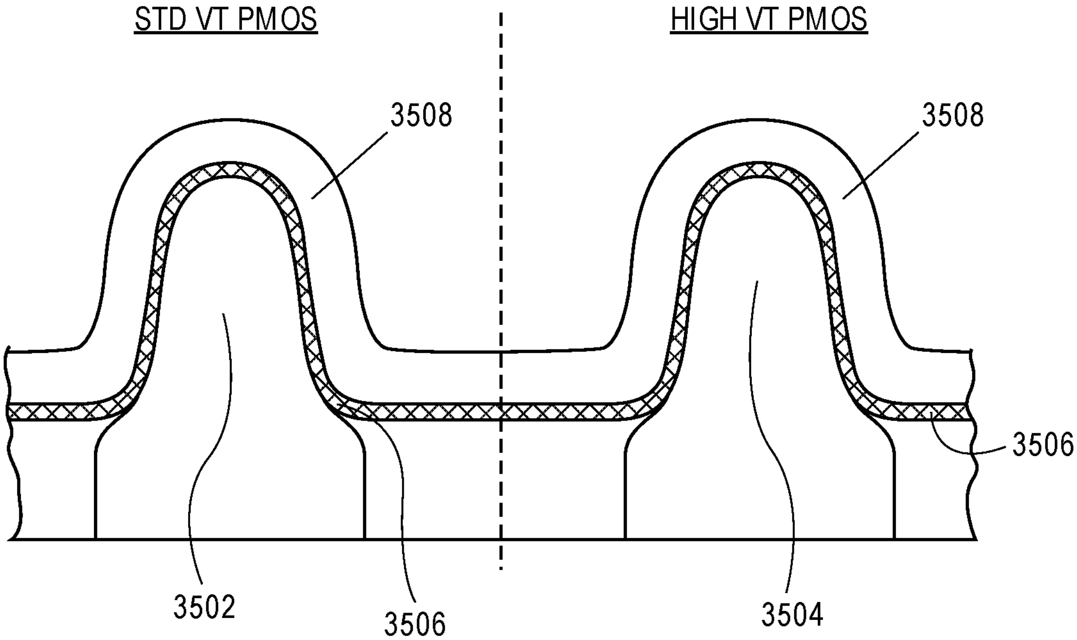
FIGS. 35A-35D illustrate cross-sectional views of various operations in a method of fabricating NMOS devices having a differentiated voltage threshold based on differentiated gate electrode structure, in accordance with another embodiment of the present disclosure.

Referring to FIG. 35A, where a "standard VT NMOS" region (STD VT NMOS) and a "high VT NMOS" region (HIGH VT NMOS) are shown as bifurcated on a common substrate, a method of fabricating an integrated circuit structure includes forming a gate dielectric layer 3506 over a first semiconductor fin 3502 and over a second semiconductor fin 3504, such as over first and second silicon fins. A P-type metal layer 3508 is formed on the gate dielectric layer 3506 over the first semiconductor fin 3502 and over the second semiconductor fin 3504.

Figure 35B:
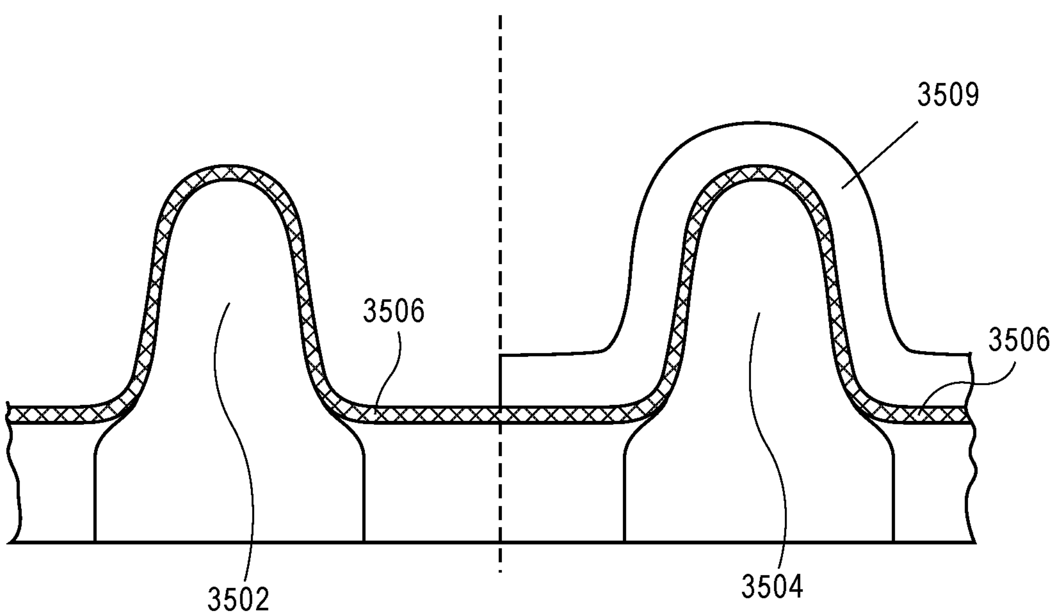

Referring to FIG. 35B, a portion of the P-type metal layer 3508 is removed from the gate dielectric layer 3506 over the first semiconductor fin 3502, but a portion 3509 of the P-type metal layer 3508 is retained on the gate dielectric layer 3506 over the second semiconductor fin 3504.

Figure 35C:
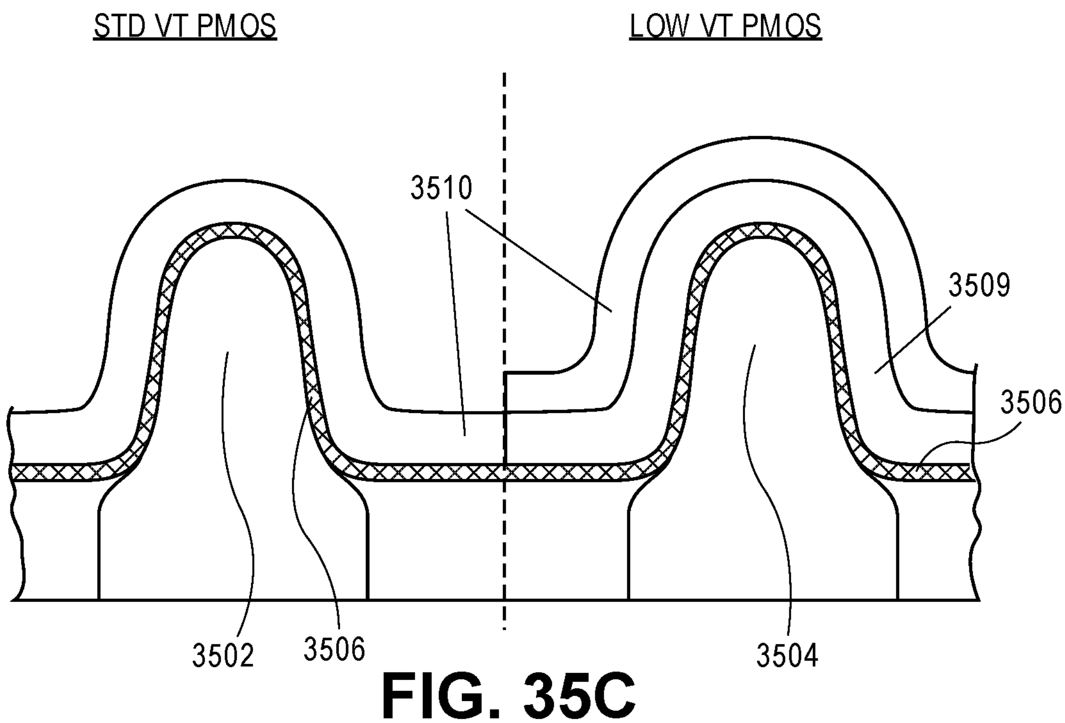

Referring to FIG. 35C, an N-type metal layer 3510 is formed on the gate dielectric layer 3506 over the first semiconductor fin 3502, and on the portion 3509 of the P-type metal layer on the gate dielectric layer 3506 over the second semiconductor fin 3504. In an embodiment, subsequent processing includes forming a first N-type device having a voltage threshold (VT) over the first semiconductor fin 3502, and forming a second N-type device having a voltage threshold (VT) over the second semiconductor fin 3504, wherein the VT of the second N-type device is higher than the VT of the first N-type device.

Figure 35D:
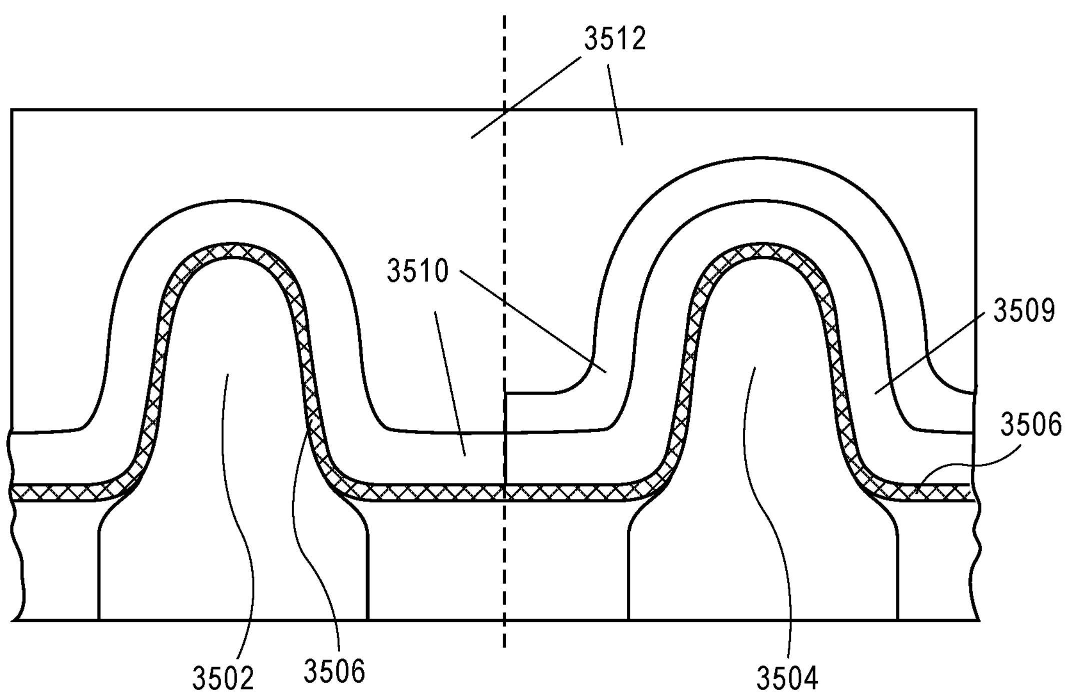

Referring to FIG. 35D, in an embodiment, a conductive fill metal layer 3512 is formed on the N-type metal layer 3510. In one such embodiment, forming the conductive fill metal layer 3512 includes forming a tungsten-containing film using atomic layer deposition (ALD) with a tungsten hexafluoride ($WF_6$) precursor.

FIGS. 36A-36D illustrate cross-sectional views of various operations in a method of fabricating PMOS devices having a differentiated voltage threshold based on differentiated gate electrode structure, in accordance with another embodiment of the present disclosure.

Figure 36A:
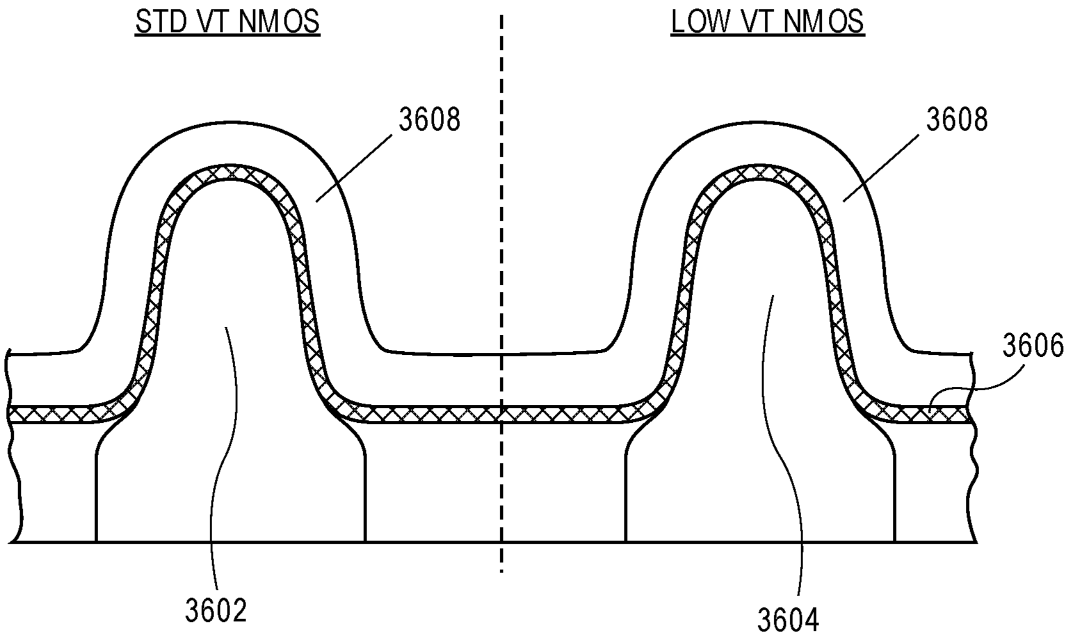
FIGS. 36A-36D illustrate cross-sectional views of various operations in a method of fabricating PMOS devices having a differentiated voltage threshold based on differentiated gate electrode structure, in accordance with another embodiment of the present disclosure.

Referring to FIG. 36A, where a "standard VT PMOS" region (STD VT PMOS) and a "low VT PMOS" region (LOW VT PMOS) are shown as bifurcated on a common substrate, a method of fabricating an integrated circuit structure includes forming a gate dielectric layer 3606 over a first semiconductor fin 3602 and over a second semiconductor fin 3604, such as over first and second silicon fins. A first P-type metal layer 3608 is formed on the gate dielectric layer 3606 over the first semiconductor fin 3602 and over the second semiconductor fin 3604.

Figure 36B:
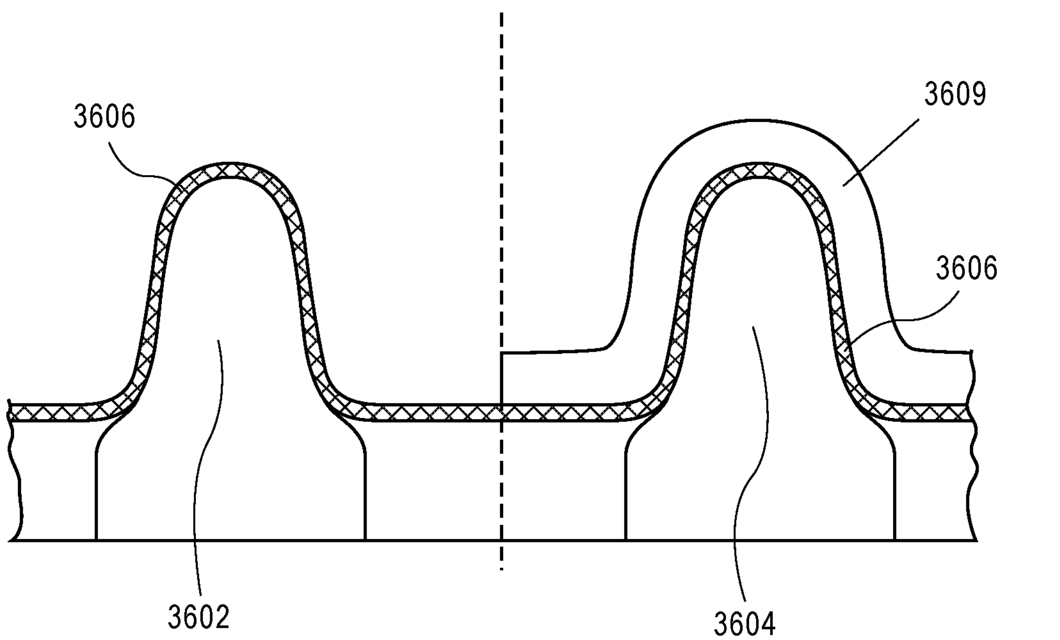

Referring to FIG. 36B, a portion of the first P-type metal layer 3608 is removed from the gate dielectric layer 3606 over the first semiconductor fin 3602, but a portion 3609 of the first P-type metal layer 3608 is retained on the gate dielectric layer 3606 over the second semiconductor fin 3604.

Figure 36C:
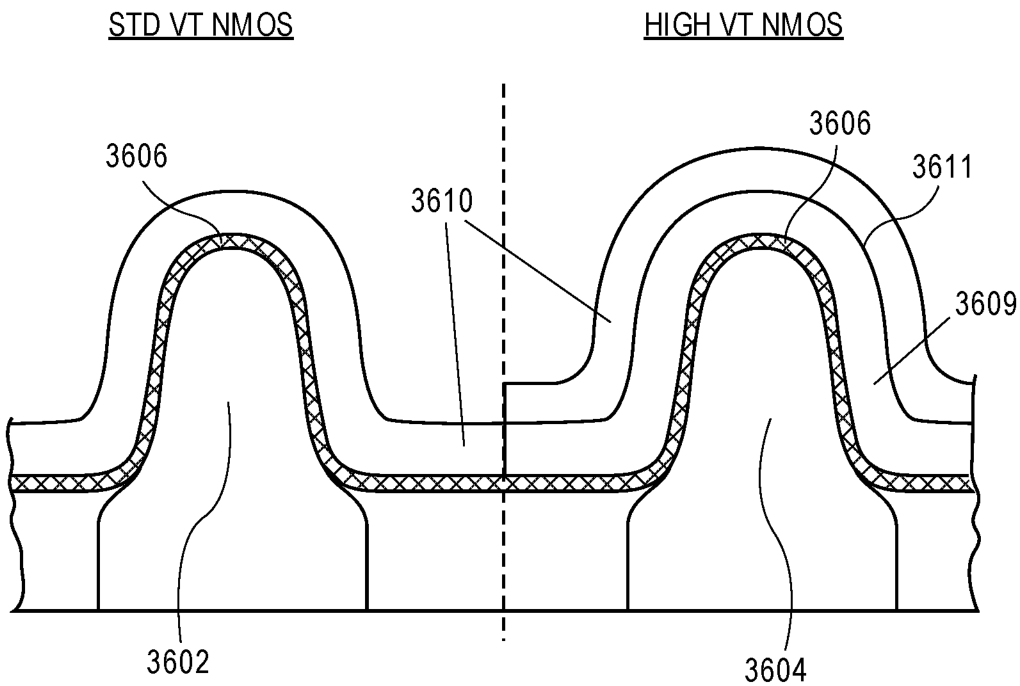

Referring to FIG. 36C, a second P-type metal layer 3610 is formed on the gate dielectric layer 3606 over the first semiconductor fin 3602, and on the portion 3609 of the first P-type metal layer on the gate dielectric layer 3606 over the second semiconductor fin 3604. In an embodiment, subsequent processing includes forming a first P-type device having a voltage threshold (VT) over the first semiconductor fin 3602, and forming a second P-type device having a voltage threshold (VT) over the second semiconductor fin 3604, wherein the VT of the second P-type device is lower than the VT of the first P-type device.

In one embodiment, the first P-type metal layer 3608 and the second P-type metal layer 3610 have a same composition. In one embodiment, the first P-type metal layer 3608 and the second P-type metal layer 3610 have a same thickness. In one embodiment, the first P-type metal layer 3608 and the second P-type metal layer 3610 have a same thickness and a same composition. In one embodiment, a seam 3611 is between the first P-type metal layer 3608 and the second P-type metal layer 3610, as is depicted.

Figure 36D:
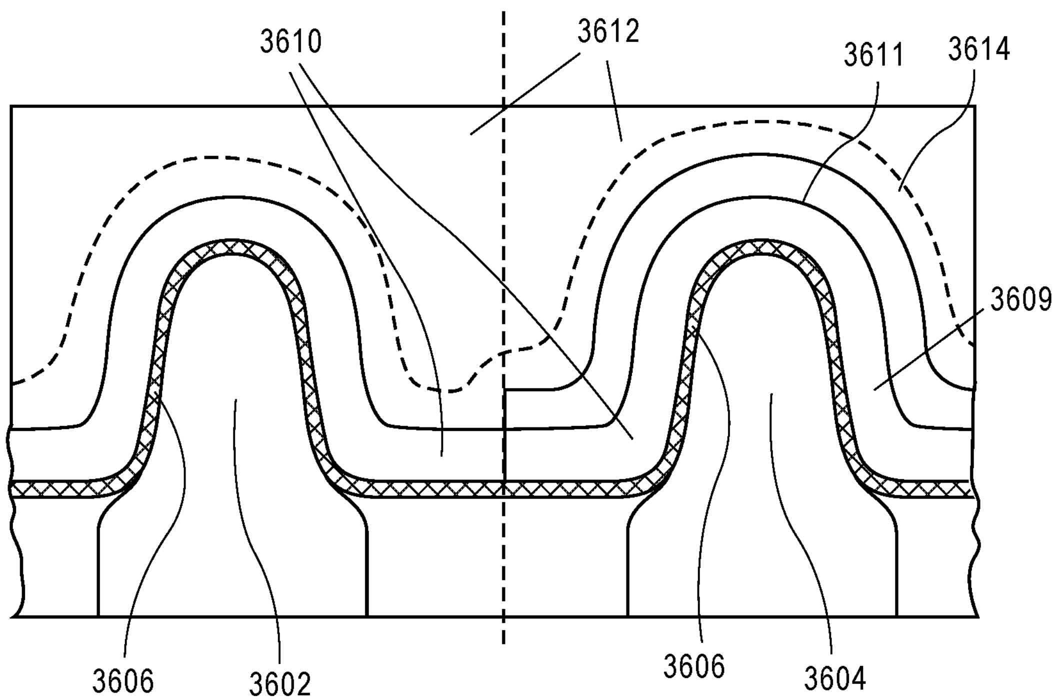

Referring to FIG. 36D, in an embodiment, a conductive fill metal layer 3612 is formed over the P-type metal layer 3610. In one such embodiment, forming the conductive fill metal layer 3612 includes forming a tungsten-containing film using atomic layer deposition (ALD) with a tungsten hexafluoride ($WF_6$) precursor. In one embodiment, an N-type metal layer 3614 is formed on the P-type metal layer 3610 prior to forming the conductive fill metal layer 3612, as is depicted. In one such embodiment, the N-type metal layer 3614 is an artifact of a dual metal gate replacement processing scheme.

In another aspect, metal gate structures for complementary metal oxide semiconductor (CMOS) semiconductor devices are described. In an example, FIG. 37 illustrates a cross-sectional view of an integrated circuit structure having a P/N junction, in accordance with an embodiment of the present disclosure.

Figure 37:
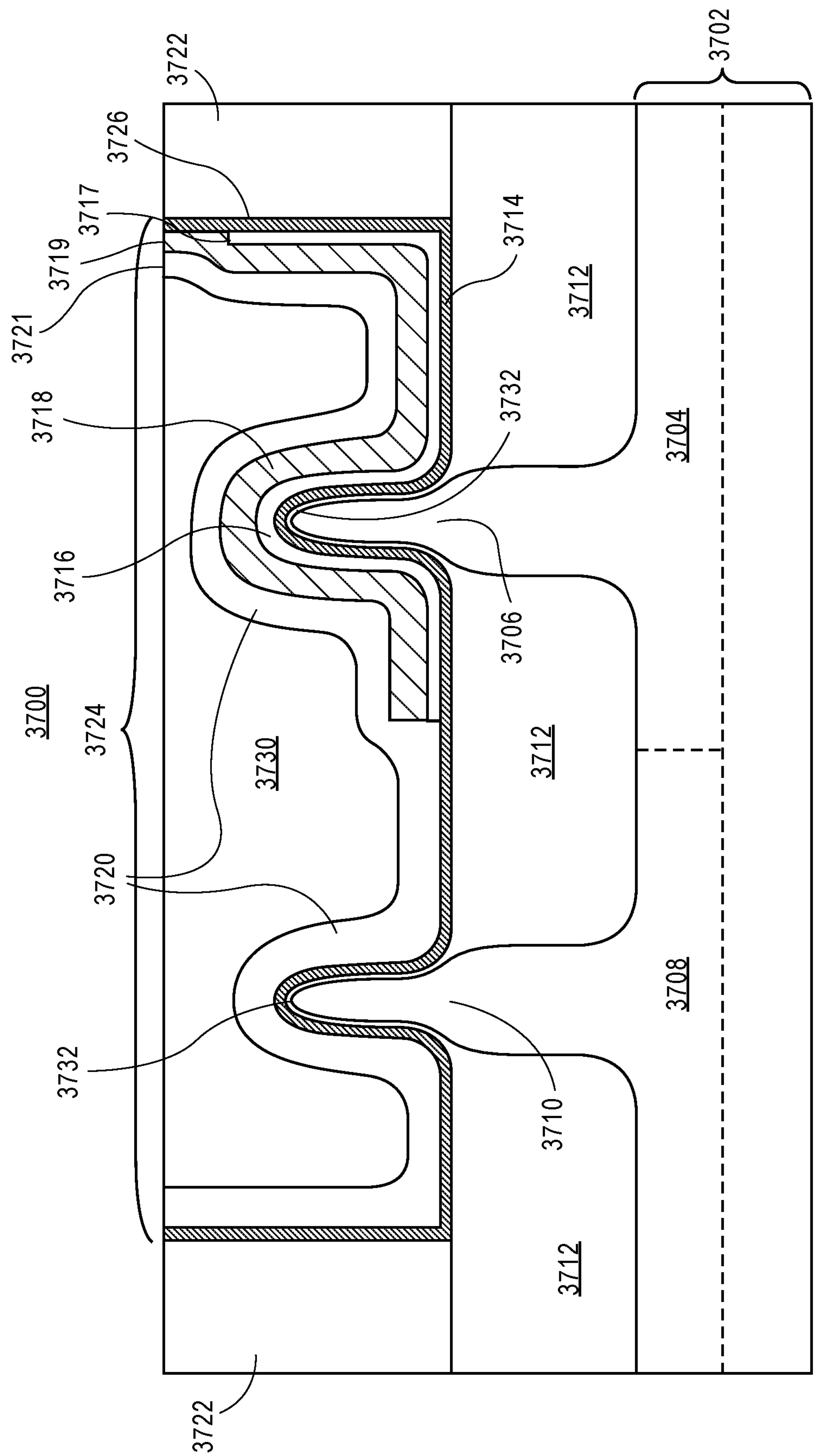
FIG. 37 illustrates a cross-sectional view of an integrated circuit structure having a P/N junction, in accordance with an embodiment of the present disclosure.

Referring to FIG. 37, an integrated circuit structure 3700 includes a semiconductor substrate 3702 having an N well region 3704 having a first semiconductor fin 3706 protruding therefrom and a P well region 3708 having a second semiconductor fin 3710 protruding therefrom. The first semiconductor fin 3706 is spaced apart from the second semiconductor fin 3710. The N well region 3704 is directly adjacent to the P well region 3708 in the semiconductor substrate 3702. A trench isolation structure 3712 is on the semiconductor substrate 3702 outside of and between the first 3706 and second 3210 semiconductor fins. The first 3706 and second 3210 semiconductor fins extend above the trench isolation structure 3712.

A gate dielectric layer 3714 is on the first 3706 and second 3710 semiconductor fins and on the trench isolation structure 3712. The gate dielectric layer 3714 is continuous between the first 3706 and second 3710 semiconductor fins. A conductive layer 3716 is over the gate dielectric layer 3714 over the first semiconductor fin 3706 but not over the second semiconductor fin 3710. In one embodiment, the conductive layer 3716 includes titanium, nitrogen and oxygen. A p type metal gate layer 3718 is over the conductive layer 3716 over the first semiconductor fin 3706 but not over the second semiconductor fin 3710. The p type metal gate layer 3718 is further on a portion of but not all of the trench isolation structure 3712 between the first semiconductor fin 3706 and the second semiconductor fin 3710. An n type metal gate layer 3720 is over the second semiconductor fin 3710, over the trench isolation structure 3712 between the first semiconductor fin 3706 and the second semiconductor fin 3710, and over the p type metal gate layer 3718.

In one embodiment, an inter-layer dielectric (ILD) layer 3722 is above the trench isolation structure 3712 on the outsides of the first semiconductor fin 3706 and the second semiconductor fin 3710. The ILD layer 3722 has an opening 3724, the opening 3724 exposing the first 3706 and second 3710 semiconductor fins. In one such embodiment, the conductive layer 3716, the p type metal gate layer 3718, and the n type metal gate layer 3720 are further formed along a sidewall 3726 of the opening 3724, as is depicted. In a particular embodiment, the conductive layer 3716 has a top surface 3717 along the sidewall 3726 of the opening 3724 below a top surface 3719 of the p type metal gate layer 3718 and a top surface 3721 of the n type metal gate layer 3720 along the sidewall 3726 of the opening 3724, as is depicted.

In one embodiment, the p type metal gate layer 3718 includes titanium and nitrogen. In one embodiment, the n type metal gate layer 3720 includes titanium and aluminum. In one embodiment, a conductive fill metal layer 3730 is over the n type metal gate layer 3720, as is depicted. In one such embodiment, the conductive fill metal layer 3730 includes tungsten. In a particular embodiment, the conductive fill metal layer 3730 includes 95 or greater atomic percent tungsten and 0.1 to 2 atomic percent fluorine. In one embodiment, the gate dielectric layer 3714 has a layer including hafnium and oxygen. In one embodiment, a thermal or chemical oxide layer 3732 is between upper portions of the first 3706 and second 3710 semiconductor fins, as is depicted. In one embodiment, the semiconductor substrate 3702 is a bulk silicon semiconductor substrate.

Referring now to only the right-hand side of FIG. 37, in accordance with an embodiment of the present disclosure, an integrated circuit structure includes a semiconductor substrate 3702 including an N well region 3704 having a semiconductor fin 3706 protruding therefrom. A trench isolation structure 3712 is on the semiconductor substrate 3702 around the semiconductor fin 3706. The semiconductor fin 3706 extends above the trench isolation structure 3712. A gate dielectric layer 3714 is over the semiconductor fin 3706. A conductive layer 3716 is over the gate dielectric layer 3714 over the semiconductor fin 3706. In one embodiment, the conductive layer 3716 includes titanium, nitrogen and oxygen. A P-type metal gate layer 3718 is over the conductive layer 3716 over the semiconductor fin 3706.

In one embodiment, an inter-layer dielectric (ILD) layer 3722 is above the trench isolation structure 3712. The ILD layer has an opening, the opening exposing the semiconductor fin 3706. The conductive layer 3716 and the P-type metal gate layer 3718 are further formed along a sidewall of the opening. In one such embodiment, the conductive layer 3716 has a top surface along the sidewall of the opening below a top surface of the P-type metal gate layer 3718 along the sidewall of the opening. In one embodiment, the P-type metal gate layer 3718 is on the conductive layer 3716. In one embodiment, the P-type metal gate layer 3718 includes titanium and nitrogen. In one embodiment, a conductive fill metal layer 3730 is over the P-type metal gate layer 3718. In one such embodiment, the conductive fill metal layer 3730 includes tungsten. In a particular such embodiment, the conductive fill metal layer 3730 is composed of 95 or greater atomic percent tungsten and 0.1 to 2 atomic percent fluorine. In one embodiment, the gate dielectric layer 3714 includes a layer having hafnium and oxygen.

FIGS. 38A-38H illustrate cross-sectional views of various operations in a method of fabricating an integrated circuit structure using a dual metal gate replacement gate process flow, in accordance with an embodiment of the present disclosure.

Figure 38A:
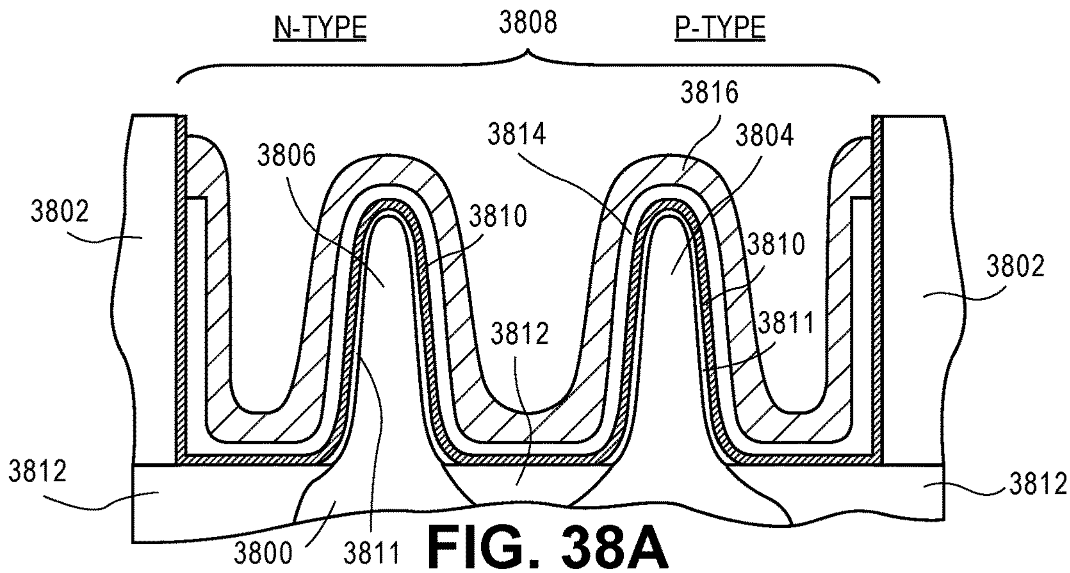
FIGS. 38A-38H illustrate cross-sectional views of various operations in a method of fabricating an integrated circuit structure using a dual metal gate replacement gate process flow, in accordance with an embodiment of the present disclosure.

Referring to FIG. 38A, which shows an NMOS (N-type) regions and a PMOS (P-type) region, a method of fabricating an integrated circuit structure includes forming an inter-layer dielectric (ILD) layer 3802 above first 3804 and second 3806 semiconductor fins above a substrate 3800. An opening 3808 is formed in the ILD layer 3802, the opening 3808 exposing the first 3804 and second 3806 semiconductor fins. In one embodiment, the opening 3808 is formed by removing a gate placeholder or dummy gate structure initially in place over the first 3804 and second 3806 semiconductor fins.

A gate dielectric layer 3810 is formed in the opening 3808 and over the first 3804 and second 3806 semiconductor fins and on a portion of a trench isolation structure 3812 between the first 3804 and second 3806 semiconductor fins. In one embodiments, the gate dielectric layer 3810 is formed on a thermal or chemical oxide layer 3811, such as a silicon oxide or silicon dioxide layer, formed on the first 3804 and second 3806 semiconductor fins, as is depicted. In another embodiment, the gate dielectric layer 3810 is formed directly on the first 3804 and second 3806 semiconductor fins.

A conductive layer 3814 is formed over the gate dielectric layer 3810 formed over the first 3804 and second 3806 semiconductor fins In one embodiment, the conductive layer 3814 includes titanium, nitrogen and oxygen. A p type metal gate layer 3816 is formed over the conductive layer 3814 formed over the first semiconductor fin 3804 and over the second 3806 semiconductor fin.

Figure 38B:
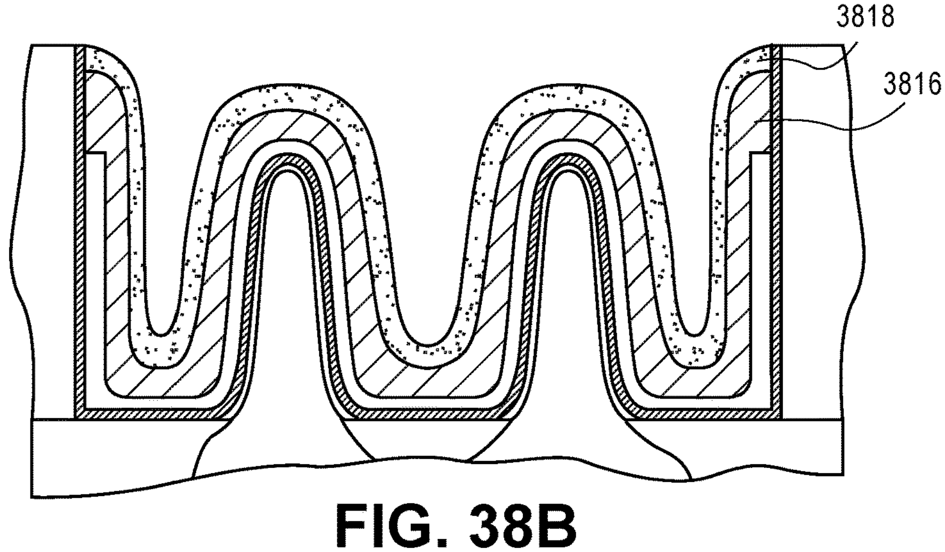

Referring to FIG. 38B, a dielectric etch stop layer 3818 is formed on the p type metal gate layer 3816. In one embodiment, the dielectric etch stop layer 3818 includes a first layer of silicon oxide (e.g., $SiO_2$), a layer of aluminum oxide (e.g., $Al_2O_3$) on the first layer of silicon oxide, and a second layer of silicon oxide (e.g., $SiO_2$) on the layer of aluminum oxide.

Figure 38C:
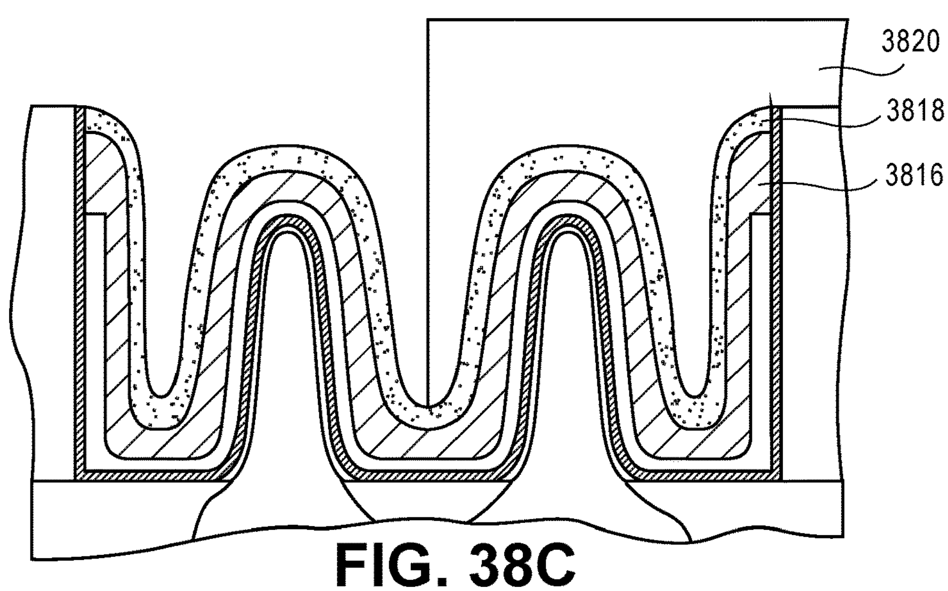

Referring to FIG. 38C, a mask 3820 is formed over the structure of FIG. 38B. The mask 3820 covers the PMOS region and expose the NMOS region.

Figure 38D:
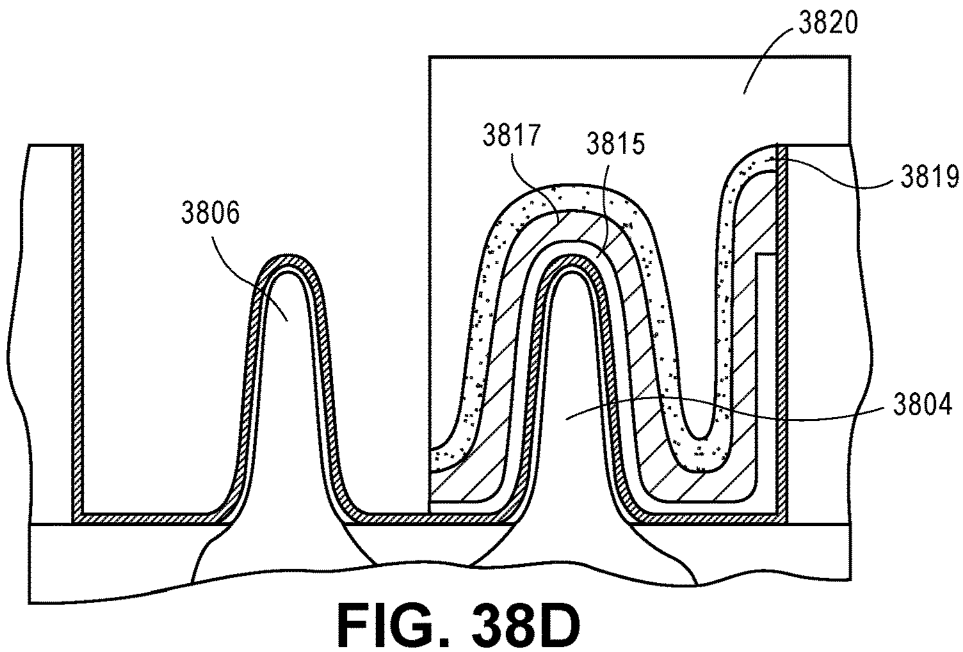

Referring to FIG. 38D, the dielectric etch stop layer 3818, the p type metal gate layer 3816 and the conductive layer 3814 are patterned to provide a patterned dielectric etch stop layer 3819, a patterned p type metal gate layer 3817 over a patterned conductive layer 3815 over the first semiconductor fin 3804 but not over the second semiconductor fin 3806. In an embodiment, the conductive layer 3814 protects the second semiconductor fin 3806 during the patterning.

Figure 38E:
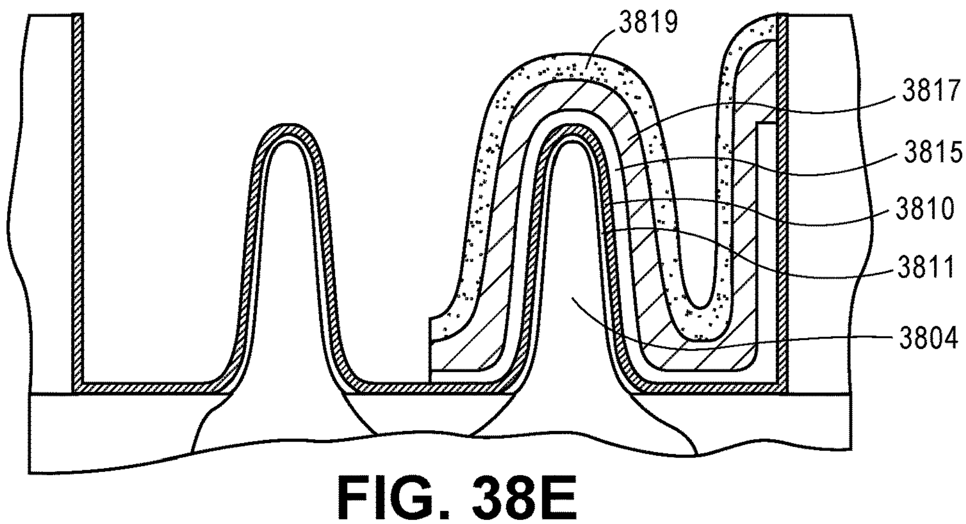
Figure 38F:
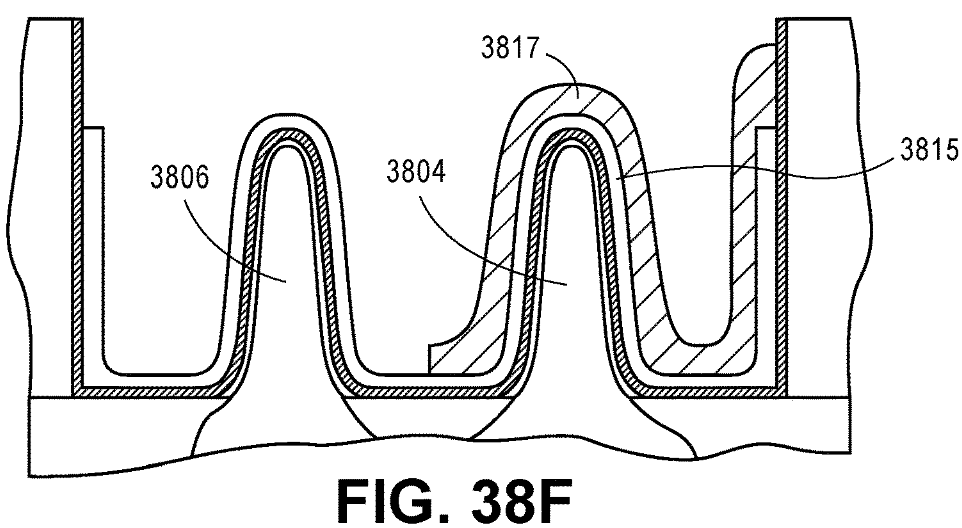

Referring to FIG. 38E, the mask 3820 is removed from the structure of FIG. 38D. Referring to FIG. 3F, the patterned dielectric etch stop layer 3819 is removed from the structure of FIG. 3E.

Figure 38G:
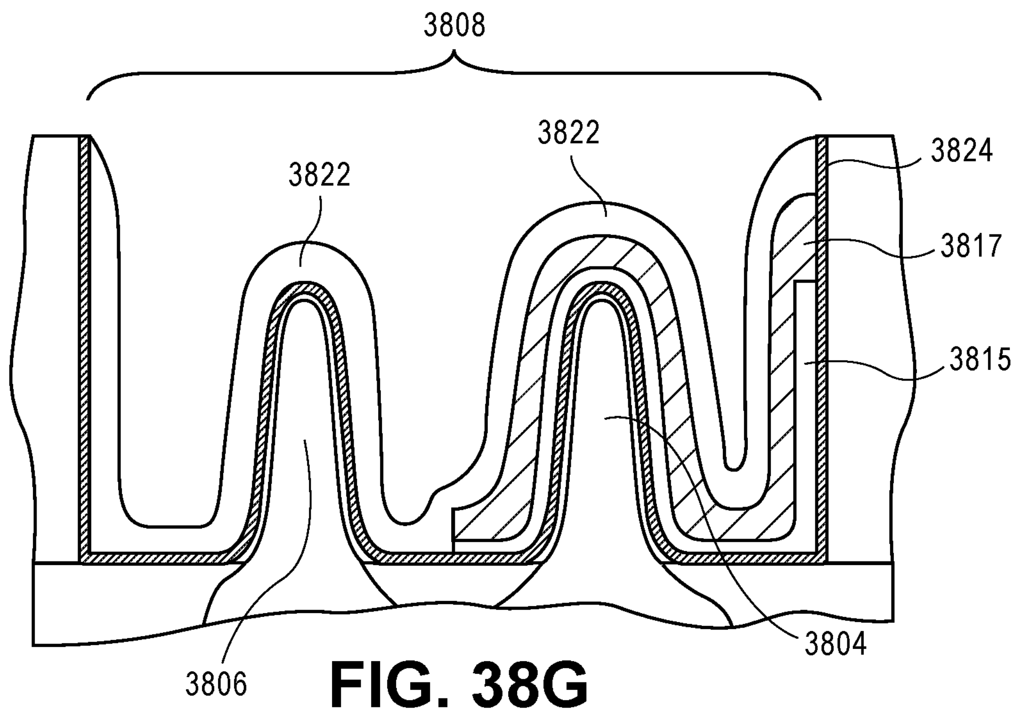

Referring to FIG. 38G, an n type metal gate layer 3822 is formed over the second semiconductor fin 3806, over the portion of the trench isolation structure 3812 between the first 3804 and second 3806 semiconductor fins, and over the patterned p type metal gate layer 3817. In an embodiment, the patterned conductive layer 3815, the patterned p type metal gate layer 3817, and the n type metal gate layer 3822 are further formed along a sidewall 3824 of the opening 3808. In one such embodiment, the patterned conductive layer 3815 has a top surface along the sidewall 3824 of the opening 3808 below a top surface of the patterned p type metal gate layer 3817 and a top surface of the n type metal gate layer 3822 along the sidewall 3824 of the opening 3808.

Figure 38H:
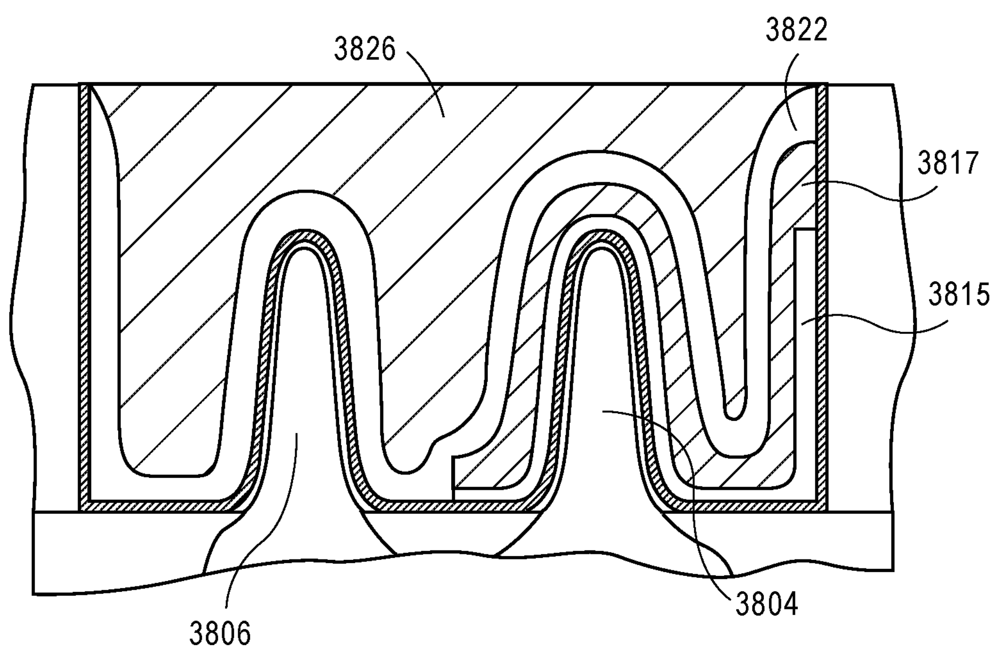

Referring to FIG. 38H, a conductive fill metal layer 3826 is formed over the n type metal gate layer 3822. In one embodiment, the conductive fill metal layer 3826 is formed by depositing a tungsten-containing film using atomic layer deposition (ALD) with a tungsten hexafluoride ($WF_6$) precursor.

In another aspect, dual silicide structures for complementary metal oxide semiconductor (CMOS) semiconductor devices are described. As an exemplary process flow, FIGS. 39A-39H illustrate cross-sectional views representing various operations in a method of fabricating a dual silicide based integrated circuit, in accordance with an embodiment of the present disclosure.

Figure 39A:
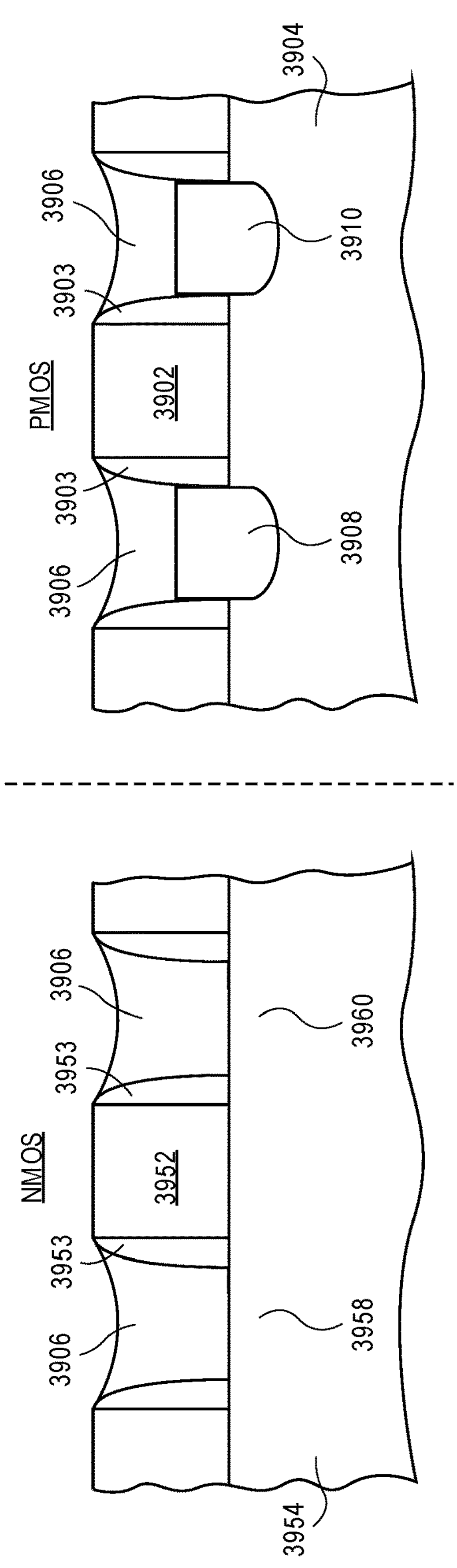
FIGS. 39A-39H illustrate cross-sectional views representing various operations in a method of fabricating a dual silicide based integrated circuit, in accordance with an embodiment of the present disclosure.

Referring to FIG. 39A, where an NMOS region and a PMOS regions are shown as bifurcated on a common substrate, a method of fabricating an integrated circuit structure includes forming a first gate structure 3902, which may include dielectric sidewall spacers 3903, over a first fin 3904, such as a first silicon fin. A second gate structure 3952, which may include dielectric sidewall spacers 3953, is formed over a second fin 3954, such as a second silicon fin. An insulating material 3906 is formed adjacent to the first gate structure 3902 over the first fin 3904 and adjacent to the second gate structure 3952 over the second fin 3954. In one embodiment, the insulating material 3906 is a sacrificial material and is used as a mask in a dual silicide process.

Figure 39B:
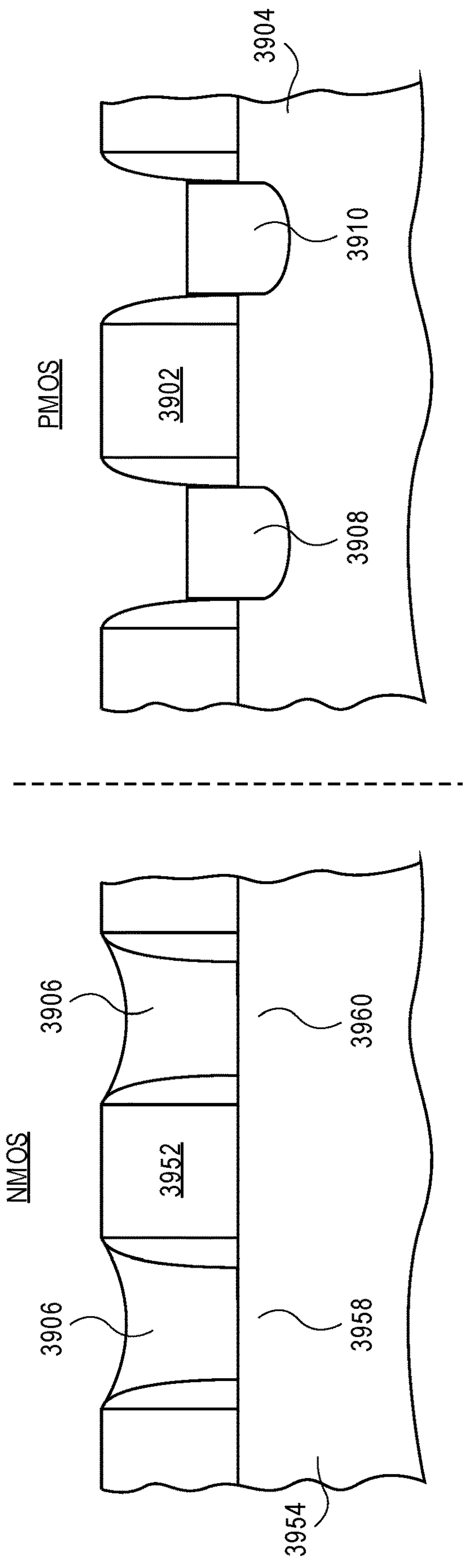

Referring to FIG. 39B, a first portion of the insulating material 3906 is removed from over the first fin 3904 but not from over the second fin 3954 to expose first 3908 and second 3910 source or drain regions of the first fin 3904 adjacent to the first gate structure 3902. In an embodiment, the first 3908 and second 3910 source or drain regions are epitaxial regions formed within recessed portions of the first fin 3904, as is depicted. In one such embodiment, the first 3908 and second 3910 source or drain regions include silicon and germanium.

Figure 39C:
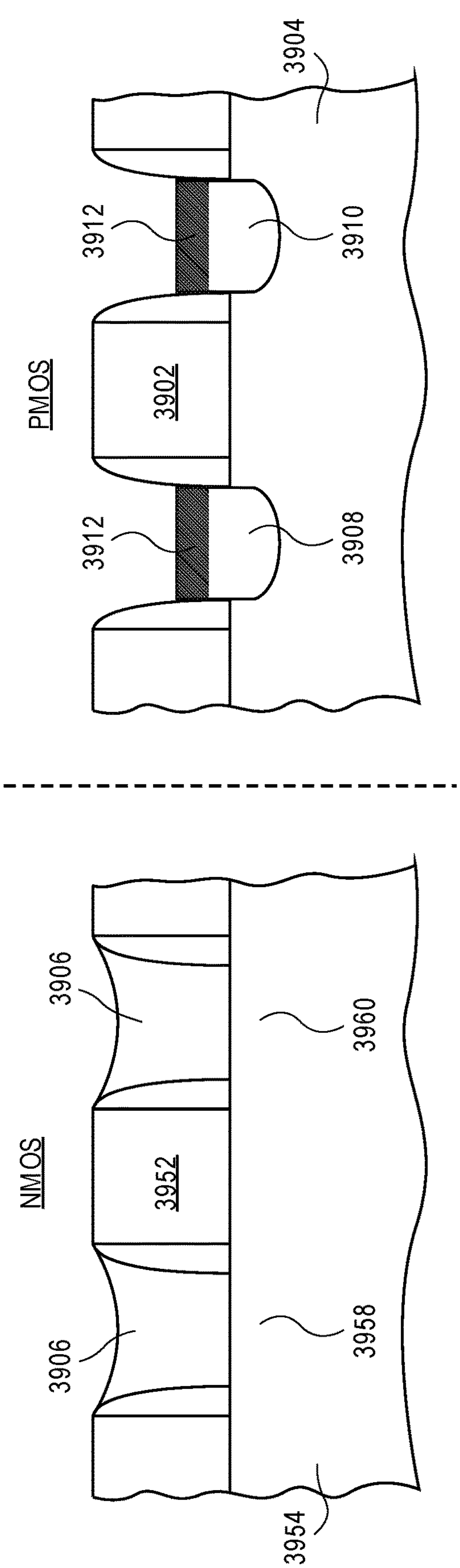

Referring to FIG. 39C, a first metal silicide layer 3912 is formed on the first 3908 and second 3910 source or drain regions of the first fin 3904. In one embodiment, the first metal silicide layer 3912 is formed by depositing a layer including nickel and platinum on the structure of FIG. 39B, annealing the layer including nickel and platinum, and removing unreacted portions of the layer including nickel and platinum.

Figure 39D:
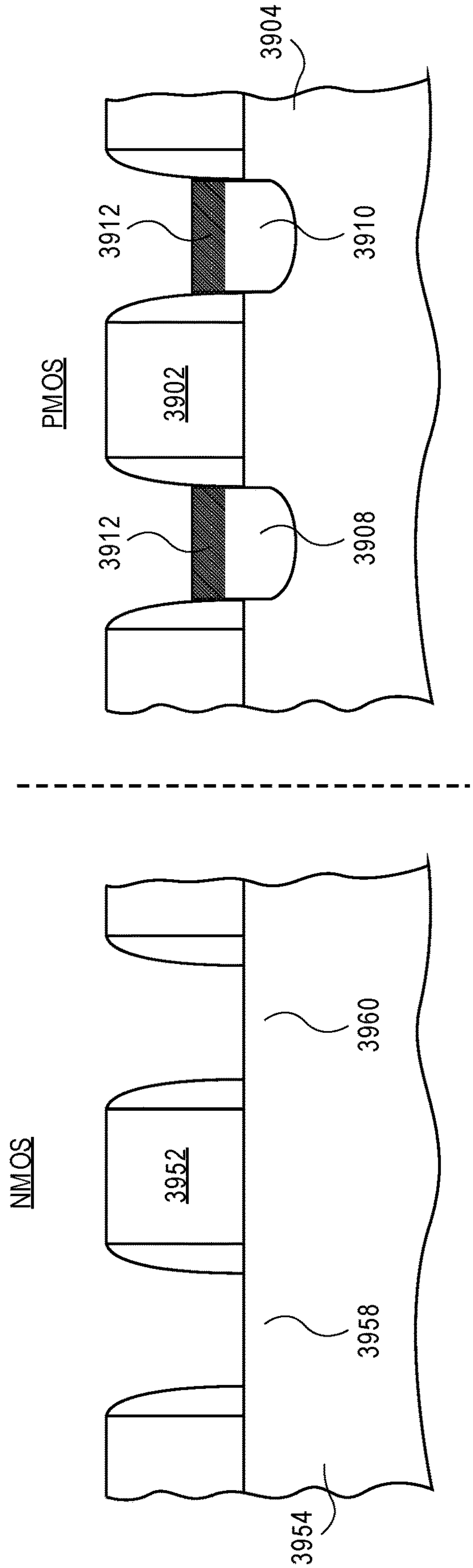

Referring to FIG. 39D, subsequent to forming the first metal silicide layer 3912, a second portion of the insulating material 3906 is removed from over the second fin 3954 to expose third 3958 and fourth 3960 source or drain regions of the second fin 3954 adjacent to the second gate structure 3952. In an embodiment, the second 3958 and third 3960 source or drain regions are formed within the second fin 3954, such as within a second silicon fin, as is depicted. In another embodiment, however, the third 3958 and fourth 3960 source or drain regions are epitaxial regions formed within recessed portions of the second fin 3954. In one such embodiment, the third 3958 and fourth 3960 source or drain regions include silicon.

Figure 39E:
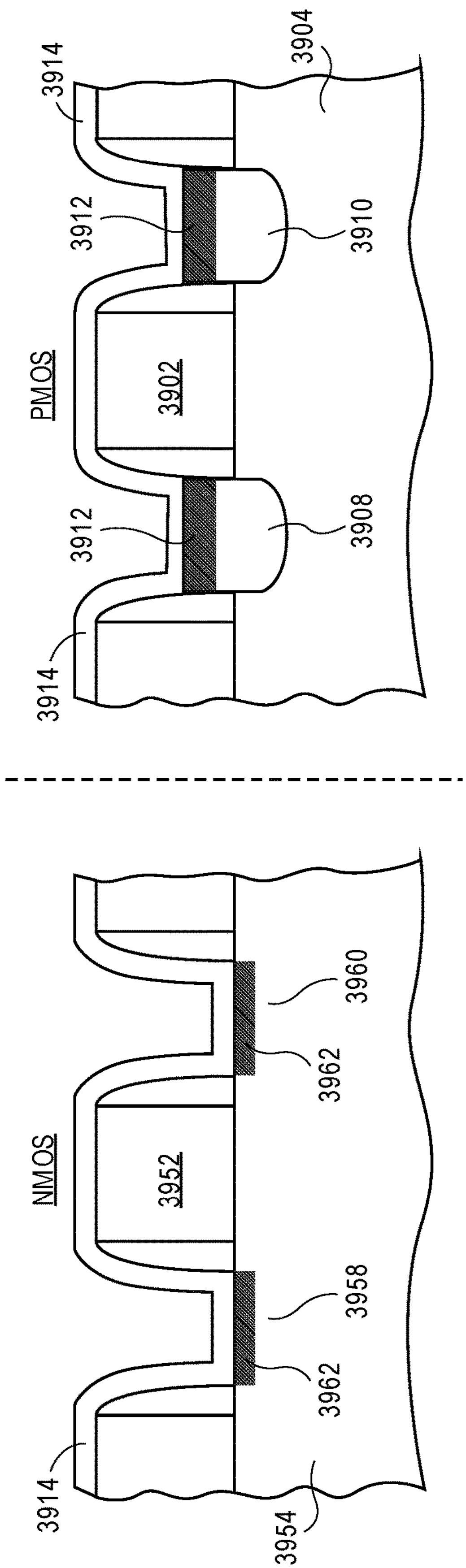

Referring to FIG. 39E, a first metal layer 3914 is formed on the structure of FIG. 39D, i.e., on the first 3908, second 3910, third 3958 and fourth 3960 source or drain regions. A second metal silicide layer 3962 is then formed on the third 3958 and fourth 3960 source or drain regions of the second fin 3954. The second metal silicide layer 3962 is formed from the first metal layer 3914, e.g., using an anneal process. In an embodiment, the second metal silicide layer 3962 is different in composition from the first metal silicide layer 3912. In one embodiment, the first metal layer 3914 is or includes a titanium layer. In one embodiment, the first metal layer 3914 is formed as a conformal metal layer, e.g., conformal with the open trenches of FIG. 39D, as is depicted.

Figure 39F:
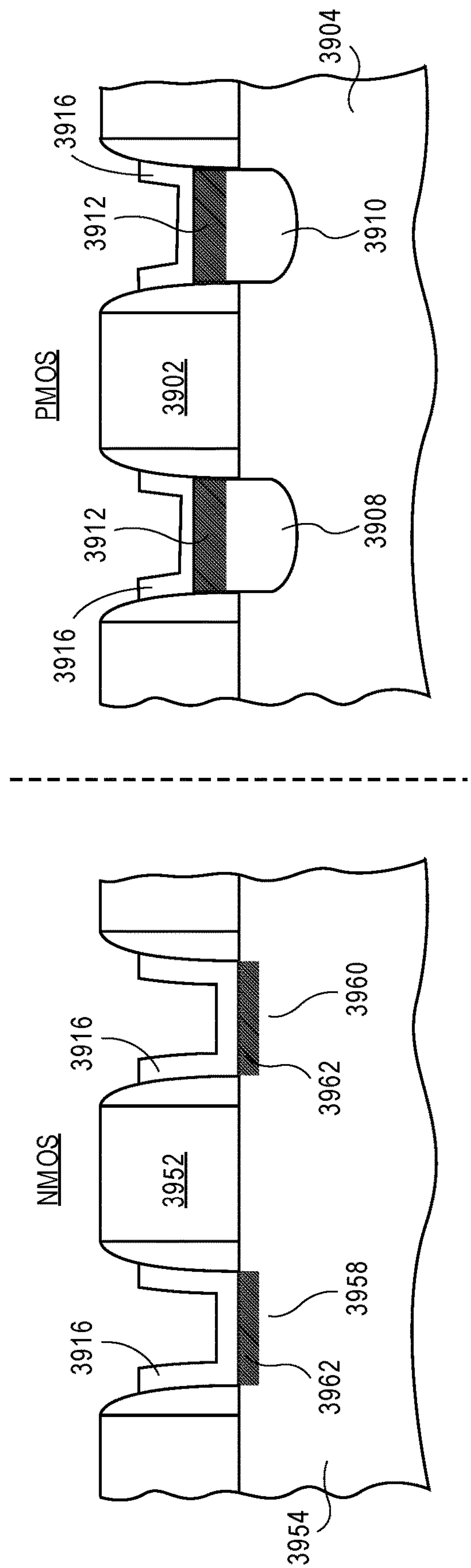

Referring to FIG. 39F, in an embodiment, the first metal layer 3914 is recessed to form a U-shaped metal layer 3916 above each of the first 3908, second 3910, third 3958 and fourth 3960 source or drain regions.

Figures 39G, 39H:
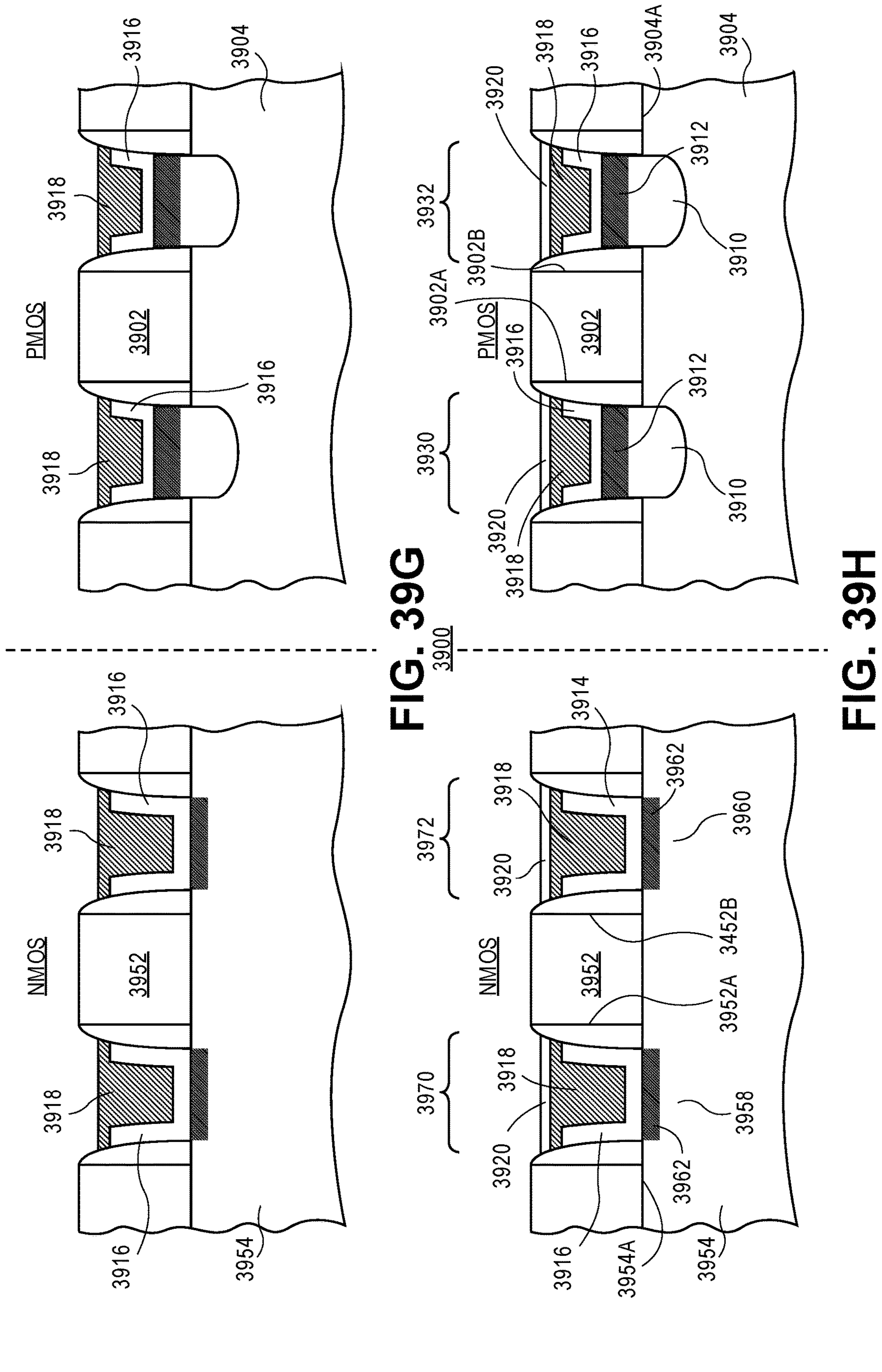

Referring to FIG. 39G, in an embodiment, a second metal layer 3918 is formed on the U-shaped metal layer 3916 of the structure of FIG. 39F. In an embodiment, the second metal layer 3918 is different in composition than the U-shaped metal layer 3916.

Referring to FIG. 39H, in an embodiment, a third metal layer 3920 is formed on the second metal layer 3918 of the structure of FIG. 39G. In an embodiment, the third metal layer 3920 has a same composition as the U-shaped metal layer 3916.

Referring again to FIG. 3H, in accordance with an embodiment of the present disclosure, an integrated circuit structure 3900 includes a P-type semiconductor device (PMOS) above a substrate. The P-type semiconductor device includes a first fin 3904, such as a first silicon fin. It is to be appreciated that the first fin has a top (shown as 3904A) and sidewalls (e.g., into and out of the page). A first gate electrode 3902 includes a first gate dielectric layer over the top 3904A of the first fin 3904 and laterally adjacent the sidewalls of the first fin 3904, and includes a first gate electrode over the first gate dielectric layer over the top 3904A of the first fin 3904 and laterally adjacent the sidewalls of the first fin 3904. The first gate electrode 3902 has a first side 3902A and a second side 3902B opposite the first side 3902A.

First 3908 and second 3910 semiconductor source or drain regions are adjacent the first 3902A and second 3902B sides of the first gate electrode 3902, respectively. First 3930 and second 3932 trench contact structures are over the first 3908 and second 3910 semiconductor source or drain regions adjacent the first 3902A and second 3902B sides of the first gate electrode 3902, respectively. A first metal silicide layer 3912 is directly between the first 3930 and second 3932 trench contact structures and the first 3908 and second 3910 semiconductor source or drain regions, respectively.

The integrated circuit structure 3900 includes an N-type semiconductor device (NMOS) above the substrate. The N-type semiconductor device includes a second fin 3954, such as a second silicon fin. It is to be appreciated that the second fin has a top (shown as 3954A) and sidewalls (e.g., into and out of the page). A second gate electrode 3952 includes a second gate dielectric layer over the top 3954A of the second fin 3954 and laterally adjacent the sidewalls of the second fin 3954, and includes a second gate electrode over the second gate dielectric layer over the top 3954A of the second fin 3954 and laterally adjacent the sidewalls of the second fin 3954. The second gate electrode 3952 has a first side 3952A and a second side 3952B opposite the first side 3952A.

Third 3958 and fourth 3960 semiconductor source or drain regions are adjacent the first 3952A and second 3952B sides side of the second gate electrode 3952, respectively. Third 3970 and fourth 3972 trench contact structures are over the third 3958 and fourth 3960 semiconductor source or drain regions adjacent the first 3952A and second 3952B sides side of the second gate electrode 3952, respectively. A second metal silicide layer 3962 is directly between the third 3970 and fourth 3972 trench contact structures and the third 3958 and fourth 3960 semiconductor source or drain regions, respectively. In an embodiment, the first metal silicide layer 3912 includes at least one metal species not included in the second metal silicide layer 3962.

In one embodiment, the second metal silicide layer 3962 includes titanium and silicon. The first metal silicide layer 3912 includes nickel, platinum and silicon. In one embodiment, the first metal silicide layer 3912 further includes germanium. In one embodiment, the first metal silicide layer 3912 further includes titanium, e.g., as incorporated into the first metal silicide layer 3912 during the subsequent formation of the second metal silicide layer 3962 with first metal layer 3914. In one such embodiment, a silicide layer already formed on a PMOS source or drain region is further modified by an anneal process used to form a silicide region on an NMOS source or drain region. This may result in a silicide layer on the PMOS source or drain region that has fractional percentage of all siliciding metals. However, in other embodiments, such a silicide layer already formed on a PMOS source or drain region does not change or does not change substantially by an anneal process used to form a silicide region on an NMOS source or drain region.

In one embodiment, the first 3908 and second 3910 semiconductor source or drain regions are first and second embedded semiconductor source or drain regions including silicon and germanium. In one such embodiment, the third 3958 and fourth 3960 semiconductor source or drain regions are third and fourth embedded semiconductor source or drain regions including silicon. In another embodiment, the third 3958 and fourth 3960 semiconductor source or drain regions are formed in the fin 3954 and are not embedded epitaxial regions.

In an embodiment, the first 3930, second 3932, third 3970 and fourth 3972 trench contact structures all include a U-shaped metal layer 3916 and a T-shaped metal layer 3918 on and over the entirety of the U-shaped metal layer 3916. In one embodiment, the U-shaped metal layer 3916 includes titanium, and the T-shaped metal layer 3918 includes cobalt. In one embodiment, the first 3930, second 3932, third 3970 and fourth 3972 trench contact structures all further include a third metal layer 3920 on the T-shaped metal layer 3918. In one embodiment, the third metal layer 3920 and the U-shaped metal layer 3916 have a same composition. In a particular embodiment, the third metal layer 3920 and the U-shaped metal layer include titanium, and the T-shaped metal layer 3918 includes cobalt.

Figure 40A:
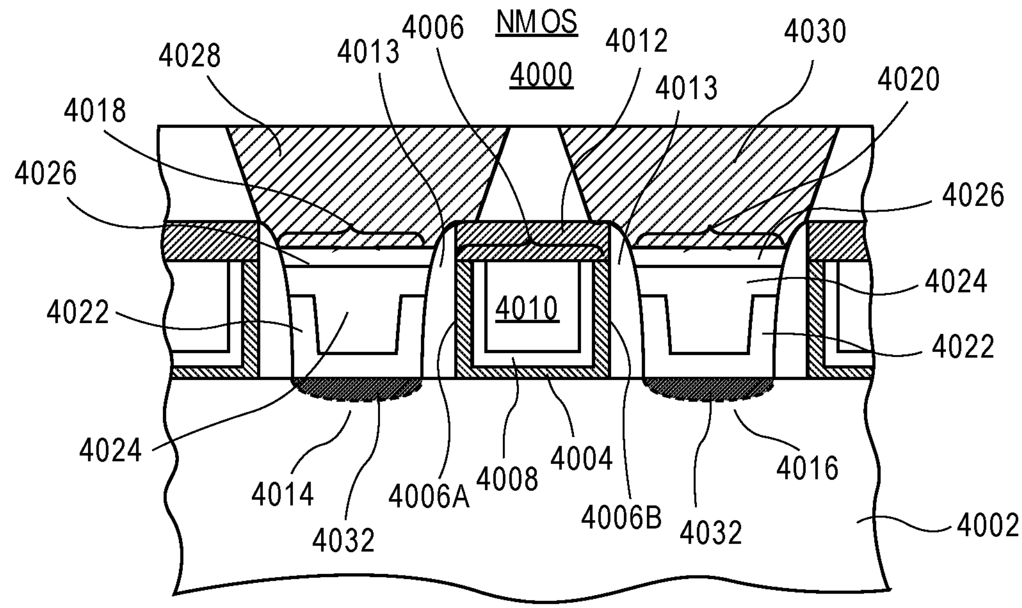
FIG. 40A illustrates a cross-sectional view of an integrated circuit structure having trench contacts for an NMOS device, in accordance with an embodiment of the present disclosure.
Figure 40B:
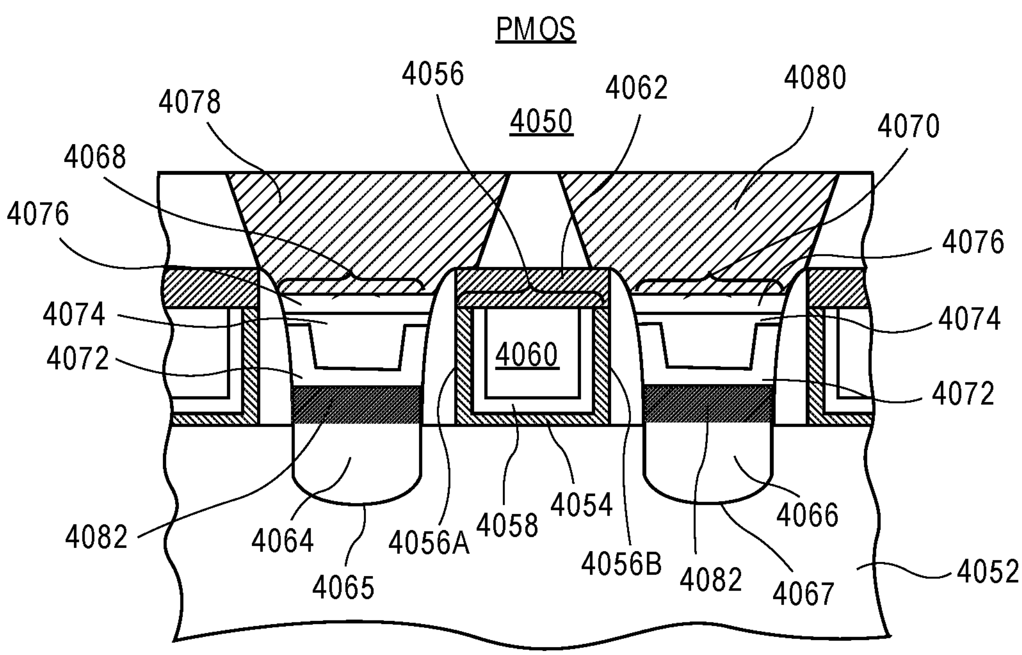
FIG. 40B illustrates a cross-sectional view of an integrated circuit structure having trench contacts for a PMOS device, in accordance with another embodiment of the present disclosure.

In another aspect, trench contact structures, e.g., for source or drain regions, are described. In an example, FIG. 40A illustrates a cross-sectional view of an integrated circuit structure having trench contacts for an NMOS device, in accordance with an embodiment of the present disclosure. FIG. 40B illustrates a cross-sectional view of an integrated circuit structure having trench contacts for a PMOS device, in accordance with another embodiment of the present disclosure.

Referring to FIG. 40A, an integrated circuit structure 4000 includes a fin 4002, such as a silicon fin. A gate dielectric layer 4004 is over fin 4002. A gate electrode 4006 is over the gate dielectric layer 4004. In an embodiment, the gate electrode 4006 includes a conformal conductive layer 4008 and a conductive fill 4010. In an embodiment, a dielectric cap 4012 is over the gate electrode 4006 and over the gate dielectric layer 4004. The gate electrode has a first side 4006A and a second side 4006B opposite the first side 4006A. Dielectric spacers 4013 are along the sidewalls of the gate electrode 4006. In one embodiment, the gate dielectric layer 4004 is further between a first of the dielectric spacers 4013 and the first side 4006A of the gate electrode 4006, and between a second of the dielectric spacers 4013 and the second side 4006B of the gate electrode 4006, as is depicted. In an embodiment, although not depicted, a thin oxide layer, such as a thermal or chemical silicon oxide or silicon dioxide layer, is between the fin 4002 and the gate dielectric layer 4004.

First 4014 and second 4016 semiconductor source or drain regions are adjacent the first 4006A and second 4006B sides of the gate electrode 4006, respectively. In one embodiment, the first 4014 and second 4016 semiconductor source or drain regions are in the fin 4002, as is depicted. However, in another embodiment, the first 4014 and second 4016 semiconductor source or drain regions are embedded epitaxial regions formed in recesses of the fin 4002.

First 4018 and second 4020 trench contact structures are over the first 4014 and second 4016 semiconductor source or drain regions adjacent the first 4006A and second 4006B sides of the gate electrode 4006, respectively. The first 4018 and second 4020 trench contact structures both include a U-shaped metal layer 4022 and a T-shaped metal layer 4024 on and over the entirety of the U-shaped metal layer 4022. In one embodiment, the U-shaped metal layer 4022 and the T-shaped metal layer 4024 differ in composition. In one such embodiment, the U-shaped metal layer 4022 includes titanium, and the T-shaped metal layer 4024 includes cobalt. In one embodiment, the first 4018 and second 4020 trench contact structures both further include a third metal layer 4026 on the T-shaped metal layer 4024. In one such embodiment, the third metal layer 4026 and the U-shaped metal layer 4022 have a same composition. In a particular embodiment, the third metal layer 4026 and the U-shaped metal layer 4022 include titanium, and the T-shaped metal layer 4024 includes cobalt.

A first trench contact via 4028 is electrically connected to the first trench contact 4018. In a particular embodiment, the first trench contact via 4028 is on and coupled to the third metal layer 4026 of the first trench contact 4018. The first trench contact via 4028 is further over and in contact with a portion of one of the dielectric spacers 4013, and over and in contact with a portion of the dielectric cap 4012. A second trench contact via 4030 is electrically connected to the second trench contact 4020. In a particular embodiment, the second trench contact via 4030 is on and coupled to the third metal layer 4026 of the second trench contact 4020. The second trench contact via 4030 is further over and in contact with a portion of another of the dielectric spacers 4013, and over and in contact with another portion of the dielectric cap 4012.

In an embodiment, a metal silicide layer 4032 is directly between the first 4018 and second 4020 trench contact structures and the first 4014 and second 4016 semiconductor source or drain regions, respectively. In one embodiment, the metal silicide layer 4032 includes titanium and silicon. In a particular such embodiment, the first 4014 and second 4016 semiconductor source or drain regions are first and second N-type semiconductor source or drain regions.

Referring to FIG. 40B, an integrated circuit structure 4050 includes a fin 4052, such as a silicon fin. A gate dielectric layer 4054 is over fin 4052. A gate electrode 4056 is over the gate dielectric layer 4054. In an embodiment, the gate electrode 4056 includes a conformal conductive layer 4058 and a conductive fill 4060. In an embodiment, a dielectric cap 4062 is over the gate electrode 4056 and over the gate dielectric layer 4054. The gate electrode has a first side 4056A and a second side 4056B opposite the first side 4056A. Dielectric spacers 4063 are along the sidewalls of the gate electrode 4056. In one embodiment, the gate dielectric layer 4054 is further between a first of the dielectric spacers 4063 and the first side 4056A of the gate electrode 4056, and between a second of the dielectric spacers 4063 and the second side 4056B of the gate electrode 4056, as is depicted. In an embodiment, although not depicted, a thin oxide layer, such as a thermal or chemical silicon oxide or silicon dioxide layer, is between the fin 4052 and the gate dielectric layer 4054.

First 4064 and second 4066 semiconductor source or drain regions are adjacent the first 4056A and second 4056B sides of the gate electrode 4056, respectively. In one embodiment, the first 4064 and second 4066 semiconductor source or drain regions are embedded epitaxial regions formed in recesses 4065 and 4067, respectively, of the fin 4052, as is depicted. However, in another embodiment, the first 4064 and second 4066 semiconductor source or drain regions are in the fin 4052.

First 4068 and second 4070 trench contact structures are over the first 4064 and second 4066 semiconductor source or drain regions adjacent the first 4056A and second 4056B sides of the gate electrode 4056, respectively. The first 4068 and second 4070 trench contact structures both include a U-shaped metal layer 4072 and a T-shaped metal layer 4074 on and over the entirety of the U-shaped metal layer 4072. In one embodiment, the U-shaped metal layer 4072 and the T-shaped metal layer 4074 differ in composition. In one such embodiment, the U-shaped metal layer 4072 includes titanium, and the T-shaped metal layer 4074 includes cobalt. In one embodiment, the first 4068 and second 4070 trench contact structures both further include a third metal layer 4076 on the T-shaped metal layer 4074. In one such embodiment, the third metal layer 4076 and the U-shaped metal layer 4072 have a same composition. In a particular embodiment, the third metal layer 4076 and the U-shaped metal layer 4072 include titanium, and the T-shaped metal layer 4074 includes cobalt.

A first trench contact via 4078 is electrically connected to the first trench contact 4068. In a particular embodiment, the first trench contact via 4078 is on and coupled to the third metal layer 4076 of the first trench contact 4068. The first trench contact via 4078 is further over and in contact with a portion of one of the dielectric spacers 4063, and over and in contact with a portion of the dielectric cap 4062. A second trench contact via 4080 is electrically connected to the second trench contact 4070. In a particular embodiment, the second trench contact via 4080 is on and coupled to the third metal layer 4076 of the second trench contact 4070. The second trench contact via 4080 is further over and in contact with a portion of another of the dielectric spacers 4063, and over and in contact with another portion of the dielectric cap 4062.

In an embodiment, a metal silicide layer 4082 is directly between the first 4068 and second 4070 trench contact structures and the first 4064 and second 4066 semiconductor source or drain regions, respectively. In one embodiment, the metal silicide layer 4082 includes nickel, platinum and silicon. In a particular such embodiment, the first 4064 and second 4066 semiconductor source or drain regions are first and second P-type semiconductor source or drain regions. In one embodiment, the metal silicide layer 4082 further includes germanium. In one embodiment, the metal silicide layer 4082 further includes titanium.

One or more embodiments described herein are directed to the use of metal chemical vapor deposition for wrap-around semiconductor contacts. Embodiments may be applicable to or include one or more of chemical vapor deposition (CVD), plasma enhanced chemical vapor deposition (PECVD), atomic layer deposition (ALD), conductive contact fabrication, or thin films.

Particular embodiments may include the fabrication of a titanium or like metallic layer using a low temperature (e.g., less than 500 degrees Celsius, or in the range of 400-500 degrees Celsius) chemical vapor deposition of a contact metal to provide a conformal source or drain contact. Implementation of such a conformal source or drain contact may improve three-dimensional (3D) transistor complementary metal oxide semiconductor (CMOS) performance.

To provide context, metal to semiconductor contact layers may be deposited using sputtering. Sputtering is a line of sight process and may not be well suited to 3D transistor fabrication. Known sputtering solutions have poor or incomplete metal-semiconductor junctions on device contact surfaces with an angle to the incidence of deposition.

In accordance with one or more embodiments of the present disclosure, a low temperature chemical vapor deposition process is implemented for fabrication of a contact metal to provide conformality in three dimensions and maximize the metal semiconductor junction contact area. The resulting greater contact area may reduce the resistance of the junction. Embodiments may include deposition on semiconductor surfaces having a non-flat topography, where the topography of an area refers to the surface shapes and features themselves, and a non-flat topography includes surface shapes and features or portions of surface shapes and features that are non-flat, i.e., surface shapes and features that are not entirely flat.

Embodiments described herein may include fabrication of wrap-around contact structures. In one such embodiment, the use of pure metal conformally deposited onto transistor source-drain contacts by chemical vapor deposition, plasma enhanced chemical vapor deposition, atomic layer deposition, or plasma enhanced atomic layer deposition is described. Such conformal deposition may be used to increase the available area of metal semiconductor contact and reduce resistance, improving the performance of the transistor device. In an embodiment, the relatively low temperature of the deposition leads to a minimized resistance of the junction per unit area.

It is to be appreciated that a variety of integrated circuit structures may be fabricated using an integration scheme involving a metallic layer deposition process as described herein. In accordance with an embodiment of the present disclosure, a method of fabricating an integrated circuit structure includes providing a substrate in a chemical vapor deposition (CVD) chamber having an RF source, the substrate having a feature thereon. The method also includes reacting titanium tetrachloride ($TiCl_4$) and hydrogen ($H_2$) to form a titanium (Ti) layer on the feature of the substrate.

In an embodiment, the titanium layer has a total atomic composition including 98% or greater of titanium and 0.5-2% of chlorine. In alternative embodiments, a similar process is used to fabricate a high purity metallic layer of zirconium (Zr), hafnium (Hf), tantalum (Ta), niobium (Nb), or vanadium (V). In an embodiment, there is relatively little film thickness variation, e.g., in an embodiment all coverage is greater than 50% and nominal is 70% or greater (i.e., thickness variation of 30% or less). In an embodiment, thickness is measurably thicker on silicon (Si) or silicon germanium (SiGe) than other surfaces, as the Si or SiGe reacts during deposition and speeds uptake of the Ti. In an embodiment, the film composition includes approximately 0.5% Cl (or less than 1%) as an impurity, with essentially no other observed impurities. In an embodiment, the deposition process enables metal coverage on non-line of sight surfaces, such as surfaces hidden by a sputter deposition line of sight. Embodiments described herein may be implemented to improves transistor device drive by reducing the external resistance of current being driven through the source and drain contacts.

In accordance with an embodiment of the present disclosure, the feature of the substrate is a source or drain contact trench exposing a semiconductor source or drain structure. The titanium layer (or other high purity metallic layer) is a conductive contact layer for the semiconductor source or drain structure. Exemplary embodiments of such an implementation are described below in association with FIGS. 41A, 41B, 42, 43A-43C and 44.

Figure 41A:
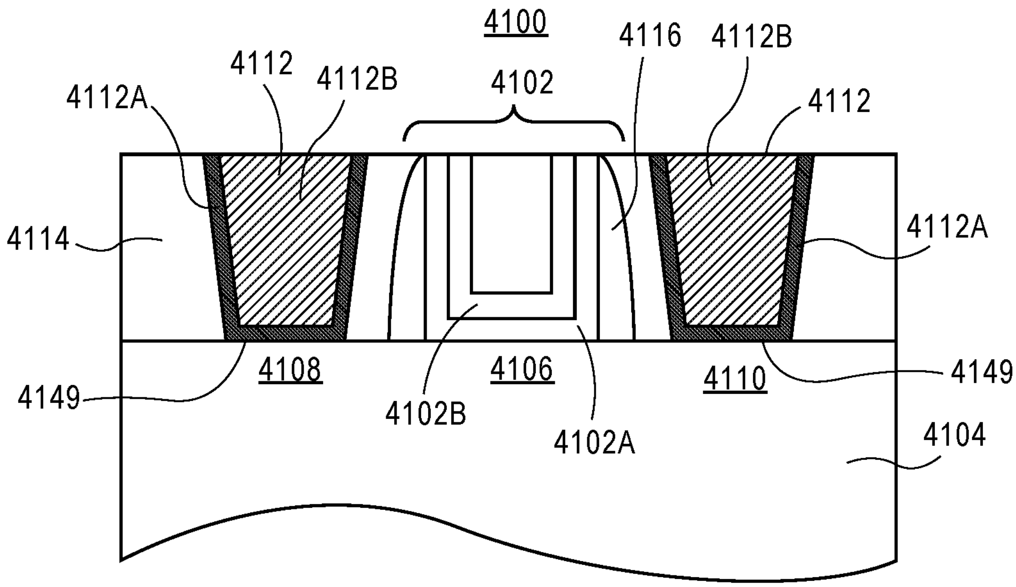
FIG. 41A illustrates a cross-sectional view of a semiconductor device having a conductive contact on a source or drain region, in accordance with an embodiment of the present disclosure.

FIG. 41A illustrates a cross-sectional view of a semiconductor device having a conductive contact on a source or drain region, in accordance with an embodiment of the present disclosure.

Referring to FIG. 41A, a semiconductor structure 4100 includes a gate structure 4102 above a substrate 4104. The gate structure 4102 includes a gate dielectric layer 4102A, a workfunction layer 4102B, and a gate fill 4102C. A source region 4108 and a drain region 4110 are on opposite sides of the gate structure 4102. Source or drain contacts 4112 are electrically connected to the source region 4108 and the drain region 4110, and are spaced apart of the gate structure 4102 by one or both of an inter-layer dielectric layer 4114 or gate dielectric spacers 4116. The source region 4108 and the drain region 4110 are regions of the substrate 4104.

In an embodiment, the source or drain contacts 4112 include a high purity metallic layer 4112A, such as described above, and a conductive trench fill material 4112B. In one embodiment, the high purity metallic layer 4112A has a total atomic composition including 98% or greater of titanium. In one such embodiment, the total atomic composition of the high purity metallic layer 4112A further includes 0.5-2% of chlorine. In an embodiment, the high purity metallic layer 4112A has a thickness variation of 30% or less. In an embodiment, the conductive trench fill material 4112B is composed of a conductive material such as, but not limited to, Cu, Al, W, or alloys thereof.

Figure 41B:
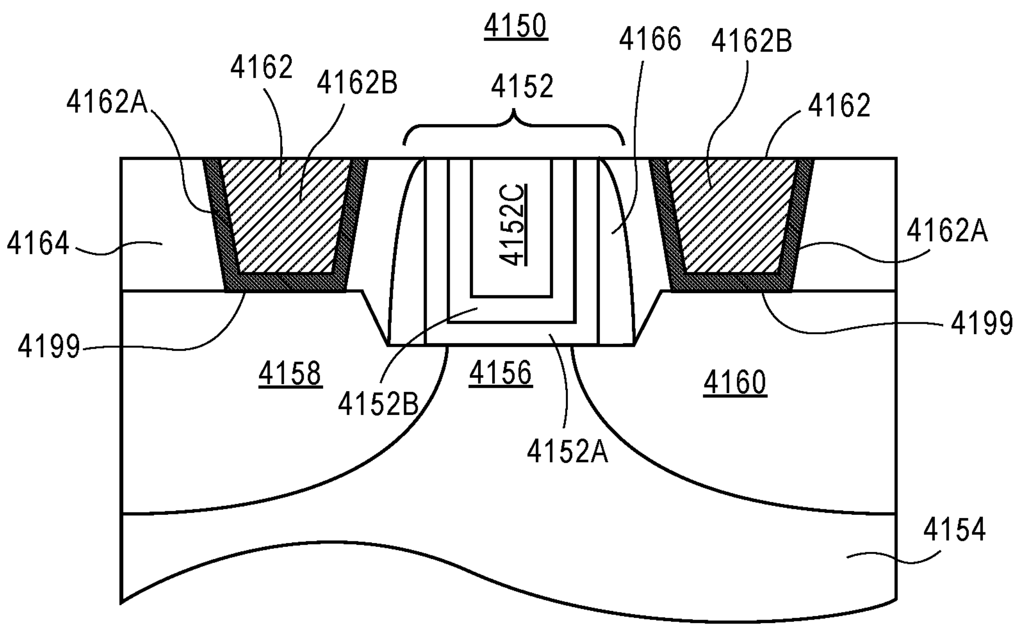
FIG. 41B illustrates a cross-sectional view of another semiconductor device having a conductive on a raised source or drain region, in accordance with an embodiment of the present disclosure.

FIG. 41B illustrates a cross-sectional view of another semiconductor device having a conductive on a raised source or drain region, in accordance with an embodiment of the present disclosure.

Referring to FIG. 41B, a semiconductor structure 4150 includes a gate structure 4152 above a substrate 4154. The gate structure 4152 includes a gate dielectric layer 4152A, a workfunction layer 4152B, and a gate fill 4152C. A source region 4158 and a drain region 4160 are on opposite sides of the gate structure 4152. Source or drain contacts 4162 are electrically connected to the source region 4158 and the drain region 4160, and are spaced apart of the gate structure 4152 by one or both of an inter-layer dielectric layer 4164 or gate dielectric spacers 4166. The source region 4158 and the drain region 4160 are epitaxial or embedded material regions formed in etched-out regions of the substrate 4154. As is depicted, in an embodiment, the source region 4158 and the drain region 4160 are raised source and drain regions. In a specific such embodiment, the raised source and drain regions are raised silicon source and drain regions or raised silicon germanium source and drain regions.

In an embodiment, the source or drain contacts 4162 include a high purity metallic layer 4162A, such as described above, and a conductive trench fill material 4162B. In one embodiment, the high purity metallic layer 4162A has a total atomic composition including 98% or greater of titanium. In one such embodiment, the total atomic composition of the high purity metallic layer 4162A further includes 0.5-2% of chlorine. In an embodiment, the high purity metallic layer 4162A has a thickness variation of 30% or less. In an embodiment, the conductive trench fill material 4162B is composed of a conductive material such as, but not limited to, Cu, Al, W, or alloys thereof.

Accordingly, in an embodiment, referring collectively to FIGS. 41A and 41B, an integrated circuit structure includes a feature having a surface (source or drain contact trench exposing a semiconductor source or drain structure). A high purity metallic layer 4112A or 4162A is on the surface of the source or drain contact trench. It is to be appreciated that contact formation processes can involve consumption of an exposed silicon or germanium or silicon germanium material of a source or drain regions. Such consumption can degrade device performance. In contrast, in accordance with an embodiment of the present disclosure, a surface (4149 or 4199) of the semiconductor source (4108 or 4158) or drain (4110 or 4160) structure is not eroded or consumed, or is not substantially eroded or consumed beneath the source or drain contact trench. In one such embodiment, the lack of consumption or erosion arises from the low temperature deposition of the high purity metallic contact layer.

Figure 42:
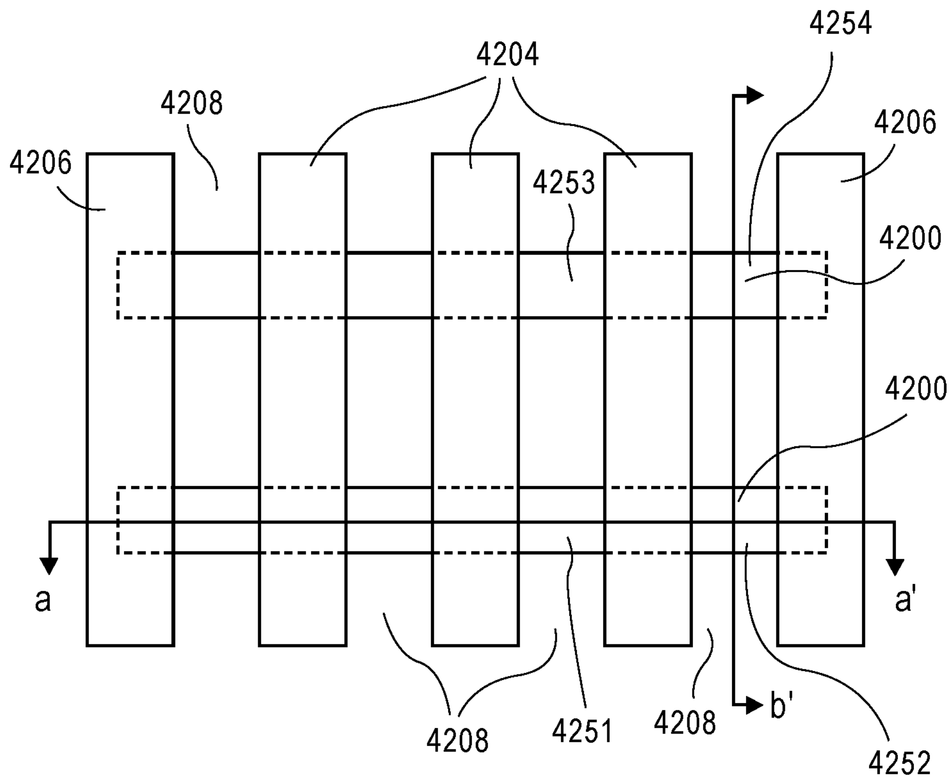
FIG. 42 illustrates a plan view of a plurality of gate lines over a pair of semiconductor fins, in accordance with an embodiment of the present disclosure.

FIG. 42 illustrates a plan view of a plurality of gate lines over a pair of semiconductor fins, in accordance with an embodiment of the present disclosure.

Referring to FIG. 42, a plurality of active gate lines 4204 is formed over a plurality of semiconductor fins 4200. Dummy gate lines 4206 are at the ends of the plurality of semiconductor fins 4200. Spacings 4208 between the gate lines 4204/4206 are locations where trench contacts may be formed as conductive contacts to source or drain regions, such as source or drain regions 4251, 4252, 4253, and 4254.

Figure 43A:
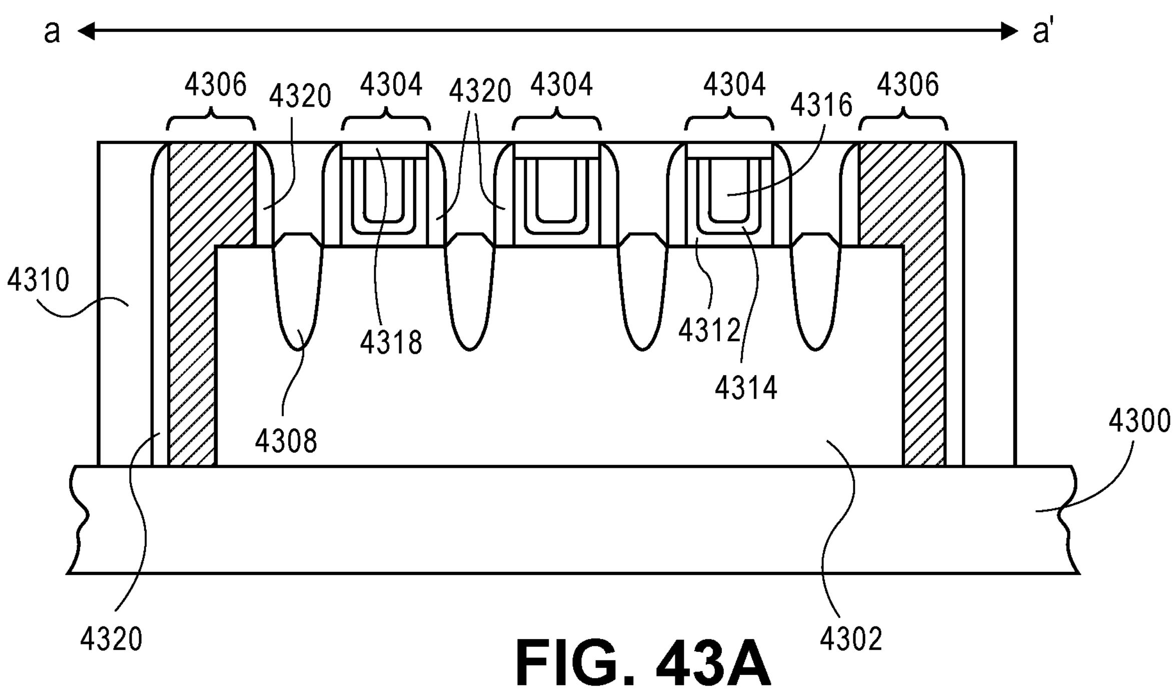
FIGS. 43A-43C illustrate cross-sectional views, taken along the a-a' axis of FIG. 42, for various operations in a method of fabricating an integrated circuit structure, in accordance with an embodiment of the present disclosure.
Figure 43B:
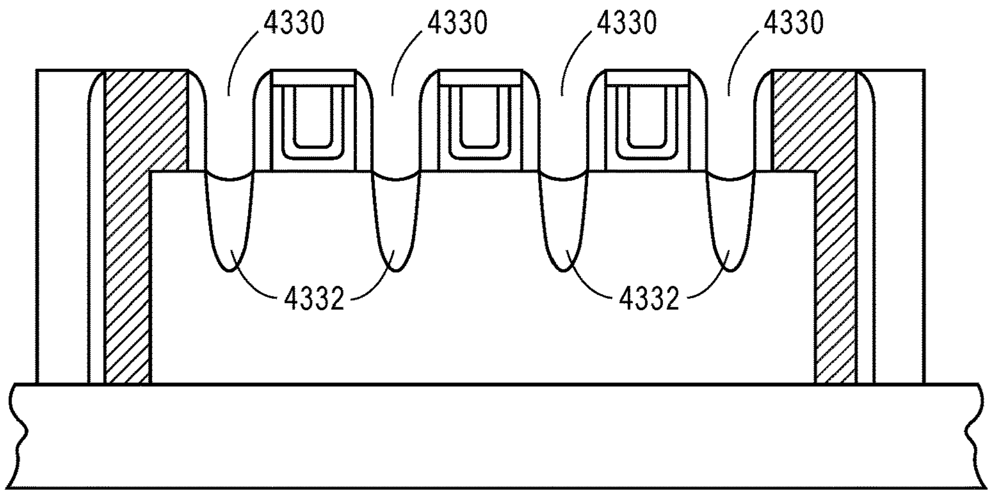
Figure 43C:
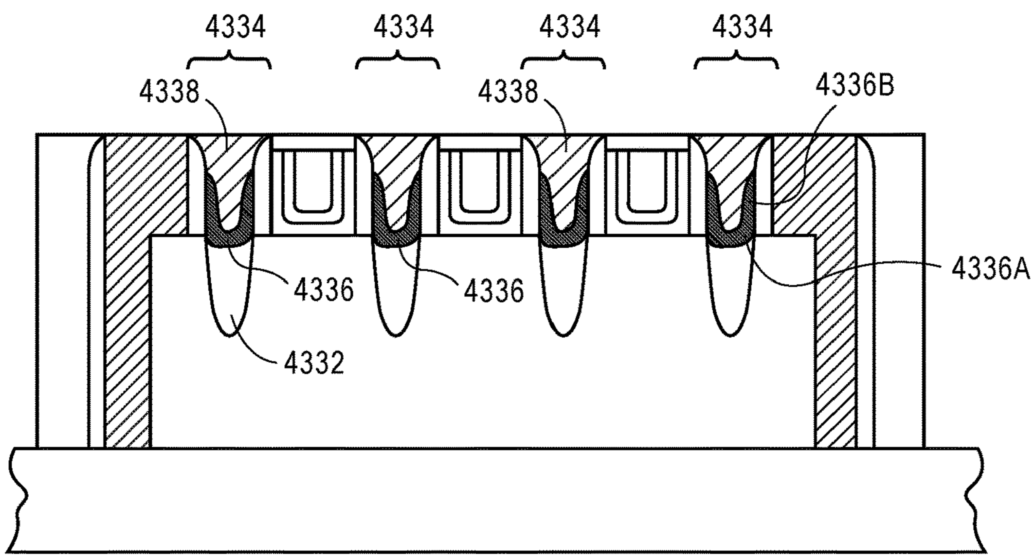

FIGS. 43A-43C illustrate cross-sectional views, taken along the a-a' axis of FIG. 42, for various operations in a method of fabricating an integrated circuit structure, in accordance with an embodiment of the present disclosure.

Referring to FIG. 43A, a plurality of active gate lines 4304 is formed over a semiconductor fin 4302 formed above a substrate 4300. Dummy gate lines 4306 are at the ends of the semiconductor fin 4302. A dielectric layer 4310 is between the active gate lines 4304, between the dummy gate lines 4306 and the active gate lines 4304, and outside of the dummy gate lines 4306. Embedded source or drain structures 4308 are in the semiconductor fin 4302 between the active gate lines 4304 and between the dummy gate lines 4306 and the active gate lines 4304. The active gate lines 4304 include a gate dielectric layer 4312, a workfunction gate electrode portion 4314 and a fill gate electrode portion 4316, and a dielectric capping layer 4318. Dielectric spacers 4320 line the sidewalls of the active gate lines 4304 and the dummy gate lines 4306.

Referring to FIG. 43B, the portion of the dielectric layer 4310 between the active gate lines 4304 and between the dummy gate lines 4306 and the active gate lines 4304 is removed to provide openings 4330 in locations where trench contacts are to be formed. Removal of the portion of the dielectric layer 4310 between the active gate lines 4304 and between the dummy gate lines 4306 and the active gate lines 4304 may lead to erosion of the embedded source or drain structures 4308 to provide eroded embedded source or drain structures 4332 which may have an upper saddle-shaped topography, as is depicted in FIG. 43B.

Referring to FIG. 43C, trench contacts 4334 are formed in openings 4330 between the active gate lines 4304 and between the dummy gate lines 4306 and the active gate lines 4304. Each of the trench contacts 4334 may include a metallic contact layer 4336 and a conductive fill material 4338.

Figure 44:
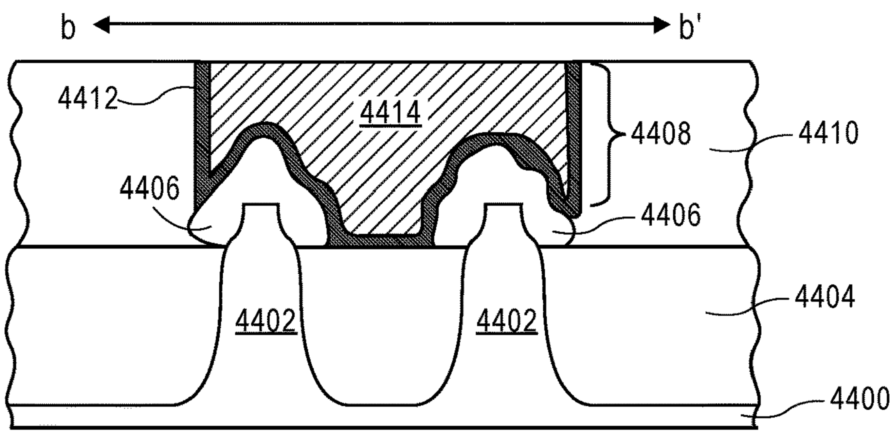
FIG. 44 illustrates a cross-sectional view, taken along the b-b' axis of FIG. 42, for an integrated circuit structure, in accordance with an embodiment of the present disclosure.

FIG. 44 illustrates a cross-sectional view, taken along the b-b' axis of FIG. 42, for an integrated circuit structure, in accordance with an embodiment of the present disclosure.

Referring to FIG. 44, fins 4402 are depicted above a substrate 4404. Lowe portions of the fins 4402 are surrounded by a trench isolation material 4404. Upper portions of fins 4402 have been removed to enable growth of embedded source and drain structures 4406. A trench contact 4408 is formed in an opening of a dielectric layer 4410, the opening exposing the embedded source and drain structures 4406. The trench contact includes a metallic contact layer 4412 and a conductive fill material 4414. It is to be appreciated that, in accordance with an embodiment, the metallic contact layer 4412 extends to the top of the trench contact 4408, as is depicted in FIG. 44. In another embodiment, however, the metallic contact layer 4412 does not extend to the top of the trench contact 4408 and is somewhat recessed within the trench contact 4408, e.g., similar to the depiction of metallic contact layer 4336 in FIG. 43C.

Accordingly, referring collectively to FIGS. 42, 43A-43C and 44, in accordance with an embodiment of the present disclosure, an integrated circuit structure includes a semiconductor fin (4200, 4302, 4402) above a substrate (4300, 4400). The semiconductor fin (4200, 4302, 4402) having a top and sidewalls. A gate electrode (4204, 4304) is over the top and adjacent to the sidewalls of a portion of the semiconductor fin (4200, 4302, 4402). The gate electrode (4204, 4304) defines a channel region in the semiconductor fin (4200, 4302, 4402). A first semiconductor source or drain structure (4251, 4332, 4406) is at a first end of the channel region at a first side of the gate electrode (4204, 4304), the first semiconductor source or drain structure (4251, 4332, 4406) having a non-flat topography. A second semiconductor source or drain structure (4252, 4332, 4406) is at a second end of the channel region at a second side of the gate electrode (4204, 4304), the second end opposite the first end, and the second side opposite the first side. The second semiconductor source or drain structure (4252, 4332, 4406) has a non-flat topography. A metallic contact material (4336, 4412) is directly on the first semiconductor source or drain structure (4251, 4332, 4406) and directly on the second semiconductor source or drain structure (4252, 4332, 4406). The metallic contact material (4336, 4412) is conformal with the non-flat topography of the first semiconductor source or drain structure (4251, 4332, 4406) and conformal with the non-flat topography of the second semiconductor source or drain structure (4252, 4332, 4406).

In an embodiment, the metallic contact material (4336, 4412) has a total atomic composition including 95% or greater of a single metal species. In one such embodiment, the metallic contact material (4336, 4412) has a total atomic composition including 98% or greater of titanium. In a specific such embodiment, the total atomic composition of metallic contact material (4336, 4412) further includes 0.5-2% of chlorine. In an embodiment, the metallic contact material (4336, 4412) has a thickness variation of 30% or less along the non-flat topography of the first semiconductor source or drain structure (4251, 4332, 4406) and along the non-flat topography of the second semiconductor source or drain structure (4252, 4332, 4406).

In an embodiment, the non-flat topography of the first semiconductor source or drain structure (4251, 4332, 4406) and the non-flat topography of the second semiconductor source or drain structure (4252, 4332, 4406) both include a raised central portion and lower side portions, e.g., as is depicted in FIG. 44. In an embodiment, the non-flat topography of the first semiconductor source or drain structure (4251, 4332, 4406) and the non-flat topography of the second semiconductor source or drain structure (4252, 4332, 4406) both include saddle-shaped portions, e.g., as is depicted in FIG. 43C.

In an embodiment, the first semiconductor source or drain structure (4251, 4332, 4406) and the second semiconductor source or drain structure (4252, 4332, 4406) both include silicon. In an embodiment, the first semiconductor source or drain structure (4251, 4332, 4406) and the second semiconductor source or drain structure (4252, 4332, 4406) both further include germanium, e.g., in the form of silicon germanium.

In an embodiment, the metallic contact material (4336, 4412) directly on the first semiconductor source or drain structure (4251, 4332, 4406) is further along sidewalls of a trench in a dielectric layer (4320, 4410) over the first semiconductor source or drain structure (4251, 4332, 4406), the trench exposing a portion of the first semiconductor source or drain structure (4251, 4332, 4406). In one such embodiment, a thickness of the metallic contact material (4336) along the sidewalls of the trench thins from the first semiconductor source or drain structure (4336A at 4332) to a location (4336B) above the first semiconductor source or drain structure (4332), an example of which is illustrated in FIG. 43C. In an embodiment, a conductive fill material (4338, 4414) is on the metallic contact material (4336, 4412) within the trench, as is depicted in FIGS. 43C and 44.

In an embodiment, the integrated circuit structure further includes a second semiconductor fin (e.g., upper fin 4200 of FIG. 42, 4302, 4402) having a top and sidewalls. The gate electrode (4204, 4304) is further over the top and adjacent to the sidewalls of a portion of the second semiconductor fin, the gate electrode defining a channel region in the second semiconductor fin. A third semiconductor source or drain structure (4253, 4332, 4406) is at a first end of the channel region of the second semiconductor fin at the first side of the gate electrode (4204, 4304), the third semiconductor source or drain structure having a non-flat topography. A fourth semiconductor source or drain structure (4254, 4332, 4406) is at a second end of the channel region of the second semiconductor fin at the second side of the gate electrode (4204, 4304), the second end opposite the first end, the fourth semiconductor source or drain structure (4254, 4332, 4406) having a non-flat topography. The metallic contact material (4336, 4412) is directly on the third semiconductor source or drain structure (4253, 4332, 4406) and directly on the fourth semiconductor source or drain structure (4254, 4332, 4406), the metallic contact material (4336, 4412) conformal with the non-flat topography of the third semiconductor source or drain structure (4253, 4332, 4406) and conformal with the non-flat topography of the fourth semiconductor source or drain structure (4254, 4332, 4406). In an embodiment, the metallic contact material (4336, 4412) is continuous between the first semiconductor source or drain structure (4251, 4332, left side 4406) and the third semiconductor source or drain structure (4253, 4332, right side 4406) and continuous between the second semiconductor source or drain structure (4252) and the fourth semiconductor source or drain structure (4254).

In another aspect, a hardmask material be used to preserve (inhibit erosion), and may be retained over, a dielectric material in trench line locations where conductive trench contacts are interrupted, e.g., in contact plug locations. For example, FIGS. 45A and 45B illustrate a plan view and corresponding cross-sectional view, respectively, of an integrated circuit structure including trench contact plugs with a hardmask material thereon, in accordance with an embodiment of the present disclosure.

Figure 45A:
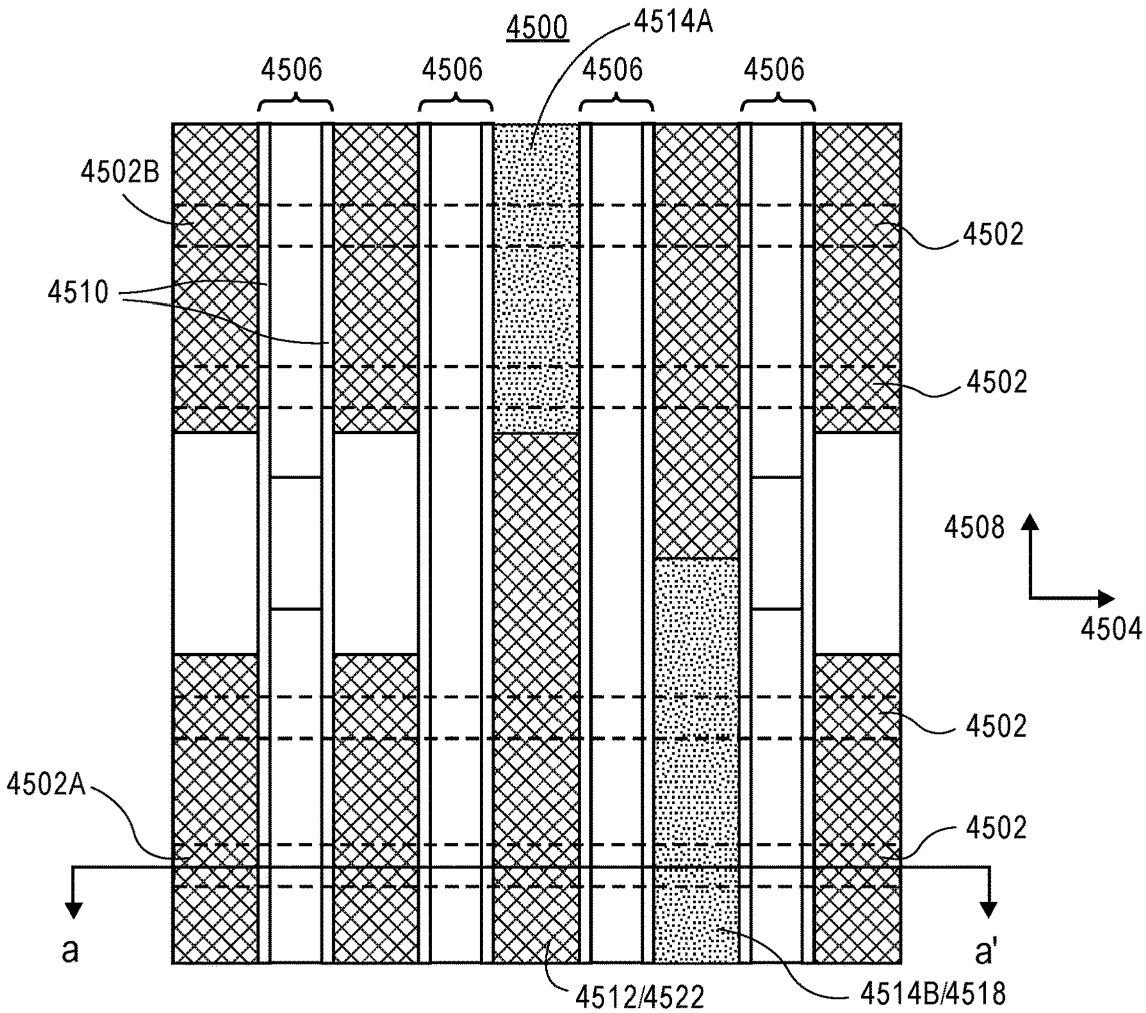
FIGS. 45A and 45B illustrate a plan view and corresponding cross-sectional view, respectively, of an integrated circuit structure including trench contact plugs with a hardmask material thereon, in accordance with an embodiment of the present disclosure.
Figure 45B:
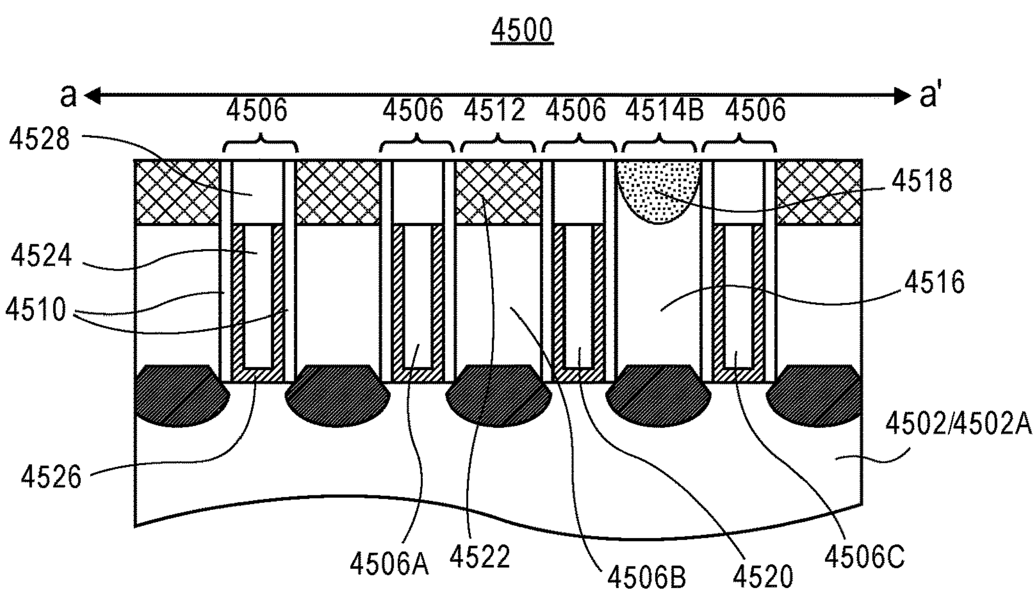

Referring to FIGS. 45A and 45B, in an embodiment, an integrated circuit structure 4500 includes a fin 4502A, such as a silicon fin. A plurality of gate structures 4506 is over the fin 4502A. Individual ones of the gate structures 4506 are along a direction 4508 orthogonal to the fin 4502A and has a pair of dielectric sidewall spacers 4510. A trench contact structure 4512 is over the fin 4502A and directly between the dielectric sidewalls spacers 4510 of a first pair 4506A/4506B of the gate structures 4506. A contact plug 4514B is over the fin 4502A and directly between the dielectric sidewalls spacers 4510 of a second pair 4506B/4506C of the gate structures 4506. The contact plug 4514B includes a lower dielectric material 4516 and an upper hardmask material 4518.

In an embodiment, the lower dielectric material 4516 of the contact plug 4516B includes silicon and oxygen, e.g., such as a silicon oxide or silicon dioxide material. The upper hardmask material 4518 of the contact plug 4516B includes silicon and nitrogen, e.g., such as a silicon nitride, silicon-rich nitride, or silicon-poor nitride material.

In an embodiment, the trench contact structure 4512 includes a lower conductive structure 4520 and a dielectric cap 4522 on the lower conductive structure 4520. In one embodiment, the dielectric cap 4522 of the trench contact structure 4512 has an upper surface co-planar with an upper surface of the upper hardmask material 4518 of the contact plug 4514B, as is depicted.

In an embodiment, individual ones of the plurality of gate structures 4506 include a gate electrode 4524 on a gate dielectric layer 4526. A dielectric cap 4528 is on the gate electrode 4524. In one embodiment, the dielectric cap 4528 of the individual ones of the plurality of gate structures 4506 has an upper surface co-planar with an upper surface of the upper hardmask material 4518 of the contact plug 4514B, as is depicted. In an embodiment, although not depicted, a thin oxide layer, such as a thermal or chemical silicon oxide or silicon dioxide layer, is between the fin 4502A and the gate dielectric layer 4526.

Referring again to FIGS. 45A and 45B, in an embodiment, an integrated circuit structure 4500 includes a plurality of fins 4502, such as a plurality of silicon fins. Individual ones of the plurality of fins 4502 are along a first direction 4504. A plurality of gate structures 4506 is over the plurality of fins 4502. Individual ones of the plurality of gate structures 4506 are along a second direction 4508 orthogonal to the first direction 4504. Individual ones of the plurality of gate structures 4506 have a pair of dielectric sidewall spacers 4510. A trench contact structure 4512 is over a first fin 4502A of the plurality of fins 4502 and directly between the dielectric sidewalls spacers 4510 of a pair of the gate structures 4506. A contact plug 4514A is over a second fin 4502B of the plurality of fins 4502 and directly between the dielectric sidewalls spacers 4510 of the pair of the gate structures 4506. Similar to the cross-sectional view of a contact plug 4514B, the contact plug 4514A includes a lower dielectric material 4516 and an upper hardmask material 4518.

In an embodiment, the lower dielectric material 4516 of the contact plug 4516A includes silicon and oxygen, e.g., such as a silicon oxide or silicon dioxide material. The upper hardmask material 4518 of the contact plug 4516A includes silicon and nitrogen, e.g., such as a silicon nitride, silicon-rich nitride, or silicon-poor nitride material.

In an embodiment, the trench contact structure 4512 includes a lower conductive structure 4520 and a dielectric cap 4522 on the lower conductive structure 4520. In one embodiment, the dielectric cap 4522 of the trench contact structure 4512 has an upper surface co-planar with an upper surface of the upper hardmask material 4518 of the contact plug 4514A or 4514B, as is depicted.

In an embodiment, individual ones of the plurality of gate structures 4506 include a gate electrode 4524 on a gate dielectric layer 4526. A dielectric cap 4528 is on the gate electrode 4524. In one embodiment, the dielectric cap 4528 of the individual ones of the plurality of gate structures 4506 has an upper surface co-planar with an upper surface of the upper hardmask material 4518 of the contact plug 4514A or 4514B, as is depicted. In an embodiment, although not depicted, a thin oxide layer, such as a thermal or chemical silicon oxide or silicon dioxide layer, is between the fin 4502A and the gate dielectric layer 4526.

One or more embodiments of the present disclosure are directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separately patterning of contacts and contact plugs.

In accordance with one or more embodiments described herein, a method of contact formation involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

FIGS. 46A-46D illustrate cross-sectional views representing various operations in a method of fabricating an integrated circuit structure including trench contact plugs with a hardmask material thereon, in accordance with an embodiment of the present disclosure.

Figure 46A:
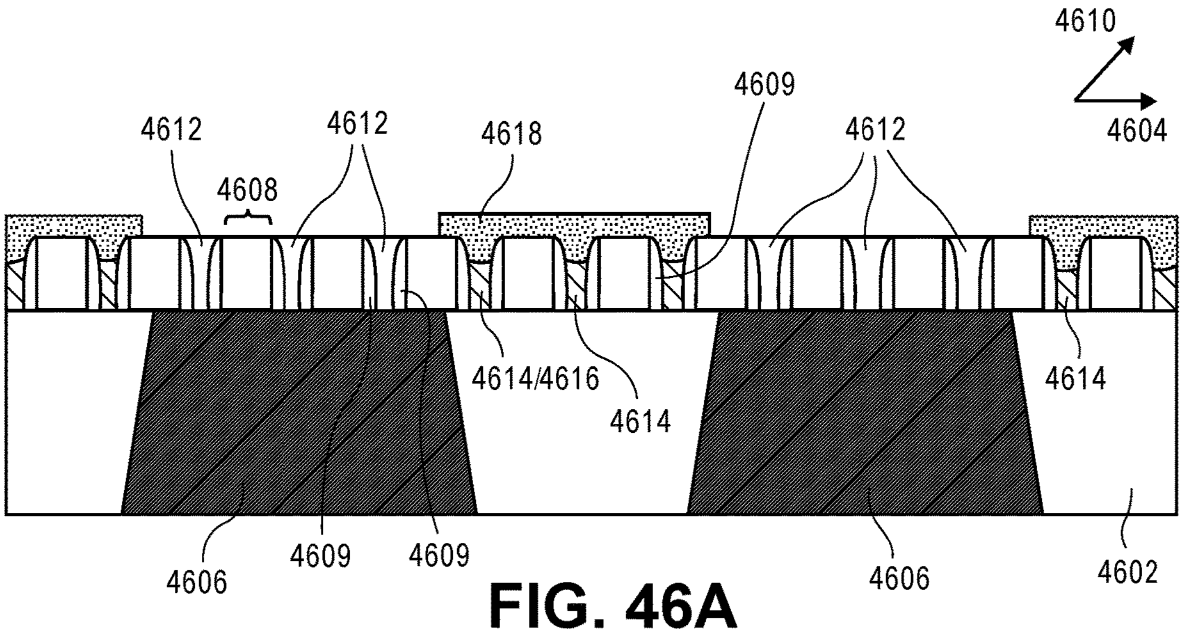
FIGS. 46A-46D illustrate cross-sectional views representing various operations in a method of fabricating an integrated circuit structure including trench contact plugs with a hardmask material thereon, in accordance with an embodiment of the present disclosure.

Referring to FIG. 46A, a method of fabricating an integrated circuit structure includes forming a plurality of fins, individual ones 4602 of the plurality of fins along a first direction 4604. Individual ones 4602 of the plurality of fins may include diffusion regions 4606. A plurality of gate structures 4608 is formed over the plurality of fins. Individual ones of the plurality of gate structures 4508 are along a second direction 4610 orthogonal to the first direction 4604 (e.g., direction 4610 is into and out of the page). A sacrificial material structure 4612 is formed between a first pair of the gate structures 4608. A contact plug 4614 between a second pair of the gate structures 4608. The contact plug includes a lower dielectric material 4616. A hardmask material 4618 is on the lower dielectric material 4616.

In an embodiment, the gate structures 4608 include sacrificial or dummy gate stacks and dielectric spacers 4609. The sacrificial or dummy gate stacks may be composed of polycrystalline silicon or silicon nitride pillars or some other sacrificial material, which may be referred to as gate dummy material.

Figure 46B:
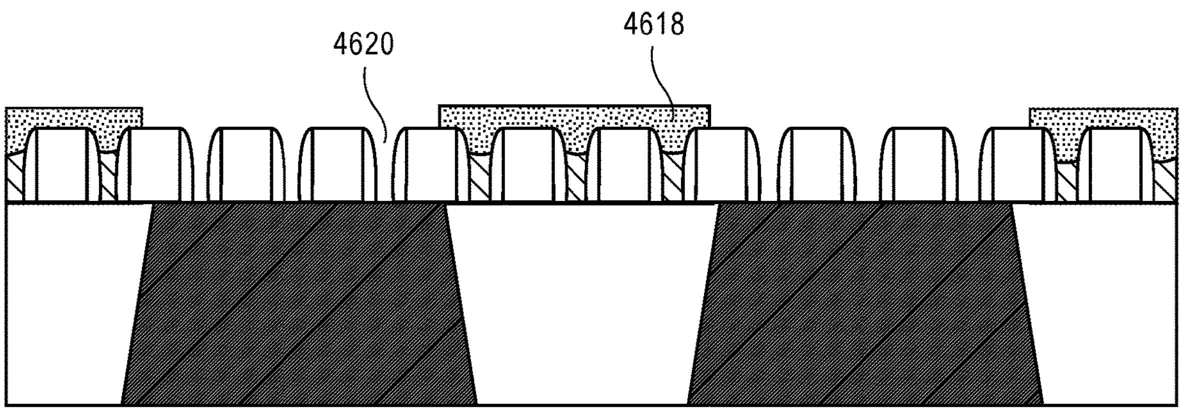

Referring to FIG. 46B, the sacrificial material structure 4612 is removed from the structure of FIG. 46A to form an opening 4620 between the first pair of the gate structures 4608.

Figure 46C:
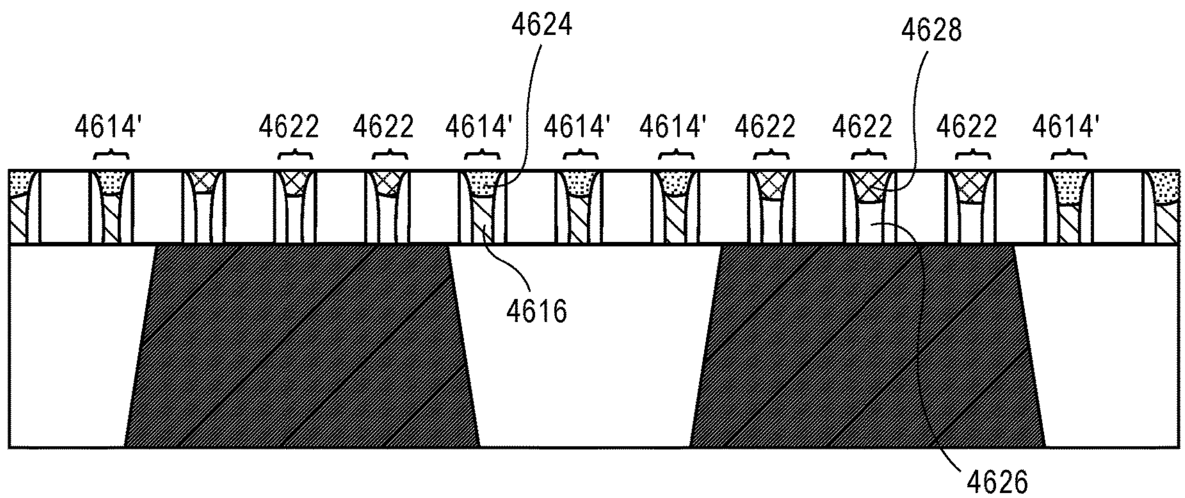

Referring to FIG. 46C, a trench contact structure 4622 is formed in the opening 4620 between the first pair of the gate structures 4608. Additionally, in an embodiment, as part of forming the trench contact structure 4622, the hardmask 4618 of FIGS. 46A and 46B is planarized. Ultimately finalized contact plugs 4614' include the lower dielectric material 4616 and an upper hardmask material 4624 formed from the hardmask material 4618.

In an embodiment, the lower dielectric material 4616 of each of the contact plugs 4614' includes silicon and oxygen, and the upper hardmask material 4624 of each of the contact plugs 4614' includes silicon and nitrogen. In an embodiment, each of the trench contact structures 4622 includes a lower conductive structure 4626 and a dielectric cap 4628 on the lower conductive structure 4626. In one embodiment, the dielectric cap 4628 of the trench contact structure 4622 has an upper surface co-planar with an upper surface of the upper hardmask material 4624 of the contact plug 4614'.

Figure 46D:
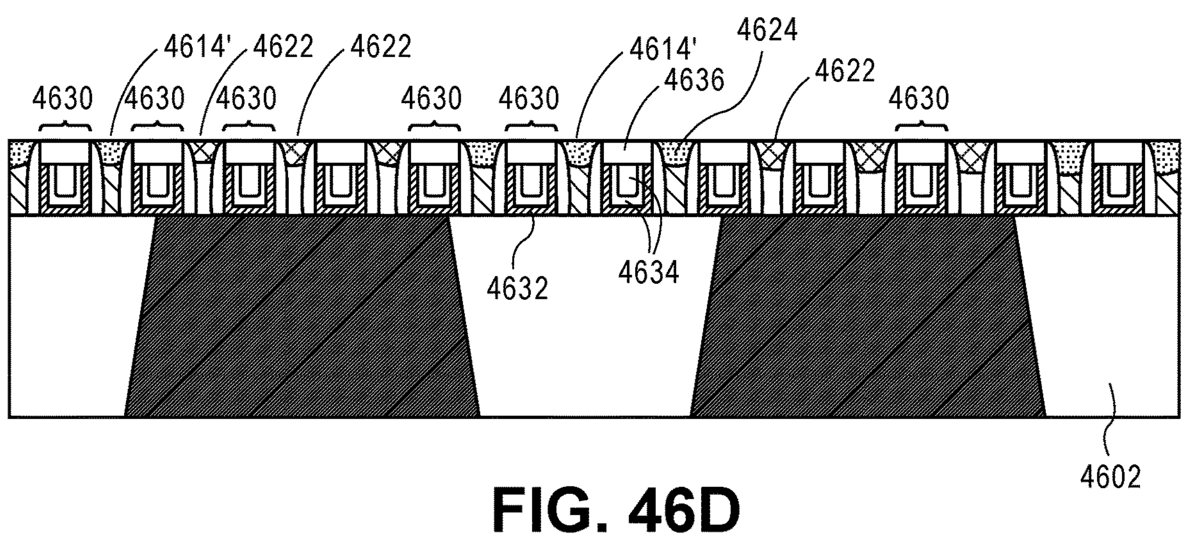

Referring to FIG. 46D, sacrificial or dummy gate stacks of gate structures 4608 are replaced in a replacement gate process scheme. In such a scheme, dummy gate material, such as polysilicon or silicon nitride pillar material, is removed and replaced with permanent gate electrode material. In one such embodiment, a permanent gate dielectric layer is also formed in this process, as opposed to being carried through from earlier processing.

Accordingly, permanent gate structures 4630 include a permanent gate dielectric layer 4632 and a permanent gate electrode layer or stack 4634. Additionally, in an embodiment, a top portion of the permanent gate structures 4630 is removed, e.g., by an etch process, and replaced with a dielectric cap 4636. In an embodiment, the dielectric cap 4636 of the individual ones of the permanent gate structures 4630 has an upper surface co-planar with an upper surface of the upper hardmask material 4624 of the contact plugs 4614'.

Referring again to FIGS. 46A-46D, in an embodiment, a replacement gate process is performed subsequent to forming trench contact structures 4622, as is depicted. In accordance with other embodiments, however, a replacement gate process is performed prior to forming trench contact structures 4622.

In another aspect, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In technologies where space and layout constraints are somewhat relaxed compared with current generation space and layout constraints, a contact to gate structure may be fabricated by making contact to a portion of the gate electrode disposed over an isolation region. As an example, FIG. 47A illustrates a plan view of a semiconductor device having a gate contact disposed over an inactive portion of a gate electrode.

Figure 47A:
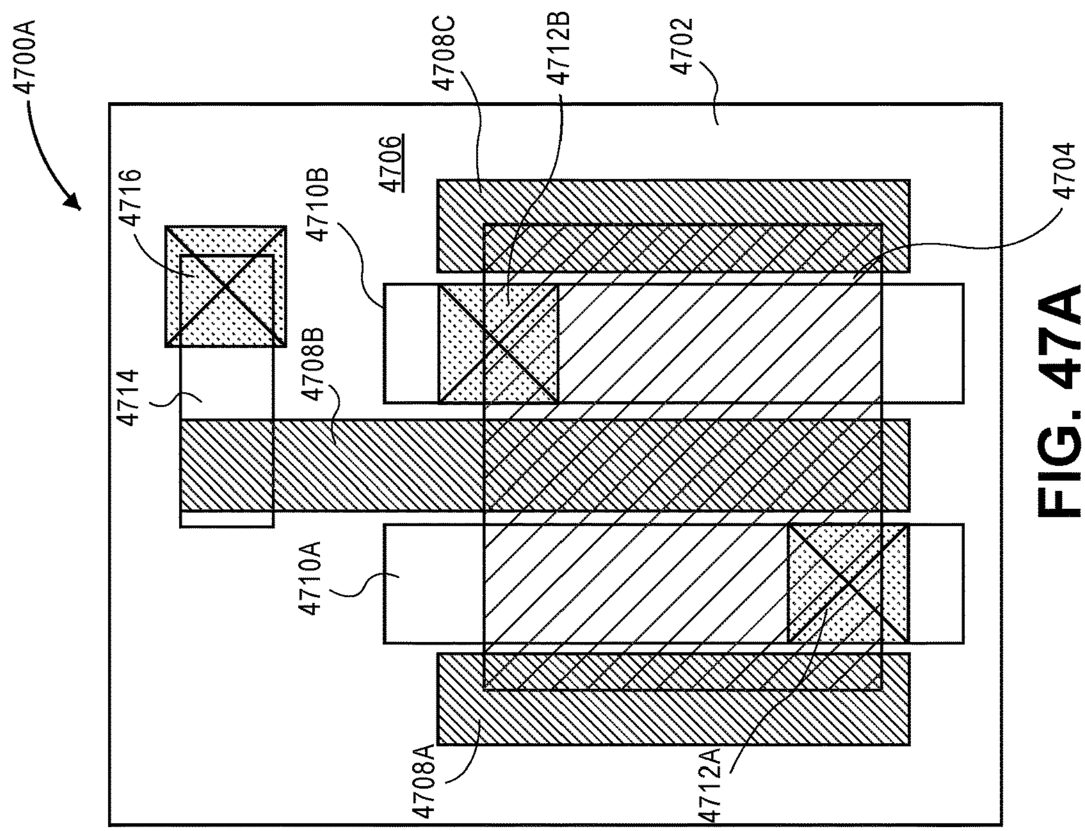
FIG. 47A illustrates a plan view of a semiconductor device having a gate contact disposed over an inactive portion of a gate electrode.

Referring to FIG. 47A, a semiconductor structure or device 4700A includes a diffusion or active region 4704 disposed in a substrate 4702, and within an isolation region 4706. One or more gate lines (also known as poly lines), such as gate lines 4708A, 4708B and 4708C are disposed over the diffusion or active region 4704 as well as over a portion of the isolation region 4706. Source or drain contacts (also known as trench contacts), such as contacts 4710A and 4710B, are disposed over source and drain regions of the semiconductor structure or device 4700A. Trench contact vias 4712A and 4712B provide contact to trench contacts 4710A and 4710B, respectively. A separate gate contact 4714, and overlying gate contact via 4716, provides contact to gate line 4708B. In contrast to the source or drain trench contacts 4710A or 4710B, the gate contact 4714 is disposed, from a plan view perspective, over isolation region 4706, but not over diffusion or active region 4704. Furthermore, neither the gate contact 4714 nor gate contact via 4716 is disposed between the source or drain trench contacts 4710A and 4710B.

Figure 47B:
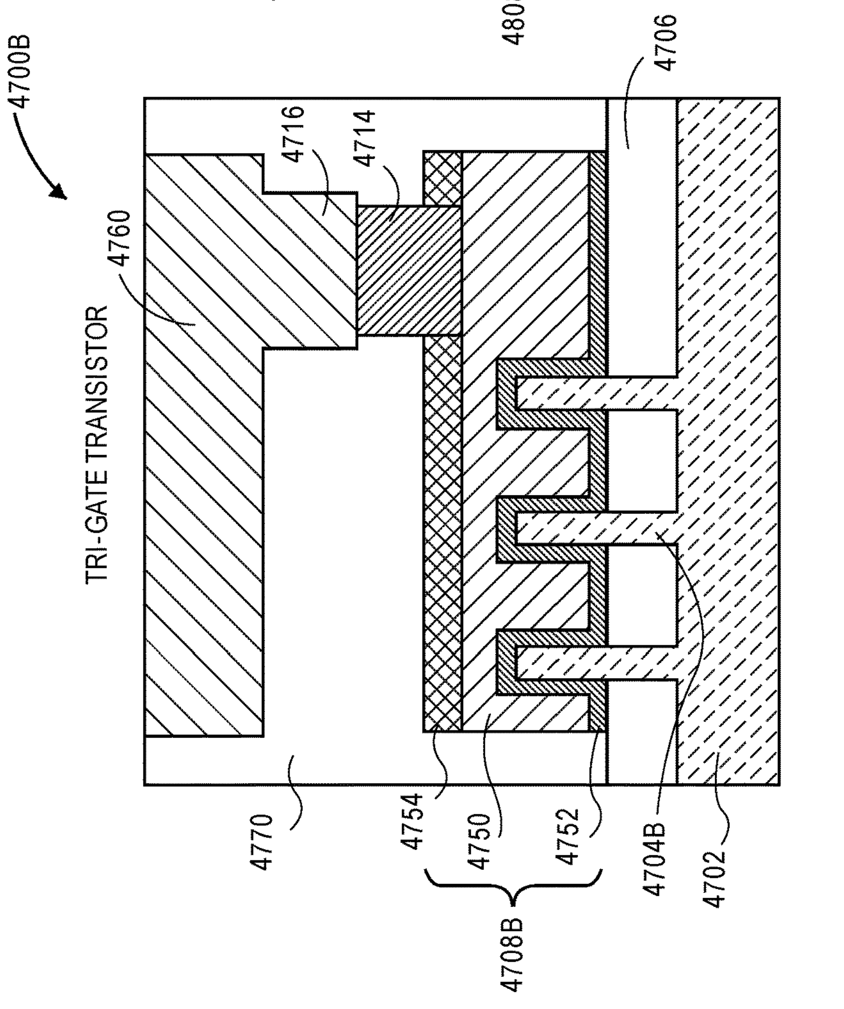
FIG. 47B illustrates a cross-sectional view of a non-planar semiconductor device having a gate contact disposed over an inactive portion of a gate electrode.

FIG. 47B illustrates a cross-sectional view of a non-planar semiconductor device having a gate contact disposed over an inactive portion of a gate electrode. Referring to FIG. 47B, a semiconductor structure or device 4700B, e.g. a non-planar version of device 4700A of FIG. 47A, includes a non-planar diffusion or active region 4704C (e.g., a fin structure) formed from substrate 4702, and within isolation region 4706. Gate line 4708B is disposed over the non-planar diffusion or active region 4704B as well as over a portion of the isolation region 4706. As shown, gate line 4708B includes a gate electrode 4750 and gate dielectric layer 4752, along with a dielectric cap layer 4754. Gate contact 4714, and overlying gate contact via 4716 are also seen from this perspective, along with an overlying metal interconnect 4760, all of which are disposed in inter-layer dielectric stacks or layers 4770. Also seen from the perspective of FIG. 47B, the gate contact 4714 is disposed over isolation region 4706, but not over non-planar diffusion or active region 4704B.

Referring again to FIGS. 47A and 47B, the arrangement of semiconductor structure or device 4700A and 4700B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

Figure 48A:
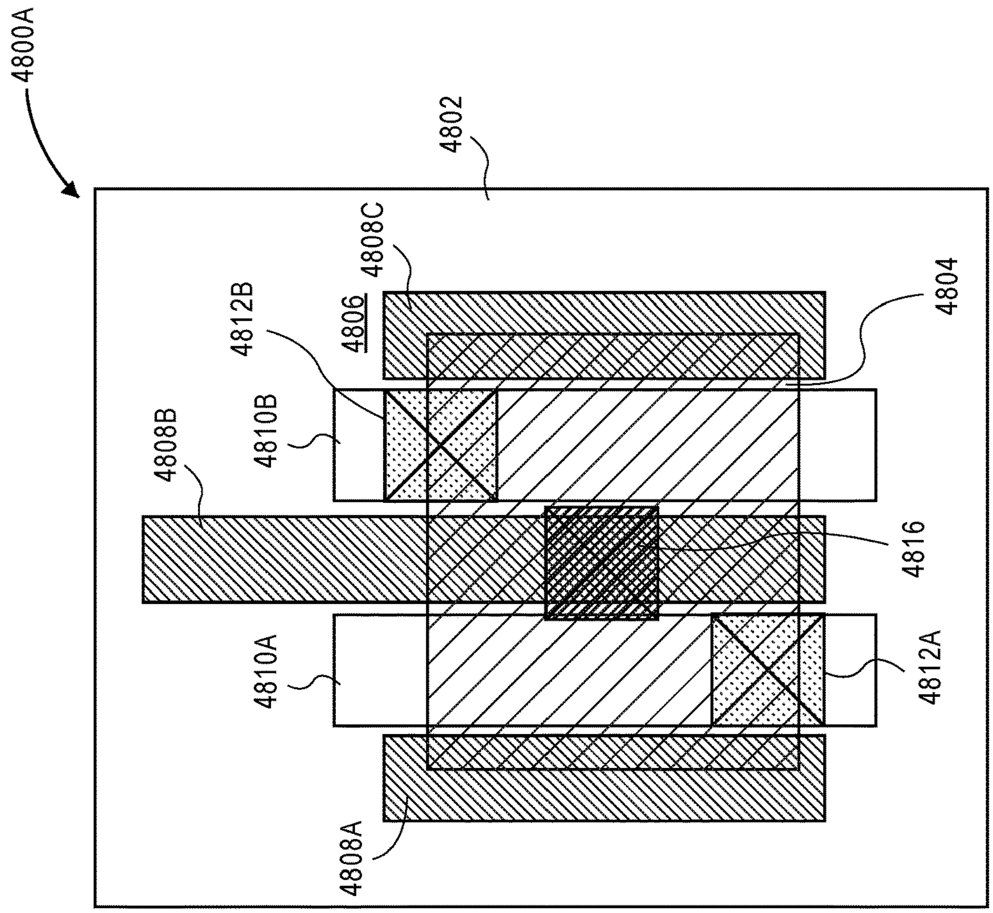
FIG. 48A illustrates a plan view of a semiconductor device having a gate contact via disposed over an active portion of a gate electrode, in accordance with an embodiment of the present disclosure.

As an example, FIG. 48A illustrates a plan view of a semiconductor device having a gate contact via disposed over an active portion of a gate electrode, in accordance with an embodiment of the present disclosure. Referring to FIG. 48A, a semiconductor structure or device 4800A includes a diffusion or active region 4804 disposed in a substrate 4802, and within an isolation region 4806. One or more gate lines, such as gate lines 4808A, 4808B and 4808C are disposed over the diffusion or active region 4804 as well as over a portion of the isolation region 4806. Source or drain trench contacts, such as trench contacts 4810A and 4810B, are disposed over source and drain regions of the semiconductor structure or device 4800A. Trench contact vias 4812A and 4812B provide contact to trench contacts 4810A and 4810B, respectively. A gate contact via 4816, with no intervening separate gate contact layer, provides contact to gate line 4808B. In contrast to FIG. 47A, the gate contact 4816 is disposed, from a plan view perspective, over the diffusion or active region 4804 and between the source or drain contacts 4810A and 4810B.

Figure 48B:
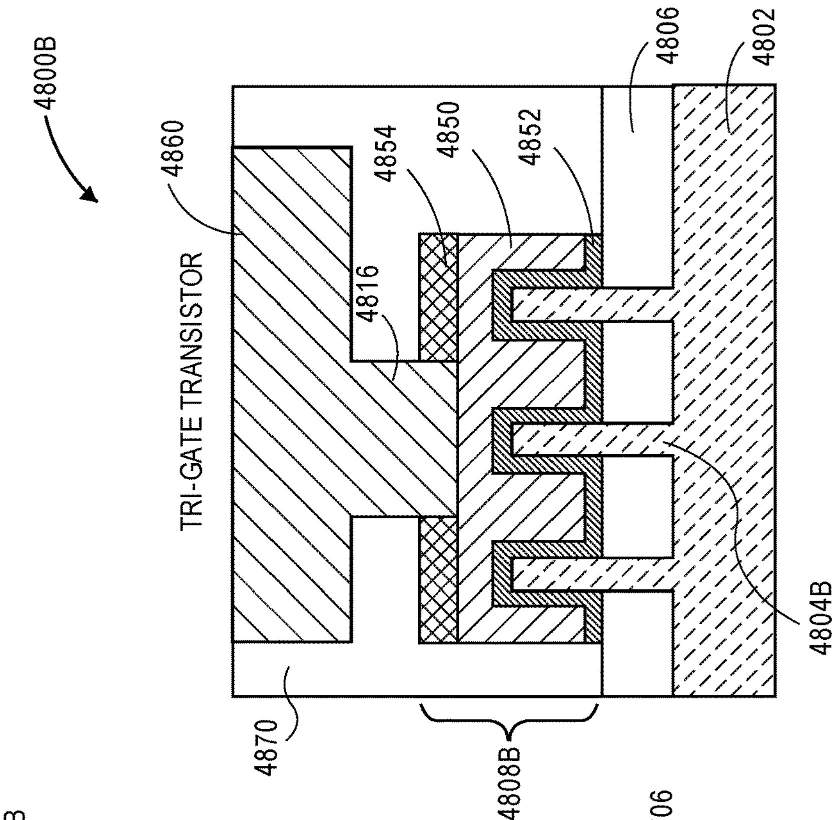
FIG. 48B illustrates a cross-sectional view of a non-planar semiconductor device having a gate contact via disposed over an active portion of a gate electrode, in accordance with an embodiment of the present disclosure.

FIG. 48B illustrates a cross-sectional view of a non-planar semiconductor device having a gate contact via disposed over an active portion of a gate electrode, in accordance with an embodiment of the present disclosure. Referring to FIG. 48B, a semiconductor structure or device 4800B, e.g. a non-planar version of device 4800A of FIG. 48A, includes a non-planar diffusion or active region 4804B (e.g., a fin structure) formed from substrate 4802, and within isolation region 4806. Gate line 4808B is disposed over the non-planar diffusion or active region 4804B as well as over a portion of the isolation region 4806. As shown, gate line 4808B includes a gate electrode 4850 and gate dielectric layer 4852, along with a dielectric cap layer 4854. The gate contact via 4816 is also seen from this perspective, along with an overlying metal interconnect 4860, both of which are disposed in inter-layer dielectric stacks or layers 4870. Also seen from the perspective of FIG. 48B, the gate contact via 4816 is disposed over non-planar diffusion or active region 4804B.

Thus, referring again to FIGS. 48A and 48B, in an embodiment, trench contact vias 4812A, 4812B and gate contact via 4816 are formed in a same layer and are essentially co-planar. In comparison to FIGS. 47A and 47B, the contact to the gate line would otherwise include and additional gate contact layer, e.g., which could be run perpendicular to the corresponding gate line. In the structure(s) described in association with FIGS. 48A and 48B, however, the fabrication of structures 4800A and 4800B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 4800 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 4808A-4808C surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 4808A-4808C each completely surrounds the channel region.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA).

As an exemplary fabrication scheme, FIGS. 49A-49D illustrate cross-sectional views representing various operations in a method of fabricating a semiconductor structure having a gate contact structure disposed over an active portion of a gate, in accordance with an embodiment of the present disclosure.

Figure 49A:
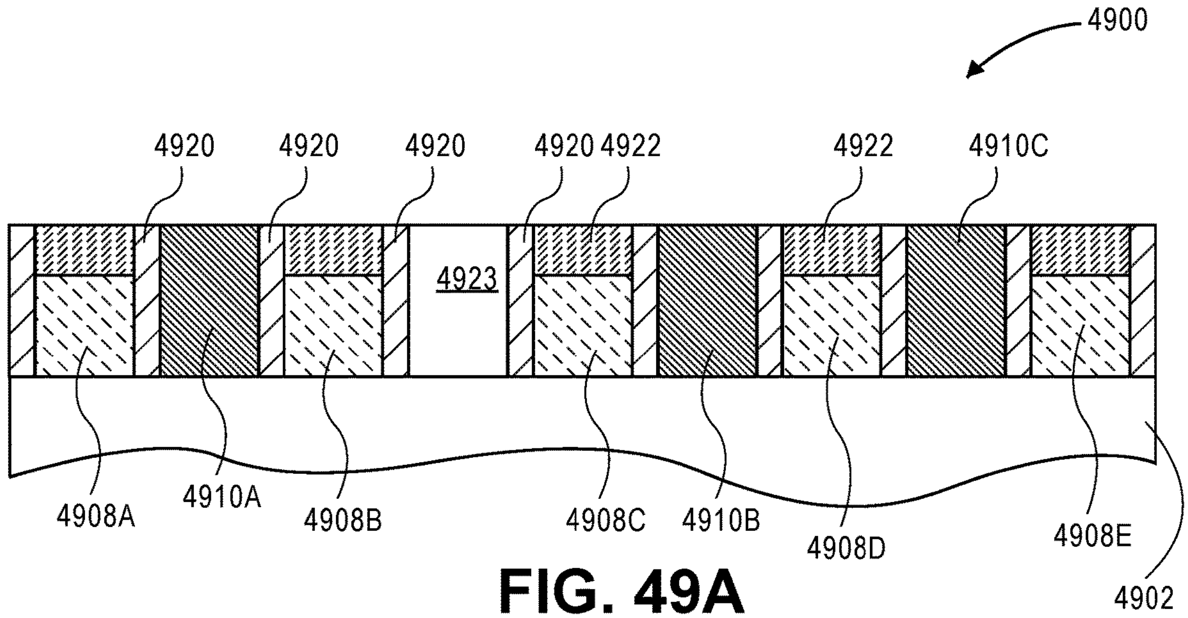
FIGS. 49A-49D illustrate cross-sectional views representing various operations in a method of fabricating a semiconductor structure having a gate contact structure disposed over an active portion of a gate, in accordance with an embodiment of the present disclosure.

Referring to FIG. 49A, a semiconductor structure 4900 is provided following trench contact (TCN) formation. It is to be appreciated that the specific arrangement of structure 4900 is used for illustration purposes only, and that a variety of possible layouts may benefit from embodiments of the disclosure described herein. The semiconductor structure 4900 includes one or more gate stack structures, such as gate stack structures 4908A-4908E disposed above a substrate 4902. The gate stack structures may include a gate dielectric layer and a gate electrode. Trench contacts, e.g., contacts to diffusion regions of substrate 4902, such as trench contacts 4910A-4910C are also included in structure 4900 and are spaced apart from gate stack structures 4908A-4908E by dielectric spacers 4920. An insulating cap layer 4922 may be disposed on the gate stack structures 4908A-4908E (e.g., GILA), as is also depicted in FIG. 49A. As is also depicted in FIG. 49A, contact blocking regions or "contact plugs," such as region 4923 fabricated from an inter-layer dielectric material, may be included in regions where contact formation is to be blocked.

In an embodiment, providing structure 4900 involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures 4908A-4908E may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 4900. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Figure 49B:
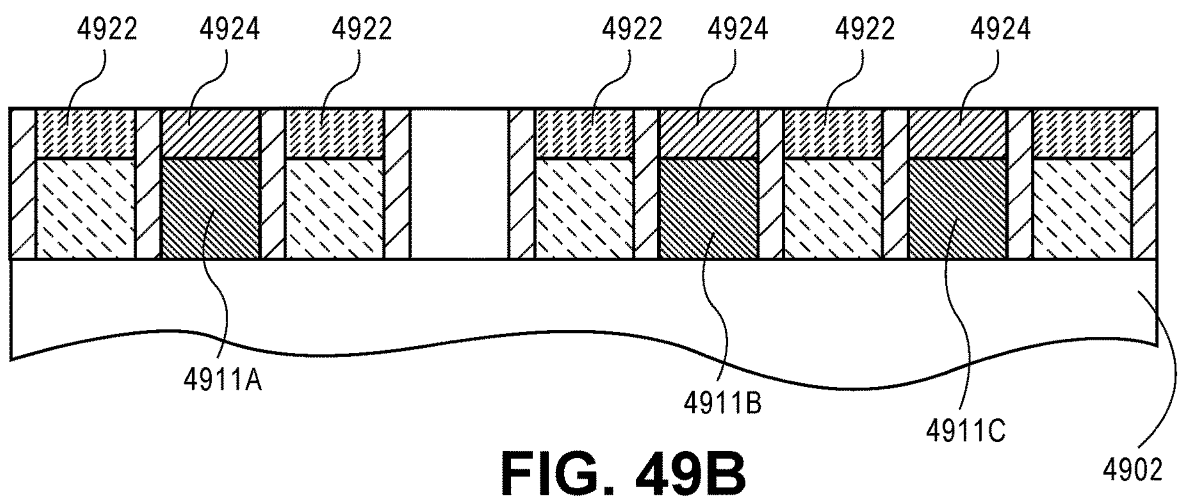

Referring to FIG. 49B, the trench contacts 4910A-4910C of the structure 4900 are recessed within spacers 4920 to provide recessed trench contacts 4911A-4911C that have a height below the top surface of spacers 4920 and insulating cap layer 4922. An insulating cap layer 4924 is then formed on recessed trench contacts 4911A-4911C (e.g., TILA). In accordance with an embodiment of the present disclosure, the insulating cap layer 4924 on recessed trench contacts 4911A-4911C is composed of a material having a different etch characteristic than insulating cap layer 4922 on gate stack structures 4908A-4908E. As will be seen in subsequent processing operations, such a difference may be exploited to etch one of 4922/4924 selectively from the other of 4922/4924.

The trench contacts 4910A-4910C may be recessed by a process selective to the materials of spacers 4920 and insulating cap layer 4922. For example, in one embodiment, the trench contacts 4910A-4910C are recessed by an etch process such as a wet etch process or dry etch process. Insulating cap layer 4924 may be formed by a process suitable to provide a conformal and sealing layer above the exposed portions of trench contacts 4910A-4910C. For example, in one embodiment, insulating cap layer 4924 is formed by a chemical vapor deposition (CVD) process as a conformal layer above the entire structure. The conformal layer is then planarized, e.g., by chemical mechanical polishing (CMP), to provide insulating cap layer 4924 material only above trench contacts 4910A-4910C, and re-exposing spacers 4920 and insulating cap layer 4922.

Regarding suitable material combinations for insulating cap layers 4922/4924, in one embodiment, one of the pair of 4922/4924 is composed of silicon oxide while the other is composed of silicon nitride. In another embodiment, one of the pair of 4922/4924 is composed of silicon oxide while the other is composed of carbon doped silicon nitride. In another embodiment, one of the pair of 4922/4924 is composed of silicon oxide while the other is composed of silicon carbide. In another embodiment, one of the pair of 4922/4924 is composed of silicon nitride while the other is composed of carbon doped silicon nitride. In another embodiment, one of the pair of 4922/4924 is composed of silicon nitride while the other is composed of silicon carbide. In another embodiment, one of the pair of 4922/4924 is composed of carbon doped silicon nitride while the other is composed of silicon carbide.

Figure 49C:
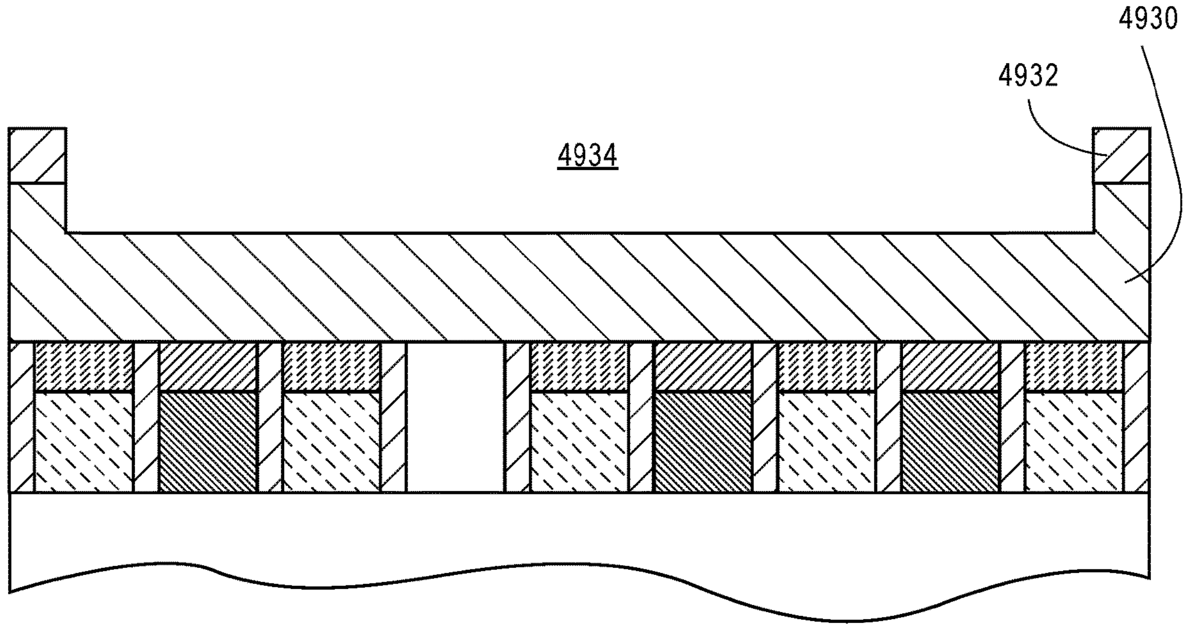

Referring to FIG. 49C, an inter-layer dielectric (ILD) 4930 and hardmask 4932 stack is formed and patterned to provide, e.g., a metal (0) trench 4934 patterned above the structure of FIG. 49B.

The inter-layer dielectric (ILD) 4930 may be composed of a material suitable to electrically isolate metal features ultimately formed therein while maintaining a robust structure between front end and back end processing. Furthermore, in an embodiment, the composition of the ILD 4930 is selected to be consistent with via etch selectivity for trench contact dielectric cap layer patterning, as described in greater detail below in association with FIG. 49D. In one embodiment, the ILD 4930 is composed of a single or several layers of silicon oxide or a single or several layers of a carbon doped oxide (CDO) material. However, in other embodiments, the ILD 4930 has a bi-layer composition with a top portion composed of a different material than an underlying bottom portion of the ILD 4930. The hardmask layer 4932 may be composed of a material suitable to act as a subsequent sacrificial layer. For example, in one embodiment, the hardmask layer 4932 is composed substantially of carbon, e.g., as a layer of cross-linked organic polymer. In other embodiments, a silicon nitride or carbon-doped silicon nitride layer is used as a hardmask 4932. The inter-layer dielectric (ILD) 4930 and hardmask 4932 stack may be patterned by a lithography and etch process.

Figure 49D:
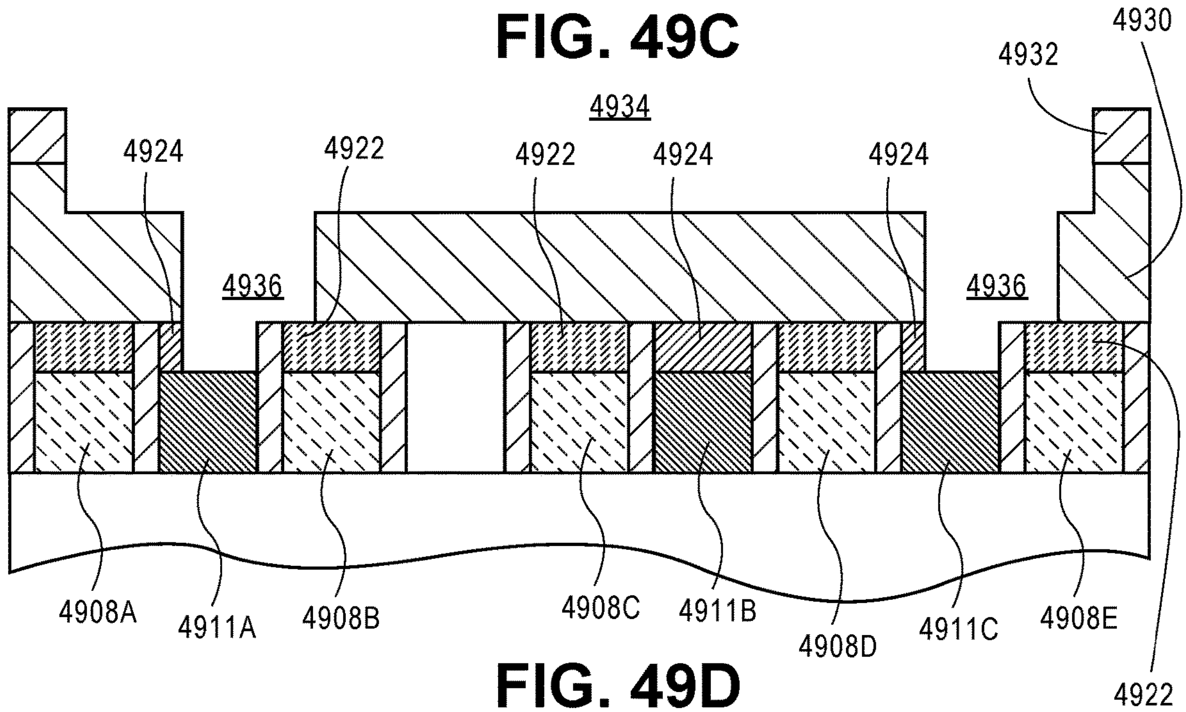

Referring to FIG. 49D, via openings 4936 (e.g., VCT) are formed in inter-layer dielectric (ILD) 4930, extending from metal (0) trench 4934 to one or more of the recessed trench contacts 4911A-4911C. For example, in FIG. 49D, via openings are formed to expose recessed trench contacts 4911A and 4911C. The formation of via openings 4936 includes etching of both inter-layer dielectric (ILD) 4930 and respective portions of corresponding insulating cap layer 4924. In one such embodiment, a portion of insulating cap layer 4922 is exposed during patterning of inter-layer dielectric (ILD) 4930 (e.g., a portion of insulating cap layer 4922 over gate stack structures 4908B and 4908E is exposed). In that embodiment, insulating cap layer 4924 is etched to form via openings 4936 selective to (i.e., without significantly etching or impacting) insulating cap layer 4922.

In one embodiment, a via opening pattern is ultimately transferred to the insulating cap layer 4924 (i.e., the trench contact insulating cap layers) by an etch process without etching the insulating cap layer 4922 (i.e., the gate insulating cap layers). The insulating cap layer 4924 (TILA) may be composed of any of the following or a combination including silicon oxide, silicon nitride, silicon carbide, carbon doped silicon nitrides, carbon doped silicon oxides, amorphous silicon, various metal oxides and silicates including zirconium oxide, hafnium oxide, lanthanum oxide or a combination thereof. The layer may be deposited using any of the following techniques including CVD, ALD, PECVD, PVD, HDP assisted CVD, low temperature CVD. A corresponding plasma dry etch is developed as a combination of chemical and physical sputtering mechanisms. Coincident polymer deposition may be used to control material removal rate, etch profiles and film selectivity. The dry etch is typically generated with a mix of gases that include $NF_3$, $CHF_3$, $C_4F_8$, HBr and $O_2$ with typically pressures in the range of 30-100 mTorr and a plasma bias of 50-1000 Watts. The dry etch may be engineered to achieve significant etch selectivity between cap layer 4924 (TILA) and 4922 (GILA) layers to minimize the loss of 4922 (GILA) during dry etch of 4924 (TILA) to form contacts to the source drain regions of the transistor.

Referring again to FIG. 49D, it is to be appreciated that a similar approach may be implemented to fabricate a via opening pattern that is ultimately transferred to the insulating cap layer 4922 (i.e., the trench contact insulating cap layers) by an etch process without etching the insulating cap layer 4924 (i.e., the gate insulating cap layers).

Figure 50:
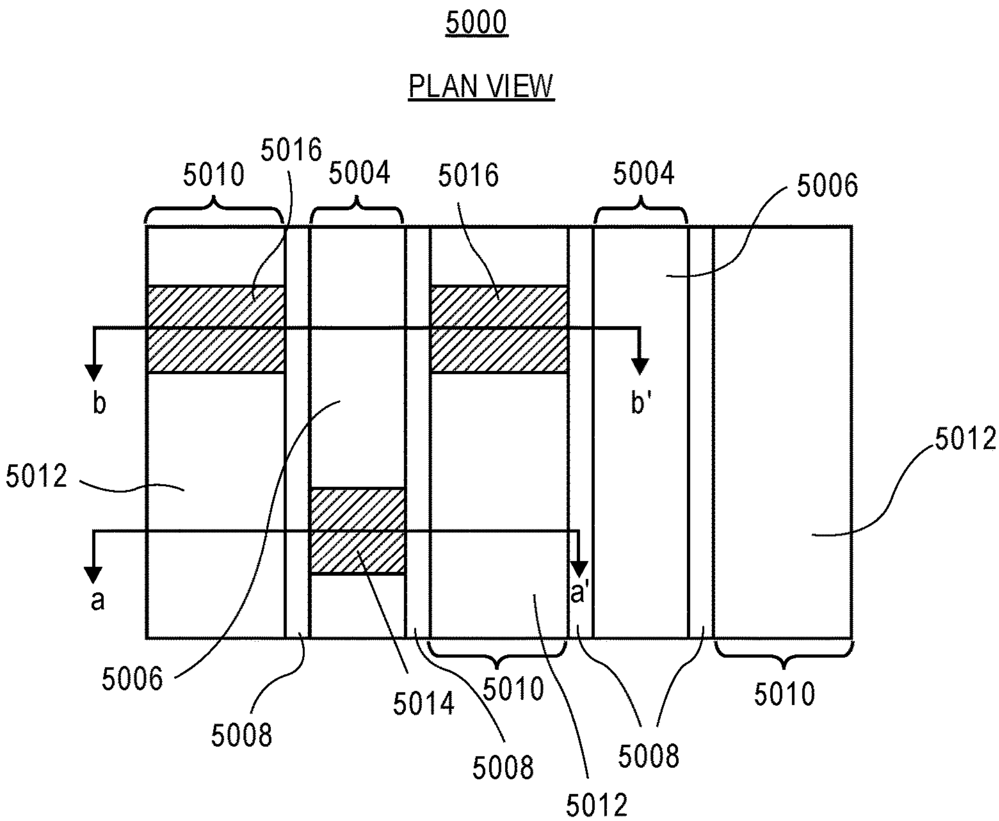
FIG. 50 illustrates a plan view and corresponding cross-sectional views of an integrated circuit structure having trench contacts including an overlying insulating cap layer, in accordance with an embodiment of the present disclosure.
Figure 50:
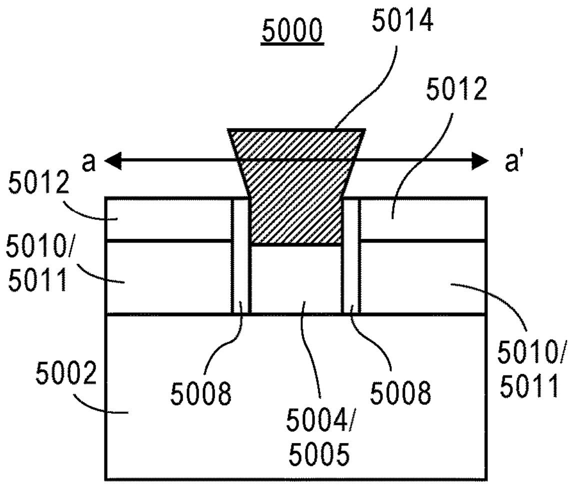
Figure 50:
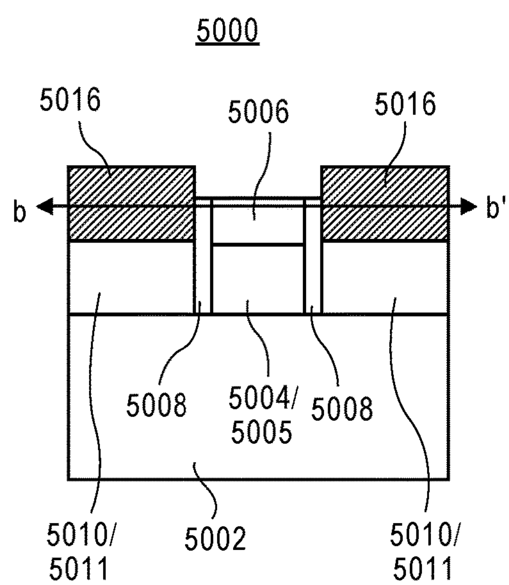

To further exemplify concepts of a contact over active gate (COAG) technology, FIG. 50 illustrates a plan view and corresponding cross-sectional views of an integrated circuit structure having trench contacts including an overlying insulating cap layer, in accordance with an embodiment of the present disclosure.

Referring to FIG. 50, an integrated circuit structure 5000 includes a gate line 5004 above a semiconductor substrate or fin 5002, such as a silicon fin. The gate line 5004 includes a gate stack 5005 (e.g., including a gate dielectric layer or stack and a gate electrode on the gate dielectric layer or stack) and a gate insulating cap layer 5006 on the gate stack 5005. Dielectric spacers 5008 are along sidewalls of the gate stack 5005 and, in an embodiment, along sidewalls of the gate insulating cap layer 5006, as is depicted.

Trench contacts 5010 are adjacent the sidewalls of the gate line 5004, with the dielectric spacers 5008 between the gate line 5004 and the trench contacts 5010. Individual ones of the trench contacts 5010 include a conductive contact structure 5011 and a trench contact insulating cap layer 5012 on the conductive contact structure 5011.

Referring again to FIG. 50, a gate contact via 5014 is formed in an opening of the gate insulating cap layer 5006 and electrically contacts the gate stack 5005. In an embodiment, the gate contact via 5014 electrically contacts the gate stack 5005 at a location over the semiconductor substrate or fin 5002 and laterally between the trench contacts 5010, as is depicted. In one such embodiment, the trench contact insulating cap layer 5012 on the conductive contact structure 5011 prevents gate to source shorting or gate to drain shorting by the gate contact via 5014.

Referring again to FIG. 50, trench contact vias 5016 are formed in an opening of the trench contact insulating cap layer 5012 and electrically contact the respective conductive contact structures 5011. In an embodiment, the trench contact vias 5016 electrically contact the respective conductive contact structures 5011 at locations over the semiconductor substrate or fin 5002 and laterally adjacent the gate stack 5005 of the gate line 5004, as is depicted. In one such embodiment, the gate insulating cap layer 5006 on the gate stack 5005 prevents source to gate shorting or drain to gate shorting by the trench contact vias 5016.

It is to be appreciated that differing structural relationships between an insulating gate cap layer and an insulating trench contact cap layer may be fabricated. As examples, FIGS. 51A-51F illustrate cross-sectional views of various integrated circuit structures, each having trench contacts including an overlying insulating cap layer and having gate stacks including an overlying insulating cap layer, in accordance with an embodiment of the present disclosure.

Figure 51A:
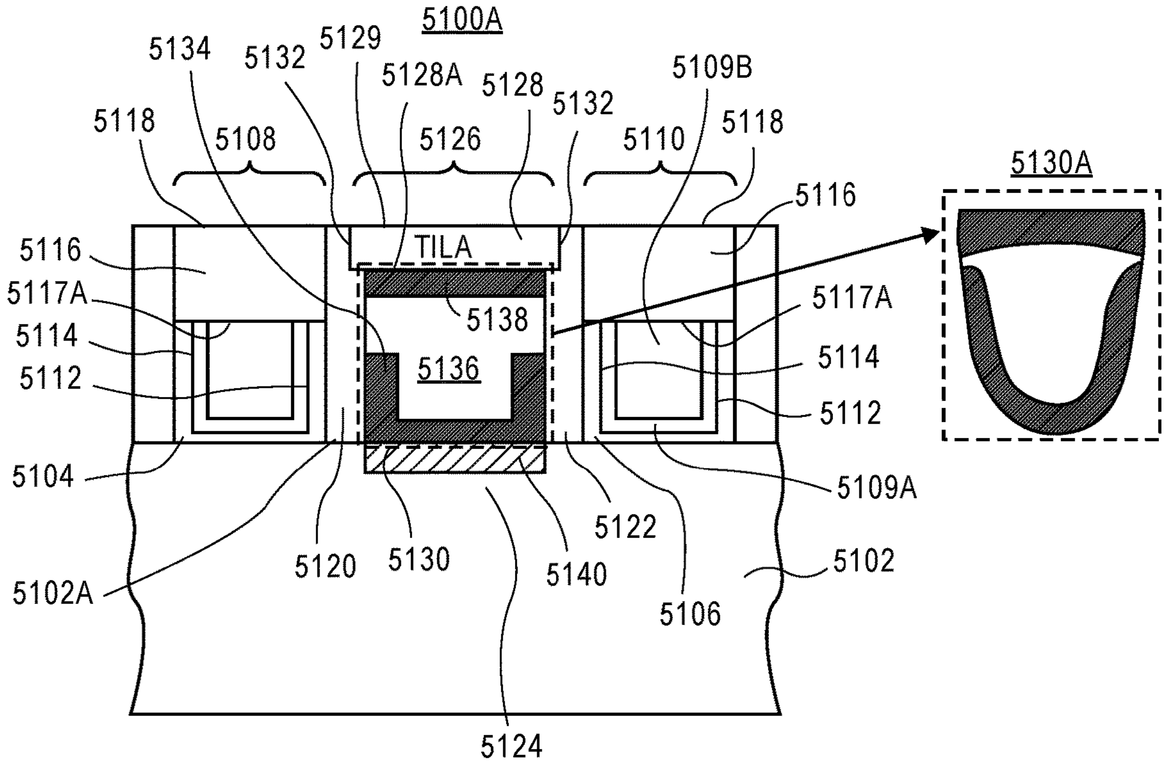
FIGS. 51A-51F illustrate cross-sectional views of various integrated circuit structures, each having trench contacts including an overlying insulating cap layer and having gate stacks including an overlying insulating cap layer, in accordance with an embodiment of the present disclosure.
Figure 51B:
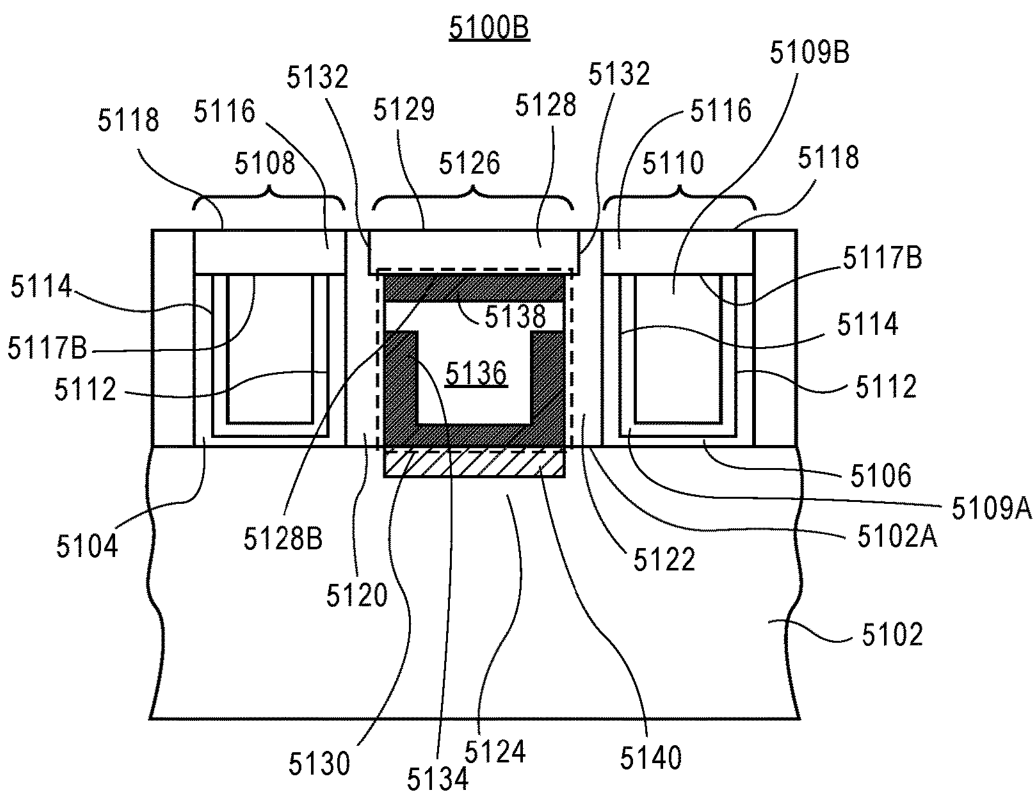
Figure 51C:
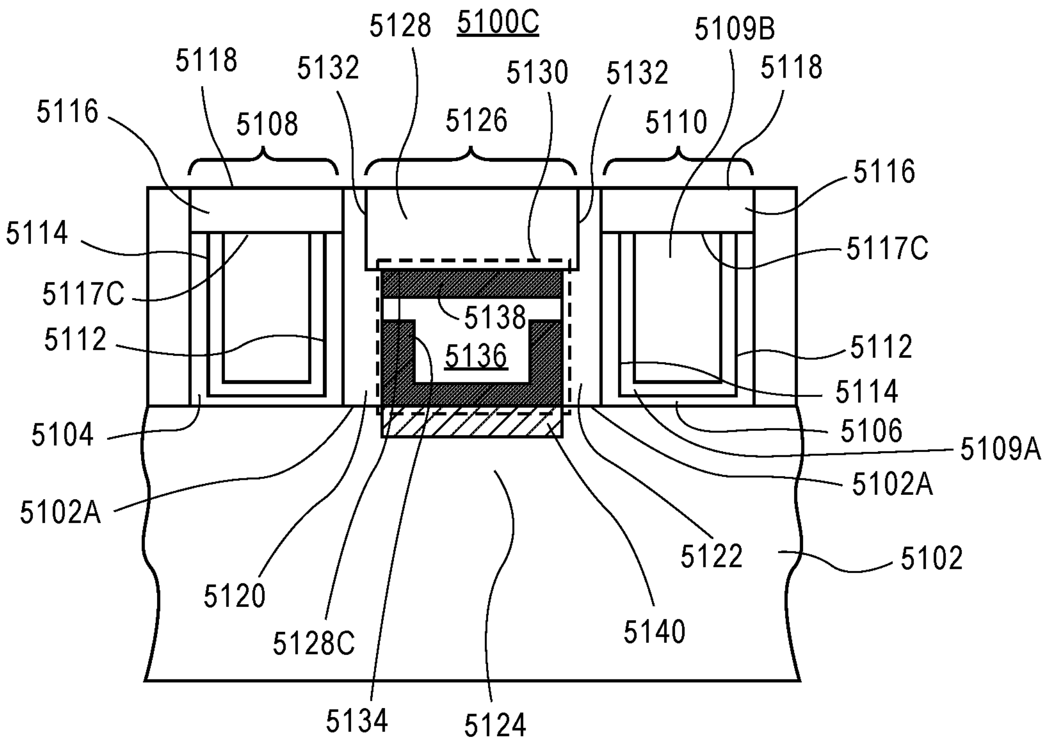

Referring to FIGS. 51A, 51B and 51C, integrated circuit structures 5100A, 5100B and 5100C, respectively, includes a fin 5102, such as a silicon fin. Although depicted as a cross-sectional view, it is to be appreciated that the fin 5102 has a top 5102A and sidewalls (into and out of the page of the perspective shown). First 5104 and second 5106 gate dielectric layers are over the top 5102A of the fin 5102 and laterally adjacent the sidewalls of the fin 5102. First 5108 and second 5110 gate electrodes are over the first 5104 and second 5106 gate dielectric layers, respectively, over the top 5102A of the fin 5102 and laterally adjacent the sidewalls of the fin 5102. The first 5108 and second 5110 gate electrodes each include a conformal conductive layer 5109A. such as a workfunction-setting layer, and a conductive fill material 5109B above the conformal conductive layer 5109A. The first 5108 and second 5110 gate electrodes both have a first side 5112 and a second side 5114 opposite the first side 5112. The first 5108 and second 5110 gate electrodes also both have an insulating cap 5116 having a top surface 5118.

A first dielectric spacer 5120 is adjacent the first side 5112 of the first gate electrode 5108. A second dielectric spacer 5122 is adjacent the second side 5114 of the second gate electrode 5110. A semiconductor source or drain region 5124 is adjacent the first 5120 and second 5122 dielectric spacers. A trench contact structure 5126 is over the semiconductor source or drain region 5124 adjacent the first 5120 and second 5122 dielectric spacers.

The trench contact structure 5126 includes an insulating cap 5128 on a conductive structure 5130. The insulating cap 5128 of the trench contact structure 5126 has a top surface 5129 substantially co-planar with a top surfaces 5118 of the insulating caps 5116 of the first 5108 and second 5110 gate electrodes. In an embodiment, the insulating cap 5128 of the trench contact structure 5126 extends laterally into recesses 5132 in the first 5120 and second 5122 dielectric spacers. In such an embodiment, the insulating cap 5128 of the trench contact structure 5126 overhangs the conductive structure 5130 of the trench contact structure 5126. In other embodiments, however, the insulating cap 5128 of the trench contact structure 5126 does not extend laterally into recesses 5132 in the first 5120 and second 5122 dielectric spacers and, hence, does not overhang the conductive structure 5130 of the trench contact structure 5126.

It is to be appreciated that the conductive structure 5130 of the trench contact structure 5126 may not be rectangular, as depicted in FIGS. 51A-51C. For example, the conductive structure 5130 of the trench contact structure 5126 may have a cross-sectional geometry similar to or the same as the geometry shown for conductive structure 5130A illustrated in the projection of FIG. 51A.

In an embodiment, the insulating cap 5128 of the trench contact structure 5126 has a composition different than a composition of the insulating caps 5116 of the first 5108 and second 5110 gate electrodes. In one such embodiment, the insulating cap 5128 of the trench contact structure 5126 includes a carbide material, such as a silicon carbide material. The insulating caps 5116 of the first 5108 and second 5110 gate electrodes include a nitride material, such as a silicon nitride material.

In an embodiment, the insulating caps 5116 of the first 5108 and second 5110 gate electrodes both have a bottom surface 5117A below a bottom surface 5128A of the insulating cap 5128 of the trench contact structure 5126, as is depicted in FIG. 51A. In another embodiment, the insulating caps 5116 of the first 5108 and second 5110 gate electrodes both have a bottom surface 5117B substantially co-planar with a bottom surface 5128B of the insulating cap 5128 of the trench contact structure 5126, as is depicted in FIG. 51B. In another embodiment, the insulating caps 5116 of the first 5108 and second 5110 gate electrodes both have a bottom surface 5117C above a bottom surface 5128C of the insulating cap 5128 of the trench contact structure 5126, as is depicted in FIG. 51C.

In an embodiment, the conductive structure 5130 of the trench contact structure 5128 includes a U-shaped metal layer 5134, a T-shaped metal layer 5136 on and over the entirety of the U-shaped metal layer 5134, and a third metal layer 5138 on the T-shaped metal layer 5136. The insulating cap 5128 of the trench contact structure 5126 is on the third metal layer 5138. In one such embodiment, the third metal layer 5138 and the U-shaped metal layer 5134 include titanium, and the T-shaped metal layer 5136 includes cobalt. In a particular such embodiment, the T-shaped metal layer 5136 further includes carbon.

In an embodiment, a metal silicide layer 5140 is directly between the conductive structure 5130 of the trench contact structure 5126 and the semiconductor source or drain region 5124. In one such embodiment, the metal silicide layer 5140 includes titanium and silicon. In a particular such embodiment, the semiconductor source or drain region 5124 is an N-type semiconductor source or drain region. In another embodiment, the metal silicide layer 5140 includes nickel, platinum and silicon. In a particular such embodiment, the semiconductor source or drain region 5124 is a P-type semiconductor source or drain region. In another particular such embodiment, the metal silicide layer further includes germanium.

Figure 51D:
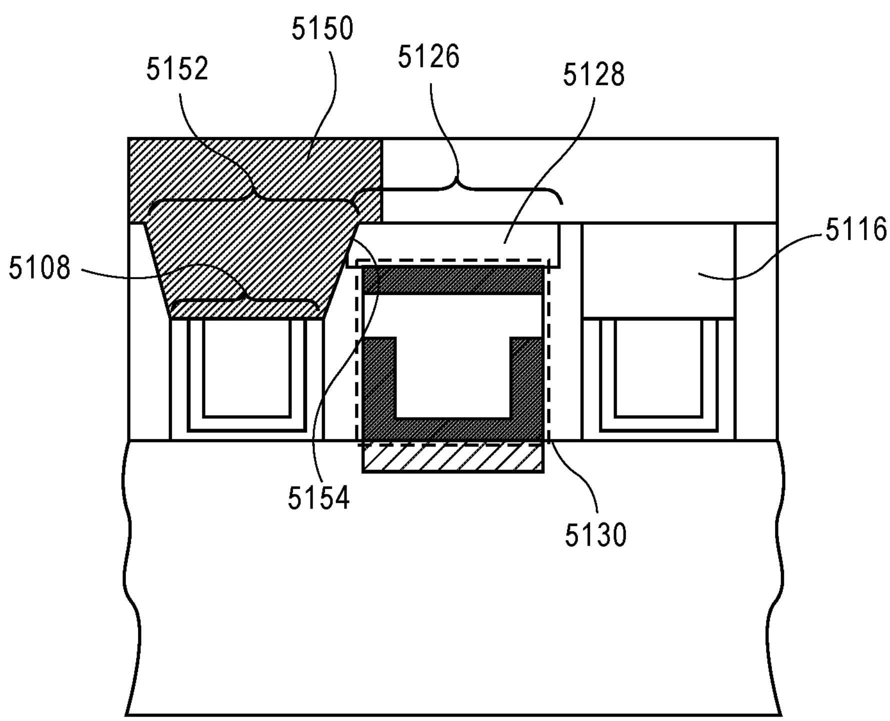

In an embodiment, referring to FIG. 51D, a conductive via 5150 is on and electrically connected to a portion of the first gate electrode 5108 over the top 5102A of the fin 5102. The conductive via 5150 is in an opening 5152 in the insulating cap 5116 of the first gate electrode 5108. In one such embodiment, the conductive via 5150 is on a portion of the insulating cap 5128 of the trench contact structure 5126 but is not electrically connected to the conductive structure 5130 of the trench contact structure 5126. In a particular such embodiment, the conductive via 5150 is in an eroded portion 5154 of the insulating cap 5128 of the trench contact structure 5126.

Figure 51E:
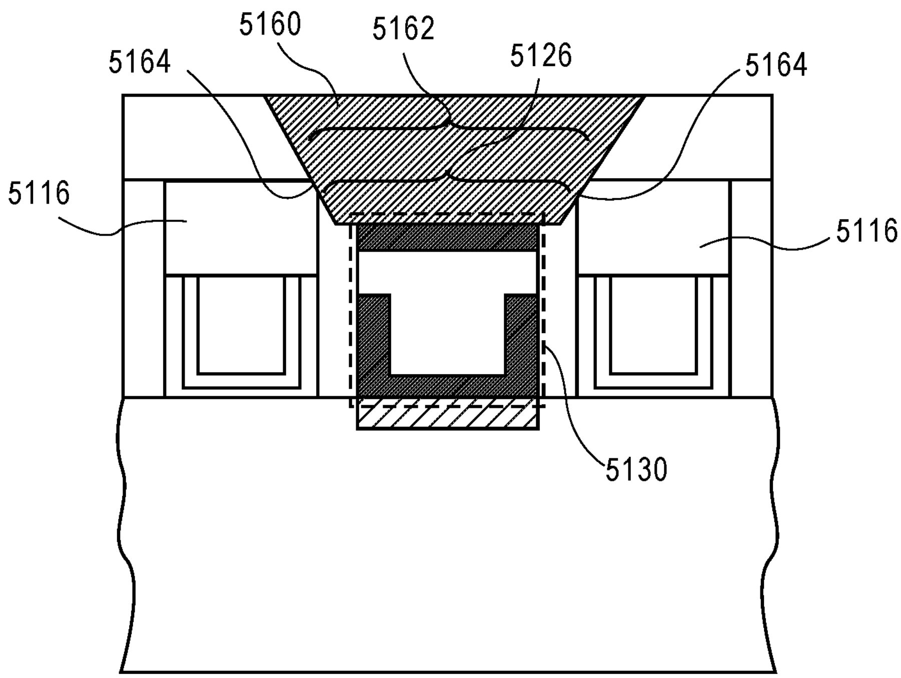

In an embodiment, referring to FIG. 51E, a conductive via 5160 is on and electrically connected to a portion of the trench contact structure 5126. The conductive via is in an opening 5162 of the insulating cap 5128 of the trench contact structure 5126. In one such embodiment, the conductive via 5160 is on a portion of the insulating caps 5116 of the first 5108 and second 5110 gate electrodes but is not electrically connected to the first 5108 and second 5110 gate electrodes. In a particular such embodiment, the conductive via 5160 is in an eroded portion 5164 of the insulating caps 5116 of the first 5108 and second 5110 gate electrodes.

Figure 51F:
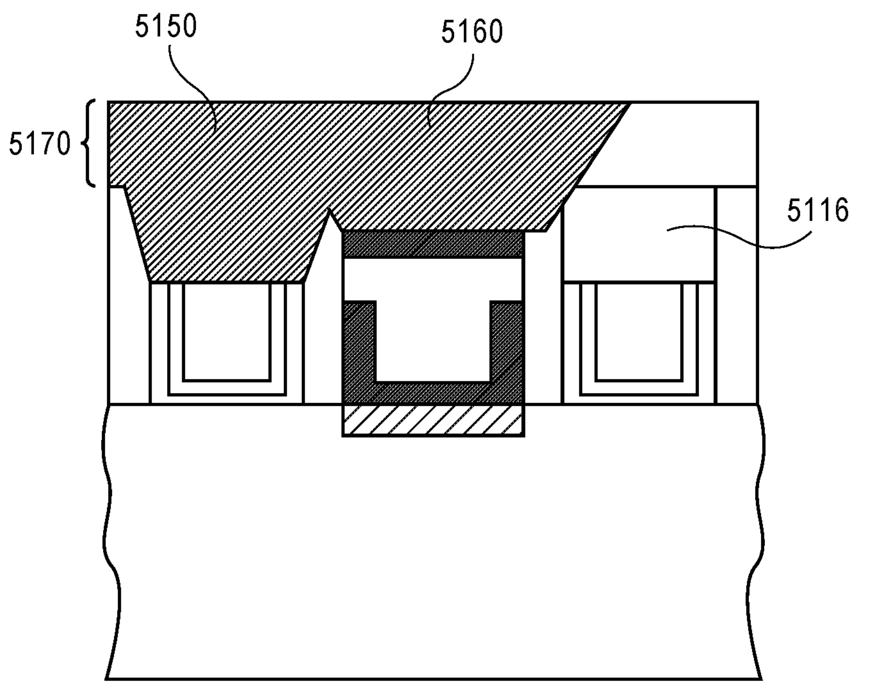

Referring again to FIG. 51E, in an embodiment, the conductive via 5160 is a second conductive via in a same structure as the conductive via 5150 of FIG. 51D. In one such embodiment, such a second conductive via 5160 is isolated from the conductive via 5150. In another such embodiment, such as second conductive via 5160 is merged with the conductive via 5150 to form an electrically shorting contact 5170, as is depicted in FIG. 51F.

Figure 52A:
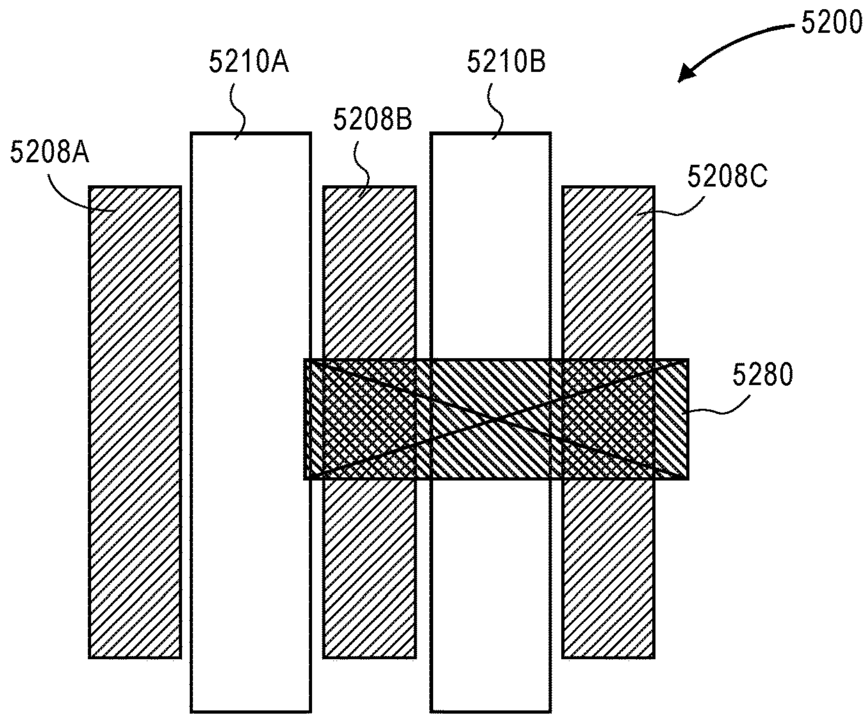
FIG. 52A illustrates a plan view of another semiconductor device having a gate contact via disposed over an active portion of a gate, in accordance with another embodiment of the present disclosure.

The approaches and structures described herein may enable formation of other structures or devices that were not possible or difficult to fabricate using other methodologies. In a first example, FIG. 52A illustrates a plan view of another semiconductor device having a gate contact via disposed over an active portion of a gate, in accordance with another embodiment of the present disclosure. Referring to FIG. 52A, a semiconductor structure or device 5200 includes a plurality of gate structures 5208A-5208C interdigitated with a plurality of trench contacts 5210A and 5210B (these features are disposed above an active region of a substrate, not shown). A gate contact via 5280 is formed on an active portion the gate structure 5208B. The gate contact via 5280 is further disposed on the active portion of the gate structure 5208C, coupling gate structures 5208B and 5208C. It is to be appreciated that the intervening trench contact 5210B may be isolated from the contact 5280 by using a trench contact isolation cap layer (e.g., TILA). The contact configuration of FIG. 52A may provide an easier approach to strapping adjacent gate lines in a layout, without the need to route the strap through upper layers of metallization, hence enabling smaller cell areas or less intricate wiring schemes, or both.

Figure 52B:
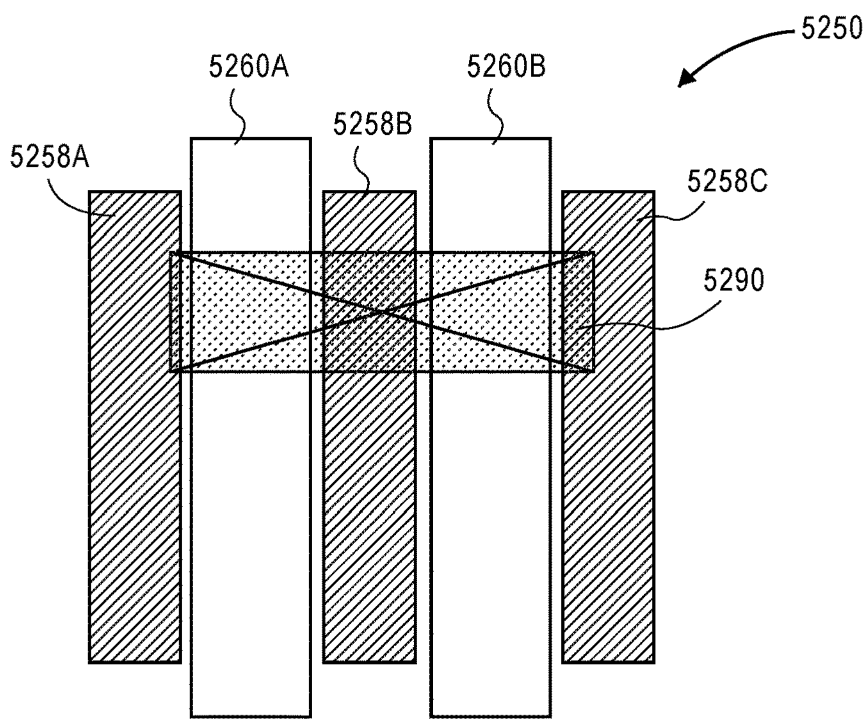
FIG. 52B illustrates a plan view of another semiconductor device having a trench contact via coupling a pair of trench contacts, in accordance with another embodiment of the present disclosure.

In a second example, FIG. 52B illustrates a plan view of another semiconductor device having a trench contact via coupling a pair of trench contacts, in accordance with another embodiment of the present disclosure. Referring to FIG. 52B, a semiconductor structure or device 5250 includes a plurality of gate structures 5258A-5258C interdigitated with a plurality of trench contacts 5260A and 5260B (these features are disposed above an active region of a substrate, not shown). A trench contact via 5290 is formed on the trench contact 5260A. The trench contact via 5290 is further disposed on the trench contact 5260B, coupling trench contacts 5260A and 5260B. It is to be appreciated that the intervening gate structure 5258B may be isolated from the trench contact via 5290 by using a gate isolation cap layer (e.g., by a GILA process). The contact configuration of FIG.

52B may provide an easier approach to strapping adjacent trench contacts in a layout, without the need to route the strap through upper layers of metallization, hence enabling smaller cell areas or less intricate wiring schemes, or both.

An insulating cap layer for a gate electrode may be fabricated using several deposition operations and, as a result, may include artifacts of a multi-deposition fabrication process. As an example, FIGS. 53A-53E illustrate cross-sectional views representing various operations in a method of fabricating an integrated circuit structure with a gate stack having an overlying insulating cap layer, in accordance with an embodiment of the present disclosure.

Figure 53A:
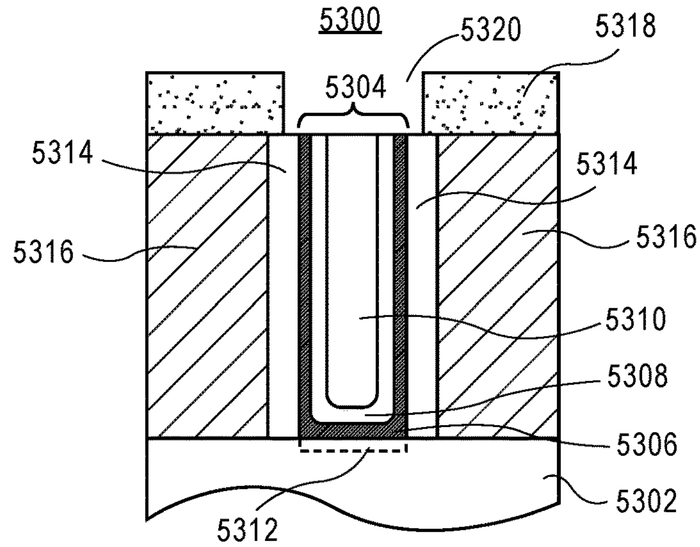
FIGS. 53A-53E illustrate cross-sectional views representing various operations in a method of fabricating an integrated circuit structure with a gate stack having an overlying insulating cap layer, in accordance with an embodiment of the present disclosure.

Referring to FIG. 53A, a starting structure 5300 includes a gate stack 5304 above a substrate or fin 5302. The gate stack 5304 includes a gate dielectric layer 5306, a conformal conductive layer 5308, and a conductive fill material 5310. In an embodiment, the gate dielectric layer 5306 is a high-k gate dielectric layer formed using an atomic layer deposition (ALD) process, and the conformal conductive layer is a workfunction layer formed using an ALD process. In one such embodiment, a thermal or chemical oxide layer 5312, such as a thermal or chemical silicon dioxide or silicon oxide layer, is between the substrate or fin 5302 and the gate dielectric layer 5306. Dielectric spacers 5314, such as silicon nitride spacers, are adjacent sidewalls of the gate stack 5304. The dielectric gate stack 5304 and the dielectric spacers 5314 are housed in an inter-layer-dielectric (ILD) layer 5316. In an embodiment, the gate stack 5304 is formed using a replacement gate and replacement gate dielectric processing scheme. A mask 5318 is patterned above the gate stack 5304 and ILD layer 5316 to provide an opening 5320 exposing the gate stack 5304.

Figure 53B:
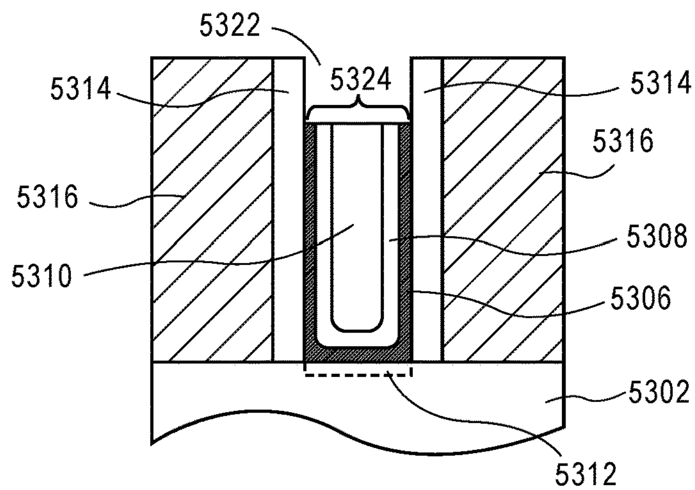

Referring to FIG. 53B, using a selective etch process or processes, the gate stack 5304, including gate dielectric layer 5306, conformal conductive layer 5308, and conductive fill material 5310, are recessed relative to dielectric spacers 5314 and layer 5316. Mask 5318 is then removed. The recessing provides a cavity 5322 above a recessed gate stack 5324.

In another embodiment, not depicted, conformal conductive layer 5308 and conductive fill material 5310 are recessed relative to dielectric spacers 5314 and layer 5316, but gate dielectric layer 5306 is not recessed or is only minimally recessed. It is to be appreciated that, in other embodiments, a maskless approach based on high etch selectivity is used for the recessing.

Figure 53C:
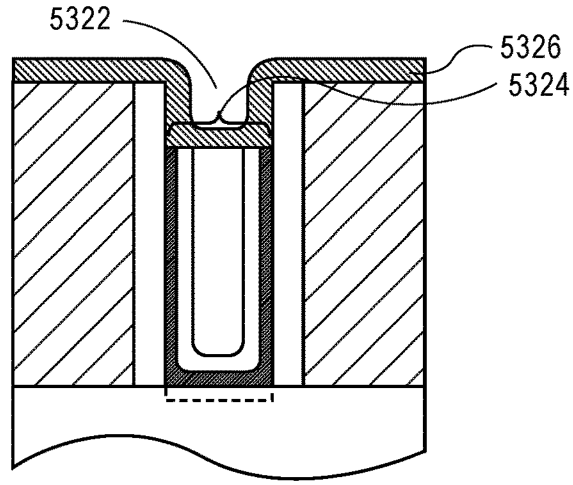

Referring to FIG. 53C, a first deposition process in a multi-deposition process for fabricating a gate insulating cap layer is performed. The first deposition process is used to form a first insulating layer 5326 conformal with the structure of FIG. 53B. In an embodiment, the first insulating layer 5326 includes silicon and nitrogen, e.g., the first insulating layer 5326 is a silicon nitride ($Si_3N_4$) layer, a silicon rich silicon nitride layer, a silicon-poor silicon nitride layer, or a carbon-doped silicon nitride layer. In an embodiment, the first insulating layer 5326 only partially fills the cavity 5322 above the recessed gate stack 5324, as is depicted.

Figure 53D:
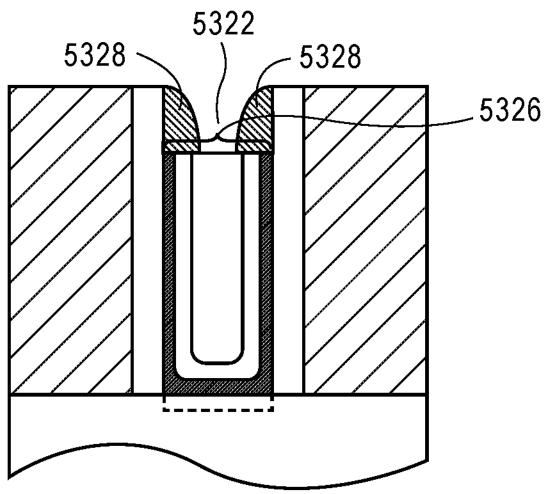

Referring to FIG. 53D, the first insulating layer 5326 is subjected to an etch-back process, such as an anisotropic etch process, to provide first portions 5328 of an insulating cap layer. The first portions 5328 of an insulating cap layer only partially fill the cavity 5322 above the recessed gate stack 5324.

Figure 53E:
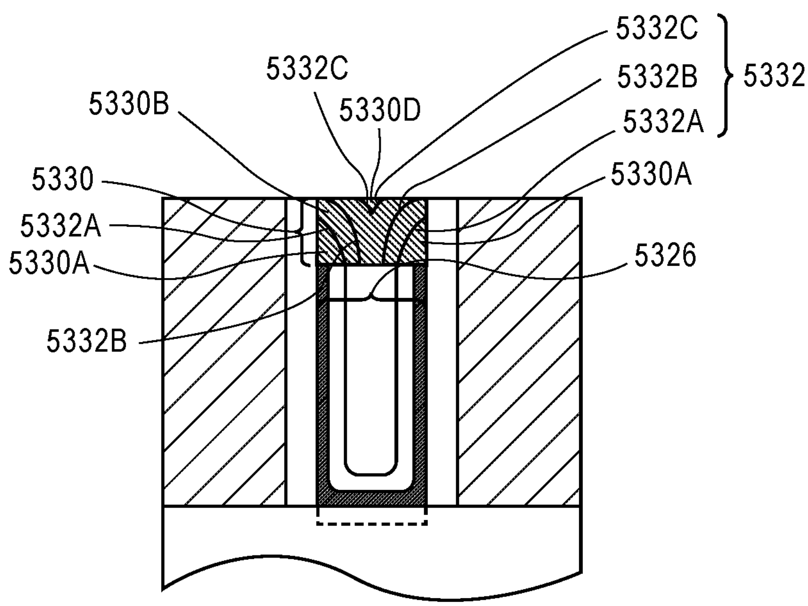

Referring to FIG. 53E, additional alternating deposition processes and etch-back processes are performed until cavity 5322 is filled with an insulating gate cap structure 5330 above the recessed gate stack 5324. Seams 5332 may be evident in cross-sectional analysis and may be indicative of the number of alternating deposition processes and etch-back processes used to insulating gate cap structure 5330. In the example shown in FIG. 53E, the presence of three sets of seams 5332A, 5332B and 5332C is indicative of four alternating deposition processes and etch-back processes used to insulating gate cap structure 5330. In an embodiment, the material 5330A, 5330B, 5330C and 5330D of insulating gate cap structure 5330 separated by seams 5332 all have exactly or substantially the same composition.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that in the above exemplary FEOL embodiments, in an embodiment, 10 nanometer or sub-10 nanometer node processing is implemented directly in to the fabrication schemes and resulting structures as a technology driver. In other embodiment, FEOL considerations may be driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

Back end of line (BEOL) layers of integrated circuits commonly include electrically conductive microelectronic structures, which are known in the arts as vias, to electrically connect metal lines or other interconnects above the vias to metal lines or other interconnects below the vias. Vias may be formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) or critical dimension uniformity (CDU), or both. Yet another such challenge is that the LWR or CDU, or both, characteristics of photoresists generally need to improve as the critical dimensions of the via openings decrease in order to maintain the same overall fraction of the critical dimension budget.

The above factors are also relevant for considering placement and scaling of non-conductive spaces or interruptions between metal lines (referred to as "plugs," "dielectric plugs" or "metal line ends" among the metal lines of back end of line (BEOL) metal interconnect structures. Thus, improvements are needed in the area of back end metallization manufacturing technologies for fabricating metal lines, metal vias, and dielectric plugs.

In another aspect, a pitch quartering approach is implemented for patterning trenches in a dielectric layer for forming BEOL interconnect structures. In accordance with an embodiment of the present disclosure, pitch division is applied for fabricating metal lines in a BEOL fabrication scheme. Embodiments may enable continued scaling of the pitch of metal layers beyond the resolution capability of state-of-the art lithography equipment.

Figure 54:
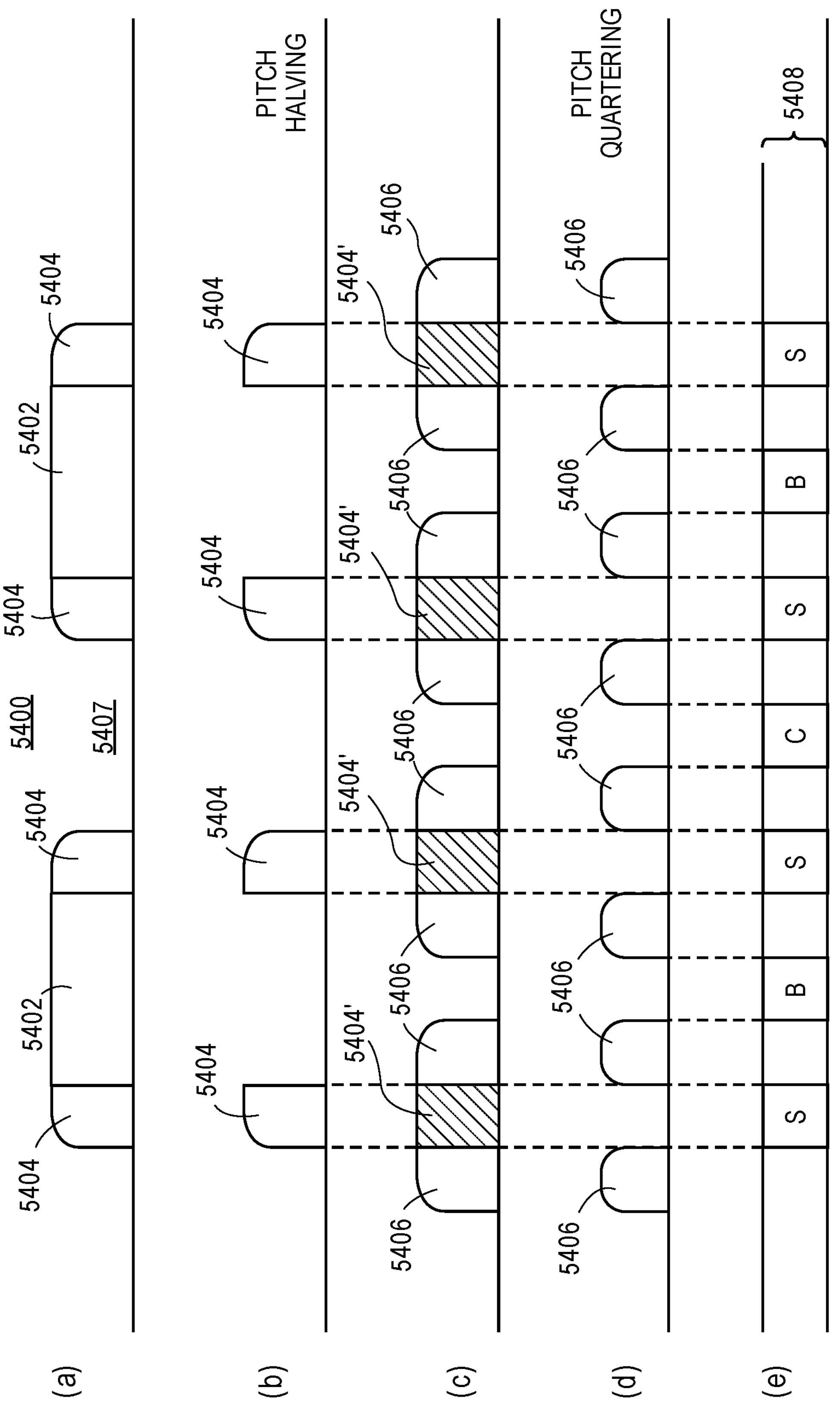
FIG. 54 is a schematic of a pitch quartering approach used to fabricate trenches for interconnect structures, in accordance with an embodiment of the present disclosure.

FIG. 54 is a schematic of a pitch quartering approach 5400 used to fabricate trenches for interconnect structures, in accordance with an embodiment of the present disclosure.

Referring to FIG. 54, at operation (a), backbone features 5402 are formed using direct lithography. For example, a photoresist layer or stack may be patterned and the pattern transferred into a hardmask material to ultimately form backbone features 5402. The photoresist layer or stack used to form backbone features 5402 may be patterned using standard lithographic processing techniques, such as 193 immersion lithography. First spacer features 5404 are then formed adjacent the sidewalls of the backbone features 5402.

At operation (b), the backbone features 5402 are removed to leave only the first spacer features 5404 remaining. At this stage, the first spacer features 5404 are effectively a half pitch mask, e.g., representing a pitch halving process. The first spacer features 5404 can either be used directly for a pitch quartering process, or the pattern of the first spacer features 5404 may first be transferred into a new hardmask material, where the latter approach is depicted.

At operation (c), the pattern of the first spacer features 5404 transferred into a new hardmask material to form first spacer features 5404'. Second spacer features 5406 are then formed adjacent the sidewalls of the first spacer features 5404'.

At operation (d), the first spacer features 5404' are removed to leave only the second spacer features 5406 remaining. At this stage, the second spacer features 5406 are effectively a quarter pitch mask, e.g., representing a pitch quartering process.

At operation (e), the second spacer features 5406 are used as a mask to pattern a plurality of trenches 5408 in a dielectric or hardmask layer. The trenches may ultimately be filled with conductive material to form conductive interconnects in metallization layers of an integrated circuit. Trenches 5408 having the label "B" correspond to backbone features 5402. Trenches 5408 having the label "S" correspond to first spacer features 5404 or 5404'. Trenches 5408 having the label "C" correspond to a complementary region 5407 between backbone features 5402.

It is to be appreciated that since individual ones of the trenches 5408 of FIG. 54 have a patterning origin that corresponds to one of backbone features 5402, first spacer features 5404 or 5404', or complementary region 5407 of FIG. 54, differences in width and/or pitch of such features may appear as artifacts of a pitch quartering process in ultimately formed conductive interconnects in metallization layers of an integrated circuit. As an example, FIG. 55A illustrates a cross-sectional view of a metallization layer fabricated using pitch quartering scheme, in accordance with an embodiment of the present disclosure.

Figure 55A:
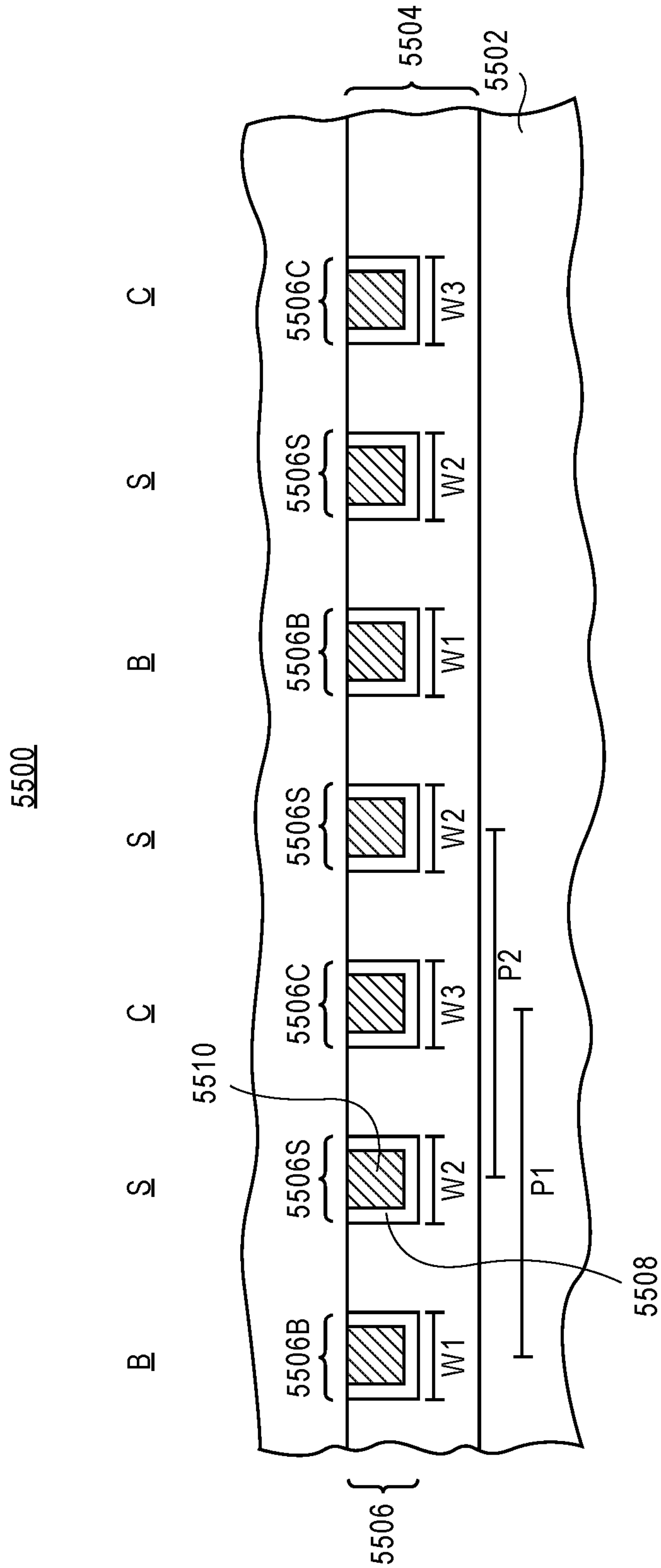
FIG. 55A illustrates a cross-sectional view of a metallization layer fabricated using pitch quartering scheme, in accordance with an embodiment of the present disclosure.

Referring to FIG. 55A, an integrated circuit structure 5500 includes an inter-layer dielectric (ILD) layer 5504 above a substrate 5502. A plurality of conductive interconnect lines 5506 is in the ILD layer 5504, and individual ones of the plurality of conductive interconnect lines 5506 are spaced apart from one another by portions of the ILD layer 5504. Individual ones of the plurality of conductive interconnect lines 5506 includes a conductive barrier layer 5508 and a conductive fill material 5510.

With reference to both FIGS. 54 and 55A, conductive interconnect lines 5506B are formed in trenches with a pattern originating from backbone features 5402. Conductive interconnect lines 5506S are formed in trenches with a pattern originating from first spacer features 5404 or 5404'. Conductive interconnect lines 5506C are formed in trenches with a pattern originating from complementary region 5407 between backbone features 5402.

Referring again to FIG. 55A, in an embodiment, the plurality of conductive interconnect lines 5506 includes a first interconnect line 5506B having a width (W1). A second interconnect line 5506S is immediately adjacent the first interconnect line 5506B, the second interconnect line 5506S having a width (W2) different than the width (W1) of the first interconnect line 5506B. A third interconnect line 5506C is immediately adjacent the second interconnect line 5506S, the third interconnect line 5506C having a width (W3). A fourth interconnect line (second 5506S) immediately adjacent the third interconnect line 5506C, the fourth interconnect line having a width (W2) the same as the width (W2) of the second interconnect line 5506S. A fifth interconnect line (second 5506B) is immediately adjacent the fourth interconnect line (second 5506S), the fifth interconnect line (second 5506B) having a width (W1) the same as the width (W1) of the first interconnect line 5506B.

In an embodiment, the width (W3) of the third interconnect line 5506C is different than the width (W1) of the first interconnect line 5506B. In one such embodiment, the width (W3) of the third interconnect line 5506C is different than the width (W2) of the second interconnect line 5506S. In another such embodiment, the width (W3) of the third interconnect line 5506C is the same as the width (W2) of the second interconnect line 5506S. In another embodiment, the width (W3) of the third interconnect line 5506C is the same as the width (W1) of the first interconnect line 5506B.

In an embodiment, a pitch (P1) between the first interconnect line 5506B and the third interconnect line 5506C is the same as a pitch (P2) between the second interconnect 5506S line and the fourth interconnect line (second 5506S). In another embodiment, a pitch (P1) between the first interconnect line 5506B and the third interconnect line 5506C is different than a pitch (P2) between the second interconnect line 5506S and the fourth interconnect line (second 5506S).

Referring again to FIG. 55A, in another embodiment, the plurality of conductive interconnect lines 5506 includes a first interconnect line 5506B having a width (W1). A second interconnect line 5506S is immediately adjacent the first interconnect line 5506B, the second interconnect line 5506S having a width (W2). A third interconnect line 5506C is immediately adjacent the second interconnect line 5506S, the third interconnect line 5506S having a width (W3) different than the width (W1) of the first interconnect line 5506B. A fourth interconnect line (second 5506S) is immediately adjacent the third interconnect line 5506C, the fourth interconnect line having a width (W2) the same as the width (W2) of the second interconnect line 5506S. A fifth interconnect line (second 5506B) is immediately adjacent the fourth interconnect line (second 5506S), the fifth interconnect line (second 5506B) having a width (W1) the same as the width (W1) of the first interconnect line 5506B.

In an embodiment, the width (W2) of the second interconnect line 5506S is different than the width (W1) of the first interconnect line 5506B. In one such embodiment, the width (W3) of the third interconnect line 5506C is different than the width (W2) of the second interconnect line 5506S. In another such embodiment, the width (W3) of the third interconnect line 5506C is the same as the width (W2) of the second interconnect line 5506S.

In an embodiment, the width (W2) of the second interconnect line 5506S is the same as the width (W1) of the first interconnect line 5506B. In an embodiment, a pitch (P1) between the first interconnect line 5506B and the third interconnect line 5506C is the same as a pitch (P2) between the second interconnect line 5506S and the fourth interconnect line (second 5506S). In an embodiment, a pitch (P1) between the first interconnect line 5506B and the third interconnect line 5506C is different than a pitch (P2) between the second interconnect line 5506S and the fourth interconnect line (second 5506S).

Figure 55B:
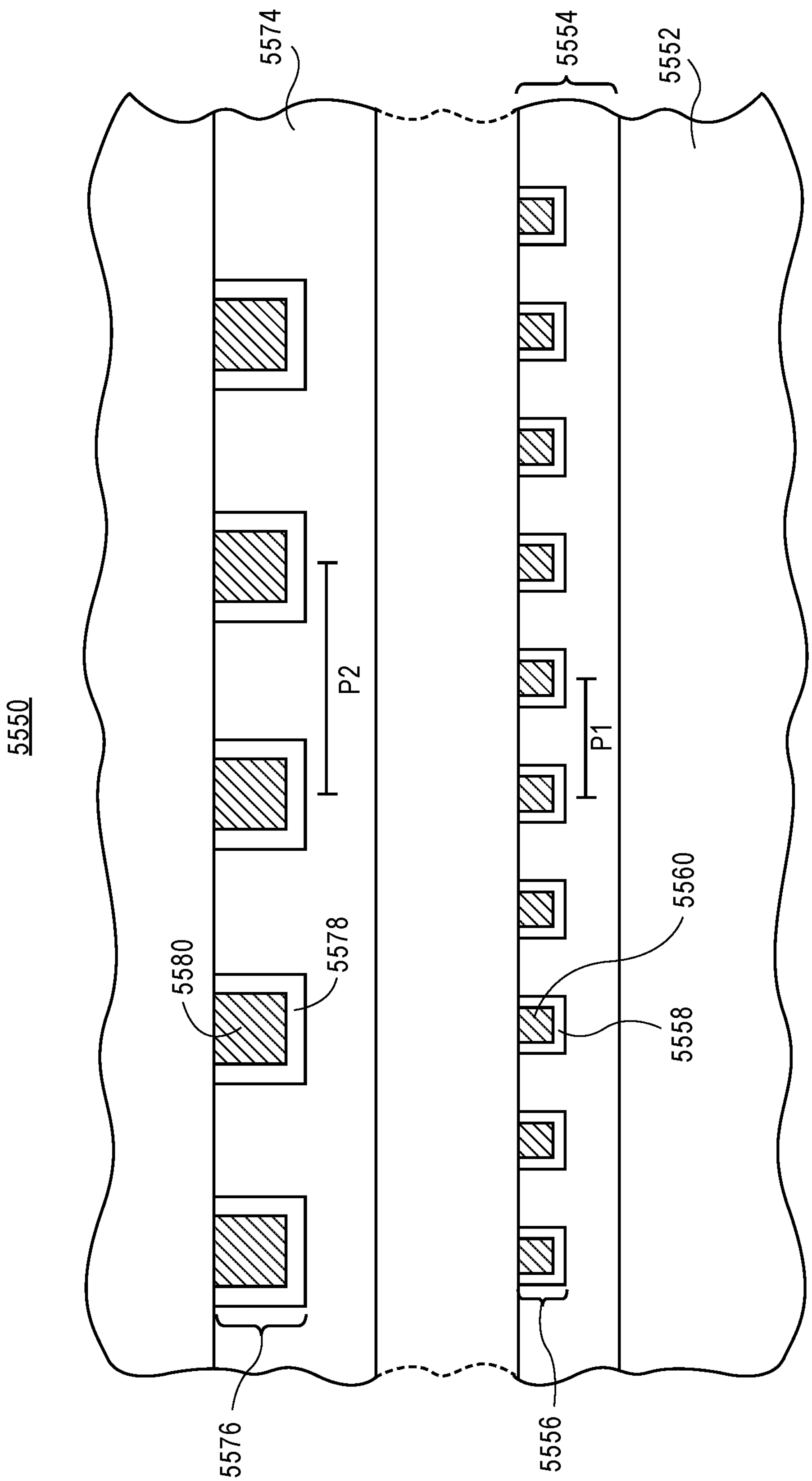
FIG. 55B illustrates a cross-sectional view of a metallization layer fabricated using pitch halving scheme above a metallization layer fabricated using pitch quartering scheme, in accordance with an embodiment of the present disclosure.

FIG. 55B illustrates a cross-sectional view of a metallization layer fabricated using pitch halving scheme above a metallization layer fabricated using pitch quartering scheme, in accordance with an embodiment of the present disclosure.

Referring to FIG. 55B, an integrated circuit structure 5550 includes a first inter-layer dielectric (ILD) layer 5554 above a substrate 5552. A first plurality of conductive interconnect lines 5556 is in the first ILD layer 5554, and individual ones of the first plurality of conductive interconnect lines 5556 are spaced apart from one another by portions of the first ILD layer 5554. Individual ones of the plurality of conductive interconnect lines 5556 includes a conductive barrier layer 5558 and a conductive fill material 5560. The integrated circuit structure 5550 further includes a second inter-layer dielectric (ILD) layer 5574 above substrate 5552. A second plurality of conductive interconnect lines 5576 is in the second ILD layer 5574, and individual ones of the second plurality of conductive interconnect lines 5576 are spaced apart from one another by portions of the second ILD layer 5574. Individual ones of the plurality of conductive interconnect lines 5576 includes a conductive barrier layer 5578 and a conductive fill material 5580.

In accordance with an embodiment of the present disclosure, with reference again to FIG. 55B, a method of fabricating an integrated circuit structure includes forming a first plurality of conductive interconnect lines 5556 in and spaced apart by a first inter-layer dielectric (ILD) layer 5554 above a substrate 5552. The first plurality of conductive interconnect lines 5556 is formed using a spacer-based pitch quartering process, e.g., the approach described in association with operations (a)-(e) of FIG. 54. A second plurality of conductive interconnect lines 5576 is formed in and is spaced apart by a second ILD layer 5574 above the first ILD layer 5554. The second plurality of conductive interconnect lines 5576 is formed using a spacer-based pitch halving process, e.g., the approach described in association with operations (a) and (b) of FIG. 54.

In an embodiment, first plurality of conductive interconnect lines 5556 has a pitch (P1) between immediately adjacent lines of than 40 nanometers. The second plurality of conductive interconnect lines 5576 has a pitch (P2) between immediately adjacent lines of 44 nanometers or greater. In an embodiment, the spacer-based pitch quartering process and the spacer-based pitch halving process are based on an immersion 193 nm lithography process.

In an embodiment, individual ones of the first plurality of conductive interconnect lines 5554 include a first conductive barrier liner 5558 and a first conductive fill material 5560. Individual ones of the second plurality of conductive interconnect lines 5556 include a second conductive barrier liner 5578 and a second conductive fill material 5580. In one such embodiment, the first conductive fill material 5560 is different in composition from the second conductive fill material 5580. In another embodiment, the first conductive fill material 5560 is the same in composition as the second conductive fill material 5580.

Although not depicted, in an embodiment, the method further includes forming a third plurality of conductive interconnect lines in and spaced apart by a third ILD layer above the second ILD layer 5574. The third plurality of conductive interconnect lines is formed without using pitch division.

Although not depicted, in an embodiment, the method further includes, prior to forming the second plurality of conductive interconnect lines 5576, forming a third plurality of conductive interconnect lines in and spaced apart by a third ILD layer above the first ILD layer 5554. The third plurality of conductive interconnect lines is formed using a spacer-based pitch quartering process. In one such embodiment, subsequent to forming the second plurality of conductive interconnect lines 5576, a fourth plurality of conductive interconnect lines is formed in and is spaced apart by a fourth ILD layer above the second ILD layer 5574. The fourth plurality of conductive interconnect lines is formed using a spacer-based pitch halving process. In an embodiment, such a method further includes forming a fifth plurality of conductive interconnect lines in and spaced apart by a fifth ILD layer above the fourth ILD layer, the fifth plurality of conductive interconnect lines formed using a spacer-based pitch halving process. A sixth plurality of conductive interconnect lines is then formed in and spaced apart by a sixth ILD layer above the fifth ILD layer, the sixth plurality of conductive interconnect lines formed using a spacer-based pitch halving process. A seventh plurality of conductive interconnect lines is then formed in and spaced apart by a seventh ILD layer above the sixth ILD layer. The seventh plurality of conductive interconnect lines is formed without using pitch division.

In another aspect, metal line compositions vary between metallization layers. Such an arrangement may be referred to as heterogeneous metallization layers. In an embodiment, copper is used as a conductive fill material for relatively larger interconnect lines, while cobalt is used as a conductive fill material for relatively smaller interconnect lines. The smaller lines having cobalt as a fill material may provide reduced electromigration while maintaining low resistivity. The use of cobalt in place of copper for smaller interconnect lines may address issues with scaling copper lines, where a conductive barrier layer consumes a greater amount of an interconnect volume and copper is reduced, essentially hindering advantages normally associated with a copper interconnect line.

Figure 56A:
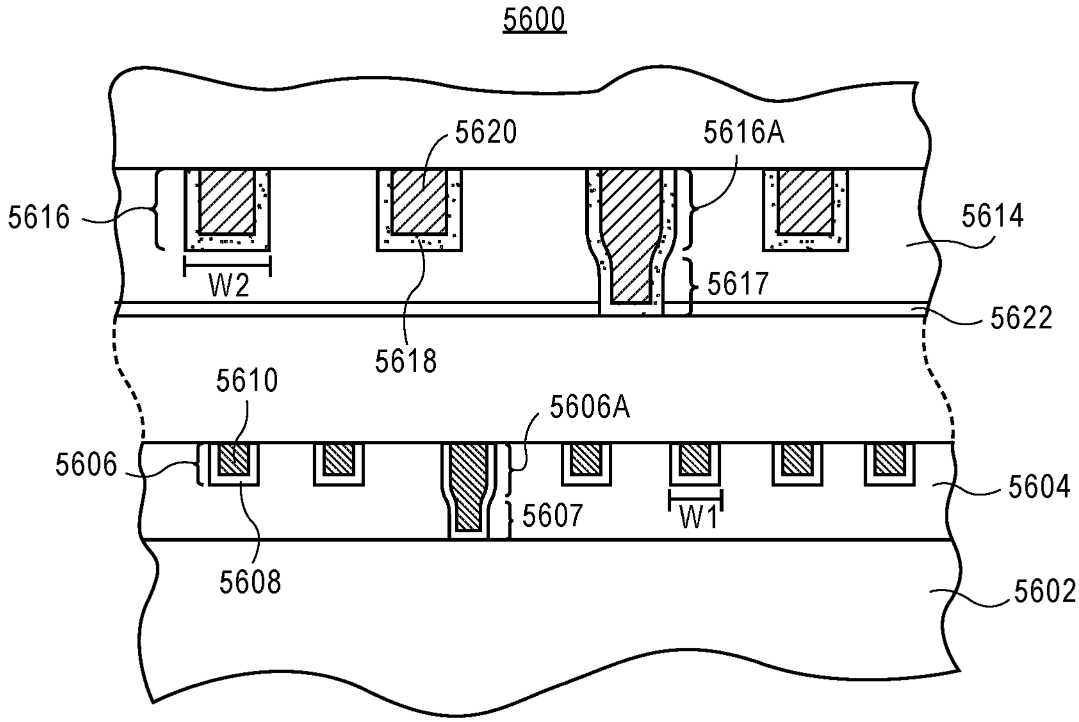
FIG. 56A illustrates a cross-sectional view of an integrated circuit structure having a metallization layer with a metal line composition above a metallization layer with a differing metal line composition, in accordance with an embodiment of the present disclosure.

In a first example, FIG. 56A illustrates a cross-sectional view of an integrated circuit structure having a metallization layer with a metal line composition above a metallization layer with a differing metal line composition, in accordance with an embodiment of the present disclosure.

Referring to FIG. 56A, an integrated circuit structure 5600 includes a first plurality of conductive interconnect lines 5606 in and spaced apart by a first inter-layer dielectric (ILD) layer 5604 above a substrate 5602. One of the conductive interconnect lines 5606A is shown as having an underlying via 5607. Individual ones of the first plurality of conductive interconnect lines 5606 include a first conductive barrier material 5608 along sidewalls and a bottom of a first conductive fill material 5610.

A second plurality of conductive interconnect lines 5616 is in and spaced apart by a second ILD layer 5614 above the first ILD layer 5604. One of the conductive interconnect lines 5616A is shown as having an underlying via 5617. Individual ones of the second plurality of conductive interconnect lines 5616 include a second conductive barrier material 5618 along sidewalls and a bottom of a second conductive fill material 5620. The second conductive fill material 5620 is different in composition from the first conductive fill material 5610.

In an embodiment, the second conductive fill material 5620 consists essentially of copper, and the first conductive fill material 5610 consists essentially of cobalt. In one such embodiment, the first conductive barrier material 5608 is different in composition from the second conductive barrier material 5618. In another such embodiment, the first conductive barrier material 5608 is the same in composition as the second conductive barrier material 5618.

In an embodiment, the first conductive fill material 5610 includes copper having a first concentration of a dopant impurity atom, and the second conductive fill material 5620 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 5610 and the second conductive barrier material 5620 have the same composition. In an embodiment, the first conductive barrier material 5610 and the second conductive barrier material 5620 have a different composition.

Referring again to FIG. 56A, the second ILD layer 5614 is on an etch-stop layer 5622. The conductive via 5617 is in the second ILD layer 5614 and in an opening of the etch-stop layer 5622. In an embodiment, the first and second ILD layers 5604 and 5614 include silicon, carbon and oxygen, and the etch-stop layer 5622 includes silicon and nitrogen. In an embodiment, individual ones of the first plurality of conductive interconnect lines 5606 have a first width (W1), and individual ones of the second plurality of conductive interconnect lines 5616 have a second width (W2) greater than the first width (W1).

Figure 56B:
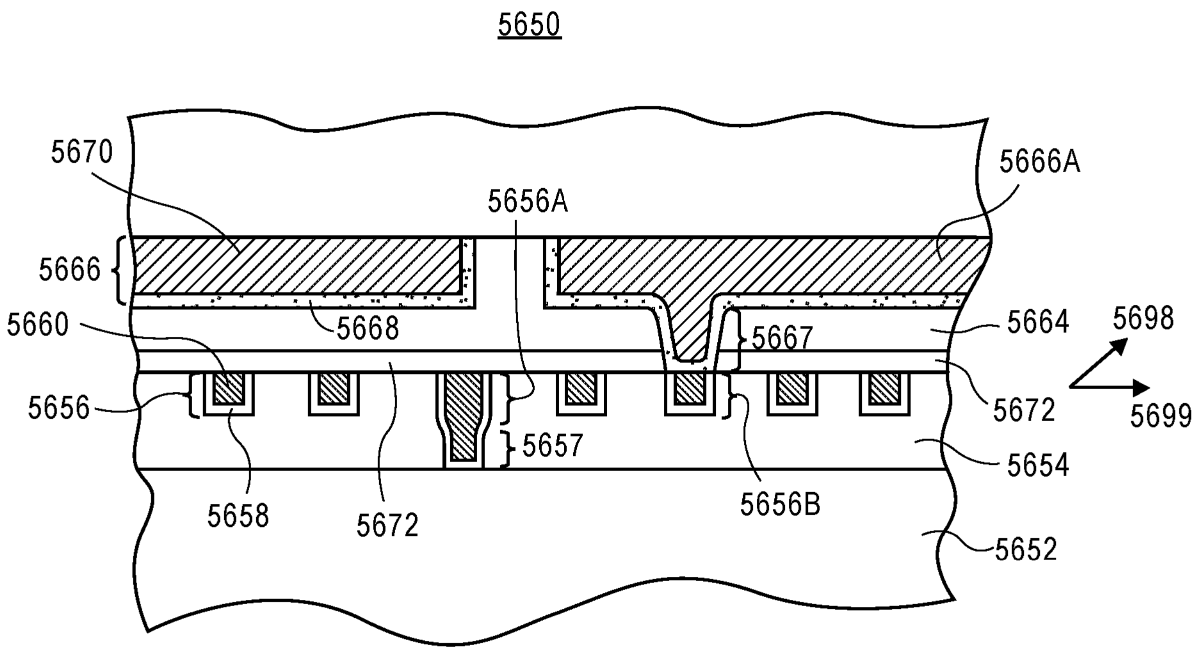
FIG. 56B illustrates a cross-sectional view of an integrated circuit structure having a metallization layer with a metal line composition coupled to a metallization layer with a differing metal line composition, in accordance with an embodiment of the present disclosure.

In a second example, FIG. 56B illustrates a cross-sectional view of an integrated circuit structure having a metallization layer with a metal line composition coupled to a metallization layer with a differing metal line composition, in accordance with an embodiment of the present disclosure.

Referring to FIG. 56B, an integrated circuit structure 5650 includes a first plurality of conductive interconnect lines 5656 in and spaced apart by a first inter-layer dielectric (ILD) layer 5654 above a substrate 5652. One of the conductive interconnect lines 5656A is shown as having an underlying via 5657. Individual ones of the first plurality of conductive interconnect lines 5656 include a first conductive barrier material 5658 along sidewalls and a bottom of a first conductive fill material 5660.

A second plurality of conductive interconnect lines 5666 is in and spaced apart by a second ILD layer 5664 above the first ILD layer 5654. One of the conductive interconnect lines 5666A is shown as having an underlying via 5667. Individual ones of the second plurality of conductive interconnect lines 5666 include a second conductive barrier material 5668 along sidewalls and a bottom of a second conductive fill material 5670. The second conductive fill material 5670 is different in composition from the first conductive fill material 5660.

In an embodiment, the conductive via 5657 is on and electrically coupled to an individual one 5656B of the first plurality of conductive interconnect lines 5656, electrically coupling the individual one 5666A of the second plurality of conductive interconnect lines 5666 to the individual one 5656B of the first plurality of conductive interconnect lines 5656. In an embodiment, individual ones of the first plurality of conductive interconnect lines 5656 are along a first direction 5698 (e.g., into and out of the page), and individual ones of the second plurality of conductive interconnect lines 5666 are along a second direction 5699 orthogonal to the first direction 5698, as is depicted. In an embodiment, the conductive via 5667 includes the second conductive barrier material 5668 along sidewalls and a bottom of the second conductive fill material 5670, as is depicted.

In an embodiment, the second ILD layer 5664 is on an etch-stop layer 5672 on the first ILD layer 5654. The conductive via 5667 is in the second ILD layer 5664 and in an opening of the etch-stop layer 5672. In an embodiment, the first and second ILD layers 5654 and 5664 include silicon, carbon and oxygen, and the etch-stop layer 5672 includes silicon and nitrogen. In an embodiment, individual ones of the first plurality of conductive interconnect lines 5656 have a first width (W1), and individual ones of the second plurality of conductive interconnect lines 5666 have a second width (W2) greater than the first width (W1).

In an embodiment, the second conductive fill material 5670 consists essentially of copper, and the first conductive fill material 5660 consists essentially of cobalt. In one such embodiment, the first conductive barrier material 5658 is different in composition from the second conductive barrier material 5668. In another such embodiment, the first conductive barrier material 5658 is the same in composition as the second conductive barrier material 5668.

In an embodiment, the first conductive fill material 5660 includes copper having a first concentration of a dopant impurity atom, and the second conductive fill material 5670 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 5660 and the second conductive barrier material 5670 have the same composition. In an embodiment, the first conductive barrier material 5660 and the second conductive barrier material 5670 have a different composition.

Figure 57A:
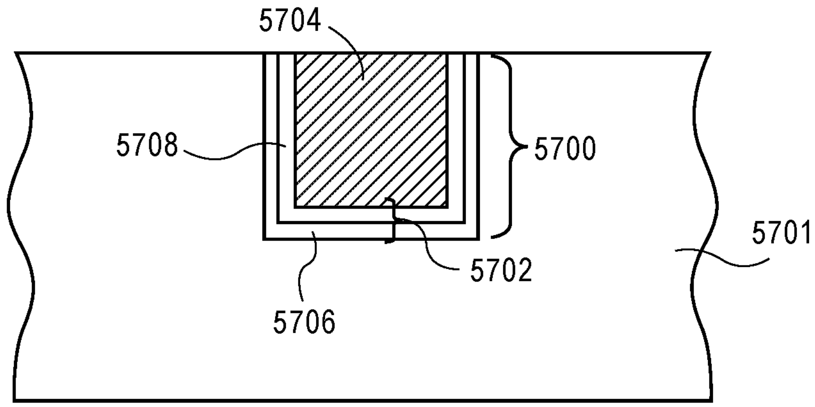
FIGS. 57A-57C illustrate cross-section views of individual interconnect lines having various liner and conductive capping structural arrangements, in accordance with an embodiment of the present disclosure.
Figure 57B:
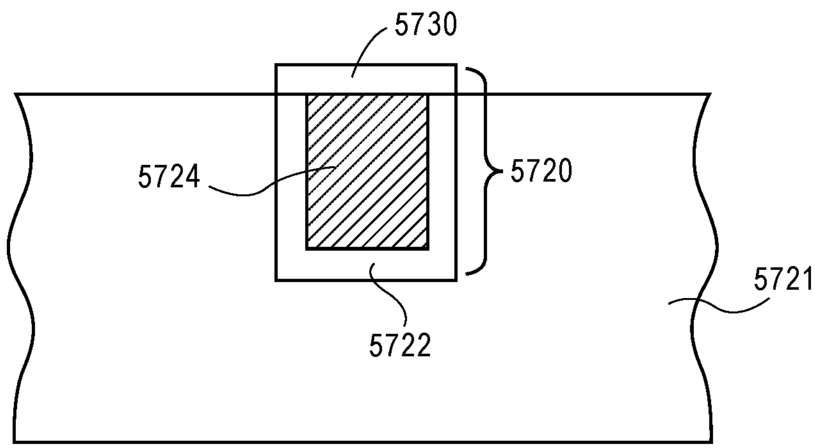
Figure 57C:
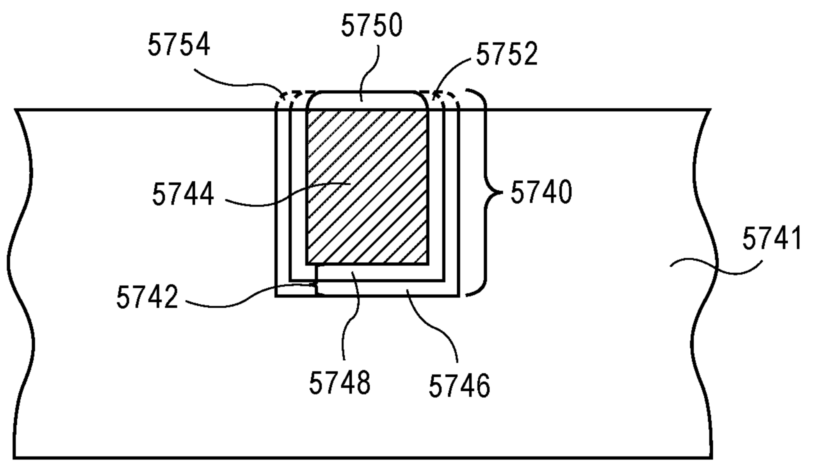

FIGS. 57A-57C illustrate cross-section views of individual interconnect lines having various barrier liner and conductive capping structural arrangements suitable for the structures described in association with FIGS. 56A and 56B, in accordance with an embodiment of the present disclosure.

Referring to FIG. 57A, an interconnect line 5700 in a dielectric layer 5701 includes a conductive barrier material 5702 and a conductive fill material 5704. The conductive barrier material 5702 includes an outer layer 5706 distal from the conductive fill material 5704 and an inner layer 5708 proximate to the conductive fill material 5704. In an embodiment, the conductive fill material includes cobalt, the outer layer 5706 includes titanium and nitrogen, and the inner layer 5708 includes tungsten, nitrogen and carbon. In one such embodiment, the outer layer 5706 has a thickness of approximately 2 nanometers, and the inner layer 5708 has a thickness of approximately 0.5 nanometers. In another embodiment, the conductive fill material includes cobalt, the outer layer 5706 includes tantalum, and the inner layer 5708 includes ruthenium. In one such embodiment, the outer layer 5706 further includes nitrogen.

Referring to FIG. 57B, an interconnect line 5720 in a dielectric layer 5721 includes a conductive barrier material 5722 and a conductive fill material 5724. A conductive cap layer 5730 is on a top of the conductive fill material 5724. In one such embodiment, the conductive cap layer 5730 is further on a top of the conductive barrier material 5722, as is depicted. In another embodiment, the conductive cap layer 5730 is not on a top of the conductive barrier material 5722. In an embodiment, the conductive cap layer 5730 consists essentially of cobalt, and the conductive fill material 5724 consists essentially of copper.

Referring to FIG. 57C, an interconnect line 5740 in a dielectric layer 5741 includes a conductive barrier material 5742 and a conductive fill material 5744. The conductive barrier material 5742 includes an outer layer 5746 distal from the conductive fill material 5744 and an inner layer 5748 proximate to the conductive fill material 5744. A conductive cap layer 5750 is on a top of the conductive fill material 5744. In one embodiment, the conductive cap layer 5750 is only a top of the conductive fill material 5744. In another embodiment, however, the conductive cap layer 5750 is further on a top of the inner layer 5748 of the conductive barrier material 5742, i.e., at location 5752. In one such embodiment, the conductive cap layer 5750 is further on a top of the outer layer 5746 of the conductive barrier material 5742, i.e., at location 5754.

In an embodiment, with reference to FIGS. 57B and 57C, a method of fabricating an integrated circuit structure includes forming an inter-layer dielectric (ILD) layer 5721 or 5741 above a substrate. A plurality of conductive interconnect lines 5720 or 5740 is formed in trenches in and spaced apart by the ILD layer, individual ones of the plurality of conductive interconnect lines 5720 or 5740 in a corresponding one of the trenches. The plurality of conductive interconnect lines is formed by first forming a conductive barrier material 5722 or 5724 on bottoms and sidewalls of the trenches, and then forming a conductive fill material 5724 or 5744 on the conductive barrier material 5722 or 5742, respectively, and filling the trenches, where the conductive barrier material 5722 or 5742 is along a bottom of and along sidewalls of the conductive fill material 5730 or 5750, respectively. The top of the conductive fill material 5724 or 5744 is then treated with a gas including oxygen and carbon. Subsequent to treating the top of the conductive fill material 5724 or 5744 with the gas including oxygen and carbon, a conductive cap layer 5730 or 5750 is formed on the top of the conductive fill material 5724 or 5744, respectively.

In one embodiment, treating the top of the conductive fill material 5724 or 5744 with the gas including oxygen and carbon includes treating the top of the conductive fill material 5724 or 5744 with carbon monoxide (CO). In one embodiment, the conductive fill material 5724 or 5744 includes copper, and forming the conductive cap layer 5730 or 5750 on the top of the conductive fill material 5724 or 5744 includes forming a layer including cobalt using chemical vapor deposition (CVD). In one embodiment, the conductive cap layer 5730 or 5750 is formed on the top of the conductive fill material 5724 or 5744, but not on a top of the conductive barrier material 5722 or 5724.

In one embodiment, forming the conductive barrier material 5722 or 5744 includes forming a first conductive layer on the bottoms and sidewalls of the trenches, the first conductive layer including tantalum. A first portion of the first conductive layer is first formed using atomic layer deposition (ALD) and then a second portion of the first conductive layer is then formed using physical vapor deposition (PVD). In one such embodiment, forming the conductive barrier material further includes forming a second conductive layer on the first conductive layer on the bottoms and sidewalls of the trenches, the second conductive layer including ruthenium, and the conductive fill material including copper. In one embodiment, the first conductive layer further includes nitrogen.

Figure 58:
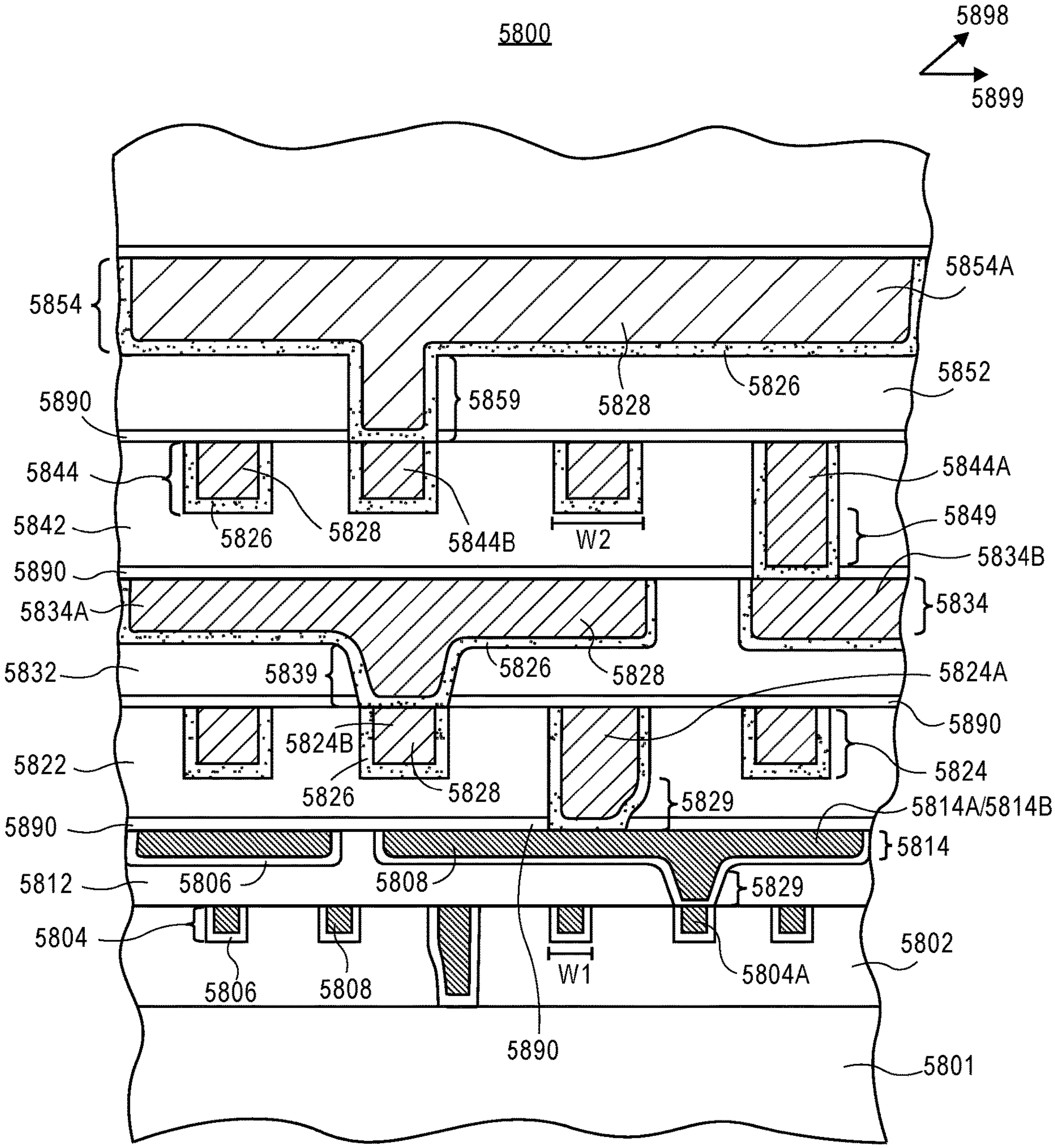
FIG. 58 illustrates a cross-sectional view of an integrated circuit structure having four metallization layers with a metal line composition and pitch above two metallization layers with a differing metal line composition and smaller pitch, in accordance with an embodiment of the present disclosure.

FIG. 58 illustrates a cross-sectional view of an integrated circuit structure having four metallization layers with a metal line composition and pitch above two metallization layers with a differing metal line composition and smaller pitch, in accordance with an embodiment of the present disclosure.

Referring to FIG. 58, an integrated circuit structure 5800 includes a first plurality of conductive interconnect lines 5804 in and spaced apart by a first inter-layer dielectric (ILD) layer 5802 above a substrate 5801. Individual ones of the first plurality of conductive interconnect lines 5804 include a first conductive barrier material 5806 along sidewalls and a bottom of a first conductive fill material 5808. Individual ones of the first plurality of conductive interconnect lines 5804 are along a first direction 5898 (e.g., into and out of the page).

A second plurality of conductive interconnect lines 5814 is in and spaced apart by a second ILD layer 5812 above the first ILD layer 5802. Individual ones of the second plurality of conductive interconnect lines 5814 include the first conductive barrier material 5806 along sidewalls and a bottom of the first conductive fill material 5808. Individual ones of the second plurality of conductive interconnect lines 5814 are along a second direction 5899 orthogonal to the first direction 5898.

A third plurality of conductive interconnect lines 5824 is in and spaced apart by a third ILD layer 5822 above the second ILD layer 5812. Individual ones of the third plurality of conductive interconnect lines 5824 include a second conductive barrier material 5826 along sidewalls and a bottom of a second conductive fill material 5828. The second conductive fill material 5828 is different in composition from the first conductive fill material 5808. Individual ones of the third plurality of conductive interconnect lines 5824 are along the first direction 5898.

A fourth plurality of conductive interconnect lines 5834 is in and spaced apart by a fourth ILD layer 5832 above the third ILD layer 5822. Individual ones of the fourth plurality of conductive interconnect lines 5834 include the second conductive barrier material 5826 along sidewalls and a bottom of the second conductive fill material 5828. Individual ones of the fourth plurality of conductive interconnect lines 5834 are along the second direction 5899.

A fifth plurality of conductive interconnect lines 5844 is in and spaced apart by a fifth ILD layer 5842 above the fourth ILD layer 5832. Individual ones of the fifth plurality of conductive interconnect lines 5844 include the second conductive barrier material 5826 along sidewalls and a bottom of the second conductive fill material 5828. Individual ones of the fifth plurality of conductive interconnect lines 5844 are along the first direction 5898.

A sixth plurality of conductive interconnect lines 5854 is in and spaced apart by a sixth ILD layer 5852 above the fifth ILD layer. Individual ones of the sixth plurality of conductive interconnect lines 5854 include the second conductive barrier material 5826 along sidewalls and a bottom of the second conductive fill material 5828. Individual ones of the sixth plurality of conductive interconnect lines 5854 are along the second direction 5899.

In an embodiment, the second conductive fill material 5828 consists essentially of copper, and the first conductive fill material 5808 consists essentially of cobalt. In an embodiment, the first conductive fill material 5808 includes copper having a first concentration of a dopant impurity atom, and the second conductive fill material 5828 includes copper having a second concentration of the dopant impurity atom, the second concentration of the dopant impurity atom less than the first concentration of the dopant impurity atom.

In an embodiment, the first conductive barrier material 5806 is different in composition from the second conductive barrier material 5826. In another embodiment, the first conductive barrier material 5806 and the second conductive barrier material 5826 have the same composition.

In an embodiment, a first conductive via 5819 is on and electrically coupled to an individual one 5804A of the first plurality of conductive interconnect lines 5804. An individual one 5814A of the second plurality of conductive interconnect lines 5814 is on and electrically coupled to the first conductive via 5819.

A second conductive via 5829 is on and electrically coupled to an individual one 5814B of the second plurality of conductive interconnect lines 5814. An individual one 5824A of the third plurality of conductive interconnect lines 5824 is on and electrically coupled to the second conductive via 5829.

A third conductive via 5839 is on and electrically coupled to an individual one 5824B of the third plurality of conductive interconnect lines 5824. An individual one 5834A of the fourth plurality of conductive interconnect lines 5834 is on and electrically coupled to the third conductive via 5839.

A fourth conductive via 5849 is on and electrically coupled to an individual one 5834B of the fourth plurality of conductive interconnect lines 5834. An individual one 5844A of the fifth plurality of conductive interconnect lines 5844 is on and electrically coupled to the fourth conductive via 5849.

A fifth conductive via 5859 is on and electrically coupled to an individual one 5844B of the fifth plurality of conductive interconnect lines 5844. An individual one 5854A of the sixth plurality of conductive interconnect lines 5854 is on and electrically coupled to the fifth conductive via 5859.

In one embodiment, the first conductive via 5819 includes the first conductive barrier material 5806 along sidewalls and a bottom of the first conductive fill material 5808. The second 5829, third 5839, fourth 5849 and fifth 5859 conductive vias include the second conductive barrier material 5826 along sidewalls and a bottom of the second conductive fill material 5828.

In an embodiment, the first 5802, second 5812, third 5822, fourth 5832, fifth 5842 and sixth 5852 ILD layers are separated from one another by a corresponding etch-stop layer 5890 between adjacent ILD layers. In an embodiment, the first 5802, second 5812, third 5822, fourth 5832, fifth 5842 and sixth 5852 ILD layers include silicon, carbon and oxygen.

In an embodiment, individual ones of the first 5804 and second 5814 pluralities of conductive interconnect lines have a first width (W1). Individual ones of the third 5824, fourth 5834, fifth 5844 and sixth 5854 pluralities of conductive interconnect lines have a second width (W2) greater than the first width (W1).

FIGS. 59A-59D illustrate cross-section views of various interconnect line ad via arrangements having a bottom conductive layer, in accordance with an embodiment of the present disclosure.

Figure 59A:
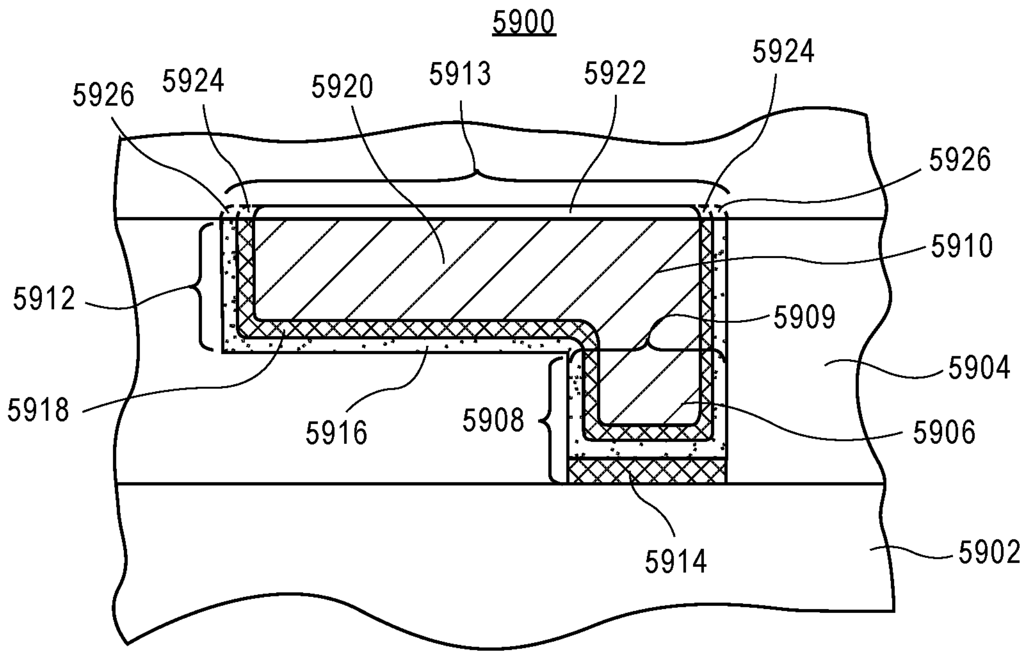
FIGS. 59A-59D illustrate cross-section views of various interconnect line ad via arrangements having a bottom conductive layer, in accordance with an embodiment of the present disclosure.
Figure 59B:
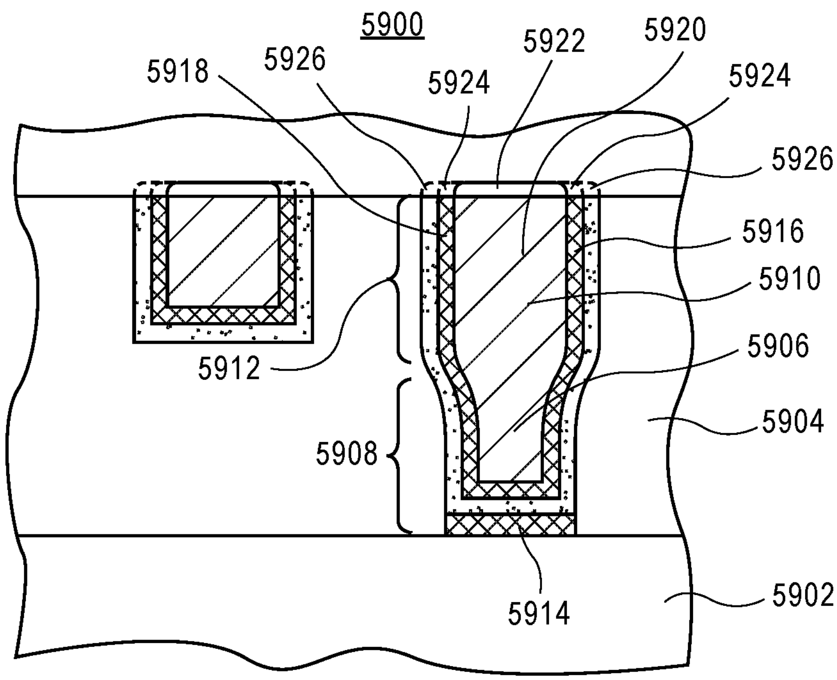

Referring to FIGS. 59A and 59B, an integrated circuit structure 5900 includes an inter-layer dielectric (ILD) layer 5904 above a substrate 5902. A conductive via 5906 is in a first trench 5908 in the ILD layer 5904. A conductive interconnect line 5910 is above and electrically coupled to the conductive via 5906. The conductive interconnect line 5910 is in a second trench 5912 in the ILD layer 5904. The second trench 5912 has an opening 5913 larger than an opening 5909 of the first trench 5908.

In an embodiment, the conductive via 5906 and the conductive interconnect line 5910 include a first conductive barrier layer 5914 on a bottom of the first trench 5908, but not along sidewalls of the first trench 5908, and not along a bottom and sidewalls of the second trench 5912. A second conductive barrier layer 5916 is on the first conductive barrier layer 5914 on the bottom of the first trench 5908. The second conductive barrier layer 5916 is further along the sidewalls of the first trench 5908, and further along the bottom and sidewalls of the second trench 5912. A third conductive barrier layer 5918 is on the second conductive barrier layer 5916 on the bottom of the first trench 5908. The third conductive barrier layer 5918 is further on the second conductive barrier layer 5916 along the sidewalls of the first trench 5908 and along the bottom and sidewalls of the second trench 5912. A conductive fill material 5920 is on the third conductive barrier layer 5918 and filling the first 5908 and second trenches 5912. The third conductive barrier layer 5918 is along a bottom of and along sidewalls of the conductive fill material 5920.

In one embodiment, the first conductive barrier layer 5914 and the third conductive barrier layer 5918 have the same composition, and the second conductive barrier layer 5916 is different in composition from the first conductive barrier layer 5914 and the third conductive barrier layer 5918. In one such embodiment, the first conductive barrier layer 5914 and the third conductive barrier layer 5918 include ruthenium, and the second conductive barrier layer 5916 includes tantalum. In a particular such embodiment, the second conductive barrier layer 5916 further includes nitrogen. In an embodiment, the conductive fill material 5920 consists essentially of copper.

In an embodiment, a conductive cap layer 5922 is on a top of the conductive fill material 5920. In one such embodiment, the conductive cap layer 5922 is not on a top of the second conductive barrier layer 5916 and is not on a top of the third conductive barrier layer 5918. However, in another embodiment, the conductive cap layer 5922 is further on a top of the third conductive barrier layer 5918, e.g., at locations 5924. In one such embodiment, the conductive cap layer 5922 is still further on a top of the second conductive barrier layer 5916, e.g., at locations 5926. In an embodiment, the conductive cap layer 5922 consists essentially of cobalt, and the conductive fill material 5920 consists essentially of copper.

Figure 59C:
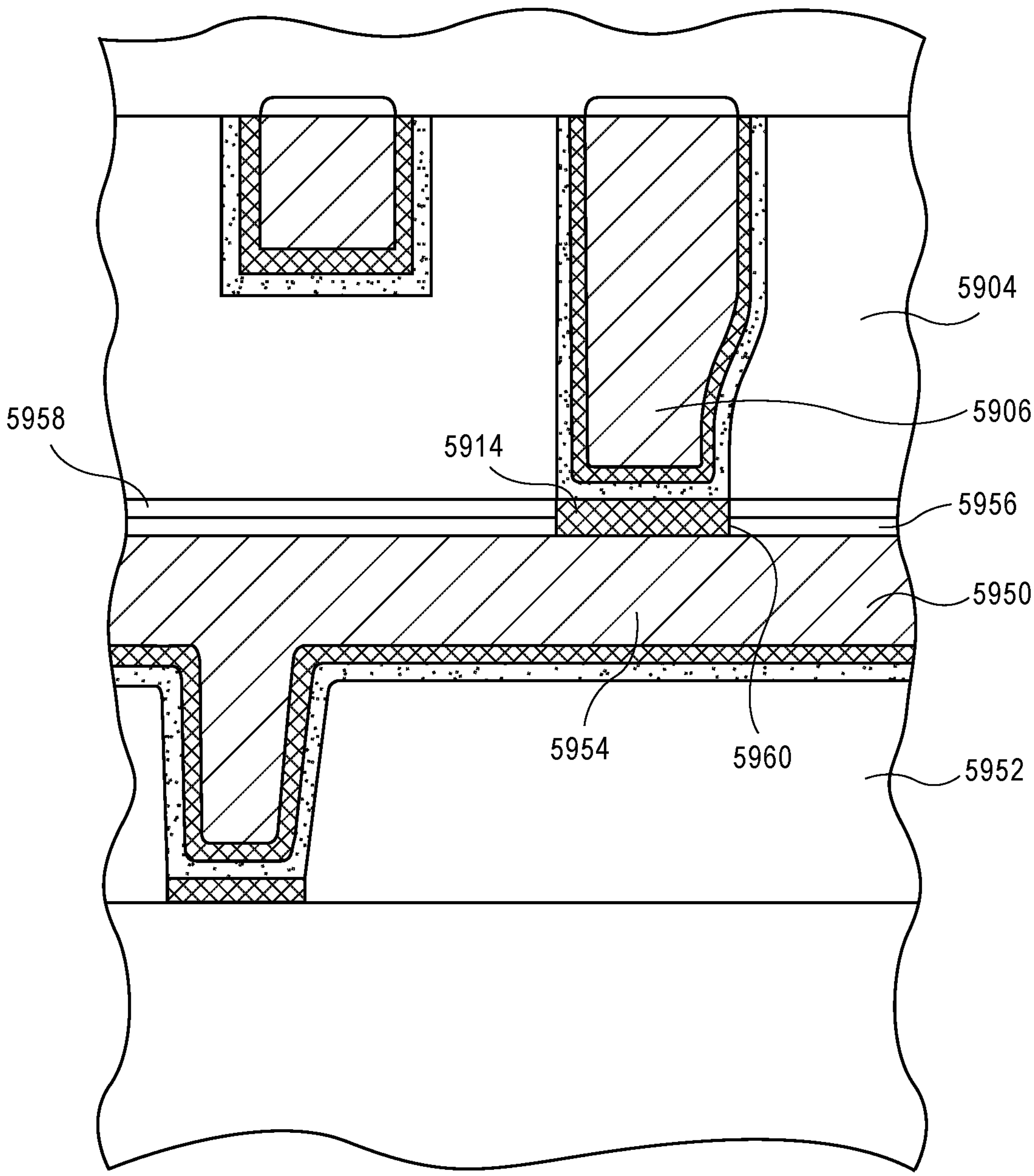
Figure 59D:
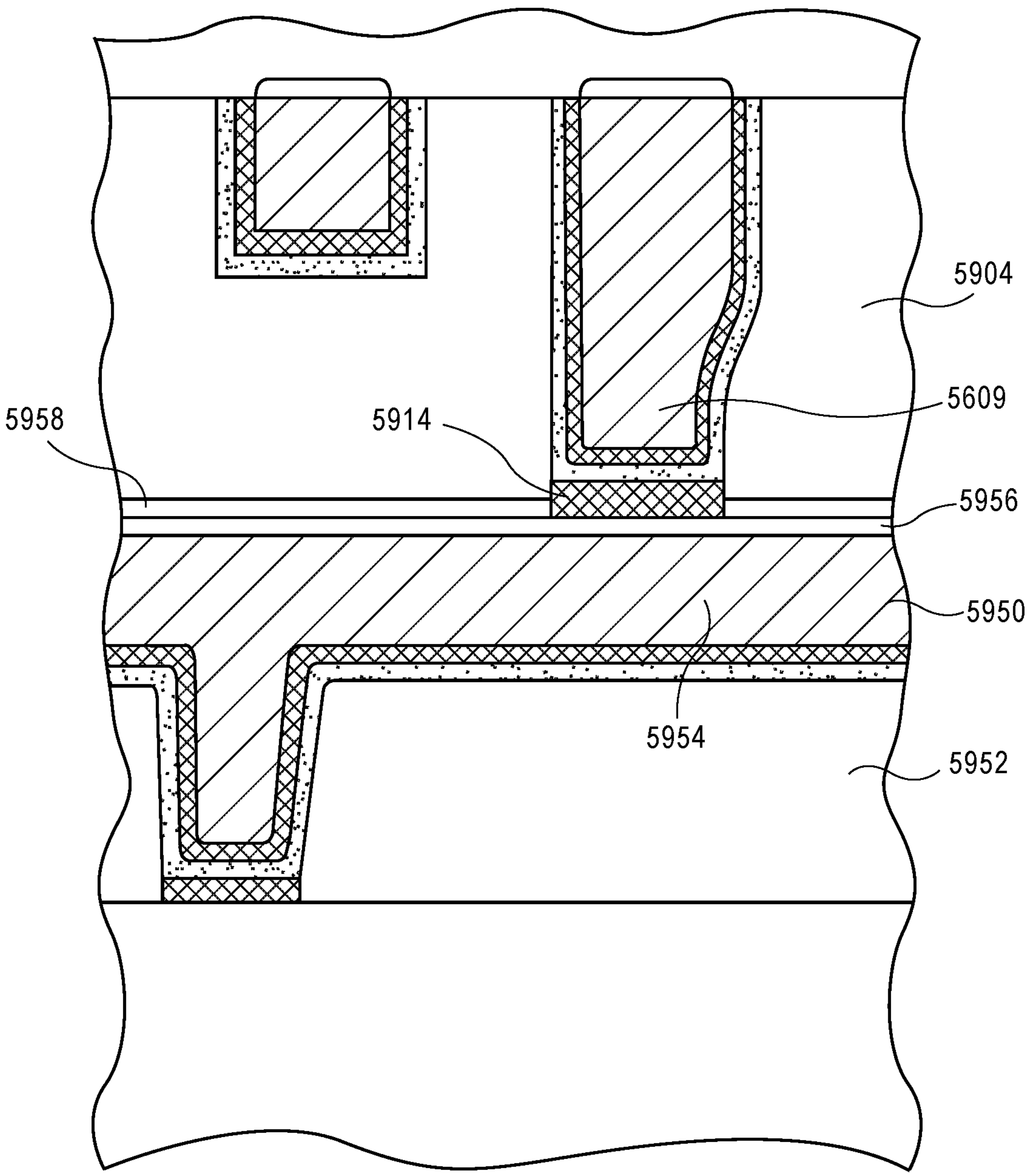

Referring to FIGS. 59C and 59D, in an embodiment, the conductive via 5906 is on and electrically connected to a second conductive interconnect line 5950 in a second ILD layer 5952 below the ILD layer 5904. The second conductive interconnect line 5950 includes a conductive fill material 5954 and a conductive cap 5956 thereon. An etch stop layer 5958 may be over the conductive cap 5956, as is depicted.

In one embodiment, the first conductive barrier layer 5914 of the conductive via 5906 is in an opening 5960 of the conductive cap 5956 of the second conductive interconnect line 5950, as is depicted in FIG. 59C. In one such embodiment, the first conductive barrier layer 5914 of the conductive via 5906 includes ruthenium, and the conductive cap 5956 of the second conductive interconnect line 5950 includes cobalt.

In another embodiment, the first conductive barrier layer 5914 of the conductive via 5906 is on a portion of the conductive cap 5956 of the second conductive interconnect line 5950, as is depicted in FIG. 59D. In one such embodiment, the first conductive barrier layer 5914 of the conductive via 5906 includes ruthenium, and the conductive cap 5956 of the second conductive interconnect line 5950 includes cobalt. In a particular embodiment, although not depicted, the first conductive barrier layer 5914 of the conductive via 5906 is on a recess into but not through the conductive cap 5956 of the second conductive interconnect line 5950.

In another aspect, a BEOL metallization layer has a non-planar topography, such as step-height differences between conducive lines and an ILD layer housing the conductive lines. In an embodiment, an overlying etch-stop layer is formed conformal with the topography and takes on the topography. In an embodiment, the topography aids in guiding an overlying via etching process toward the conductive lines to hinder "non-landedness" of conductive vias.

In a first example of etch stop layer topography, FIGS. 60A-60D illustrate cross-sectional views of structural arrangements for a recessed line topography of a BEOL metallization layer, in accordance with an embodiment of the present disclosure.

Figure 60A:
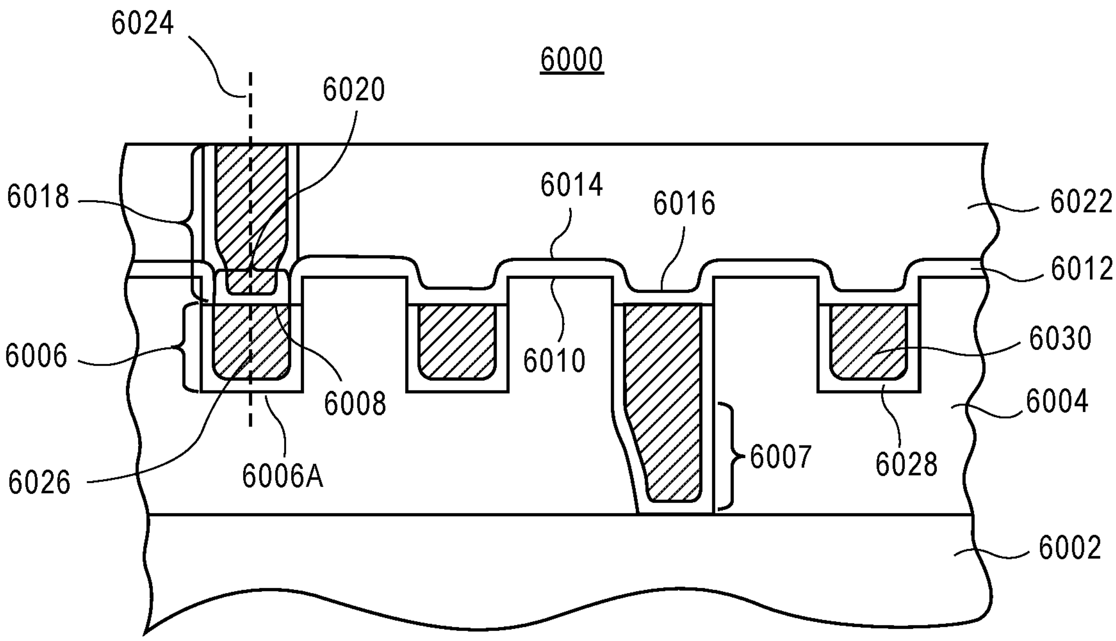
FIGS. 60A-60D illustrate cross-sectional views of structural arrangements for a recessed line topography of a BEOL metallization layer, in accordance with an embodiment of the present disclosure.

Referring to FIG. 60A, an integrated circuit structure 6000 includes a plurality of conductive interconnect lines 6006 in and spaced apart by an inter-layer dielectric (ILD) layer 6004 above a substrate 6002. One of the plurality of conductive interconnect lines 6006 is shown as coupled to an underlying via 6007 for exemplary purposes. Individual ones of the plurality of conductive interconnect lines 6006 have an upper surface 6008 below an upper surface 6010 of the ILD layer 6004. An etch-stop layer 6012 is on and conformal with the ILD layer 6004 and the plurality of conductive interconnect lines 6006. The etch-stop layer 6012 has a non-planar upper surface with an uppermost portion 6014 of the non-planar upper surface over the ILD layer 6004 and a lowermost portion 6016 of the non-planar upper surface over the plurality of conductive interconnect lines 6006.

A conductive via 6018 is on and electrically coupled to an individual one 6006A of the plurality of conductive interconnect lines 6006. The conductive via 6018 is in an opening 6020 of the etch-stop layer 6012. The opening 6020 is over the individual one 6006A of the plurality of conductive interconnect lines 6006 but not over the ILD layer 6014. The conductive via 6018 is in a second ILD layer 6022 above the etch-stop layer 6012. In one embodiment, the second ILD layer 6022 is on and conformal with the etch-stop layer 6012, as is depicted in FIG. 60A.

Figure 60B:
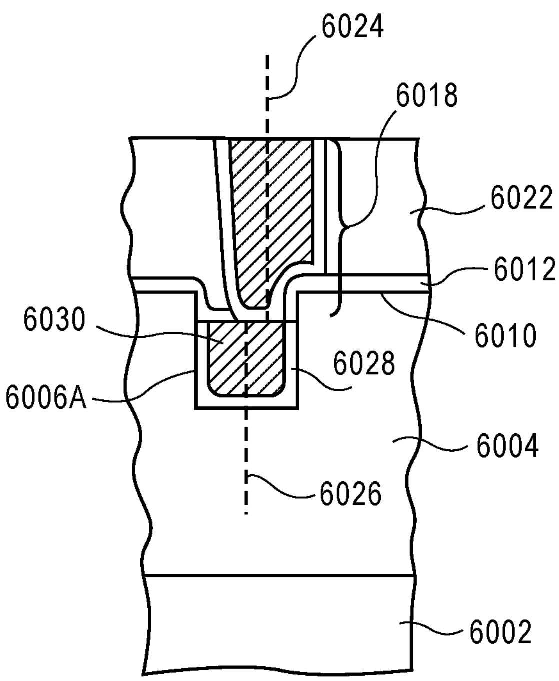

In an embodiment, a center 6024 of the conductive via 6018 is aligned with a center 6026 of the individual one 6006A of the plurality of conductive interconnect lines 6006, as is depicted in FIG. 60A. In another embodiment, however, a center 6024 of the conductive via 6018 is off-set from a center 6026 of the individual one 6006A of the plurality of conductive interconnect lines 6006, as is depicted in FIG. 60B.

Figure 60C:
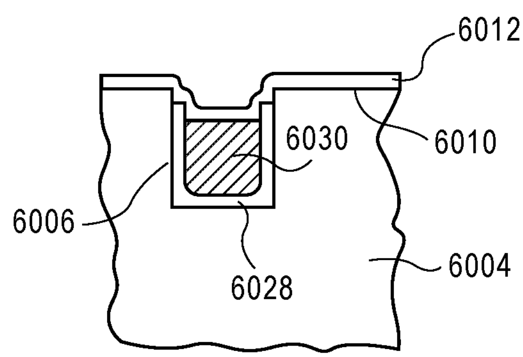

In an embodiment, individual ones of the plurality of conductive interconnect lines 6006 include a barrier layer 6028 along sidewalls and a bottom of a conductive fill material 6030. In one embodiment, both the barrier layer 6028 and the conductive fill material 6030 have an uppermost surface below the upper surface 6010 of the ILD layer 6004, as is depicted in FIGS. 60A, 60B and 60C. In a particular such embodiment, the uppermost surface of the barrier layer 6028 is above the uppermost surface of the conductive fill material 6030, as is depicted in FIG. 6C. In another embodiment, he conductive fill material 6030 has an uppermost surface below the upper surface 6010 of the ILD layer 6004, and the barrier layer 6028 has an uppermost surface co-planar with the upper surface 6010 of the ILD layer 6004, as is depicted in FIG. 6D.

In an embodiment, the ILD layer 6004 includes silicon, carbon and oxygen, and the etch-stop layer 6012 includes silicon and nitrogen. In an embodiment, the upper surface 6008 of the individual ones of the plurality of conductive interconnect lines 6006 is below the upper surface 6010 of the ILD layer 6004 by an amount in the range of 0.5-1.5 nanometers.

Referring collectively to FIGS. 60A-60D, in accordance with an embodiment of the present disclosure, a method of fabricating an integrated circuit structure includes forming a plurality of conductive interconnect lines in and spaced apart by a first inter-layer dielectric (ILD) layer 6004 above a substrate 6002. The plurality of conductive interconnect lines is recessed relative to the first ILD layer to provide individual ones 6006 of the plurality of conductive interconnect lines having an upper surface 6008 below an upper surface 6010 of the first ILD layer 6004. Subsequent to recessing the plurality of conductive interconnect lines, an etch-stop layer 6012 is formed on and conformal with the first ILD layer 6004 and the plurality of conductive interconnect lines 6006. The etch-stop layer 6012 has a non-planar upper surface with an uppermost portion 6016 of the non-planar upper surface over the first ILD layer 6004 and a lowermost portion 6014 of the non-planar upper surface over the plurality of conductive interconnect lines 6006. A second ILD layer 6022 is formed on the etch-stop layer 6012. A via trench is etched in the second ILD layer 6022. The etch-stop layer 6012 directs the location of the via trench in the second ILD layer 6022 during the etching. The etch-stop layer 6012 is etched through the via trench to form an opening 6020 in the etch-stop layer 6012. The opening 6020 is over an individual one 6006A of the plurality of conductive interconnect lines 6006 but not over the first ILD layer 6004. A conductive via 6018 is formed in the via trench and in the opening 6020 in the etch-stop layer 6012. The conductive via 6018 is on and electrically coupled to the individual one 6006A of the plurality of conductive interconnect lines 6006.

Figure 60D:
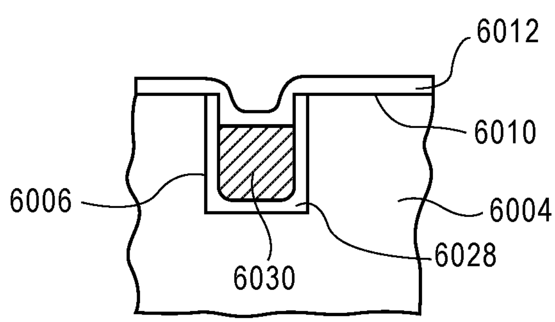

In one embodiment, individual ones of the plurality of conductive interconnect lines 6006 include a barrier layer 6028 along sidewalls and a bottom of a conductive fill material 6030, and recessing the plurality of conductive interconnect lines includes recessing both the barrier layer 6028 and the conductive fill material 6030, as is depicted in FIGS. 60A-60C. In another embodiment, individual ones of the plurality of conductive interconnect lines 6006 include a barrier layer 6028 along sidewalls and a bottom of a conductive fill material 6030, and recessing the plurality of conductive interconnect lines includes recessing the conductive fill material 6030 but not substantially recessing the barrier layer 6028, as is depicted in FIG. 60D. In an embodiment, the etch-stop layer 6012 re-directs a lithographically mis-aligned via trench pattern. In an embodiment, recessing the plurality of conductive interconnect lines includes recessing by an amount in the range of 0.5-1.5 nanometers relative to the first ILD layer 6004.

In a second example of etch stop layer topography, FIGS. 61A-61D illustrate cross-sectional views of structural arrangements for a stepped line topography of a BEOL metallization layer, in accordance with an embodiment of the present disclosure.

Figure 61A:
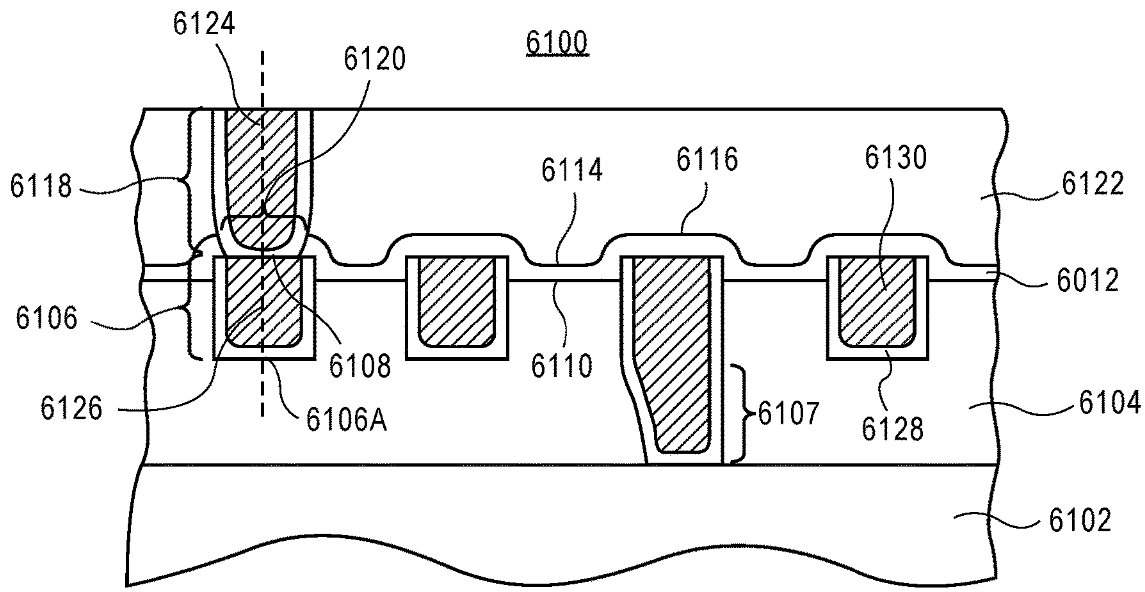
FIGS. 61A-61D illustrate cross-sectional views of structural arrangements for a stepped line topography of a BEOL metallization layer, in accordance with an embodiment of the present disclosure.

Referring to FIG. 61A, an integrated circuit structure 6100 includes a plurality of conductive interconnect lines 6106 in and spaced apart by an inter-layer dielectric (ILD) layer 6104 above a substrate 6102. One of the plurality of conductive interconnect lines 6106 is shown as coupled to an underlying via 6107 for exemplary purposes. Individual ones of the plurality of conductive interconnect lines 6106 have an upper surface 6108 above an upper surface 6110 of the ILD layer 6104. An etch-stop layer 6112 is on and conformal with the ILD layer 6104 and the plurality of conductive interconnect lines 6106. The etch-stop layer 6112 has a non-planar upper surface with a lowermost portion 6114 of the non-planar upper surface over the ILD layer 6104 and an uppermost portion 6116 of the non-planar upper surface over the plurality of conductive interconnect lines 6106.

A conductive via 6118 is on and electrically coupled to an individual one 6106A of the plurality of conductive interconnect lines 6106. The conductive via 6118 is in an opening 6120 of the etch-stop layer 6112. The opening 6120 is over the individual one 6106A of the plurality of conductive interconnect lines 6106 but not over the ILD layer 6114. The conductive via 6118 is in a second ILD layer 6122 above the etch-stop layer 6112. In one embodiment, the second ILD layer 6122 is on and conformal with the etch-stop layer 6112, as is depicted in FIG. 61A.

Figure 61B:
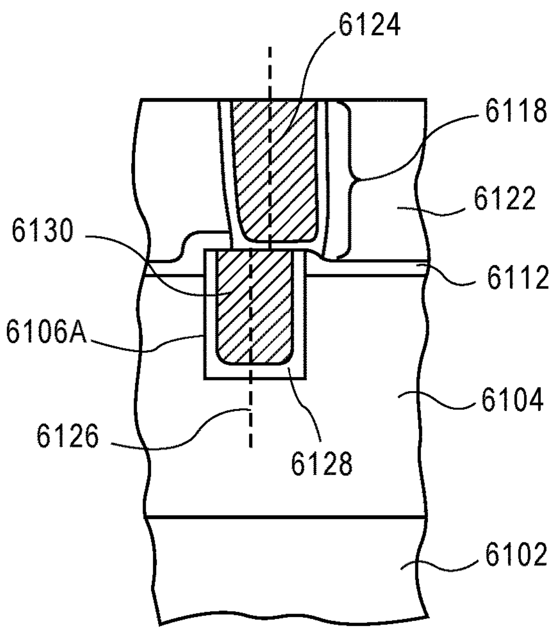

In an embodiment, a center 6124 of the conductive via 6118 is aligned with a center 6126 of the individual one 6106A of the plurality of conductive interconnect lines 6106, as is depicted in FIG. 61A. In another embodiment, however, a center 6124 of the conductive via 6118 is off-set from a center 6126 of the individual one 6106A of the plurality of conductive interconnect lines 6106, as is depicted in FIG. 61B.

Figure 61C:
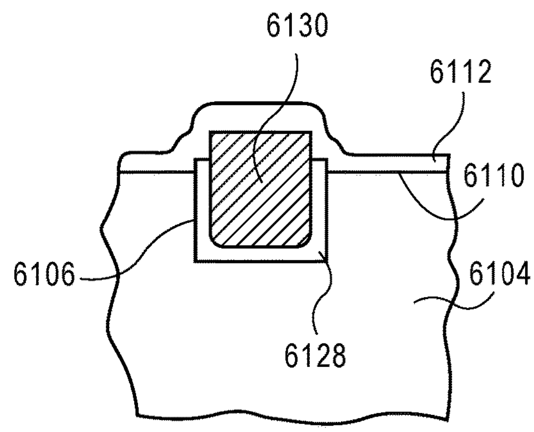
Figure 61D:
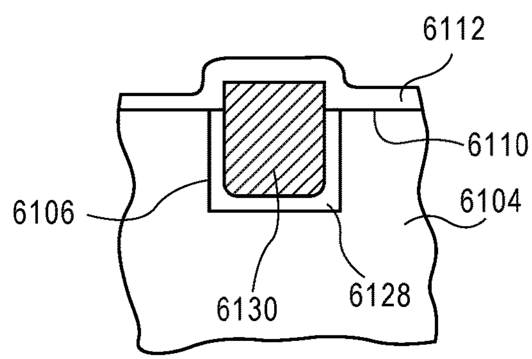

In an embodiment, individual ones of the plurality of conductive interconnect lines 6106 include a barrier layer 6128 along sidewalls and a bottom of a conductive fill material 6130. In one embodiment, both the barrier layer 6128 and the conductive fill material 6130 have an uppermost surface above the upper surface 6110 of the ILD layer 6104, as is depicted in FIGS. 61A, 61B and 61C. In a particular such embodiment, the uppermost surface of the barrier layer 6128 is below the uppermost surface of the conductive fill material 6130, as is depicted in FIG. 61C. In another embodiment, the conductive fill material 6130 has an uppermost surface above the upper surface 6110 of the ILD layer 6104, and the barrier layer 6128 has an uppermost surface co-planar with the upper surface 6110 of the ILD layer 6104, as is depicted in FIG. 61D.

In an embodiment, the ILD layer 6104 includes silicon, carbon and oxygen, and the etch-stop layer 6112 includes silicon and nitrogen. In an embodiment, the upper surface 6108 of the individual ones of the plurality of conductive interconnect lines 6106 is above the upper surface 6110 of the ILD layer 6004 by an amount in the range of 0.5-1.5 nanometers.

Referring collectively to FIGS. 61A-61D, in accordance with an embodiment of the present disclosure, a method of fabricating an integrated circuit structure includes forming a plurality of conductive interconnect lines 6106 in and spaced apart by a first inter-layer dielectric (ILD) layer above a substrate 6102. The first ILD layer 6104 is recessed relative to the plurality of conductive interconnect lines 6106 to provide individual ones of the plurality of conductive interconnect lines 6106 having an upper surface 6108 above an upper surface 6110 of the first ILD layer 6104. Subsequent to recessing the first ILD layer 6104, an etch-stop layer 6112 is formed on and conformal with the first ILD layer 6104 and the plurality of conductive interconnect lines 6106. The etch-stop layer 6112 has a non-planar upper surface with a lowermost portion 6114 of the non-planar upper surface over the first ILD layer 6104 and an uppermost portion 6116 of the non-planar upper surface over the plurality of conductive interconnect lines 6106. A second ILD layer 6122 is formed on the etch-stop layer 6112. A via trench is etched in the second ILD layer 6122. The etch-stop layer 6112 directs the location of the via trench in the second ILD layer 6122 during the etching. The etch-stop layer 6112 is etched through the via trench to form an opening 6120 in the etch-stop layer 6112. The opening 6120 is over an individual one 6106A of the plurality of conductive interconnect lines 6106 but not over the first ILD layer 6104. A conductive via 6118 is formed in the via trench and in the opening 6120 in the etch-stop layer 6112. The conductive via 6118 is on and electrically coupled to the individual one 6106A of the plurality of conductive interconnect lines 6106.

In one embodiment, individual ones of the plurality of conductive interconnect lines 6106 include a barrier layer 6128 along sidewalls and a bottom of a conductive fill material 6130, and recessing the first ILD layer 6104 includes recessing relative to both the barrier layer 6128 and the conductive fill material 6130, as is depicted in FIGS. 61A-61C. In another embodiment, individual ones of the plurality of conductive interconnect lines 6106 include a barrier layer 6128 along sidewalls and a bottom of a conductive fill material 6130, and recessing the first ILD layer 6104 includes recessing relative to the conductive fill material 6130 but not relative to the barrier layer 6128, as is depicted in FIG. 61D. In an embodiment, wherein the etch-stop layer 6112 re-directs a lithographically misaligned via trench pattern. In an embodiment, recessing the first ILD layer 6104 includes recessing by an amount in the range of 0.5-1.5 nanometers relative to the plurality of conductive interconnect lines 6106.

In another aspect, techniques for patterning metal line ends are described. To provide context, in the advanced nodes of semiconductor manufacturing, lower level interconnects may created by separate patterning processes of the line grating, line ends, and vias. However, the fidelity of the composite pattern may tend to degrade as the vias encroach upon the line ends and vice-versa. Embodiments described herein provide for a line end process also known as a plug process that eliminates associated proximity rules. Embodiments may allow for a via to be placed at the line end and a large via to strap across a line end.

Figure 62A:
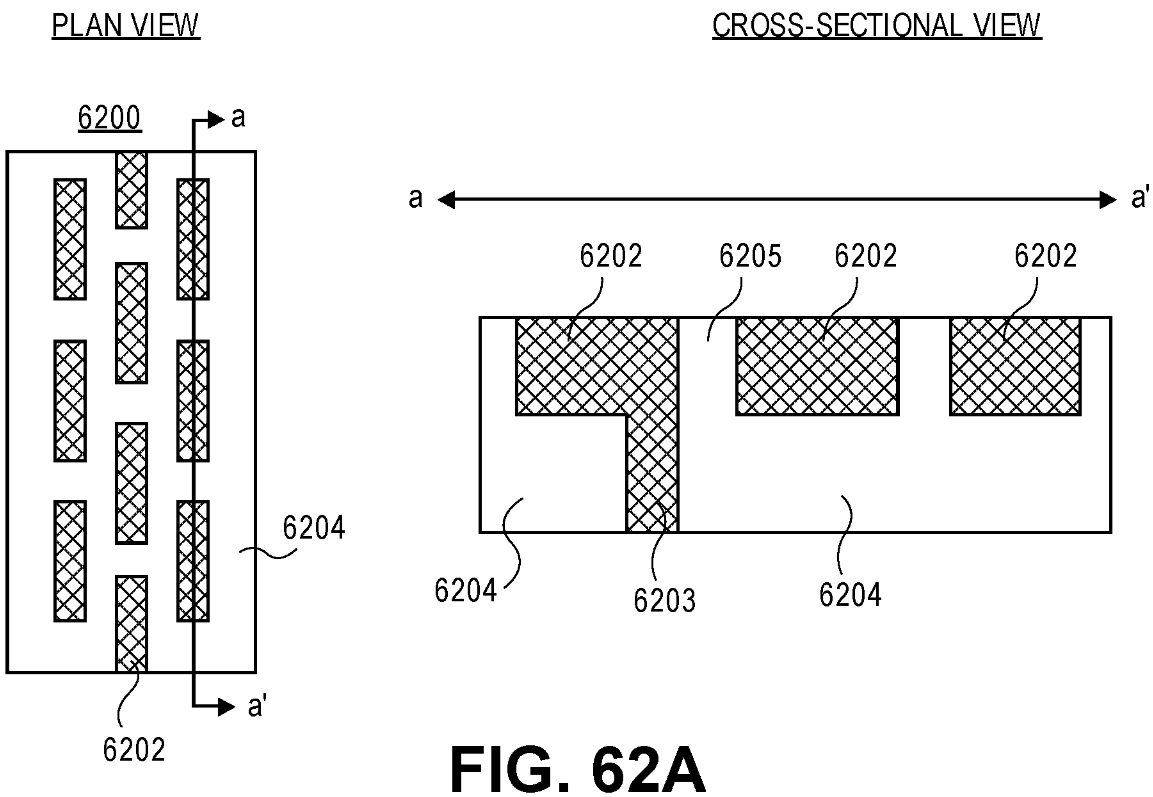
FIG. 62A illustrates a plan view and corresponding cross-sectional view taken along the a-a' axis of the plan view of a metallization layer, in accordance with an embodiment of the present disclosure.
Figure 62B:
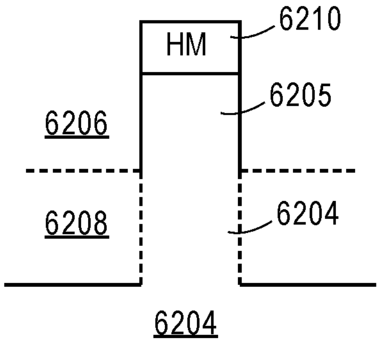
FIG. 62B illustrates a cross-sectional view of a line end or plug, in accordance with an embodiment of the present disclosure.
Figure 62C:
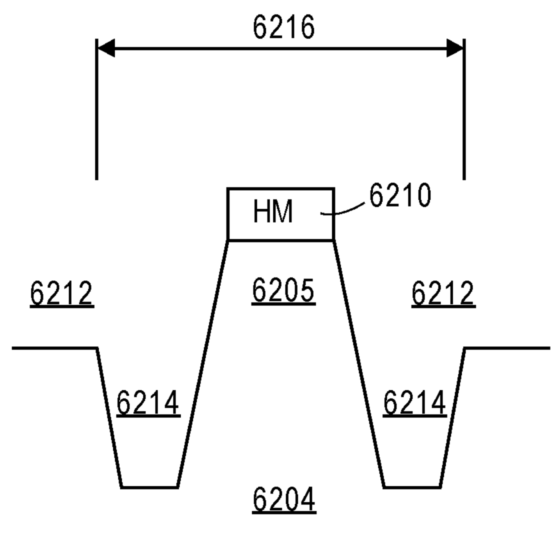
FIG. 62C illustrates another cross-sectional view of a line end or plug, in accordance with an embodiment of the present disclosure.

To provide further context, FIG. 62A illustrates a plan view and corresponding cross-sectional view taken along the a-a' axis of the plan view of a metallization layer, in accordance with an embodiment of the present disclosure. FIG. 62B illustrates a cross-sectional view of a line end or plug, in accordance with an embodiment of the present disclosure. FIG. 62C illustrates another cross-sectional view of a line end or plug, in accordance with an embodiment of the present disclosure.

Referring to FIG. 62A, a metallization layer 6200 includes metal lines 6202 formed in a dielectric layer 6204. The metal lines 6202 may be coupled to underlying vias 6203. The dielectric layer 6204 may include line end or plug regions 6205. Referring to FIG. 62B, a line end or plug region 6205 of a dielectric layer 6204 may be fabricated by patterning a hardmask layer 6210 on the dielectric layer 6204 and then etching exposed portions of the dielectric layer 6204. The exposed portions of the dielectric layer 6204 may be etched to a depth suitable to form a line trench 6206 or further etched to a depth suitable to form a via trench 6208. Referring to FIG. 62C, two vias adjacent opposing sidewalls of the line end or plug 6205 may be fabricated in a single large exposure 6216 to ultimately form line trenches 6212 and via trenches 6214.

However, referring again to FIGS. 62A-62C, fidelity issues and/or hardmask erosion issues may lead to imperfect patterning regimes. By contrast, one or more embodiments described herein include implementation of a process flow involving construction of a line end dielectric (plug) after a trench and via patterning process.

In an aspect, then, one or more embodiments described herein are directed to approaches for building non-conductive spaces or interruptions between metals lines (referred to as "line ends," "plugs" or "cuts") and, in some embodiments, associated conductive vias. Conductive vias, by definition, are used to land on a previous layer metal pattern. In this vein, embodiments described herein enable a more robust interconnect fabrication scheme since alignment by lithography equipment is relied on to a lesser extent. Such an interconnect fabrication scheme can be used to relax constraints on alignment/exposures, can be used to improve electrical contact (e.g., by reducing via resistance), and can be used to reduce total process operations and processing time otherwise required for patterning such features using conventional approaches.

FIGS. 63A-63F illustrate plan views and corresponding cross-sectional views representing various operations in a plug last processing scheme, in accordance with an embodiment of the present disclosure.

Figure 63A:
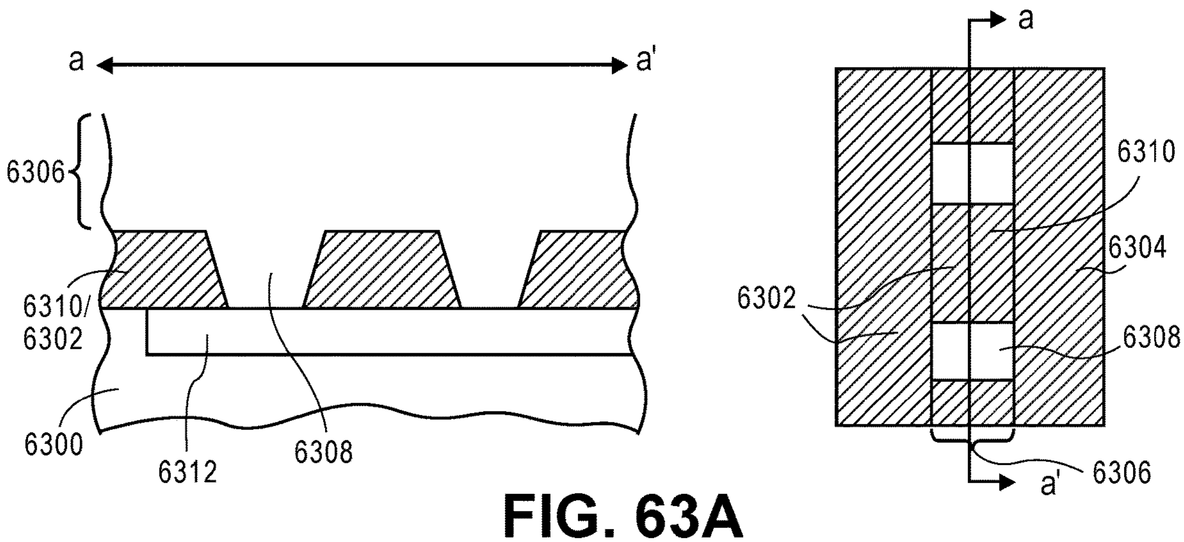
FIGS. 63A-63F illustrate plan views and corresponding cross-sectional views representing various operations in a plug last processing scheme, in accordance with an embodiment of the present disclosure.

Referring to FIG. 63A, a method of fabricating an integrated circuit structure includes forming a line trench 6306 in an upper portion 6304 of an interlayer dielectric (ILD) material layer 6302 formed above an underlying metallization layer 6300. A via trench 6308 is formed in a lower portion 6310 of the ILD material layer 6302. The via trench 6308 exposes a metal line 6312 of the underlying metallization layer 6300.

Figure 63B:
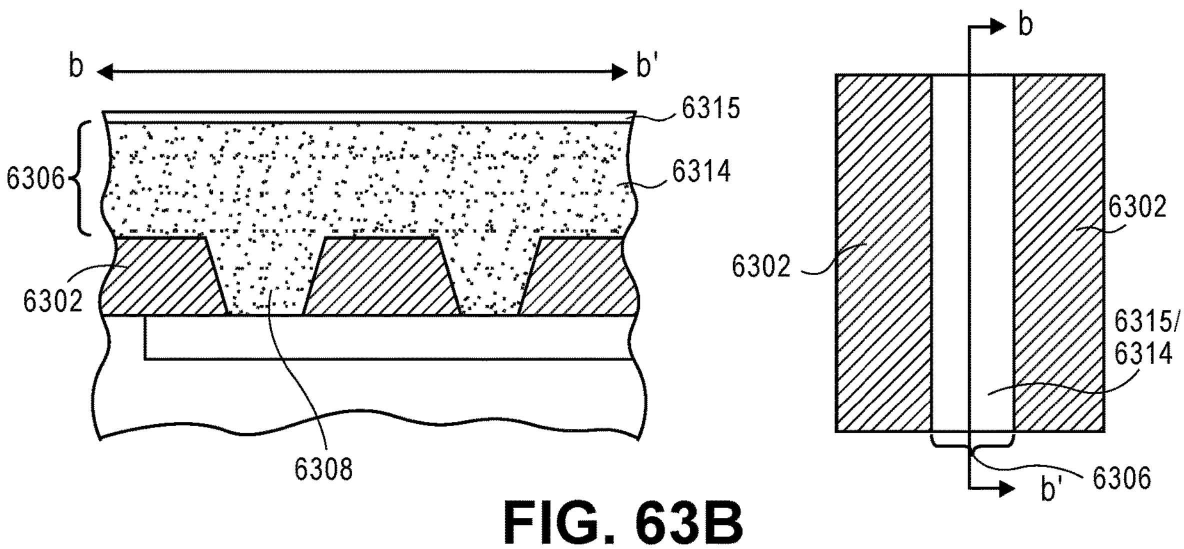

Referring to FIG. 63B, a sacrificial material 6314 is formed above the ILD material layer 6302 and in the line trench 6306 and the via trench 6308. The sacrificial material 6314 may have a hardmask 6315 formed thereon, as is depicted in FIG. 63B. In one embodiment, the sacrificial material 6314 includes carbon.

Figure 63C:
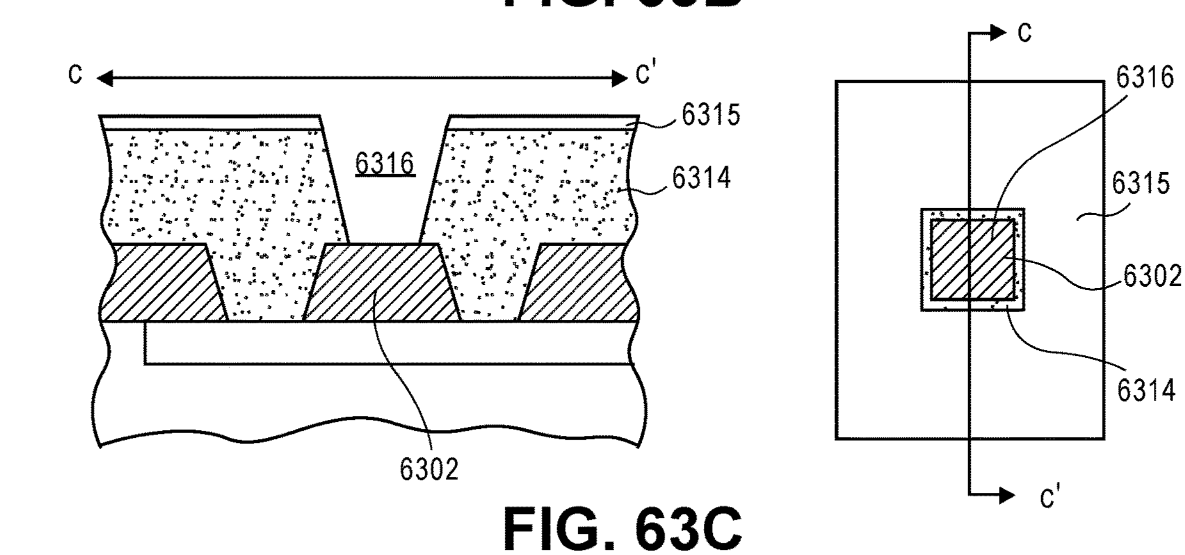

Referring to FIG. 63C, the sacrificial material 6314 is patterned to break a continuity of the sacrificial material 6314 in the line trench 6306, e.g., to provide an opening 6316 in the sacrificial material 6314.

Figure 63D:
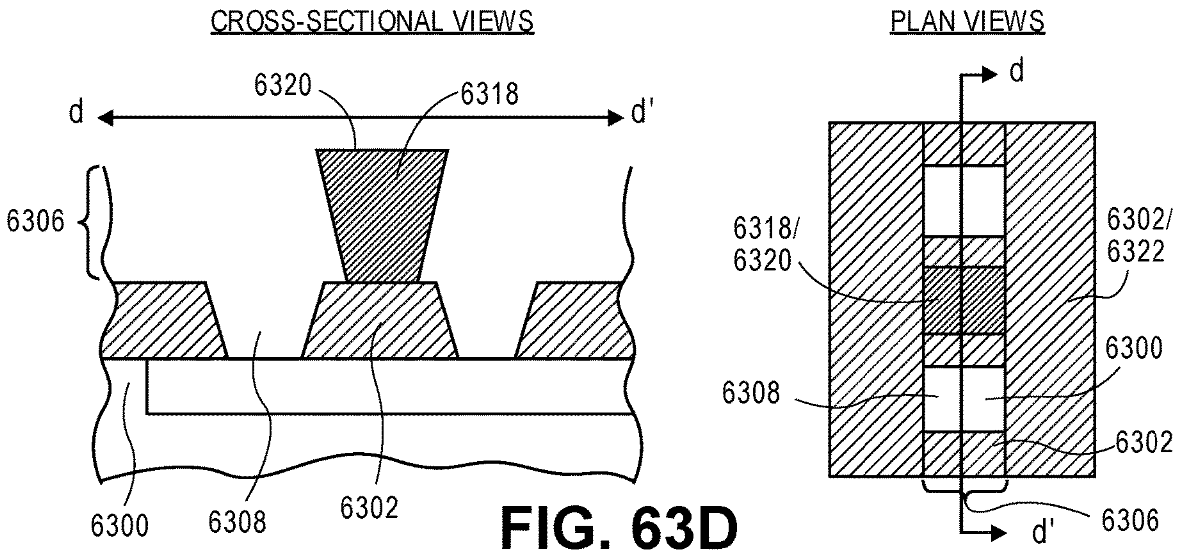

Referring to FIG. 63D, the opening 6316 in the sacrificial material 6314 is filled with a dielectric material to form a dielectric plug 6318. In an embodiment, subsequent to filling the opening 6316 in the sacrificial material 6314 with the dielectric material, the hardmask 6315 is removed to provide the dielectric plug 6318 having an upper surface 6320 above an upper surface 6322 of the ILD material 6302, as is depicted in FIG. 63D. The sacrificial material 6314 is removed to leave the dielectric plug 6318 to remain.

In an embodiment, filling the opening 6316 of the sacrificial material 6314 with the dielectric material includes filling with a metal oxide material. In one such embodiment, the metal oxide material is aluminum oxide. In an embodiment, filling the opening 6314 of the sacrificial material 6316 with the dielectric material includes filling using atomic layer deposition (ALD).

Figure 63E:
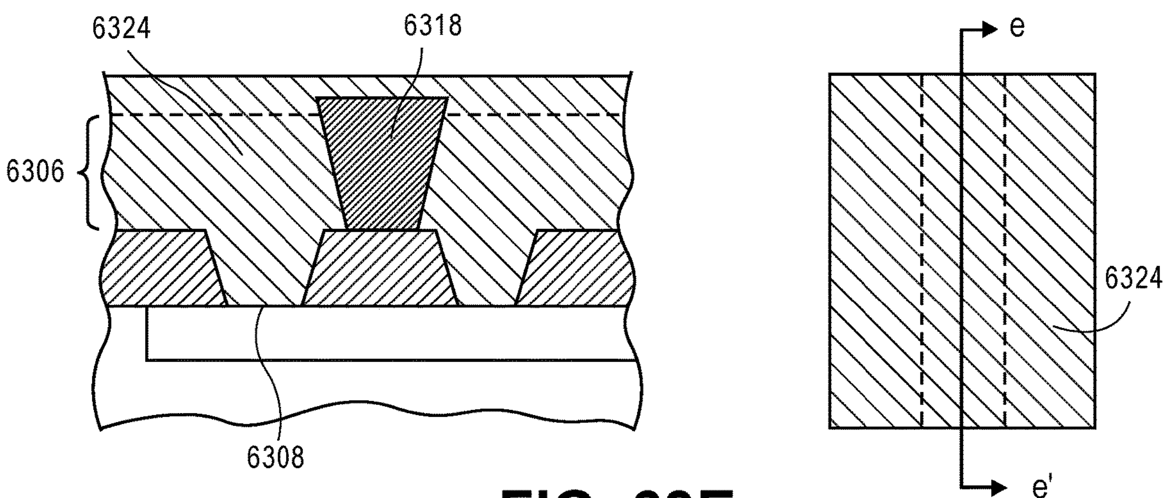

Referring to FIG. 63E, the line trench 6306 and the via trench 6308 are filled with a conductive material 6324. In an embodiment, the conductive material 6324 is formed above and over the dielectric plug 6318 and the ILD layer 6302, as is depicted.

Figure 63F:
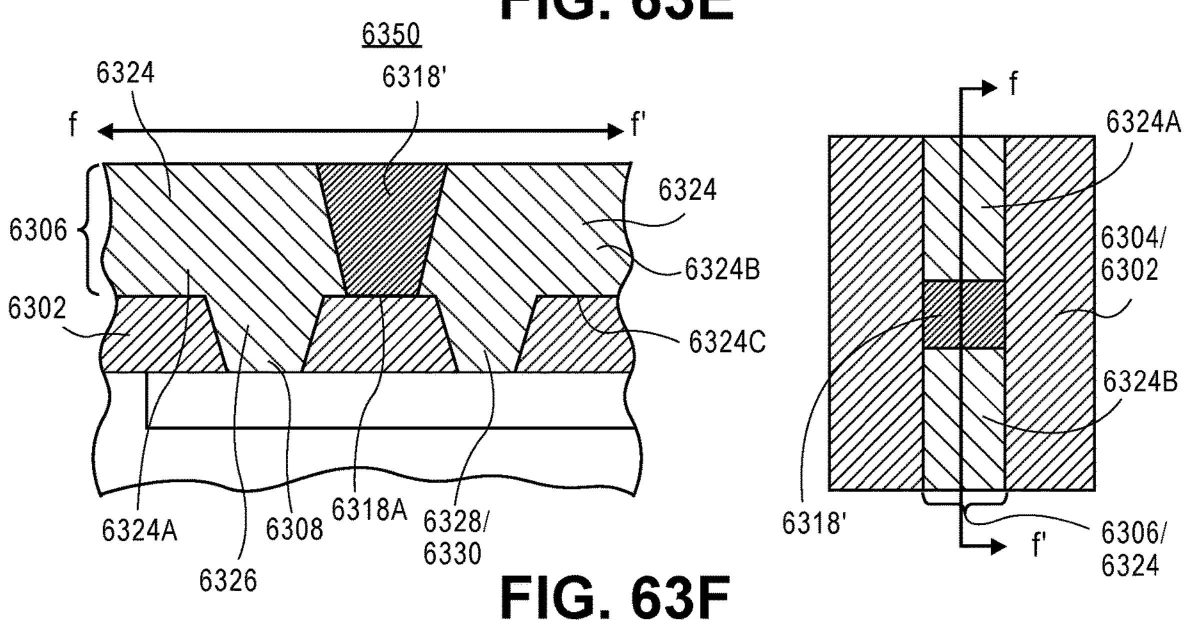

Referring to FIG. 63F, the conductive material 6324 and the dielectric plug 6318 are planarized to provide a planarized dielectric plug 6318' breaking a continuity of the conductive material 6324 in the line trench 6306.

Referring again to FIG. 63F, in an accordance with an embodiment of the present disclosure, an integrated circuit structure 6350 includes an inter-layer dielectric (ILD) layer 6302 above a substrate. A conductive interconnect line 6324 is in a trench 6306 in the ILD layer 6302. The conductive interconnect line 6324 has a first portion 6324A and a second portion 6324B, the first portion 6324A laterally adjacent to the second portion 6324B. A dielectric plug 6318' is between and laterally adjacent to the first 6324A and second 6324B portions of the conductive interconnect line 6324. Although not depicted, in an embodiment, the conductive interconnect line 6324 includes a conductive barrier liner and a conductive fill material, exemplary materials for which are described above. In one such embodiment, the conductive fill material includes cobalt.

In an embodiment, the dielectric plug 6318' includes a metal oxide material. In one such embodiment, the metal oxide material is aluminum oxide. In an embodiment, the dielectric plug 6318' is in direct contact with the first 6324A and second 6324B portions of the conductive interconnect line 6324.

In an embodiment, the dielectric plug 6318' has a bottom 6318A substantially co-planar with a bottom 6324C of the conductive interconnect line 6324. In an embodiment, a first conductive via 6326 is in a trench 6308 in the ILD layer 6302. In one such embodiment, the first conductive via 6326 is below the bottom 6324C of the interconnect line 6324, and the first conductive via 6326 is electrically coupled to the first portion 6324A of the conductive interconnect line 6324.

In an embodiment, a second conductive via 6328 is in a third trench 6330 in the ILD layer 6302. The second conductive via 6328 is below the bottom 6324C of the interconnect line 6324, and the second conductive via 6328 is electrically coupled to the second portion 6324B of the conductive interconnect line 6324.

A dielectric plug may be formed using a fill process such as a chemical vapor deposition process. Artifacts may remain in the fabricated dielectric plug. As an example, FIG. 64A illustrates a cross-sectional view of a conductive line plug having a seam therein, in accordance with an embodiment of the present disclosure.

Figure 64A:
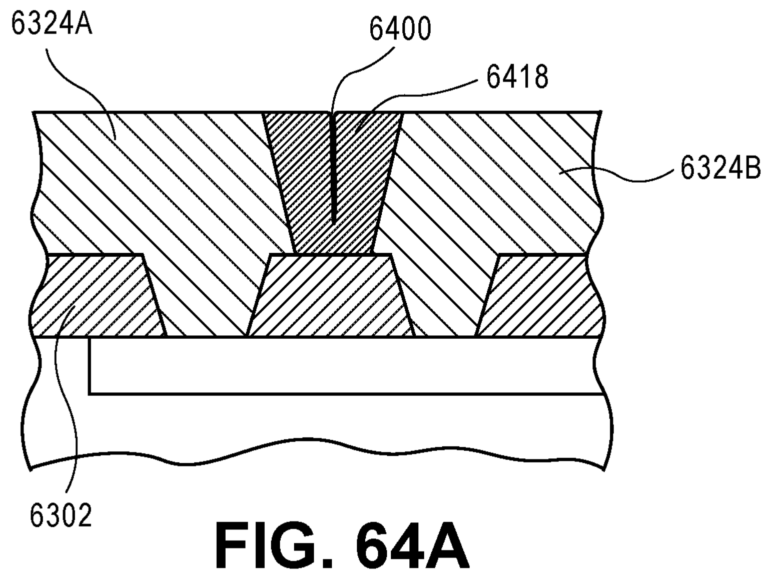
FIG. 64A illustrates a cross-sectional view of a conductive line plug having a seam therein, in accordance with an embodiment of the present disclosure.

Referring to FIG. 64A, a dielectric plug 6418 has an approximately vertical seam 6400 spaced approximately equally from the first portion 6324A of the conductive interconnect line 6324 and from the second portion 6324B of the conductive interconnect line 6324.

It is to be appreciated that dielectric plugs differing in composition from an ILD material in which they are housed may be included on only select metallization layers, such as in lower metallization layers. As an example, FIG. 64B illustrates a cross-sectional view of a stack of metallization layers including a conductive line plug at a lower metal line location, in accordance with an embodiment of the present disclosure.

Figure 64B:
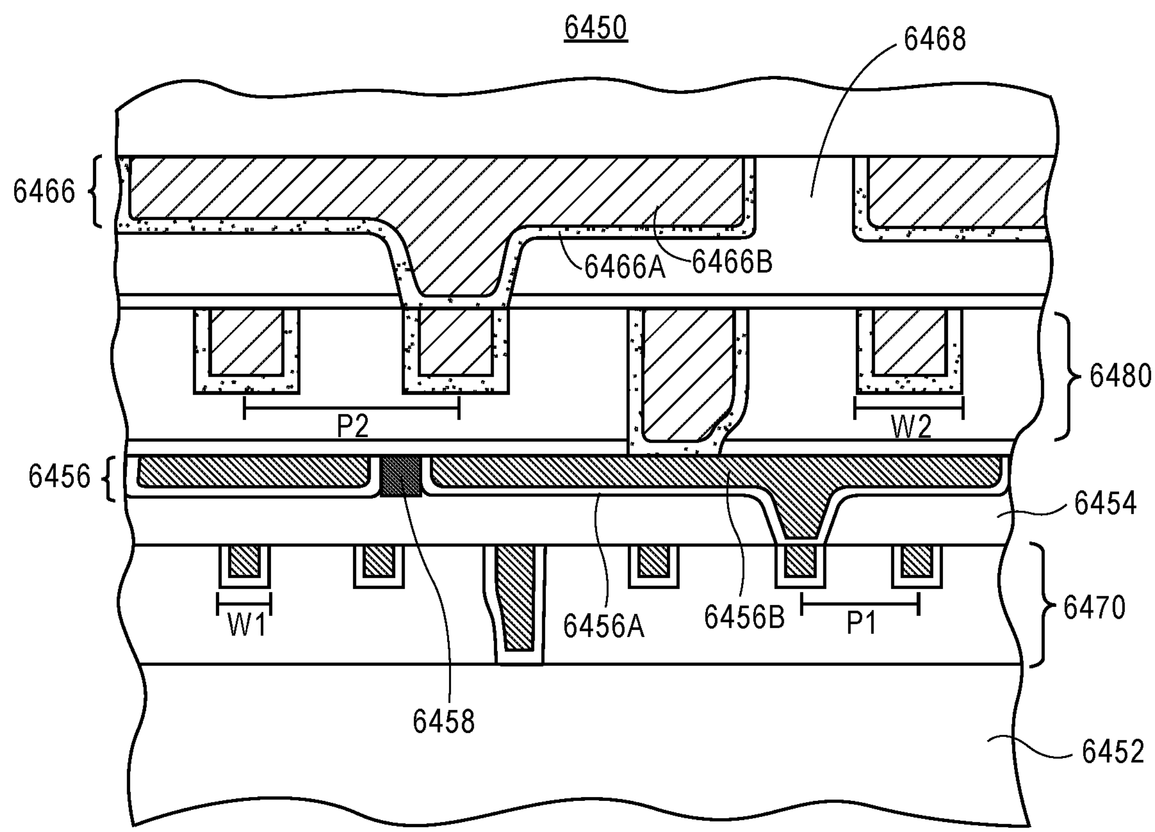
FIG. 64B illustrates a cross-sectional view of a stack of metallization layers including a conductive line plug at a lower metal line location, in accordance with an embodiment of the present disclosure.

Referring to FIG. 64B, an integrated circuit structure 6450 includes a first plurality of conductive interconnect lines 6456 in and spaced apart by a first inter-layer dielectric (ILD) layer 6454 above a substrate 6452. Individual ones of the first plurality of conductive interconnect lines 6456 have a continuity broken by one or more dielectric plugs 6458. In an embodiment, the one or more dielectric plugs 6458 include a material different than the ILD layer 6452. A second plurality of conductive interconnect lines 6466 is in and spaced apart by a second ILD layer 6464 above the first ILD layer 6454. In an embodiment, individual ones of the second plurality of conductive interconnect lines 6466 have a continuity broken by one or more portions 6468 of the second ILD layer 6464. It is to be appreciated, as depicted, that other metallization layers may be included in the integrated circuit structure 6450.

In one embodiment, the one or more dielectric plugs 6458 include a metal oxide material. In one such embodiment, the metal oxide material is aluminum oxide. In one embodiment, the first ILD layer 6454 and the second ILD layer 6464 (and, hence, the one or more portions 6568 of the second ILD layer 6464) include a carbon-doped silicon oxide material.

In one embodiment, individual ones of the first plurality of conductive interconnect lines 6456 include a first conductive barrier liner 6456A and a first conductive fill material 6456B. Individual ones of the second plurality of conductive interconnect lines 6466 include a second conductive barrier liner 6466A and a second conductive fill material 6466B. In one such embodiment, the first conductive fill material 6456B is different in composition from the second conductive fill material 6466B. In a particular such embodiment, the first conductive fill material 6456B includes cobalt, and the second conductive fill material 6466B includes copper.

In one embodiment, the first plurality of conductive interconnect lines 6456 has a first pitch (P1, as shown in like-layer 6470). The second plurality of conductive interconnect lines 6466 has a second pitch (P2, as shown in like-layer 6480). The second pitch (P2) is greater than the first pitch (P1). In one embodiment, individual ones of the first plurality of conductive interconnect lines 6456 have a first width (W1, as shown in like-layer 6470). Individual ones of the second plurality of conductive interconnect lines 6466 have a second width (W2, as shown in like-layer 6480). The second width (W2) is greater than the first width (W1).

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments described herein are directed to memory bit cells having an internal node jumper. Particular embodiments may include a layout-efficient technique of implementing memory bit cells in advanced self-aligned process technologies. Embodiments may be directed to 10 nanometer or smaller technology nodes. Embodiments may provide an ability to develop memory bit cells having improved performance within a same footprint by utilizing contact over active gate (COAG) or aggressive metal 1 (M1) pitch scaling, or both. Embodiments may include or be directed to bit cell layouts that make possible higher performance bit cells in a same or smaller footprint relative to a previous technology node.

In accordance with an embodiment of the present disclosure, a higher metal layer (e.g., metal1 or M1) jumper is implemented to connect internal nodes rather than the use of a traditional gate-trench contact-gate contact (poly-tcn-polycon) connection. In an embodiment, a contact over active gate (COAG) integration scheme combined with a metal 1 jumper to connect internal nodes mitigates or altogether eliminates the need to grow a footprint for a higher performance bit cell. That is, an improved transistor ratio may be achieved. In an embodiment, such an approach enables aggressive scaling to provide improved cost per transistor for, e.g., a 10 nanometer (10 nm) technology node. Internal node M1 jumpers may be implemented in SRAM, RF and Dual Port bit cells in 10 nm technology to produce very compact layouts.

Figure 65:
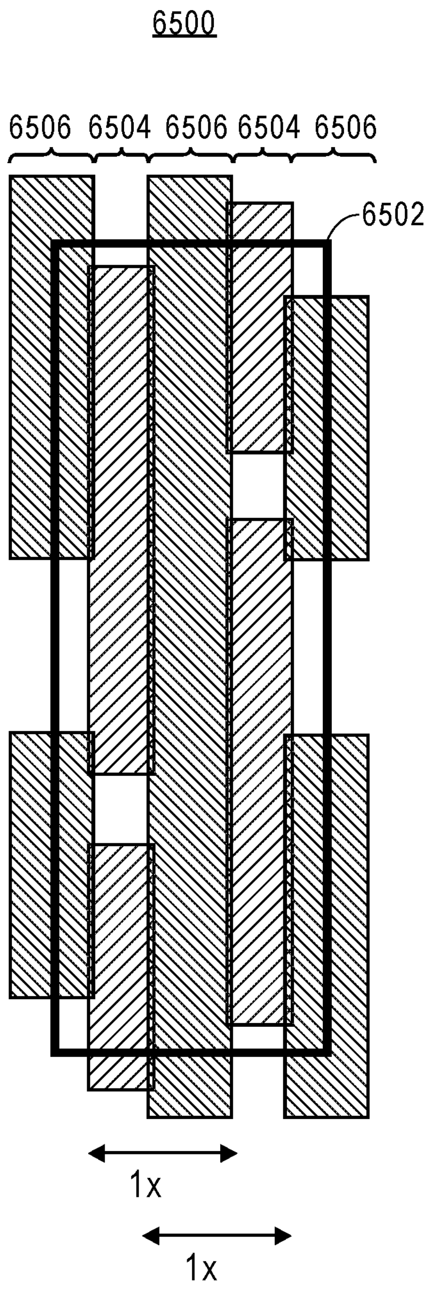
FIG. 65 illustrates a first view of a cell layout for a memory cell.

As a comparative example, FIG. 65 illustrates a first view of a cell layout for a memory cell.

Referring to FIG. 65, an exemplary 14 nanometer (14 nm) layout 6500 includes a bit cell 6502. Bit cell 6502 includes gate or poly lines 6504 and metal 1 (M1) lines 6506. In the example shown, the poly lines 6504 have a 1× pitch, and the M1 lines 6506 have a 1× pitch. In a particular embodiment, the poly lines 6504 have 70 nm pitch, and the M1 lines 6506 have a 70 nm pitch.

Figure 66:
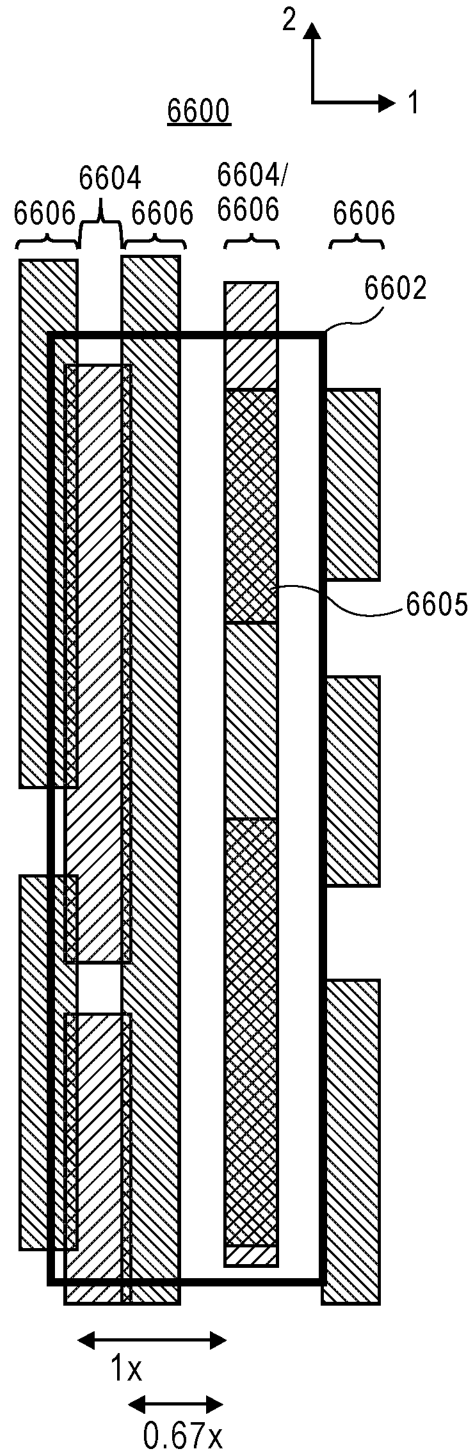
FIG. 66 illustrates a first view of a cell layout for a memory cell having an internal node jumper, in accordance with an embodiment of the present disclosure.

In contrast to FIG. 65, FIG. 66 illustrates a first view of a cell layout for a memory cell having an internal node jumper, in accordance with an embodiment of the present disclosure.

Referring to FIG. 66, an exemplary 10 nanometer (10 nm) layout 6600 includes a bit cell 6602. Bit cell 6602 includes gate or poly lines 6604 and metal 1 (M1) lines 6606. In the example shown, the poly lines 6604 have 1× pitch, and the M1 lines 6606 have a 0.67× pitch. The result is an overlapping line 6605, which includes a M1 line directly over a poly line. In a particular embodiment, the poly lines 6604 have 54 nm pitch, and the M1 lines 6606 have a 36 nm pitch.

In comparison to layout 6500, in layout 6600, the M1 pitch is less than the gate pitch, freeing up an extra line (6605) every third line (e.g., for every two poly lines, there are three M1 lines). The "freed up" M1 line is referred to herein as an internal node jumper. The internal node jumper may be used for gate to gate (poly to poly) interconnection or for trench contact to trench contact interconnection. In an embodiment, contact to poly is achieved through a contact over active gate (COAG) arrangement, enabling fabrication of the internal node jumper.

Referring more generally to FIG. 66, in an embodiment, an integrated circuit structure includes a memory bit cell 6602 on a substrate. The memory bit cell 6602 includes first and second gate lines 6604 parallel along a second direction 2 of the substrate. The first and second gate lines 6602 have a first pitch along a first direction (1) of the substrate, the first direction (1) perpendicular to the second direction (2). First, second and third interconnect lines 6606 are over the first and second gate lines 6604. The first, second and third interconnect lines 6606 are parallel along the second direction (2) of the substrate. The first, second and third interconnect lines 6606 have a second pitch along the first direction, where the second pitch is less than the first pitch. In one embodiment, one of the first, second and third interconnect lines 6606 is an internal node jumper for the memory bit cell 6602.

As is applicable throughout the present disclosure, the gate lines 6604 may be referred to as being on tracks to form a grating structure. Accordingly, the grating-like patterns described herein may have gate lines or interconnect lines spaced at a constant pitch and having a constant width. The pattern may be fabricated by a pitch halving or pitch quartering, or other pitch division, approach.

Figure 67:
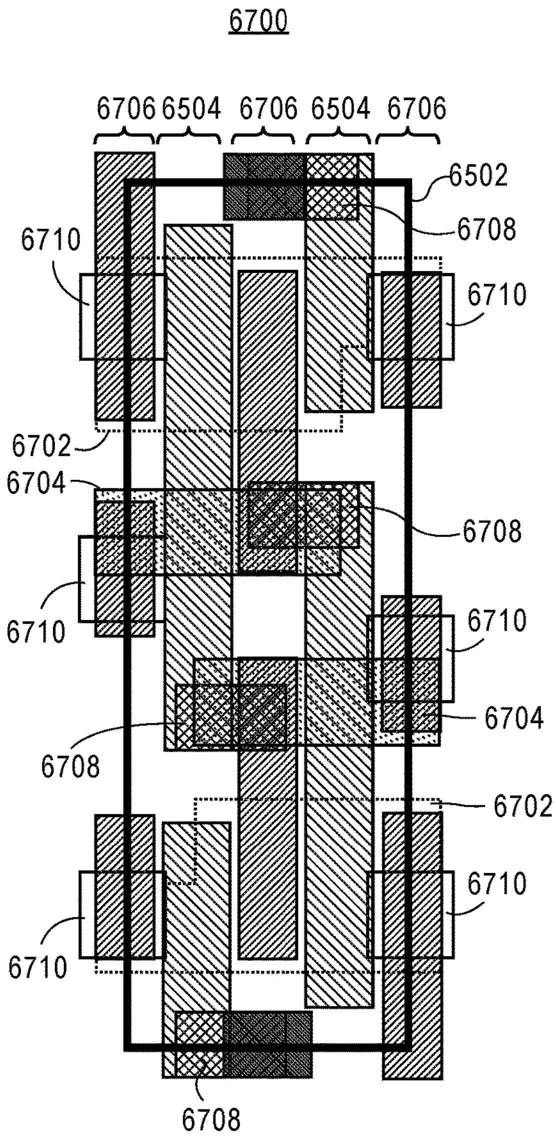
FIG. 67 illustrates a second view of a cell layout for a memory cell.

As a comparative example, FIG. 67 illustrates a second view of a cell layout 6700 for a memory cell.

Referring to FIG. 67, the 14 nm bit cell 6502 is shown with N-diffusion 6702 (e.g., P-type doped active regions, such as boron doped diffusion regions of an underlying substrate) and P-diffusion 6704 (e.g., N-type doped active regions, such as phosphorous or arsenic, or both, doped diffusion regions of an underlying substrate) with M1 lines removed for clarity. Layout 6700 of bit cell 102 includes gate or poly lines 6504, trench contacts 6706, gate contacts 6708 (specific for 14 nm node) and contact vias 6710.

Figure 68:
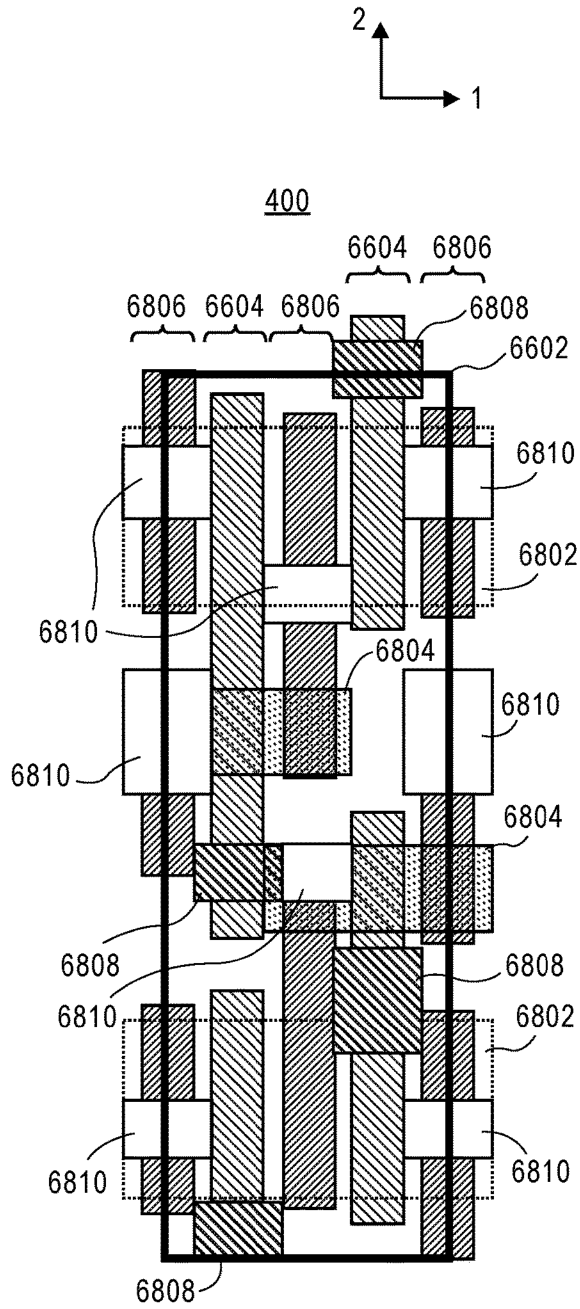
FIG. 68 illustrates a second view of a cell layout for a memory cell having an internal node jumper, in accordance with an embodiment of the present disclosure.

In contrast to FIG. 67, FIG. 68 illustrates a second view of a cell layout 6800 for a memory cell having an internal node jumper, in accordance with an embodiment of the present disclosure.

Referring to FIG. 68, the 10 nm bit cell 6602 is shown with N-diffusion 6802 (e.g., P-type doped active regions, such as boron doped diffusion regions of an underlying substrate) and P-diffusion 6804 (e.g., N-type doped active regions, such as phosphorous or arsenic, or both, doped diffusion regions of an underlying substrate) with M1 lines removed for clarity. Layout 6800 of bit cell 202 includes gate or poly lines 6604, trench contacts 6806, gate vias 6808 (specific for 10 nm node) and trench contact vias 6710.

In comparing layouts 6700 and 6800, in accordance with an embodiment of the present disclosure, in the 14 nm layout the internal nodes are connected by a gate contact (GCN) only. An enhanced performance layout cannot be created in the same footprint due to poly to GCN space constraints. In the 10 nm layout, the design allows for landing a contact (VCG) on the gate to eliminate the need for a poly contact. In one embodiment, the arrangement enabled connection of an internal node using M1, allowing for addition active region density (e.g., increased number of fins) within the 14 nm footprint. In the 10 nm layout, upon using a COAG architecture, spacing between diffusion regions can be made smaller since they are not limited by trench contact to gate contact spacing. In an embodiment, the layout 6700 of FIG. 67 is referred to as a 112 (1 fin pull-up, 1 fin pass gate, 2 fin pull down) arrangement. By contrast, the layout 6800 of FIG. 68 is referred to as a 122 (1 fin pull-up, 2 fin pass gate, 2 fin pull down) arrangement that, in a particular embodiment, is within the same footprint as the 112 layout of FIG. 67. In an embodiment, the 122 arrangement provides improved performance as compared with the 112 arrangement.

Figure 69:
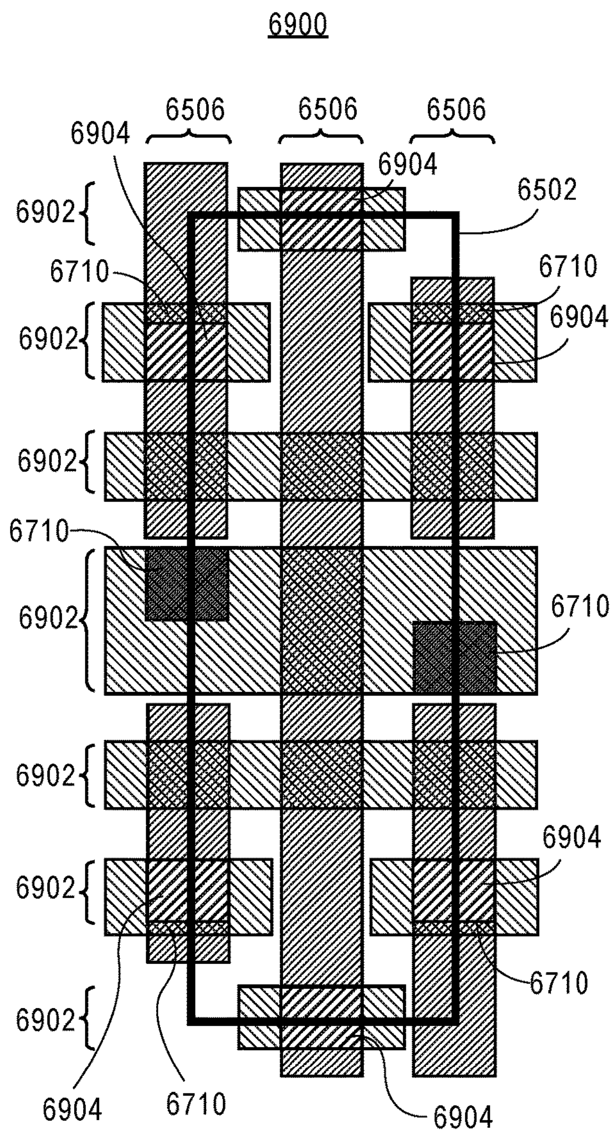
FIG. 69 illustrates a third view of a cell layout for a memory cell.

As a comparative example, FIG. 69 illustrates a third view of a cell layout 6900 for a memory cell.

Referring to FIG. 69, the 14 nm bit cell 6502 is shown with metal 0 (M0) lines 6902 with poly lines removed for clarity. Also shown are metal 1 (M1) lines 6506, contact vias 6710, via 0 structures 6904.

Figure 70:
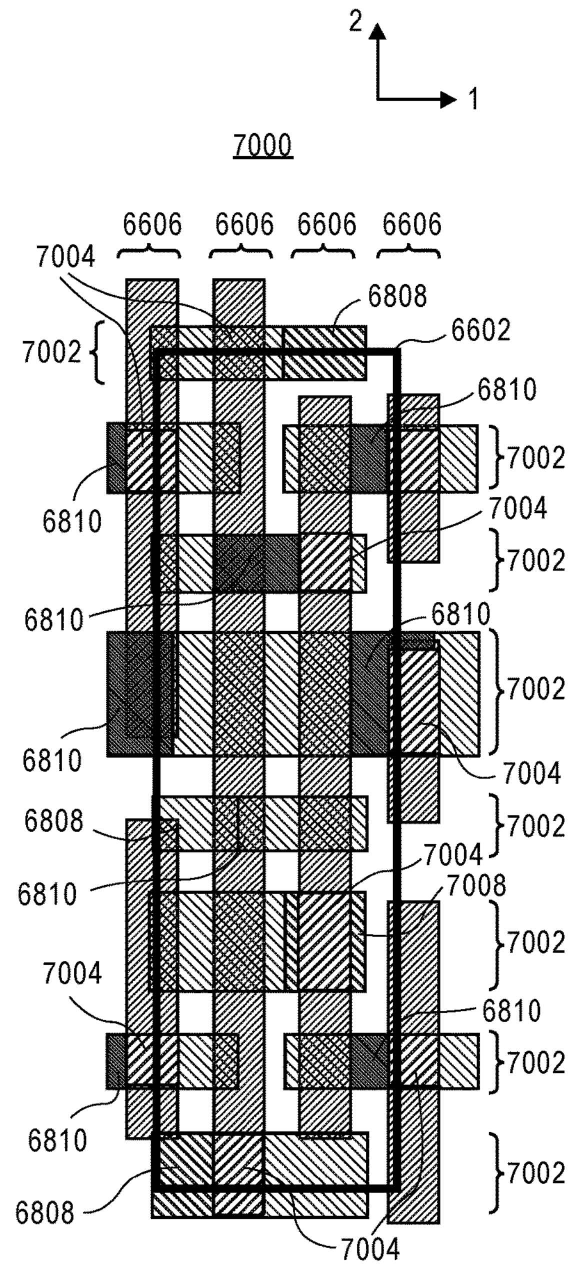
FIG. 70 illustrates a third view of a cell layout for a memory cell having an internal node jumper, in accordance with an embodiment of the present disclosure.

In contrast to FIG. 69, FIG. 70 illustrates a third view of a cell layout 7000 for a memory cell having an internal node jumper, in accordance with an embodiment of the present disclosure.

Referring to FIG. 70, the 10 nm bit cell 6602 is shown with metal 0 (M0) lines 7002 with poly lines removed for clarity. Also shown are metal 1 (M1) lines 6606, gate vias 6808, trench contact vias 6810, and via 0 structures 7004. In comparing FIGS. 69 and 70, in accordance with an embodiment of the present disclosure, for the 14 nm layout the internal nodes are connected by gate contact (GCN) only, while for the 10 nm layout one of the internal nodes is connected using a M1 jumper.

Referring to FIGS. 66, 68 and 70 collectively, in accordance with an embodiment of the present disclosure, an integrated circuit structure includes a memory bit cell 6602 on a substrate. The memory bit cell 6602 includes first (top 6802), second (top 6804), third (bottom 6804) and fourth (bottom 6802) active regions parallel along a first direction (1) of the substrate. First (left 6604) and second (right 6604) gate lines are over the first, second, third and fourth active regions 6802/6804. The first and second gate lines 6604 are parallel along a second direction (2) of the substrate, the second direction (2) perpendicular to the first direction (1). First (far left 6606), second (near left 6606) and third (near right 6606) interconnect lines are over the first and second gate lines 6604. The first, second and third interconnect lines 6606 are parallel along the second direction (2) of the substrate.

In an embodiment, the first (far left 6606) and second (near left 6606) interconnect lines are electrically connected to the first and second gate lines 6604 at locations of the first and second gate lines 6604 over one or more of the first, second, third and fourth active regions 6802/6804 (e.g., at so-called "active gate" locations). In one embodiment, the first (far left 6606) and second (near left 6606) interconnect lines are electrically connected to the first and second gate lines 6604 by an intervening plurality of interconnect lines 7004 vertically between the first and second interconnect lines 6606 and the first and second gate lines 6604. The intervening plurality of interconnect lines 7004 is parallel along the first direction (1) of the substrate.

In an embodiment, the third interconnect line (near right 6606) electrically couples together a pair of gate electrodes of the memory bit cell 6602, the pair of gate electrodes included in the first and second gate lines 6604. In another embodiment, the third interconnect line (near right 6606) electrically couples together a pair of trench contacts of the memory bit cell 6602, the pair of trench contacts included in a plurality of trench contact lines 6806. In an embodiment, the third interconnect line (near right 6606) is an internal node jumper.

In an embodiment, the first active region (top 6802) is a P-type doped active region (e.g., to provide N-diffusion for an NMOS device), the second active region (top 6804) is an N-type doped active region (e.g., to provide P-diffusion for a PMOS device), the third active region (bottom 6804) is an N-type doped active region (e.g., to provide P-diffusion for a PMOS device), and the fourth active region (bottom 6802) is an N-type doped active region (e.g., to provide N-diffusion for an NMOS device). In an embodiment, the first, second, third and fourth active regions 6802/6804 are in silicon fins. In an embodiment, the memory bit cell 6602 includes a pull-up transistor based on a single silicon fin, a pass-gate transistor based on two silicon fins, and a pull-down transistor based on two silicon fins.

In an embodiment, the first and second gate lines 6604 alternate with individual ones of a plurality of trench contact lines 6806 parallel along the second direction (2) of the substrate. The plurality of trench contact lines 6806 includes trench contacts of the memory bit cell 6602. The first and second gate lines 6604 include gate electrode of the memory bit cell 6602.

In an embodiment, the first and second gate lines 6604 have a first pitch along the first direction (1). The first, second and third interconnect lines 6606 have a second pitch along the first direction (2). In one such embodiment, the second pitch is less than the first pitch. In a specific such embodiment, the first pitch is in the range of 50 nanometers to 60 nanometers, and the second pitch is in the range of 30 nanometers to 40 nanometers. In a particular such embodiment, the first pitch is 54 nanometers, and the second pitch is 36 nanometers.

Embodiments described herein may be implemented to provide an increased number of fins within a relatively same bit cell footprint as a previous technology node, enhancing the performance of a smaller technology node memory bit cell relative to that of a previous generation. As an example, FIGS. 71A and 71B illustrate a bit cell layout and a schematic diagram, respectively, for a six transistor (6T) static random access memory (SRAM), in accordance with an embodiment of the present disclosure.

Figure 71A:
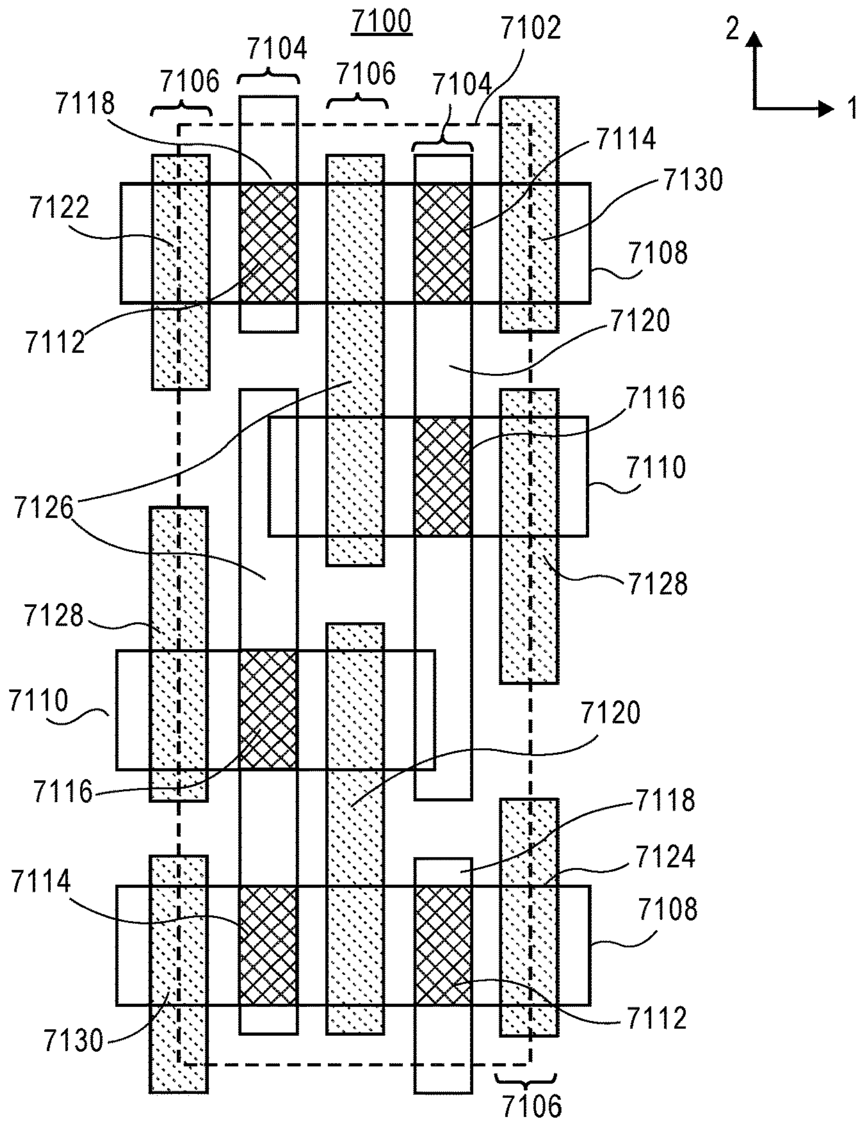
FIGS. 71A and 71B illustrate a bit cell layout and a schematic diagram, respectively, for a six transistor (6T) static random access memory (SRAM), in accordance with an embodiment of the present disclosure.
Figure 71B:
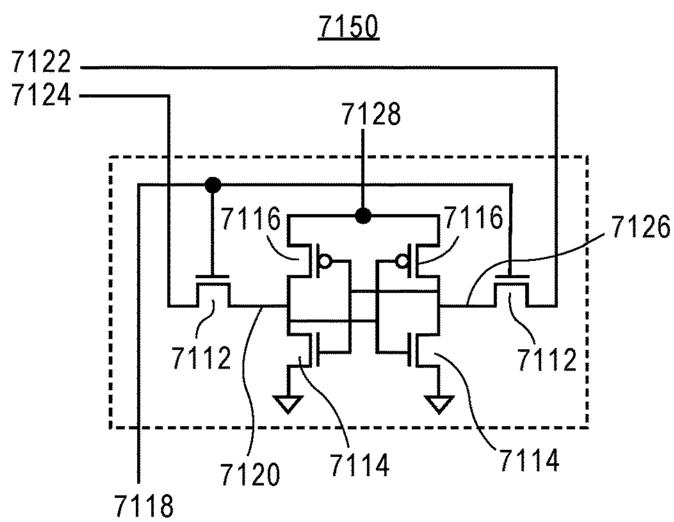

Referring to FIGS. 71A and 71B, a bit cell layout 7102 includes therein gate lines 7104 (which may also be referred to as poly lines) parallel along direction (2). Trench contact lines 7106 alternate with the gate lines 7104. The gate lines 7104 and trench contact lines 7106 are over NMOS diffusion regions 7108 (e.g., P-type doped active regions, such as boron doped diffusion regions of an underlying substrate) and PMOS diffusion regions 7110 (e.g., N-type doped active regions, such as phosphorous or arsenic, or both, doped diffusion regions of an underlying substrate) which are parallel along direction (1). In an embodiment, both of the NMOS diffusion regions 7108 each includes two silicon fins. Both of the PMOS diffusion regions 7110 each includes one silicon fin.

Referring again to FIGS. 71A and 71B, NMOS pass gate transistors 7112, NMOS pull-down transistors 7114, and PMOS pull-up transistors 7116 are formed from the gate lines 7104 and the NMOS diffusion regions 7108 and the PMOS diffusion regions 7110. Also depicted are a wordline (WL) 7118, internal nodes 7120 and 7126, a bit line (BL) 7122, a bit line bar (BLB) 7124, SRAM VCC 7128, and VSS 7130.

In an embodiment, contact to the first and second gate lines 7104 of the bit cell layout 7102 is made to active gate locations of the first and second gate lines 7104. In an embodiment, the 6T SRAM bit cell 7104 includes an internal node jumper, such as described above.

In an embodiment, layouts described herein are compatible with uniform plug and mask patterns, including a uniform fin trim mask. Layouts may be compatible with non-EUV processes. Additionally, layouts may only require use of a middle-fin trim mask. Embodiments described herein may enable increased density in terms of area compared to other layouts. Embodiments may be implemented to provide a layout-efficient memory implementation in advanced self-aligned process technologies. Advantages may be realized in terms of die area or memory performance, or both. Circuit techniques may be uniquely enabled by such layout approaches.

One or more embodiments described herein are directed to multi version library cell handling when parallel interconnect lines (e.g., Metal 1 lines) and gate lines are misaligned. Embodiments may be directed to 10 nanometer or smaller technology nodes. Embodiments may include or be directed to cell layouts that make possible higher performance cells in a same or smaller footprint relative to a previous technology node. In an embodiment, interconnect lines overlying gate lines are fabricated to have an increased density relative to the underlying gate lines. Such an embodiment may enable an increase in pin hits, increased routing possibilities, or increased access to cell pins. Embodiments may be implemented to provide greater than 6% block level density.

To provide context, gate lines and the next parallel level of interconnects (typically referred to as metal 1, with a metal 0 layer running orthogonal between metal 1 and the gate lines) need to be in alignment at the block level. However, in an embodiment, the pitch of the metal 1 lines is made different, e.g., smaller, than the pitch of the gate lines. Two standard cell versions (e.g., two different cell patterns) for each cell are made available to accommodate the difference in pitch. The particular version selected follows a rule placement adhering at the block level. If not selected properly, dirty registration (DR) may occur. In accordance with an embodiment of the present disclosure, a higher metal layer (e.g., metal 1 or M1) with increased pitch density relative to the underlying gate lines is implemented. In an embodiment, such an approach enables aggressive scaling to provide improved cost per transistor for, e.g., a 10 nanometer (10 nm) technology node.

Figure 72:
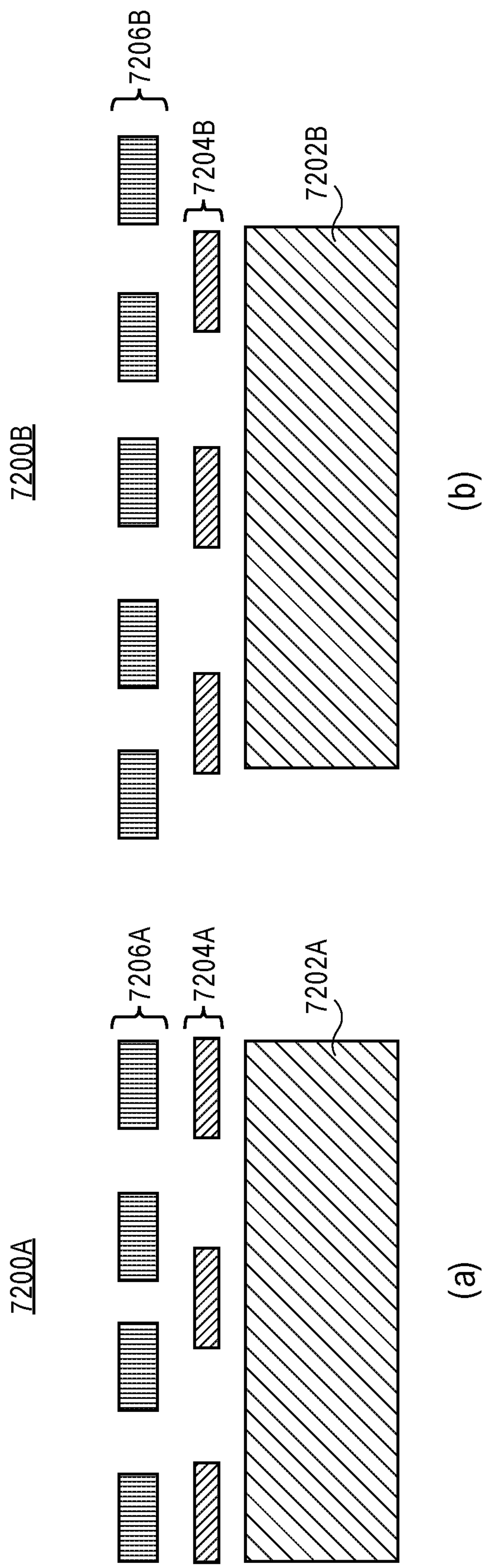
FIG. 72 illustrates cross-sectional views of two different layouts for a same standard cell, in accordance with an embodiment of the present disclosure.

FIG. 72 illustrates cross-sectional views of two different layouts for a same standard cell, in accordance with an embodiment of the present disclosure.

Referring to part (a) of FIG. 72, a set of gate lines 7204A overlies a substrate 7202A. A set of metal 1 (M1) interconnects 7206A overlies the set of gate lines 7204A. The set of metal 1 (M1) interconnects 7206A has a tighter pitch than the set of gate lines 7204A. However, the outermost metal 1 (M1) interconnects 7206A have outer alignment with the outermost gate lines 7204A. For designation purposes, as used throughout the present disclosure, the aligned arrangement of part (a) of FIG. 72 is referred to as having even (E) alignment.

In contrast to part (a), referring to part (b) of FIG. 72, a set of gate lines 7204B overlies a substrate 7202B. A set of metal 1 (M1) interconnects 7206B overlies the set of gate lines 7204B. The set of metal 1 (M1) interconnects 7206B has a tighter pitch than the set of gate lines 7204B. The outermost metal 1 (M1) interconnects 7206B do not have outer alignment with the outermost gate lines 7204B. For designation purposes, as used throughout the present disclosure, the non-aligned arrangement of part (b) of FIG. 72 is referred to as having odd (O) alignment.

Figure 73:
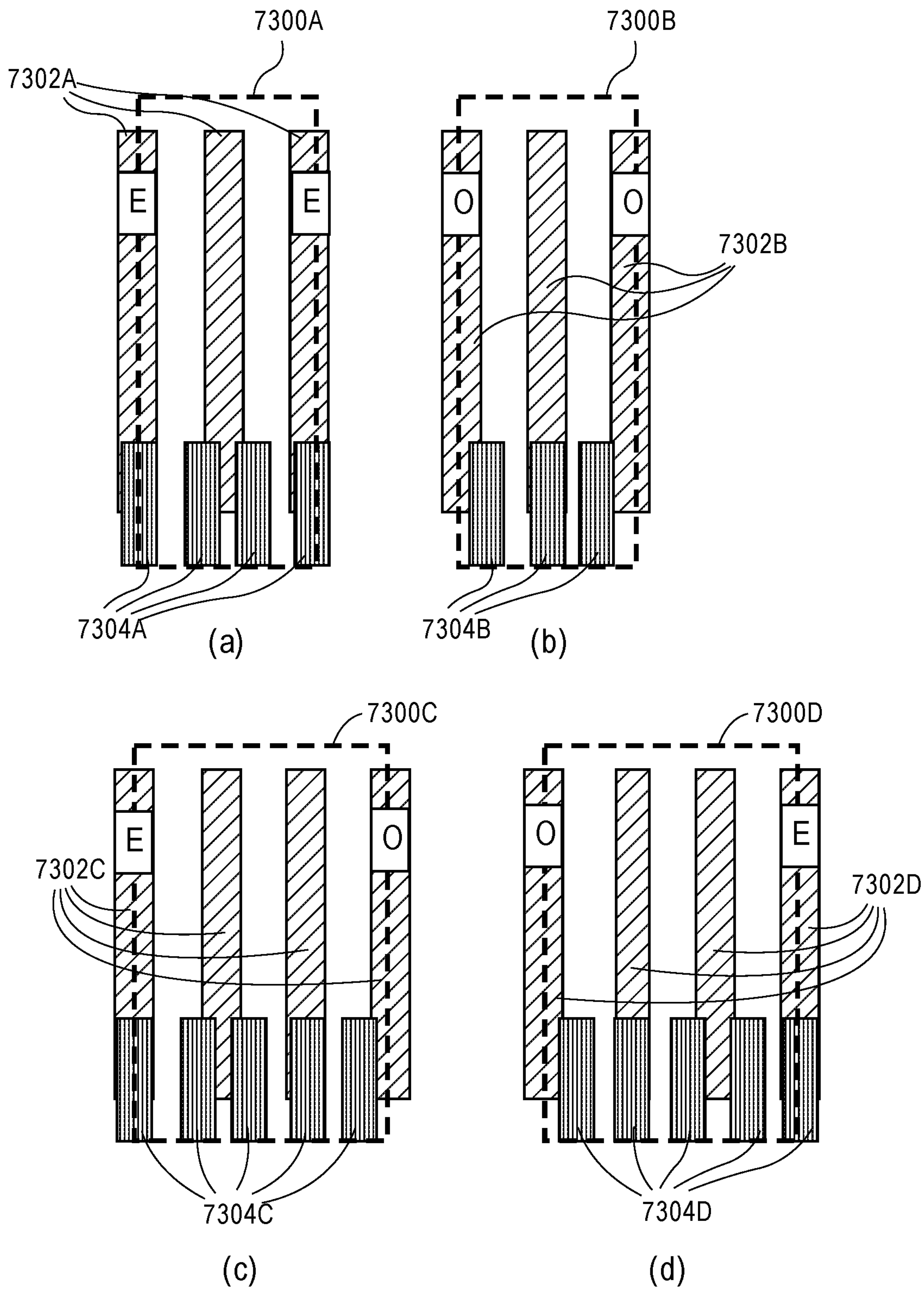
FIG. 73 illustrates plan views of four different cell arrangements indicating the even (E) or odd (O) designation, in accordance with an embodiment of the present disclosure.

FIG. 73 illustrates plan views of four different cell arrangements indicating the even (E) or odd (O) designation, in accordance with an embodiment of the present disclosure.

Referring to part (a) of FIG. 73, a cell 7300A has gate (or poly) lines 7302A and metal 1 (M1) lines 7304A. The cell 7300A is designated as an EE cell since the left side of cell 7300A and right side of cell 7300A have aligned gate 7302A and M1 7304A lines. By contrast, referring to part (b) of FIG. 73, a cell 7300B has gate (or poly) lines 7302B and metal 1 (M1) lines 7304B. The cell 7300B is designated as an OO cell since the left side of cell 7300B and right side of cell 7300B have non-aligned gate 7302B and M1 7304B lines.

Referring to part (c) of FIG. 73, a cell 7300C has gate (or poly) lines 7302C and metal 1 (M1) lines 7304C. The cell 7300C is designated as an EO cell since the left side of cell 7300C has aligned gate 7302C and M1 7304C lines, but the right side of cell 7300C has non-aligned gate 7302C and M1 7304C lines. By contrast, referring to part (d) of FIG. 73, a cell 7300D has gate (or poly) lines 7302D and metal 1 (M1) lines 7304D. The cell 7300D is designated as an OE cell since the left side of cell 7300D has non-aligned gate 7302D and M1 7304D lines, but the right side of cell 7300D has aligned gate 7302D and M1 7304D lines.

Figure 74:
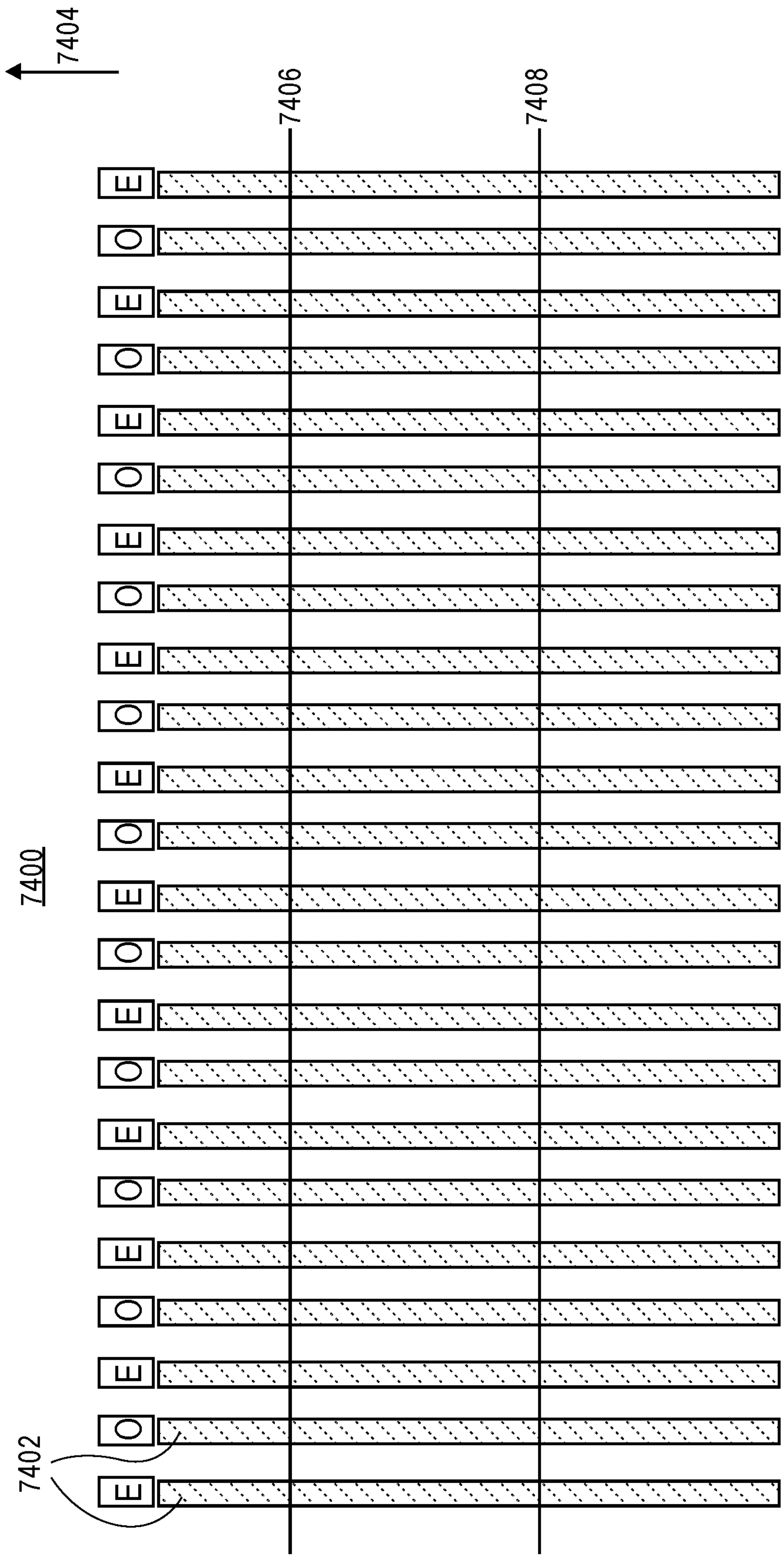
FIG. 74 illustrates a plan view of a block level poly grid, in accordance with an embodiment of the present disclosure.

As a foundation for placing selected first or second versions of standard cell types, FIG. 74 illustrates a plan view of a block level poly grid, in accordance with an embodiment of the present disclosure. Referring to FIG. 74, a block level poly grid 7400 includes gate lines 7402 running parallel along a direction 7404. Designated cell layout borders 7406 and 7408 are shown running in a second, orthogonal direction. The gate lines 7402 alternate between even (E) and odd (O) designation.

Figure 75:
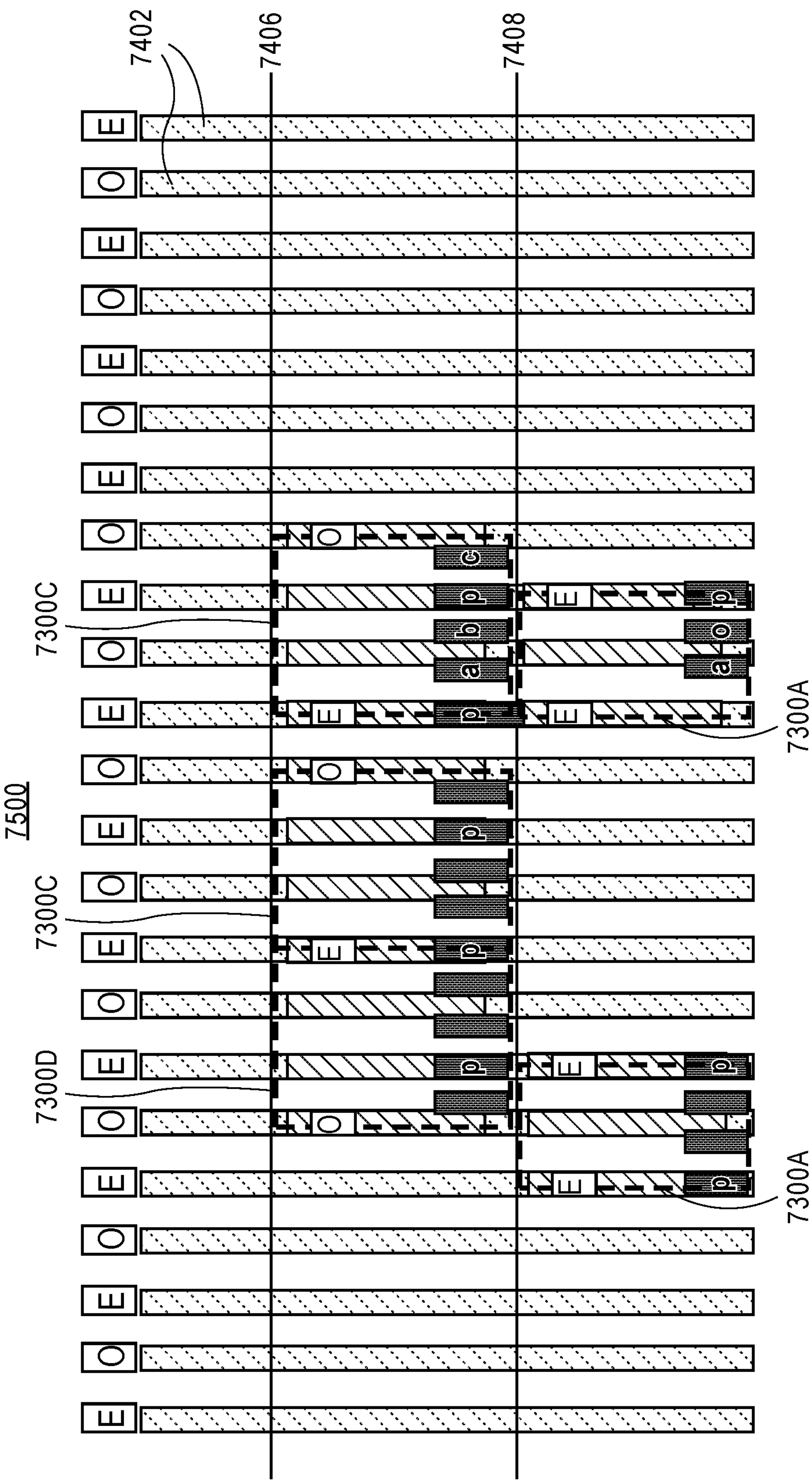
FIG. 75 illustrates an exemplary acceptable (pass) layout based on standard cells having different versions, in accordance with an embodiment of the present disclosure.

FIG. 75 illustrates an exemplary acceptable (pass) layout based on standard cells having different versions, in accordance with an embodiment of the present disclosure. Referring to FIG. 75, a layout 7500 includes three cells of the type 7300C/7300D as placed in order from left to right between borders 7406 and 7408: 7300D, abutting first 7300C and spaced apart second 7300C. The selection between 7300C and 7300D is based on the alignment of the E or O designations on the corresponding gate lines 7402. The layout 7500 also includes cells of the type 7300A/7300B as placed in order from left to right below border 7408: first 7300A spaced apart from second 7300A. The selection between 7300A and 7300B is based on the alignment of the E or O designations on the corresponding gate lines 7402. Layout 7500 is a pass cell in the sense that no dirty registration (DR) occurs in the layout 7500. It is to be appreciated that p designates power, and a, b, c or o are exemplary pins. In the arrangement 7500 the power lines p line up with one another across border 7408.

Referring more generally to FIG. 75, in accordance with an embodiment of the present disclosure, an integrated circuit structure includes a plurality of gate lines 7402 parallel along a first direction of a substrate and having a pitch along a second direction orthogonal to the first direction. A first version 7300C of a cell type is over a first portion of the plurality of gate lines 7402. The first version 7300C of the cell type includes a first plurality of interconnect lines having a second pitch along the second direction, the second pitch less than the first pitch. A second version 7300D of the cell type is over a second portion of the plurality of gate lines 7402 laterally adjacent to the first version 7300C of the cell type along the second direction. The second version 7300D of the cell type includes a second plurality of interconnect lines having the second pitch along the second direction. The second version 7300D of the cell type is structurally different than the first version 7300C of the cell type.

In an embodiment, individual ones of the first plurality of interconnect lines of the first version 7300C of the cell type align with individual ones of the plurality of gate lines 7402 along the first direction at a first edge (e.g., left edge) but not at a second edge (e.g., right edge) of the first version 7300C of the cell type along the second direction. In one such embodiment, the first version of the cell type 7300C is a first version of a NAND cell. Individual ones of the second plurality of interconnect lines of the second version 7300D of the cell type do not align with individual ones of the plurality of gate lines 7402 along the first direction at a first edge (e.g., left edge) but do align at a second edge (e.g., right edge) of the second version 7300D of the cell type along the second direction. In one such embodiment, the second version of the cell type 7300D is a second version of a NAND cell.

In another embodiment, the first and second versions are selected from cell types 7300A and 7300B. Individual ones of the first plurality of interconnect lines of the first version 7300A of the cell type align with individual ones of the plurality of gate lines 7402 along the first direction at both edges of the first version of the cell type 7300A along the second direction. In one embodiment, the first version 7300A of the cell type is a first version of an inverter cell. It is to be appreciated that individual ones of the second plurality of interconnect lines of the second version 7300B of the cell type would otherwise not align with individual ones of the plurality of gate lines 7402 along the first direction at both edges of the second version 7300B of the cell type along the second direction. In one embodiment, the second version 7300B of the cell type is a second version of an inverter cell.

Figure 76:
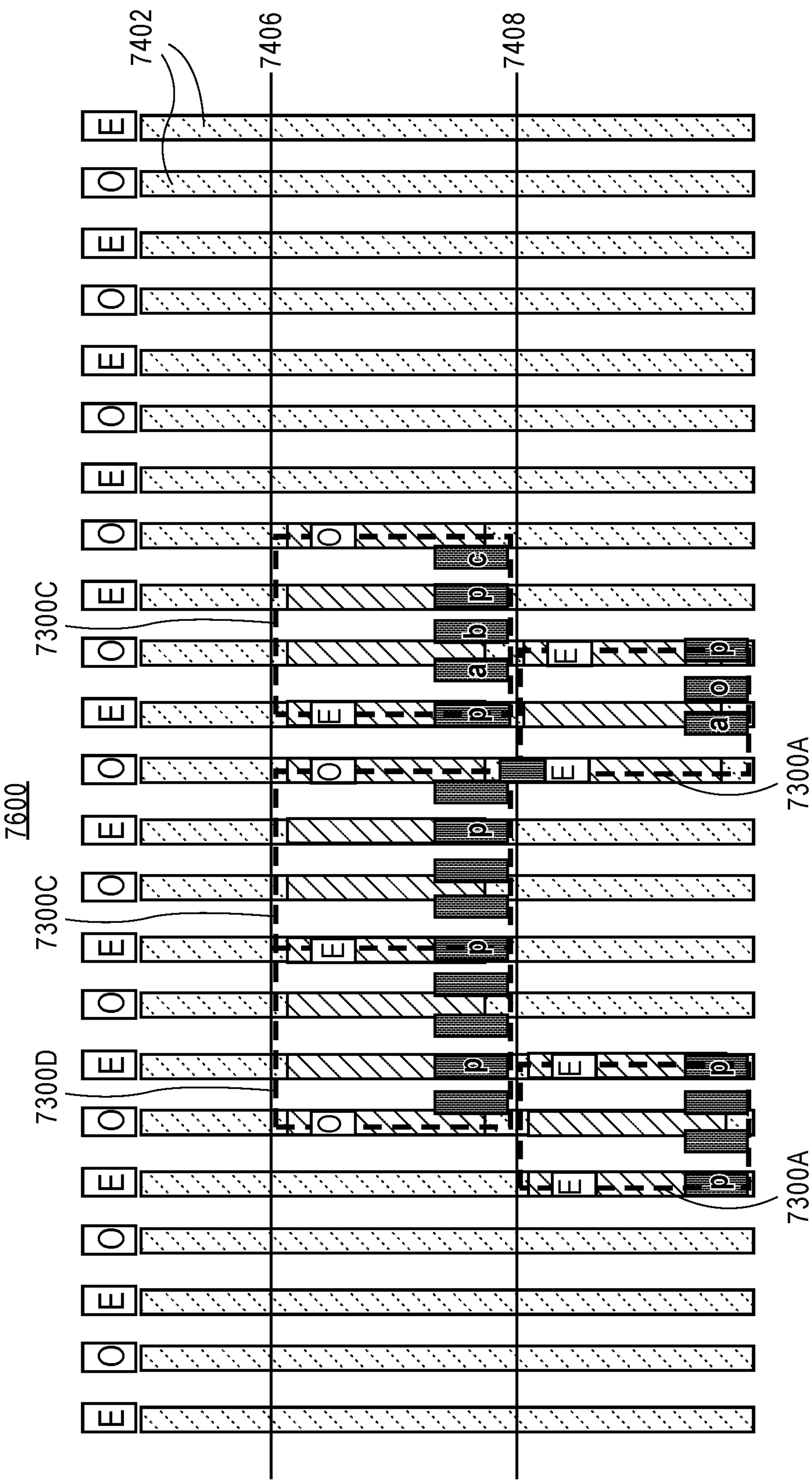
FIG. 76 illustrates an exemplary unacceptable (fail) layout based on standard cells having different versions, in accordance with an embodiment of the present disclosure.

FIG. 76 illustrates an exemplary unacceptable (fail) layout based on standard cells having different versions, in accordance with an embodiment of the present disclosure. Referring to FIG. 76, a layout 7600 includes three cells of the type 7300C/7300D as placed in order from left to right between borders 7406 and 7408: 7300D, abutting first 7300C and spaced apart second 7300C. The appropriate selection between 7300C and 7300D is based on the alignment of the E or O designations on the corresponding gate lines 7402, as is shown. However, the layout 7600 also includes cells of the type 7300A/7300B as placed in order from left to right below border 7408: first 7300A spaced apart from second 7300A. The layout 7600 differs from 7500 in that the second 7300A is moved one line over to the left. Although, the selection between 7300A and 7300B should be based on the alignment of the E or O designations on the corresponding gate lines 7402, it is not, and second cell 7300A is misaligned, one consequence of which is misaligned power (p) lines. Layout 7600 is a fail cell since a dirty registration (DR) occurs in the layout 7600.

Figure 77:
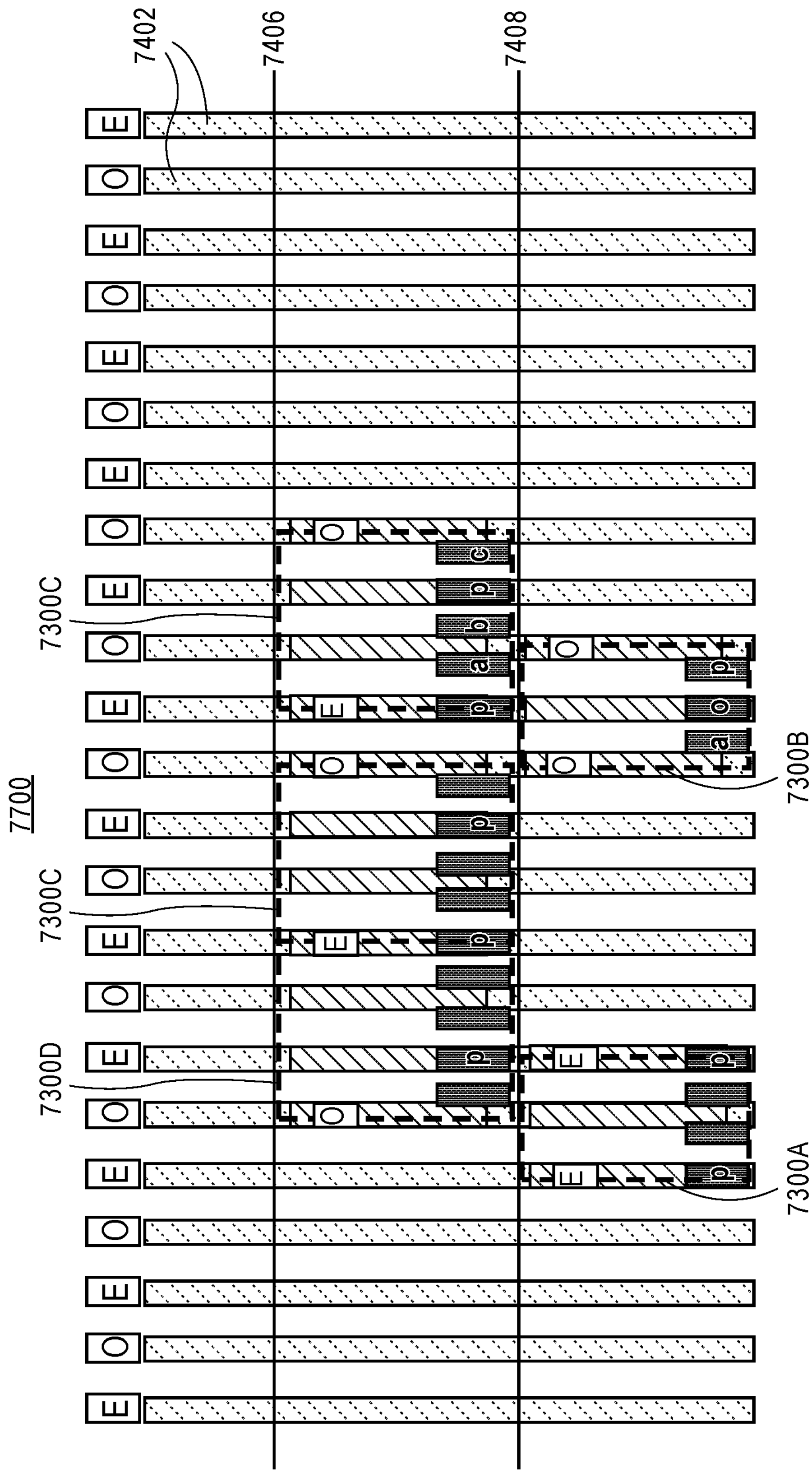
FIG. 77 illustrates another exemplary acceptable (pass) layout based on standard cells having different versions, in accordance with an embodiment of the present disclosure.

FIG. 77 illustrates another exemplary acceptable (pass) layout based on standard cells having different versions, in accordance with an embodiment of the present disclosure. Referring to FIG. 77, a layout 7700 includes three cells of the type 7300C/7300D as placed in order from left to right between borders 7406 and 7408: 7300D, abutting first 7300C and spaced apart second 7300C. The selection between 7300C and 7300D is based on the alignment of the E or O designations on the corresponding gate lines 7402. The layout 7700 also includes cells of the type 7300A/7300B as placed in order from left to right below border 7408: 7300A spaced apart from 7300B. The position of 7300B is the same as the position of 7300A in the layout 7600, but the selected cell 7300B is based on the appropriate alignment of the O designation on the corresponding gate lines 7402. Layout 7700 is a pass cell in the sense that no dirty registration (DR) occurs in the layout 7700. It is to be appreciated that p designates power, and a, b, c or o are exemplary pins. In the arrangement 7700 the power lines p line up with one another across border 7408.

Referring collectively to FIGS. 76 and 77, a method of fabricating a layout for an integrated circuit structure includes designating alternating ones of a plurality of gate lines 7402 parallel along a first direction as even (E) or odd (O) along a second direction. A location is then selected for a cell type over the plurality of gate lines 7402. The method also includes selecting between a first version of the cell type and a second version of the cell type depending on the location, the second version structurally different than the first version, wherein the selected version of the cell type has an even (E) or odd (O) designation for interconnects at edges of the cell type along the second direction, and wherein the designation of the edges of the cell type match with the designation of individual ones of the plurality of gate lines below the interconnects.

In another aspect, one or more embodiments are directed to the fabrication of metal resistors on a fin-based structure included in a fin field effect transistor (FET) architecture. In an embodiment, such precision resistors are implanted as a fundamental component of a system-on-chip (SoC) technology, due to the high speed IOs required for faster data transfer rates. Such resistors may enable the realization of high speed analog circuitry (such as CSI/SERDES) and scaled IO architectures due to the characteristics of having low variation and near-zero temperature coefficients. In one embodiment, a resistor described herein is a tunable resistor.

To provide context, traditional resistors used in current process technologies typically fall in one of two classes: general resistors or precision resistors. General resistors, such as trench contact resistors, are cost-neutral but may suffer from high variation due to variations inherent in the fabrication methods utilized or the associated large temperature coefficients of the resistors, or both. Precision resistors may alleviate the variation and temperature coefficient issues, but often at the expense of higher process cost and an increased number of fabrication operations required. The integration of polysilicon precision resistors is proving increasingly difficult in high-k/metal gate process technologies.

In accordance with embodiments, fin-based thin film resistors (TFRs) are described. In one embodiment, such resistors have a near-zero temperature coefficient. In one embodiment, such resistors exhibit reduced variation from dimensional control. In accordance with one or more embodiments of the present disclosure, an integrated precision resistor is fabricated within a fin-FET transistor architecture. It is to be appreciated that traditional resistors used in high-k/metal gate process technologies are typically tungsten trench contacts (TCN), well resistors, or polysilicon precision resistors. Such resistors either add process cost or complexity, or suffer from high variation and poor temperature coefficients due to variations in the fabrication processes used. By contrast, in an embodiment, fabrication of a fin-integrated thin film resistor enables a cost-neutral, good (close to zero) temperature coefficient, and low variation alternative to known approaches.

To provide further context, state-of-the-art precision resistors have been fabricated using two-dimensional (2D) metallic thin films or highly doped poly lines. Such resistors tend to be discretized into templates of fixed values and, hence, a finer granularity of resistance values is hard to achieve.

Addressing one or more of the above issues, in accordance with one or more embodiments of the present disclosure, design of a high density precision resistor using a fin backbone, such as a silicon fin backbone, is described herein. In one embodiment, advantages of such a high density precision resistor include that the high density can be achieved by using fin packing density. Additionally, in one embodiment, such a resistor is integrated on the same level as active transistors, leading to the fabrication of compact circuitry. The use of a silicon fin backbone may permit high packing density and provide multiple degrees of freedom to control the resistance of the resistor. Accordingly, in a specific embodiment, the flexibility of a fin patterning process is leveraged to provide a wide range of resistance values, resulting in tunable precision resistor fabrication.

Figure 78:
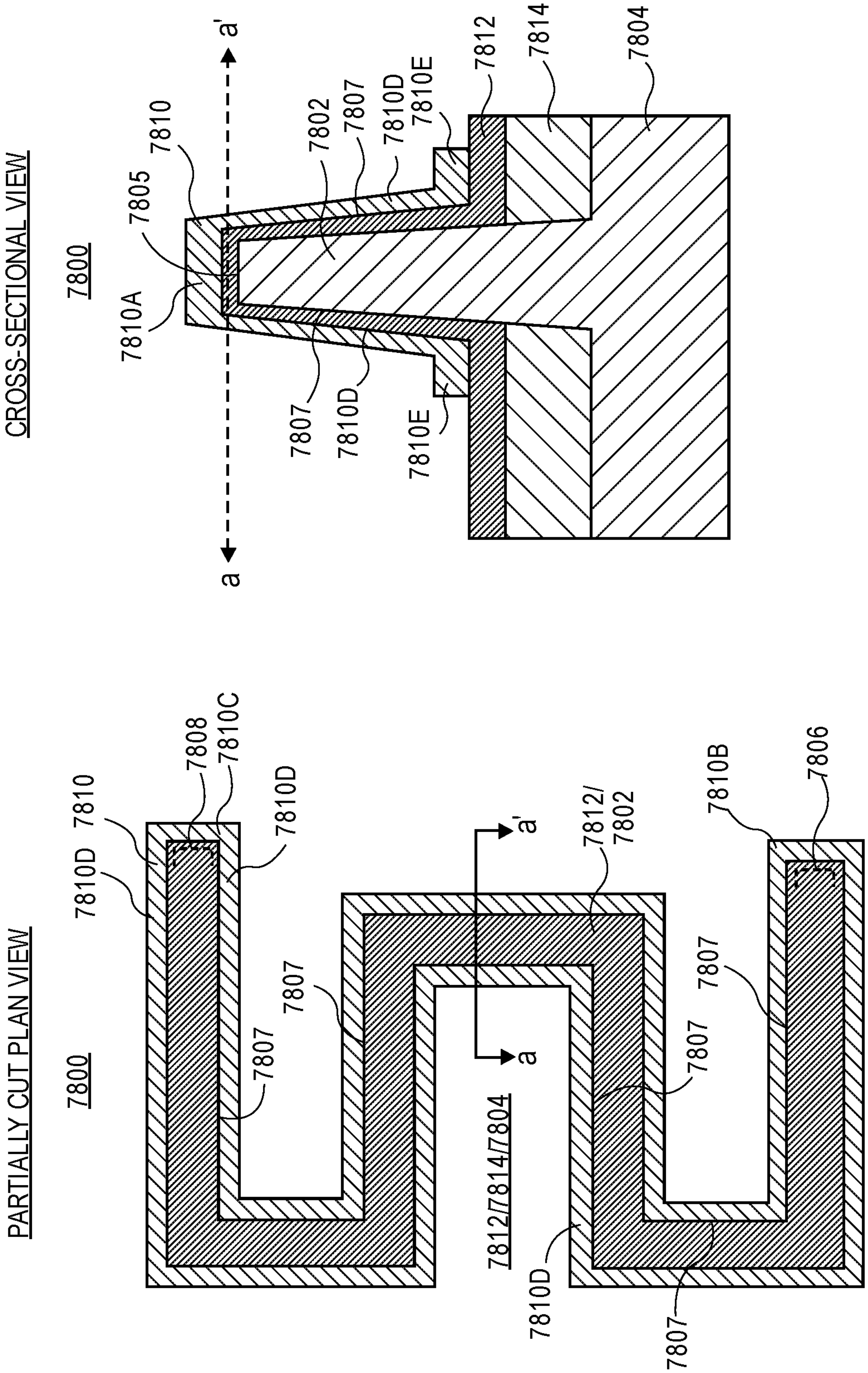
FIG. 78 illustrates a partially cut plan view and a corresponding cross-sectional view of a fin-based thin film resistor structure, where the cross-sectional view is taken along the a-a' axis of the partially cut plan view, in accordance with an embodiment of the present disclosure.

As an exemplary geometry for a fin-based precision resistor, FIG. 78 illustrates a partially cut plan view and a corresponding cross-sectional view of a fin-based thin film resistor structure, where the cross-sectional view is taken along the a-a' axis of the partially cut plan view, in accordance with an embodiment of the present disclosure.

Referring to FIG. 78, an integrated circuit structure 7800 includes a semiconductor fin 7802 protruding through a trench isolation region 7814 above a substrate 7804. In one embodiment, the semiconductor fin 7802 protrudes from and is continuous with the substrate 7804, as is depicted. The semiconductor fin has a top surface 7805, a first end 7806 (shown as a dashed line in the partially cut plan view since the fin is covered in this view), a second end 7808 (shown as a dashed line in the partially cut plan view since the fin is covered in this view), and a pair of sidewalls 7807 between the first end 7806 and the second end 7808. It is to be appreciated that the sidewalls 7807 are actually covered by layer 7812 in the partially cut plan view).

An isolation layer 7812 is conformal with the top surface 7805, the first end 7806, the second end 7808, and the pair of sidewalls 7807 of the semiconductor fin 7802. A metal resistor layer 7810 is conformal with the isolation layer 7814 conformal with the top surface 7805 (metal resistor layer portion 7810A), the first end 7806 (metal resistor layer portion 7810B), the second end 7808 (metal resistor layer portion 7810C), and the pair of sidewalls 7807 (metal resistor layer portions 7810D) of the semiconductor fin 7802. In a particular embodiment, the metal resistor layer 7810 includes a footed feature 7810E adjacent to the sidewalls 7807, as is depicted. The isolation layer 7812 electrically isolates the metal resistor layer 7810 from the semiconductor fin 7802 and, hence, from the substrate 7804.

In an embodiment, the metal resistor layer 7810 is composed of a material suitable to provide a near-zero temperature coefficient, in that the resistance of the metal resistor layer portion 7810 does not change significantly over a range of operating temperatures of a thin film resistor (TFR) fabricated therefrom. In an embodiment, the metal resistor layer 7810 is a titanium nitride (TiN) layer. In another embodiment, the metal resistor layer 7810 is a tungsten (W) metal layer. It is to be appreciated that other metals may be used for the metal resistor layer 7810 in place of, or in combination with, titanium nitride (TiN) or tungsten (W). In an embodiment, the metal resistor layer 7810 has a thickness approximately in the range of 2-5 nanometers. In an embodiment, the metal resistor layer 7810 has a resistivity approximately in the range of 100-100,000 ohms/square.

In an embodiment, an anode electrode and a cathode electrode are electrically connected to the metal resistor layer 7810, exemplary embodiments of which are described in greater detail below in association with FIG. 84. In one such embodiment, the metal resistor layer 7810, the anode electrode, and the cathode electrode form a precision thin film resistor (TFR) passive device. In an embodiment, the TFR based on the structure 7800 of FIG. 78 permits precise control of resistance based on fin 7802 height, fin 7802 width, metal resistor layer 7810 thickness and total fin 7802 length. These degrees of freedom may allow a circuit designer to achieve a selected resistance value. Additionally, since the resistor patterning is fin-based, high density is possible at on the scale of transistor density.

In an embodiment, state-of-the-art finFET processing operations are used to provide a fin suitable for fabricating a fin-based resistor. An advantage of such an approach may lie in its high density and proximity to the active transistors, enabling ease of integration into circuits. Also, the flexibility in the geometry of the underlying fin allows for a wide range of resistance values. In an exemplary processing scheme, a fin is first patterned using backbone lithography and spacerization approach. The fin is then covered with isolation oxide which is recessed to set the height of the resistor. An insulating oxide is then deposited conformally on the fin to separate the conductive film from the underlying substrate, such as an underlying silicon substrate. A metal or highly doped polysilicon film is then deposited on the fin. The film is then spacerized to create the precision resistor.

In an exemplary processing scheme, FIGS. 79-83 illustrate plan views and corresponding cross-sectional view representing various operations in a method of fabricating a fin-based thin film resistor structure, in accordance with an embodiment of the present disclosure.

Figure 79:
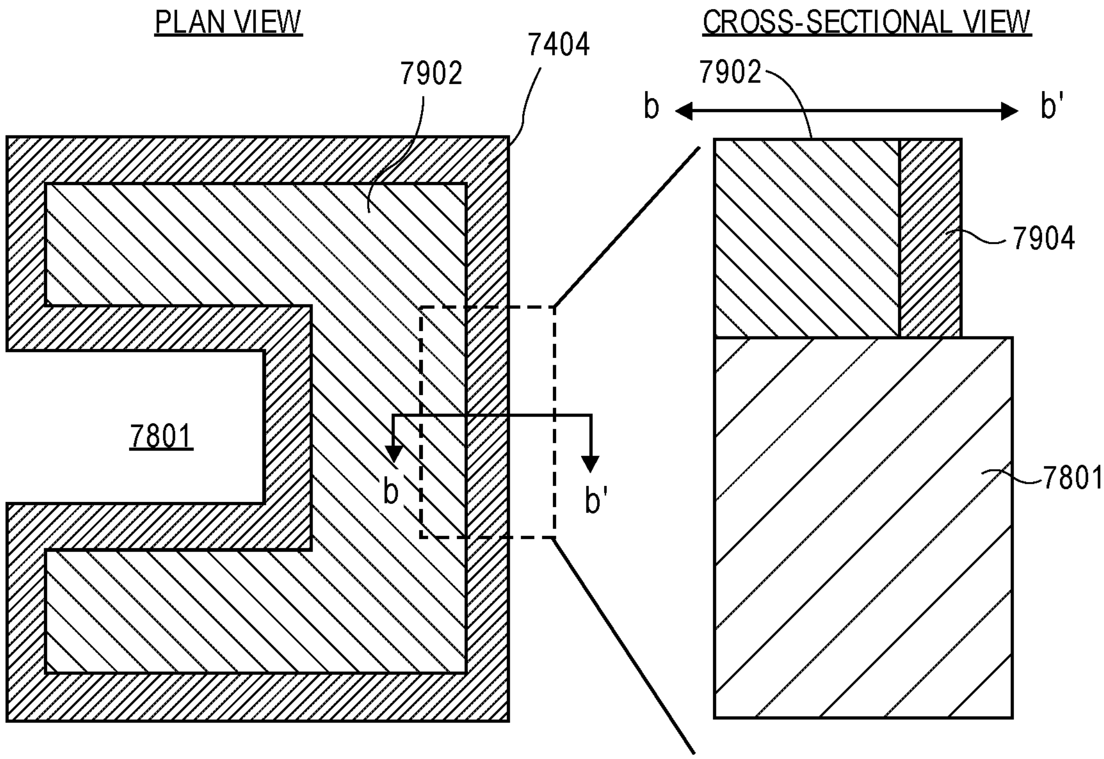
FIGS. 79-83 illustrate plan views and corresponding cross-sectional view representing various operations in a method of fabricating a fin-based thin film resistor structure, in accordance with an embodiment of the present disclosure.

Referring to FIG. 79, a plan view and corresponding cross-sectional view taken along the b-b' axis of the plan view illustrate a stage of a process flow following forming of a backbone template structure 7902 on a semiconductor substrate 7801. A sidewall spacer layer 7904 is then formed conformal with sidewall surfaces of the backbone template structure 7902. In an embodiment, following patterning of the backbone template structure 7902, conformal oxide material is deposited and then anisotropically etched (spacerized) to provide the sidewall spacer layer 7904.

Figure 80:
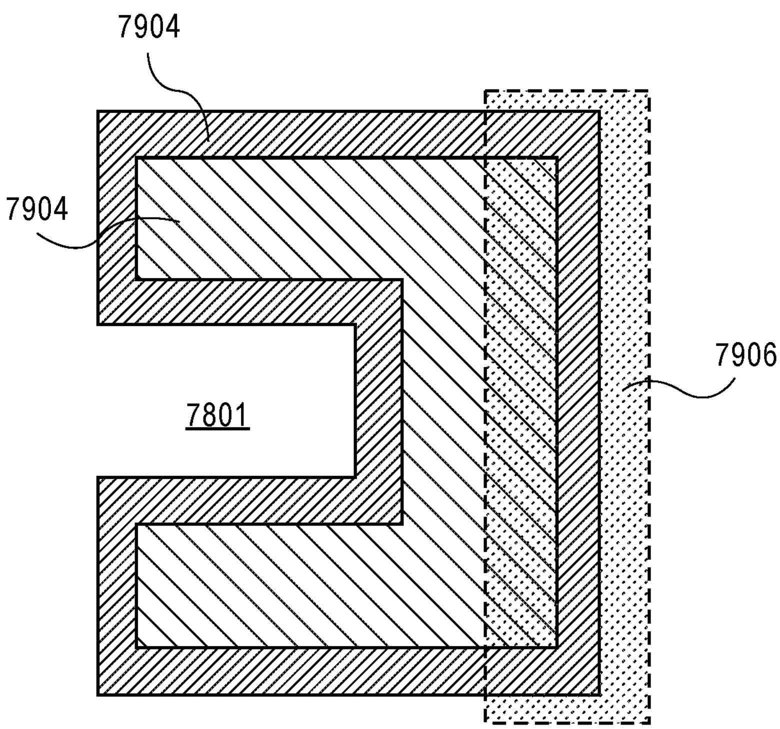

Referring to FIG. 80, a plan view illustrates a stage of the process flow following exposure of a region 7906 of the sidewall spacer layer 7904, e.g., by a lithographic masking and exposure process. The portions of the sidewall spacer layer 7904 included in region 7906 are then removed, e.g., by an etch process. The portions removed are those portions that will be used for ultimate fin definition.

Figure 81:
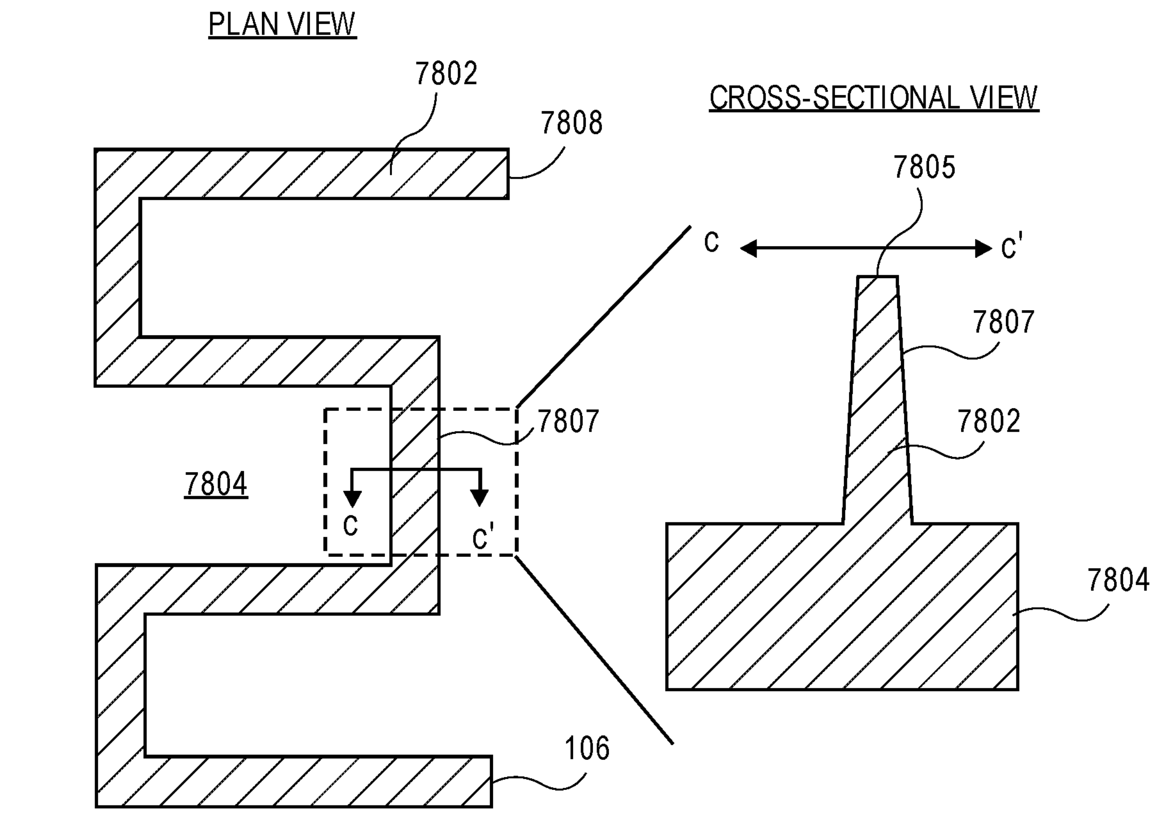

Referring to FIG. 81, a plan view and corresponding cross-sectional view taken along the c-c' axis of the plan view illustrate a stage of the process flow following removal of the portions of the sidewall spacer layer 7904 included in region 7906 of FIG. 80 to form a fin patterning mask (e.g., oxide fin patterning mask). The backbone template structure 7902 is then removed and the remaining patterning mask is used as an etch mask to pattern the substrate 7801. Upon patterning of the substrate 7801 and subsequent removal of the fin patterning mask, a semiconductor fin 7802 remains protruding from and continuous with a now patterned semiconductor substrate 7804. The semiconductor fin 7802 has a top surface 7805, a first end 7806, a second end 7808, and a pair of sidewalls 7807 between the first end and the second end, as described above in association with FIG. 78.

Figure 82:
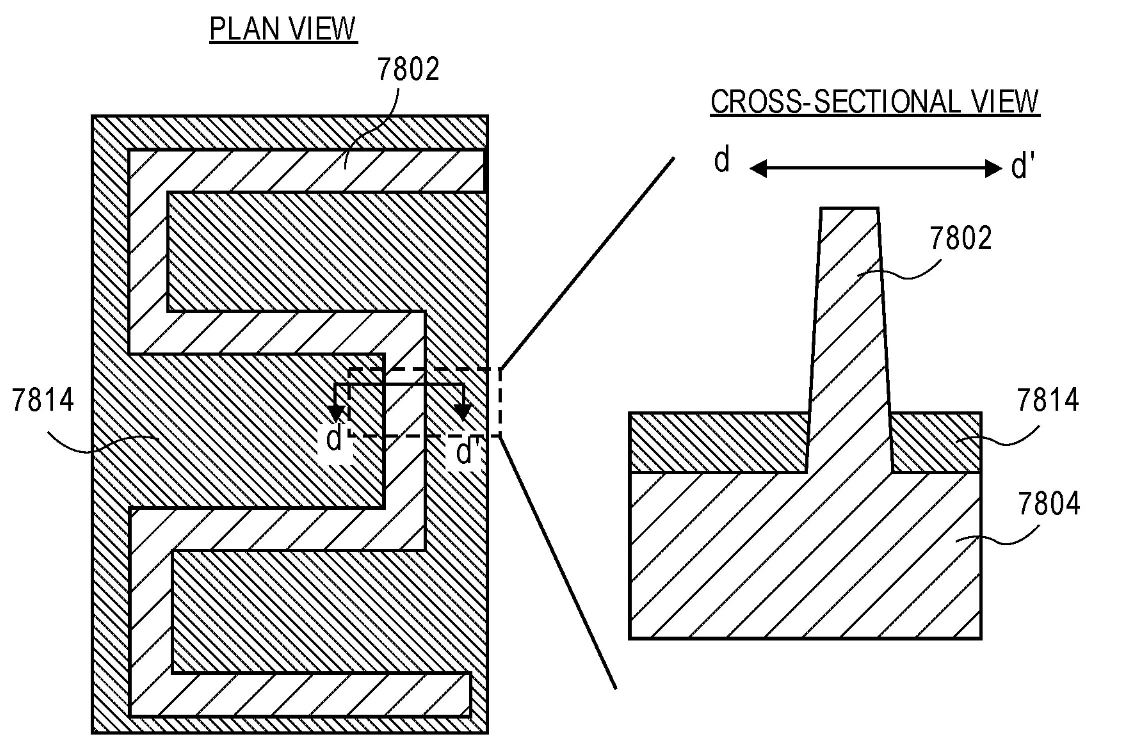

Referring to FIG. 82, a plan view and corresponding cross-sectional view taken along the d-d' axis of the plan view illustrate a stage of the process flow following formation of a trench isolation layer 7814. In an embodiment, the trench isolation layer 7814 is formed by depositing of an insulating material and subsequent recessing to define the fin height (Hsi) to define fin height.

Figure 83:
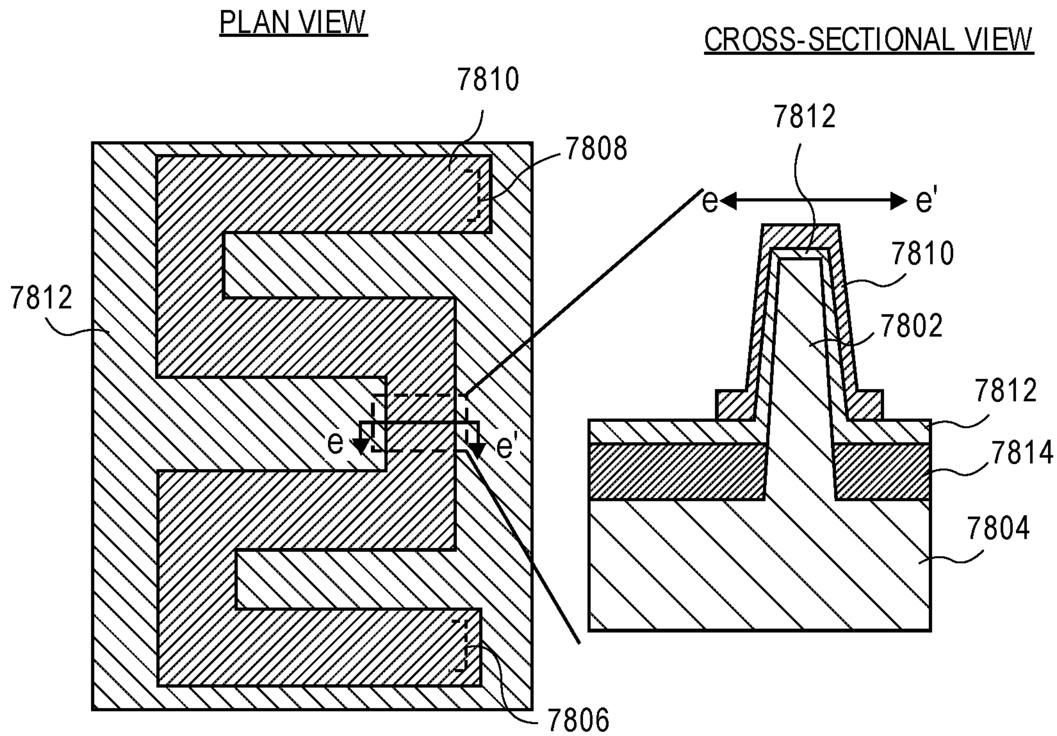

Referring to FIG. 83, a plan view and corresponding cross-sectional view taken along the e-e' axis of the plan view illustrate a stage of the process flow following formation of an isolation layer 7812. In an embodiment, the isolation layer 7812 is formed by a chemical vapor deposition (CVD) process. The isolation layer 7812 is formed conformal with the top surface (7805), the first end 7806, the second end 7808, and the pair of sidewalls (7807) of the semiconductor fin 7802. A metal resistor layer 7810 is then formed conformal with the isolation layer 7812 conformal with the top surface, the first end, the second end, and the pair of sidewalls of the semiconductor fin 7802.

In an embodiment, the metal resistor layer 7810 is formed using a blanket deposition and subsequent anisotropic etching process. In an embodiment, the metal resistor layer 7810 is formed using atomic layer deposition (ALD). In an embodiment, the metal resistor layer 7810 is formed to a thickness in the range of 2-5 nanometers. In an embodiment, the metal resistor layer 7810 is or includes a titanium nitride (TiN) layer or a tungsten (W) layer. In an embodiment, the metal resistor layer 7810 is formed to have a resistivity in the range of 100-100,000 ohms/square.

In a subsequent processing operation, a pair of anode or cathode electrodes may be formed and may be electrically connected to the metal resistor layer 7810 of the structure of FIG. 83. As an example, FIG. 84 illustrates a plan view of a fin-based thin film resistor structure with a variety of exemplary locations for anode or cathode electrode contacts, in accordance with an embodiment of the present disclosure.

Figure 84:
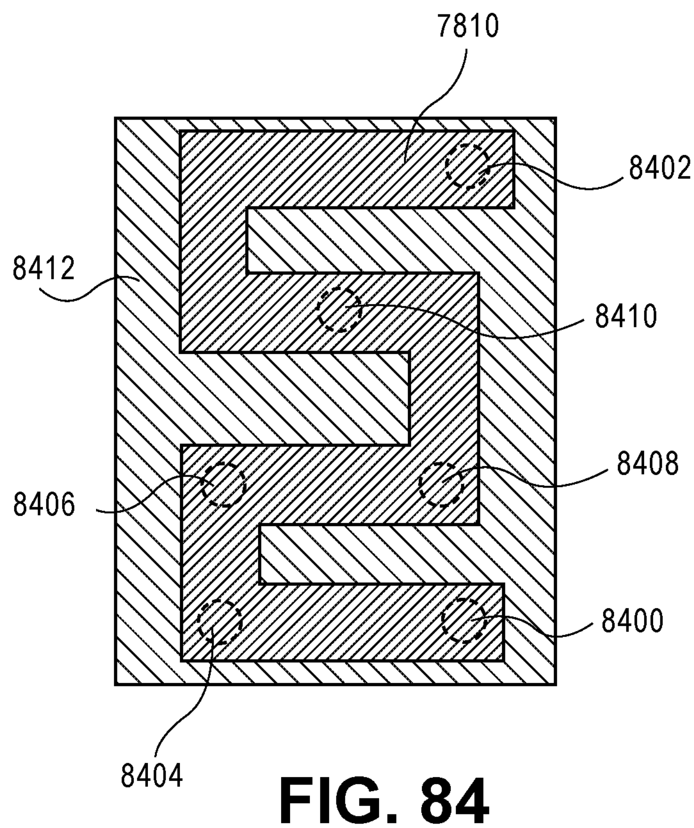
FIG. 84 illustrates a plan view of a fin-based thin film resistor structure with a variety of exemplary locations for anode or cathode electrode contacts, in accordance with an embodiment of the present disclosure.

Referring to FIG. 84, a first anode or cathode electrode, e.g., one of 8400, 8402, 8404, 8406, 8408, 8410, is electrically connected to the metal resistor layer 7810. A second anode or cathode electrode, e.g., another of 8400, 8402, 8404, 8406, 8408, 8410, is electrically connected to the metal resistor layer 7810. In an embodiment, the metal resistor layer 7810, the anode electrode, and the cathode electrode form a precision thin film resistor (TFR) passive device. The precision TFR passive device may be tunable in that the resistance can be selected based on the distance between the first anode or cathode electrode and the second anode or cathode electrode. The options may be provided by forming a variety of actual electrodes, e.g., 8400, 8402, 8404, 8406, 8408, 8410 and other possibilities, and then selecting the actual pairing based on interconnecting circuitry. Alternatively, a single anode or cathode pairing may be formed, with the locations for each selected during fabrication of the TFR device. In either case, in an embodiment, the location for one of the anode or cathode electrodes is at an end of the fin 7802 (e.g., at location 8400 or 8402), is at a corner of the fin 7802 (e.g., at location 8404, 8406 or 8408), or in a center of a transition between corners (e.g., at location 8410).

In an exemplary embodiment, the first anode or cathode electrode is electrically connected to the metal resistor layer 7810 proximate to the first end 7806, e.g., at location 8400, of the semiconductor fin 7802. The second anode or cathode electrode is electrically connected to the metal resistor layer 7810 proximate to the second end 7808, e.g., at location 8402, of the semiconductor fin 7802.

In another exemplary embodiment, the first anode or cathode electrode is electrically connected to the metal resistor layer 7810 proximate to the first end 7806, e.g., at location 8400, of the semiconductor fin 7802. The second anode or cathode electrode is electrically connected to the metal resistor layer 7810 distal from the second end 7808, e.g., at location 8410, 8408, 8406 or 8404, of the semiconductor fin 7802.

In another exemplary embodiment, the first anode or cathode electrode is electrically connected to the metal resistor layer 7810 distal from the first end 7806, e.g., at location 8404 or 8406, of the semiconductor fin 7802. The second anode or cathode electrode is electrically connected to the metal resistor layer 7810 distal from the second end 7808, e.g., at location 8410 or 8408, of the semiconductor fin 7802.

More specifically, in accordance with one or more embodiments of the present disclosure, a topographical feature of a fin-based transistor architecture is used as a foundation for fabricating an embedded resistor. In one embodiment, a precision resistor is fabricated on a fin structure. In a specific embodiment, such an approach enables very high density integration of a passive component such as a precision resistor.

It is to be appreciated that a variety of fin geometries are suitable for fabricating a fin-based precision resistor. FIGS. 85A-85D illustrate plan views of various fin geometries for fabricating a fin-based precision resistor, in accordance with an embodiment of the present disclosure.

Figure 85A:
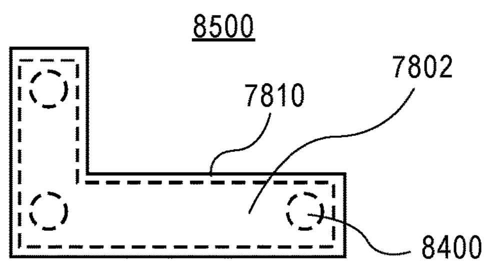
FIGS. 85A-85D illustrate plan views of various fin geometries for fabricating a fin-based precision resistor, in accordance with an embodiment of the present disclosure.
Figure 85B:
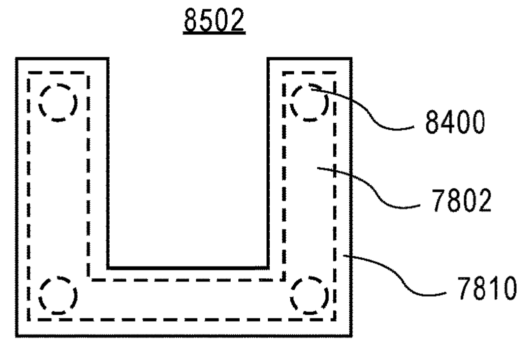
Figure 85C:
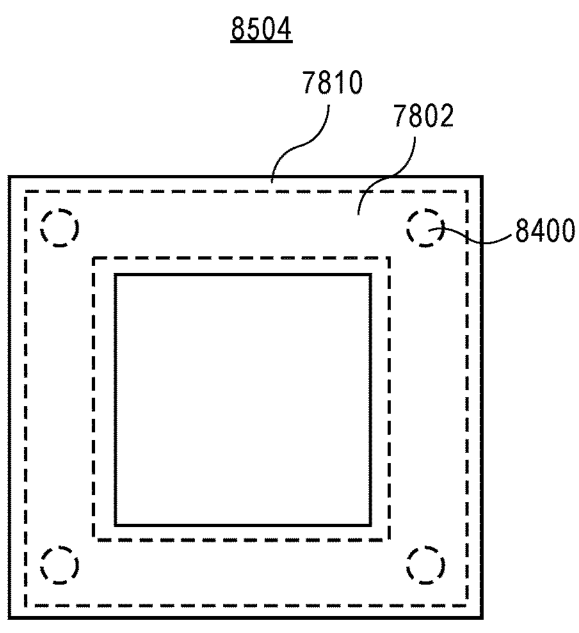

In an embodiment, referring to FIGS. 85A-85C, a semiconductor fin 7802 is a non-linear semiconductor fin. In one embodiment, the semiconductor fin 7802 protrudes through a trench isolation region above a substrate. A metal resistor layer 7810 is conformal with an isolation layer (not shown) conformal with the non-linear semiconductor fin 7802. In one embodiment, two or more anode or cathode electrodes 8400 are electrically connected to the metal resistor layer 7810, with exemplary optional locations shown by the dashed circles in FIGS. 85A-85C.

A non-linear fin geometry includes one or more corners, such as, but not limited to, a single corner (e.g., L-shaped), two corners (e.g., U-shaped), four corners (e.g., S-shaped), or six corners (e.g., the structure of FIG. 78). In an embodiment, the non-linear fin geometry is an open structure geometry. In another embodiment, the non-linear fin geometry is a closed structure geometry.

As exemplary embodiments of an open structure geometry for a non-linear fin geometry, FIG. 85A illustrates a non-linear fin having one corner to provide an open structure L-shaped geometry. FIG. 85B illustrates a non-linear fin having two corners to provide an open structure U-shaped geometry. In the case of an open structure, the non-linear semiconductor fin 7802 has a top surface, a first end, a second end, and a pair of sidewalls between the first end and the second end. A metal resistor layer 7810 is conformal with an isolation layer (not shown) conformal with the top surface, the first end, the second end, and the pair of sidewalls between the first end and the second end.

In a specific embodiment, referring again to FIGS. 85A and 85B, a first anode or cathode electrode is electrically connected to the metal resistor layer 7810 proximate to a first end of an open structure non-linear semiconductor fin, and a second anode or cathode electrode is electrically connected to the metal resistor layer 7810 proximate to a second end of the open structure non-linear semiconductor fin. In another specific embodiment, a first anode or cathode electrode is electrically connected to the metal resistor layer 7810 proximate to a first end of an open structure non-linear semiconductor fin, and a second anode or cathode electrode is electrically connected to the metal resistor layer 7810 distal from a second end of the open structure non-linear semiconductor fin. In another specific embodiment, a first anode or cathode electrode is electrically connected to the metal resistor layer 7810 distal from a first end of an open structure non-linear semiconductor fin, and a second anode or cathode electrode is electrically connected to the metal resistor layer 7810 distal from a second end of the open structure non-linear semiconductor fin.

As an exemplary embodiment of a closed structure geometry for a non-linear fin geometry, FIG. 85C illustrates a non-linear fin having four corners to provide a closed structure square-shaped or rectangular-shaped geometry. In the case of a closed structure, the non-linear semiconductor fin 7802 has a top surface and a pair of sidewalls and, in particular, an inner sidewall and an outer sidewall. However, the closed structure does not include exposed first and second ends. A metal resistor layer 7810 is conformal with an isolation layer (not shown) conformal with the top surface, the inner sidewall, and the outer sidewall of the fin 7802.

Figure 85D:
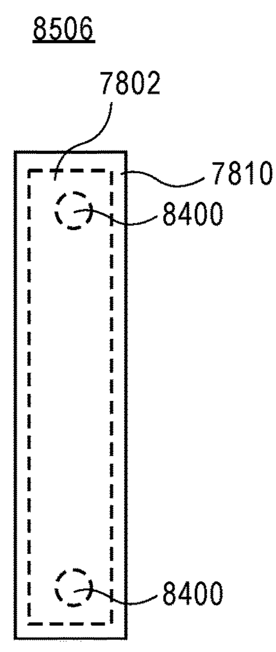

In another embodiment, referring to FIG. 85D, a semiconductor fin 7802 is a linear semiconductor fin. In one embodiment, the semiconductor fin 7802 protrudes through a trench isolation region above a substrate. A metal resistor layer 7810 is conformal with an isolation layer (not shown) conformal with the linear semiconductor fin 7802. In one embodiment, two or more anode or cathode electrodes 8400 are electrically connected to the metal resistor layer 7810, with exemplary optional locations shown by the dashed circles in FIG. 85D.

In another aspect, in accordance with an embodiment of the present disclosure, new structures for high resolution phase shift masks (PSM) fabrication for lithography are described. Such PSM masks may be used for general (direct) lithography or complementary lithography.

Photolithography is commonly used in a manufacturing process to form patterns in a layer of photoresist. In the photolithography process, a photoresist layer is deposited over an underlying layer that is to be etched. Typically, the underlying layer is a semiconductor layer, but may be any type of hardmask or dielectric material. The photoresist layer is then selectively exposed to radiation through a photomask or reticle. The photoresist is then developed and those portions of the photoresist that are exposed to the radiation are removed, in the case of "positive" photoresist.

The photomask or reticle used to pattern the wafer is placed within a photolithography exposure tool, commonly known as a "stepper" or "scanner." In the stepper or scanner machine, the photomask or reticle is placed between a radiation source and a wafer. The photomask or reticle is typically formed from patterned chrome (absorber layer) placed on a quartz substrate. The radiation passes substantially unattenuated through the quartz sections of the photomask or reticle in locations where there is no chrome. In contrast, the radiation does not pass through the chrome portions of the mask. Because radiation incident on the mask either completely passes through the quartz sections or is completely blocked by the chrome sections, this type of mask is referred to as a binary mask. After the radiation selectively passes through the mask, the pattern on the mask is transferred into the photoresist by projecting an image of the mask into the photoresist through a series of lenses.

As features on the photomask or reticle become closer and closer together, diffraction effects begin to take effect when the size of the features on the mask are comparable to the wavelength of the light source. Diffraction blurs the image projected onto the photoresist, resulting in poor resolution.

One approach for preventing diffraction patterns from interfering with the desired patterning of the photoresist is to cover selected openings in the photomask or reticle with a transparent layer known as a shifter. The shifter shifts one of the sets of exposing rays out of phase with another adjacent set, which nullifies the interference pattern from diffraction. This approach is referred to as a phase shift mask (PSM) approach. Nevertheless, alternative mask fabrication schemes that reduce defects and increase throughput in mask production are important focus areas of lithography process development.

One or more embodiments of the present disclosure are directed to methods for fabricating lithographic masks and the resulting lithographic masks. To provide context, the requirement to meet aggressive device scaling goals set forth by the semiconductor industry harbors on the ability of lithographic masks to pattern smaller features with high fidelity. However, approaches to pattern smaller and smaller features present formidable challenges for mask fabrication. In this regard, lithographic masks widely in use today rely on the concept of phase shift mask (PSM) technology to pattern features. However, reducing defects while creating smaller and smaller patterns remains one of the biggest obstacles in mask fabrication. Use of the phase shift mask may have several disadvantages. First, the design of a phase shift mask is a relatively complicated procedure that requires significant resources. Second, because of the nature of a phase shift mask, it is difficult to check whether or not defects are present in the phase shift mask. Such defects in phase shift masks arise out of the current integration schemes employed to produce the mask itself. Some phase shift masks adopt a cumbersome and somewhat defect prone approach to pattern thick light absorbing materials and then transfer the pattern to a secondary layer that aids in the phase shifting. To complicate matters, the absorber layer is subjected to plasma etch twice and, consequently, unwanted effects of plasma etch such as loading effects, reactive ion etch lag, charging and reproducible effects leads to defects in mask production.

Innovation in materials and novel integration techniques to fabricate defect free lithographic masks remains a high priority to enable device scaling. Accordingly, in order to exploit the full benefits of a phase shift mask technology, a novel integration scheme that employs (i) patterning a shifter layer with high fidelity and (ii) patterning an absorber only once and during the final stages of fabrication may be needed. Additionally, such a fabrication scheme may also offer other advantages such as flexibility in material choices, decreased substrate damage during fabrication, and increased throughput in mask fabrication.

Figure 86:
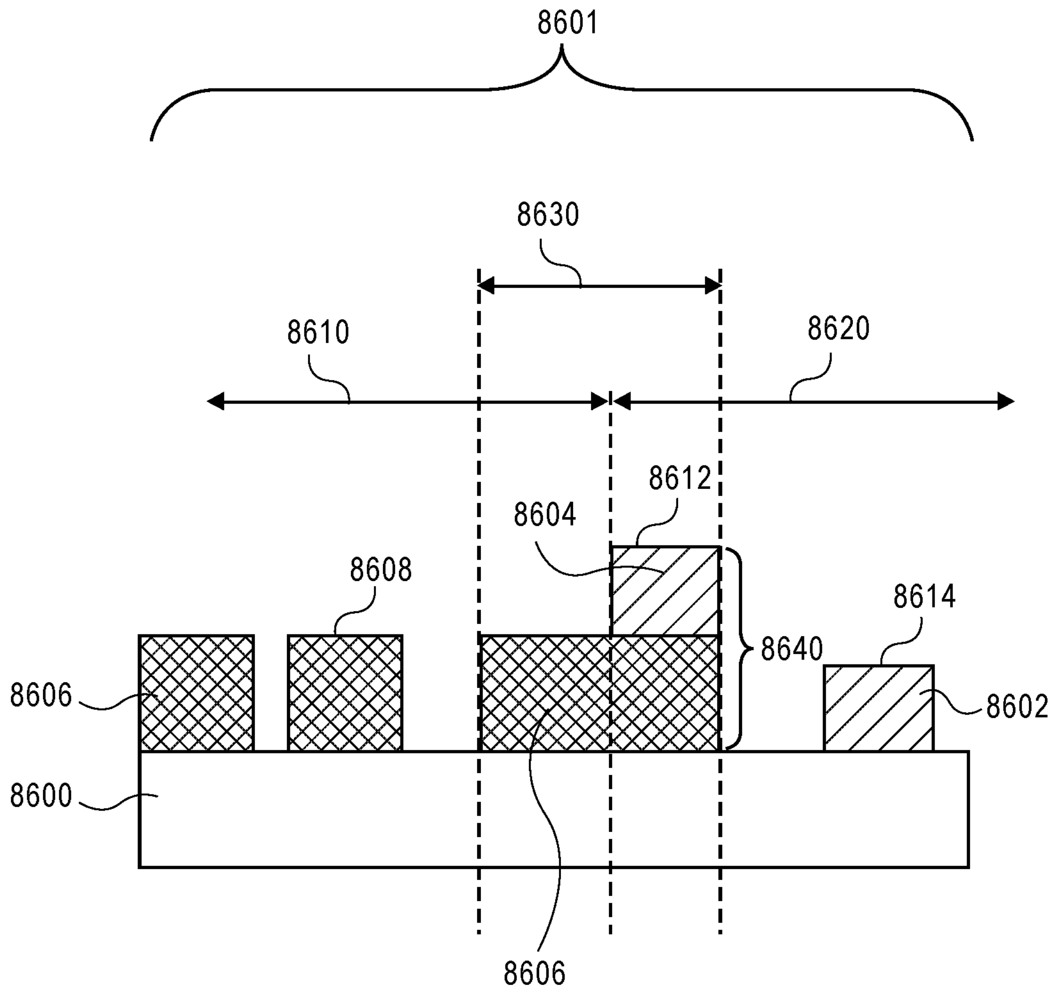
FIG. 86 illustrates a cross sectional view of a lithography mask structure, in accordance with an embodiment of the present disclosure.

FIG. 86 illustrates a cross sectional view of a lithography mask structure 8601 in accordance with an embodiment of the present disclosure. The lithography mask 8601 includes an in-die region 8610, a frame region 8620 and a die-frame interface region 8630. The die-frame interface region 8630 includes adjacent portions of the in-die region 8610 and the frame region 8620. The in-die region 8610 includes a patterned shifter layer 8606 disposed directly on a substrate 8600, wherein the patterned shifter layer has features that have sidewalls. The frame region 8620 surrounds the in-die region 8610 and includes a patterned absorber layer 8602 disposed directly on the substrate 8600.

The die-frame interface region 8630, disposed on substrate 8600, includes a dual layer stack 8640. The dual layer stack 8640 includes an upper layer 8604, disposed on the lower patterned shifter layer 8606. The upper layer 8604 of the dual layer stack 8640 is composed of a same material as the patterned absorber layer 8602 of the frame region 8620.

In an embodiment, an uppermost surface 8608 of the features of the patterned shifter layer 8606 have a height that is different than an uppermost surface 8612 of features of the die-frame interface region and different than an uppermost surface 8614 of the features in the frame region. Furthermore, in an embodiment the height of the uppermost surface 8612 of the features of the die-frame interface region is different than the height of the uppermost surface 8614 of the features of the frame region. Typical thickness of the phase shifter layer 8606 ranges from 40-100 nm, while a typical thickness of the absorber layer ranges from 30-100 nm. In an embodiment, the thickness of the absorber layer 8602 in the frame region 8620 is 50 nm, the combined thickness of the absorber layer 8604 which is disposed on the shifter layer 8606 in the die-frame interface region 8630 is 120 nm and the thickness of the absorber in the frame region is 70 nm. In an embodiment, the substrate 8600 is quartz, the patterned shifter layer includes a material such as but not limited to molybdenum-silicide, molybdenum-silicon oxynitride, molybdenum-silicon nitride, silicon oxynitride, or silicon nitride, and the absorber material is chrome.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 87:
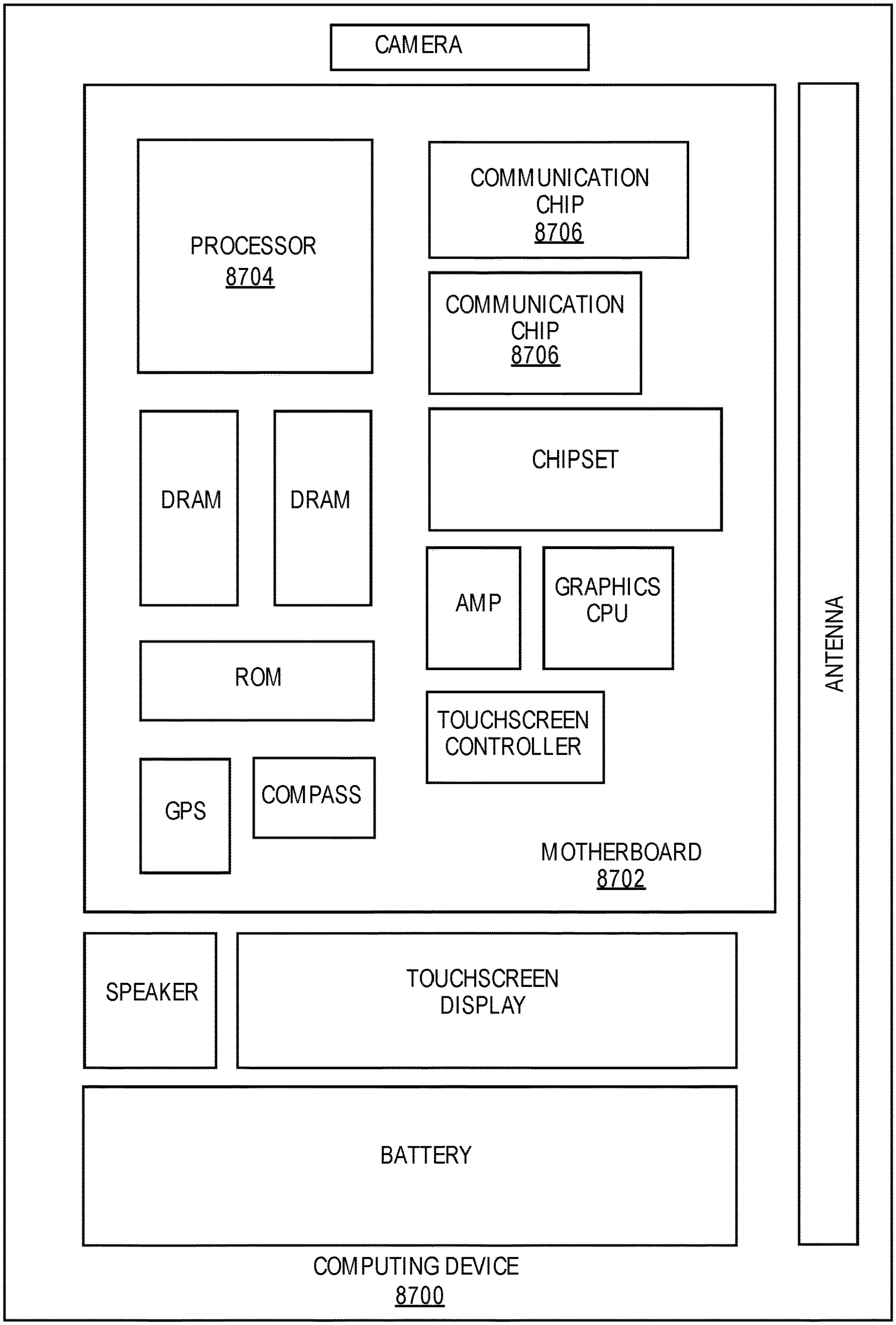
FIG. 87 illustrates a computing device in accordance with one implementation of the disclosure.

FIG. 87 illustrates a computing device 8700 in accordance with one implementation of the disclosure. The computing device 8700 houses a board 8702. The board 8702 may include a number of components, including but not limited to a processor 7904 and at least one communication chip 8706. The processor 8704 is physically and electrically coupled to the board 8702. In some implementations the at least one communication chip 8706 is also physically and electrically coupled to the board 8702. In further implementations, the communication chip 8706 is part of the processor 8704.

Depending on its applications, computing device 8700 may include other components that may or may not be physically and electrically coupled to the board 8702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 8706 enables wireless communications for the transfer of data to and from the computing device 8700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 8706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 8700 may include a plurality of communication chips 8706. For instance, a first communication chip 8706 may be dedicated to shorter range wireless communications such as Wi-Fi and Bluetooth and a second communication chip 8706 may be dedicated to longer range wireless communications such as GPS, EDGE, GPRS, CDMA, WiMAX, LTE, Ev-DO, and others.

The processor 8704 of the computing device 8700 includes an integrated circuit die packaged within the processor 8704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 8706 also includes an integrated circuit die packaged within the communication chip 8706. In accordance with another implementation of the disclosure, the integrated circuit die of the communication chip is built in accordance with implementations of the disclosure.

In further implementations, another component housed within the computing device 8700 may contain an integrated circuit die built in accordance with implementations of embodiments of the disclosure.

In various embodiments, the computing device 8700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 8700 may be any other electronic device that processes data.

Figure 88:
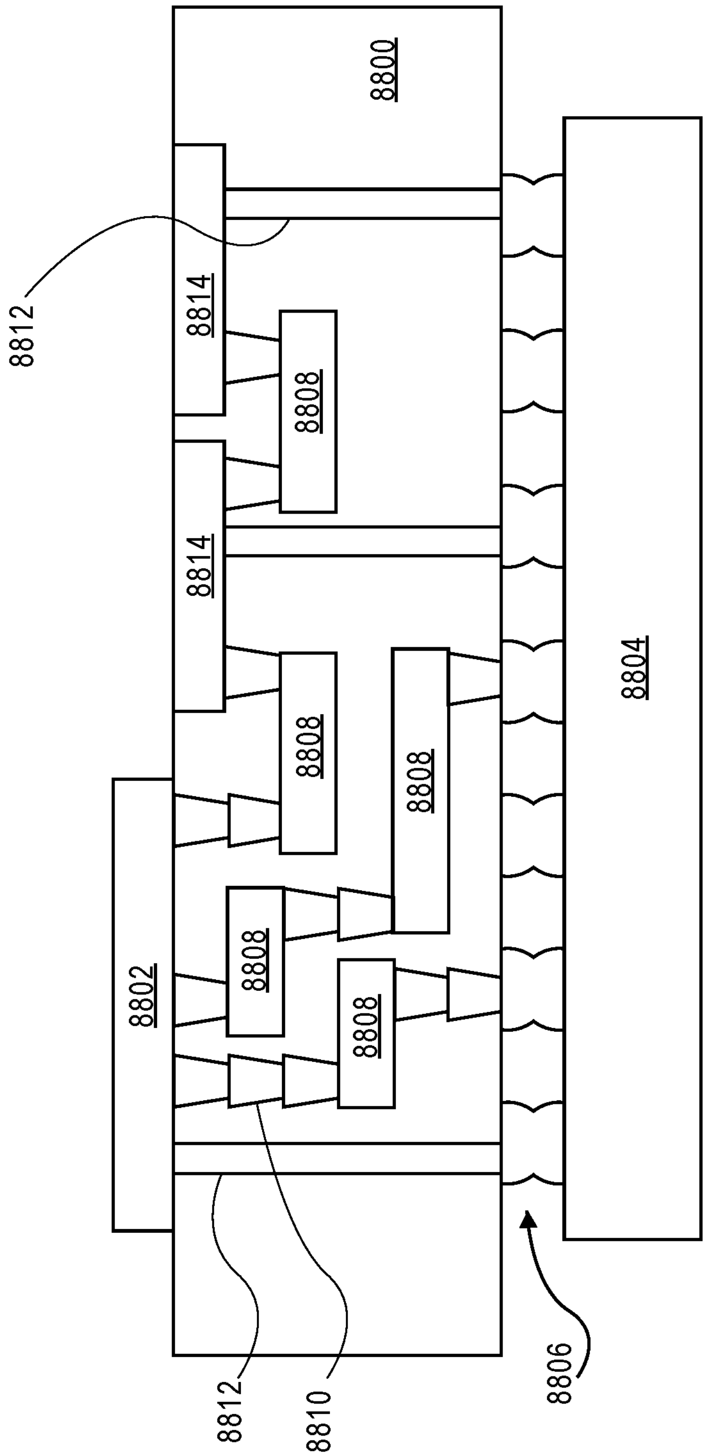
FIG. 88 illustrates an interposer that includes one or more embodiments of the disclosure.

FIG. 88 illustrates an interposer 8800 that includes one or more embodiments of the disclosure. The interposer 8800 is an intervening substrate used to bridge a first substrate 8802 to a second substrate 8804. The first substrate 8802 may be, for instance, an integrated circuit die. The second substrate 8804 may be, for instance, a memory module, a computer motherboard, or another integrated circuit die. Generally, the purpose of an interposer 8800 is to spread a connection to a wider pitch or to reroute a connection to a different connection. For example, an interposer 8800 may couple an integrated circuit die to a ball grid array (BGA) 8806 that can subsequently be coupled to the second substrate 8804. In some embodiments, the first and second substrates 8802/8804 are attached to opposing sides of the interposer 8800. In other embodiments, the first and second substrates 8802/8804 are attached to the same side of the interposer 8800. And in further embodiments, three or more substrates are interconnected by way of the interposer 8800.

The interposer 8800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 8808 and vias 8810, including but not limited to through-silicon vias (TSVs) 8812. The interposer 8800 may further include embedded devices 8814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 8000. In accordance with embodiments of the disclosure, apparatuses or processes disclosed herein may be used in the fabrication of interposer 8800 or in the fabrication of components included in the interposer 8800.

Figure 89:
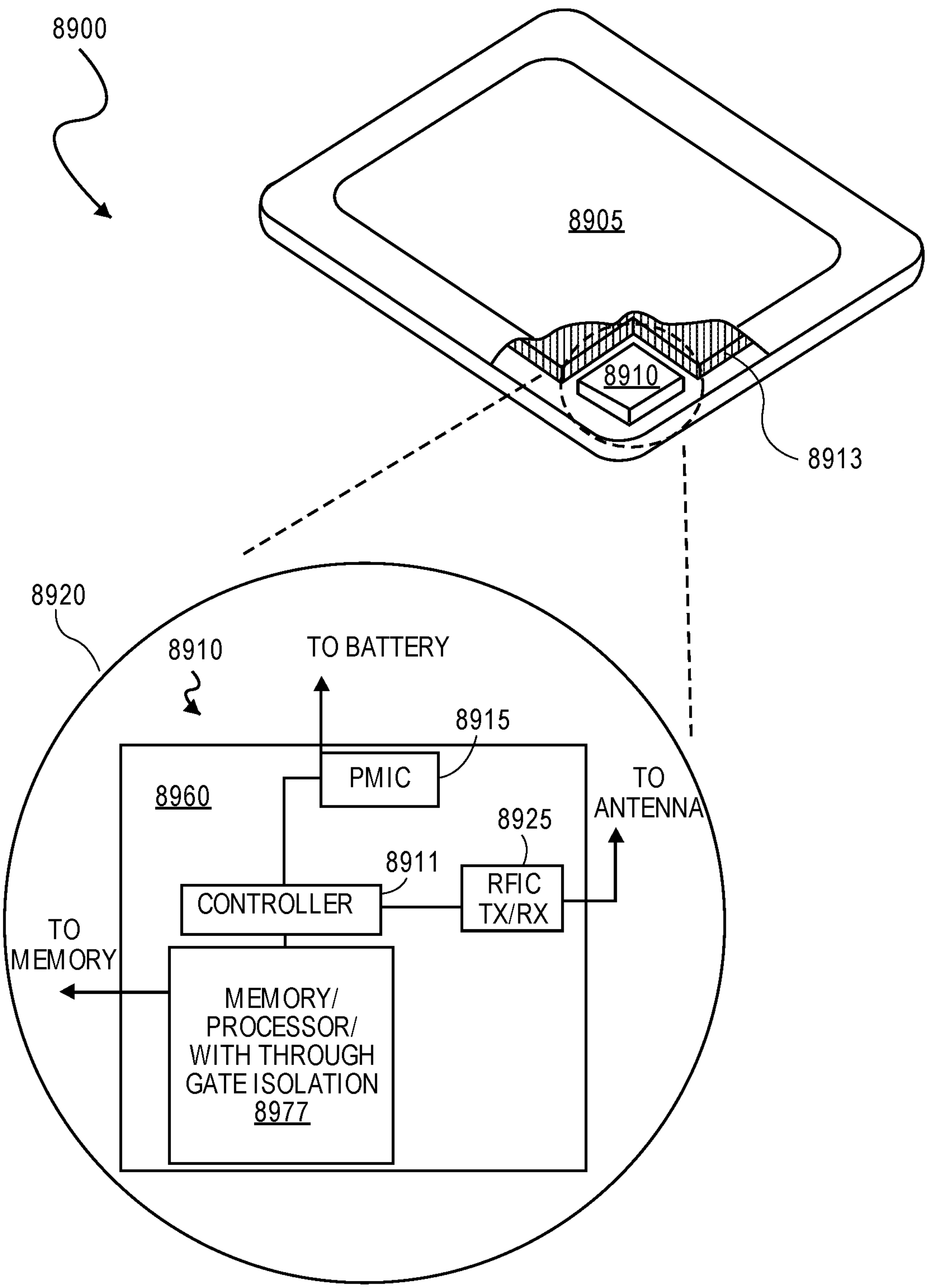
FIG. 89 is an isometric view of a mobile computing platform employing an IC fabricated according to one or more processes described herein or including one or more features described herein, in accordance with an embodiment of the present disclosure.

FIG. 89 is an isometric view of a mobile computing platform 8900 employing an integrated circuit (IC) fabricated according to one or more processes described herein or including one or more features described herein, in accordance with an embodiment of the present disclosure.

The mobile computing platform 8900 may be any portable device configured for each of electronic data display, electronic data processing, and wireless electronic data transmission. For example, mobile computing platform 8900 may be any of a tablet, a smart phone, laptop computer, etc. and includes a display screen 8905 which in the exemplary embodiment is a touchscreen (capacitive, inductive, resistive, etc.), a chip-level (SoC) or package-level integrated system 8910, and a battery 8913. As illustrated, the greater the level of integration in the system 8910 enabled by higher transistor packing density, the greater the portion of the mobile computing platform 8900 that may be occupied by the battery 8913 or non-volatile storage, such as a solid state drive, or the greater the transistor gate count for improved platform functionality. Similarly, the greater the carrier mobility of each transistor in the system 8910, the greater the functionality. As such, techniques described herein may enable performance and form factor improvements in the mobile computing platform 8900.

The integrated system 8910 is further illustrated in the expanded view 8920. In the exemplary embodiment, packaged device 8977 includes at least one memory chip (e.g., RAM), or at least one processor chip (e.g., a multi-core microprocessor and/or graphics processor) fabricated according to one or more processes described herein or including one or more features described herein. The packaged device 8977 is further coupled to the board 8960 along with one or more of a power management integrated circuit (PMIC) 8915, RF (wireless) integrated circuit (RFIC) 8925 including a wideband RF (wireless) transmitter and/or receiver (e.g., including a digital baseband and an analog front end module further comprises a power amplifier on a transmit path and a low noise amplifier on a receive path), and a controller thereof 8911. Functionally, the PMIC 8915 performs battery power regulation, DC-to-DC conversion, etc., and so has an input coupled to the battery 8913 and with an output providing a current supply to all the other functional modules. As further illustrated, in the exemplary embodiment, the RFIC 8925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 8977 or within a single IC (SoC) coupled to the package substrate of the packaged device 8977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 90:
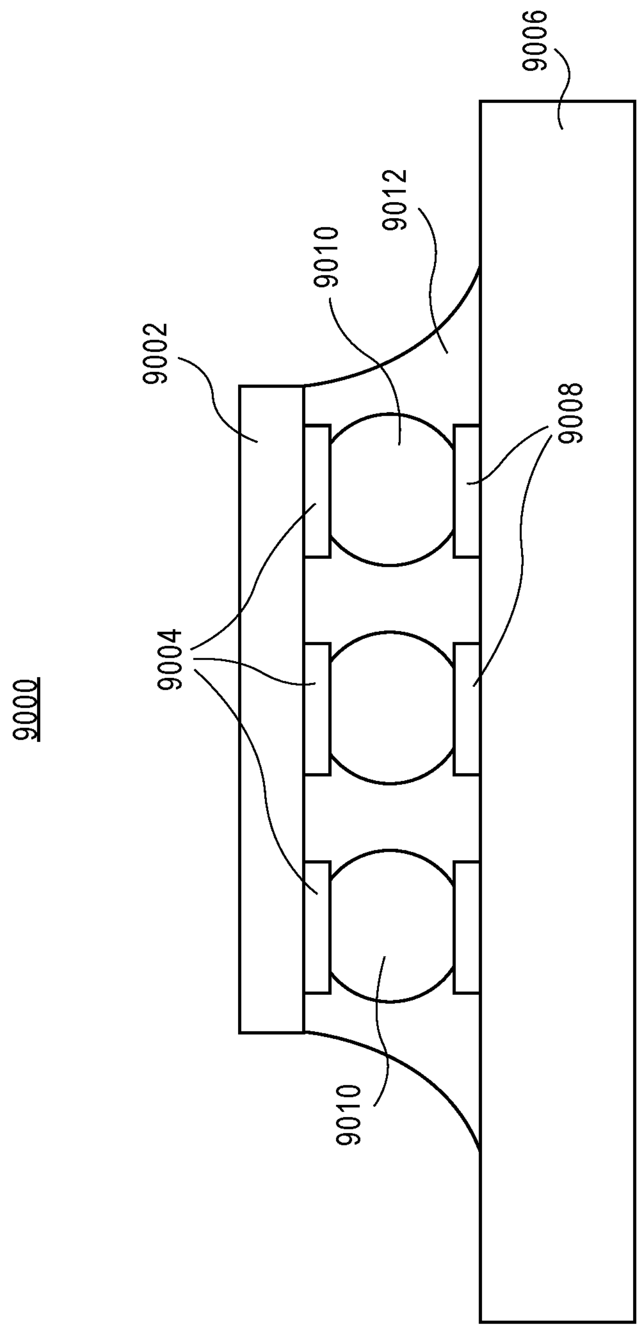
FIG. 90 illustrates a cross-sectional view of a flip-chip mounted die, in accordance with an embodiment of the present disclosure.

FIG. 90 illustrates a cross-sectional view of a flip-chip mounted die, in accordance with an embodiment of the present disclosure.

Referring to FIG. 90, an apparatus 9000 includes a die 9002 such as an integrated circuit (IC) fabricated according to one or more processes described herein or including one or more features described herein, in accordance with an embodiment of the present disclosure. The die 9002 includes metallized pads 9004 thereon. A package substrate 9006, such as a ceramic or organic substrate, includes connections 9008 thereon. The die 9002 and package substrate 9006 are electrically connected by solder balls 9010 coupled to the metallized pads 9004 and the connections 9008. An underfill material 9012 surrounds the solder balls 9010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An integrated circuit structure includes a fin comprising silicon. A plurality of gate structures is over the fin, individual ones of the plurality of gate structures along a direction orthogonal to the fin and having a pair of dielectric sidewall spacers. A trench contact structure is over the fin and directly between the dielectric sidewalls spacers of a first pair of the plurality of gate structures. A contact plug is over the fin and directly between the dielectric sidewalls spacers of a second pair of the plurality of gate structures, the contact plug comprising a lower dielectric material and an upper hardmask material.

Example Embodiment 2

The integrated circuit structure of example embodiment 1, wherein the lower dielectric material of the contact plug comprises silicon and oxygen, and the upper hardmask material of the contact plug comprises silicon and nitrogen.

Example Embodiment 3

The integrated circuit structure of example embodiment 1 or 2, wherein the trench contact structure comprises a lower conductive structure and a dielectric cap on the lower conductive structure.

Example Embodiment 4

The integrated circuit structure of example embodiment 3, wherein the dielectric cap of the trench contact structure has an upper surface co-planar with an upper surface of the upper hardmask material of the contact plug.

Example Embodiment 5

The integrated circuit structure of example embodiment 1, 2, 3 or 4, wherein individual ones of the plurality of gate structures comprise a gate electrode on a gate dielectric layer, and a dielectric cap on the gate electrode.

Example Embodiment 6

The integrated circuit structure of example embodiment 5, wherein the dielectric cap of the individual ones of the plurality of gate structures has an upper surface co-planar with an upper surface of the upper hardmask material of the contact plug.

Example Embodiment 7

The integrated circuit structure of example embodiment 1, 2, 3, 4, 5 or 6, wherein the fin is continuous with a bulk crystalline silicon substrate.

Example Embodiment 8

An integrated circuit structure includes a plurality of fins comprising silicon, individual ones of the plurality of fins along a first direction. A plurality of gate structures is over the plurality of fins, individual ones of the plurality of gate structures along a second direction orthogonal to the first direction, and individual ones of the plurality of gate structures having a pair of dielectric sidewall spacers. A trench contact structure is over a first fin of the plurality of fins and directly between the dielectric sidewalls spacers of a pair of the gate structures. A contact plug is over a second fin of the plurality of fins and directly between the dielectric sidewalls spacers of the pair of the plurality of gate structures, the contact plug comprising a lower dielectric material and an upper hardmask material.

Example Embodiment 9

The integrated circuit structure of example embodiment 8, wherein the lower dielectric material of the contact plug comprises silicon and oxygen, and the upper hardmask material of the contact plug comprises silicon and nitrogen.

Example Embodiment 10

The integrated circuit structure of example embodiment 8 or 9, wherein the trench contact structure comprises a lower conductive structure and a dielectric cap on the lower conductive structure.

Example Embodiment 11

The integrated circuit structure of example embodiment 10, wherein the dielectric cap of the trench contact structure has an upper surface co-planar with an upper surface of the upper hardmask material of the contact plug.

Example Embodiment 12

The integrated circuit structure of example embodiment 8, 9, 10 or 11, wherein individual ones of the plurality of gate structures comprise a gate electrode on a gate dielectric layer, and a dielectric cap on the gate electrode.

Example Embodiment 13

The integrated circuit structure of example embodiment 12, wherein the dielectric cap of the individual ones of the plurality of gate structures has an upper surface co-planar with an upper surface of the upper hardmask material of the contact plug.

Example Embodiment 14

The integrated circuit structure of example embodiment 8, 9, 10, 11, 12 or 13, wherein the pluarlity of fins is continuous with a bulk crystalline silicon substrate.

Example Embodiment 15

A method of fabricating an integrated circuit structure includes forming a plurality of fins, individual ones of the plurality of fins along a first direction. The method also includes forming a plurality of gate structures over the plurality of fins, individual ones of the plurality of gate structures along a second direction orthogonal to the first direction. The method also includes forming a sacrificial material structure between a first pair of the plurality of gate structures. The method also includes forming a contact plug between a second pair of the gate structures, the contact plug comprising a lower dielectric material and an upper hardmask material. The method also includes removing the sacrificial material structure to form an opening between the first pair of the plurality of gate structures. The method also includes forming a trench contact structure in the opening between the first pair of the plurality of gate structures.

Example Embodiment 16

The method of example embodiment 15, wherein the lower dielectric material of the contact plug comprises silicon and oxygen, and the upper hardmask material of the contact plug comprises silicon and nitrogen.

Example Embodiment 17

The method of example embodiment 15 or 16, wherein the trench contact structure comprises a lower conductive structure and a dielectric cap on the lower conductive structure.

Example Embodiment 18

The method of example embodiment 17, wherein the dielectric cap of the trench contact structure has an upper surface co-planar with an upper surface of the upper hardmask material of the contact plug.

Example Embodiment 19

The method of example embodiment 15, 16, 17 or 18, wherein individual ones of the plurality of gate structures comprise a gate electrode on a gate dielectric layer, and a dielectric cap on the gate electrode.

Example Embodiment 20

The method of example embodiment 19, wherein the dielectric cap of the individual ones of the plurality of gate structures has an upper surface co-planar with an upper surface of the upper hardmask material of the contact plug.

What is claimed is:

1. A method of fabricating an integrated circuit structure, the method comprising:

forming a plurality of fins, individual ones of the plurality of fins along a first direction;

forming a plurality of gate structures over the plurality of fins, individual ones of the plurality of gate structures along a second direction orthogonal to the first direction;

forming a sacrificial material structure between a first pair of the plurality of gate structures;

forming a contact plug between a second pair of the gate structures, the contact plug comprising a lower dielectric material and an upper hardmask material, wherein the upper hardmask material has a flat uppermost surface and a rounded lowermost surface;

removing the sacrificial material structure to form an opening between the first pair of the plurality of gate structures; and forming a trench contact structure in the opening between the first pair of the plurality of gate structures.

2. The method of claim 1, wherein the lower dielectric material of the contact plug comprises silicon and oxygen, and the upper hardmask material of the contact plug comprises silicon and nitrogen.

3. The method of claim 1, wherein the trench contact structure comprises a lower conductive structure and a dielectric cap on the lower conductive structure.

4. The method of claim 3, wherein the dielectric cap of the trench contact structure has an upper surface co-planar with an upper surface of the upper hardmask material of the contact plug.

5. The method of claim 1, wherein individual ones of the plurality of gate structures comprise a gate electrode on a gate dielectric layer, and a dielectric cap on the gate electrode.

6. The method of claim 5, wherein the dielectric cap of the individual ones of the plurality of gate structures has an upper surface co-planar with an upper surface of the upper hardmask material of the contact plug.

7. A method of fabricating an integrated circuit structure, the method comprising:

forming a plurality of fins, individual ones of the plurality of fins along a first direction;

forming a plurality of gate structures over the plurality of fins, individual ones of the plurality of gate structures along a second direction orthogonal to the first direction;

forming a sacrificial material structure between a first pair of the plurality of gate structures;

forming a dielectric material between a second pair of the gate structures;

annealing the dielectric material to form a recessed dielectric material having an upper surface below an upper surface of the plurality of gate structures;

forming a hardmask layer;

patterning the hardmask layer to form a patterned hardmask layer on the recessed dielectric material, the patterned hardmask layer having an upper surface above the upper surface of the plurality of gate structures;

removing the sacrificial material structure to form an opening between the first pair of the plurality of gate structures;

forming a trench contact structure in the opening between the first pair of the plurality of gate structures;

subsequent to forming the trench contact structure, planarizing the patterned hardmask layer to form a contact plug between the second pair of the gate structures, the contact plug comprising the recessed dielectric material and a portion of the patterned hardmask layer.

8. The method of claim 7, wherein the plurality of gate structures is a plurality of dummy gate structures, the method further comprising:

subsequent to planarizing the patterned hardmask layer to form the contact plug, removing the plurality of dummy gate structures to form a plurality of gate trenches; and forming a plurality of permanent gate structures in the plurality of gate trenches.

9. The method of claim 7, wherein the dielectric material comprises silicon and oxygen, and the hardmask layer comprises silicon and nitrogen.

10. The method of claim 7, wherein the trench contact structure comprises a lower conductive structure and a dielectric cap on the lower conductive structure.

11. The method of claim 10, wherein the dielectric cap of the trench contact structure has an upper surface co-planar with an upper surface of the contact plug.

12. The method of claim 7, wherein individual ones of the plurality of gate structures comprise a gate electrode on a gate dielectric layer, and a dielectric cap on the gate electrode.

13. The method of claim 12, wherein the dielectric cap of the individual ones of the plurality of gate structures has an upper surface co-planar with an upper surface of the contact plug.

14. A method of fabricating an integrated circuit structure, the method comprising:

forming a fin comprising silicon;

forming a plurality of gate structures over the fin, individual ones of the plurality of gate structures along a direction orthogonal to the fin and having a pair of dielectric sidewall spacers;

forming a trench contact structure over the fin and directly between the dielectric sidewall spacers of a first pair of the plurality of gate structures; and forming a contact plug over the fin and directly between the dielectric sidewall spacers of a second pair of the plurality of gate structures without an intervening trench contact structure between the dielectric sidewall spacers of the second pair of the plurality of gate structures, the contact plug comprising a lower dielectric material and an upper hardmask material, the upper hardmask material having a rounded bottom surface.

15. The method of claim 14, wherein the lower dielectric material of the contact plug comprises silicon and oxygen, and the upper hardmask material of the contact plug comprises silicon and nitrogen.

16. The method of claim 14, wherein the trench contact structure comprises a lower conductive structure and a dielectric cap on the lower conductive structure.

17. The method of claim 16, wherein the dielectric cap of the trench contact structure has an upper surface co-planar with an upper surface of the upper hardmask material of the contact plug.

18. The method of claim 14, wherein individual ones of the plurality of gate structures comprise a gate electrode on a gate dielectric layer, and a dielectric cap on the gate electrode.

19. The method of claim 18, wherein the dielectric cap of the individual ones of the plurality of gate structures has an upper surface co-planar with an upper surface of the upper hardmask material of the contact plug.

20. The method of claim 14, wherein the fin is continuous with a bulk crystalline silicon substrate.

* * * * *